(12) United States Patent
Kwak et al.

(10) Patent No.: US 12,063,850 B2
(45) Date of Patent: *Aug. 13, 2024

(54) ORGANOMETALLIC COMPOUND, ORGANIC LIGHT-EMITTING DEVICE INCLUDING THE SAME AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Seungyeon Kwak, Suwon-si (KR); Sukekazu Aratani, Hwaseong-si (KR); Sangdong Kim, Seongnam-si (KR); Hyeonho Choi, Seoul (KR); Hyun Koo, Seongnam-si (KR); Soyeon Kim, Seoul (KR); Jiyoun Lee, Anyang-si (KR); Yongsuk Cho, Hwaseong-si (KR); Jongwon Choi, Yongin-si (KR); Dmitry Kravchuk, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 556 days.

This patent is subject to a terminal disclaimer.

(21) Appl. No.: 17/060,751

(22) Filed: Oct. 1, 2020

(65) Prior Publication Data
US 2021/0193938 A1 Jun. 24, 2021

(30) Foreign Application Priority Data

Dec. 24, 2019 (KR) .................. 10-2019-0174284
Sep. 28, 2020 (KR) .................. 10-2020-0126371

(51) Int. Cl.
| | | |
|---|---|---|
| H01L 51/50 | (2006.01) | |
| C07F 15/00 | (2006.01) | |
| C09K 11/06 | (2006.01) | |
| H10K 85/30 | (2023.01) | |
| H10K 50/11 | (2023.01) | |
| H10K 101/10 | (2023.01) | |

(52) U.S. Cl.
CPC ....... H10K 85/342 (2023.02); C07F 15/0033 (2013.01); C09K 11/06 (2013.01); C09K 2211/185 (2013.01); H10K 50/11 (2023.02); H10K 2101/10 (2023.02)

(58) Field of Classification Search
CPC .. H10K 85/342; H10K 50/11; H10K 2101/10; H10K 50/12; H10K 85/40; C07F 15/0033; C09K 11/06; C09K 2211/185
USPC ...................................................... 428/690
See application file for complete search history.

(56) References Cited

U.S. PATENT DOCUMENTS

| | | |
|---|---|---|
| 6,465,115 B2 | 10/2002 | Shi et al. |
| 6,596,415 B2 | 7/2003 | Shi et al. |
| 7,294,415 B2 | 11/2007 | Son et al. |
| 7,959,993 B2 | 6/2011 | Lee |
| 8,431,243 B2 | 4/2013 | Kwong et al. |
| 9,130,177 B2 | 9/2015 | Ma et al. |
| 9,379,361 B2 | 6/2016 | Tsurutani et al. |
| 9,466,804 B2 | 10/2016 | Kishino et al. |
| 9,899,613 B2 | 2/2018 | Takayuki et al. |
| 9,917,264 B2 | 3/2018 | Horiuchi et al. |
| 9,960,370 B2 | 5/2018 | Kishino et al. |
| 10,038,152 B2 | 7/2018 | Kosuge et al. |
| 10,109,807 B2 | 10/2018 | Kamatani et al. |
| 10,862,054 B2 | 12/2020 | Ji et al. |
| 2001/0019782 A1 | 9/2001 | Igarashi et al. |
| 2006/0103298 A1 | 5/2006 | Lee |
| 2010/0219407 A1 | 9/2010 | Kamatani et al. |
| 2015/0076483 A1 | 3/2015 | Tsurutani et al. |
| 2015/0295188 A1 | 10/2015 | Kosuge et al. |
| 2015/0303386 A1 | 10/2015 | Kishino et al. |
| 2015/0333279 A1 | 11/2015 | Kamatani et al. |
| 2015/0357586 A1* | 12/2015 | Horiuchi ............... H10K 50/81 257/40 |
| 2015/0364701 A1 | 12/2015 | Horiuchi et al. |
| 2015/0364702 A1 | 12/2015 | Abe et al. |

(Continued)

FOREIGN PATENT DOCUMENTS

| | | |
|---|---|---|
| CN | 1780019 A | 5/2006 |
| CN | 102459505 A | 5/2012 |

(Continued)

OTHER PUBLICATIONS

Pending claims in U.S. Appl. No. 16/697,760, filed Mar. 10, 2023. (Year: 2023).*

(Continued)

*Primary Examiner* — Gregory D Clark
(74) *Attorney, Agent, or Firm* — CANTOR COLBURN LLP

(57) ABSTRACT

An organometallic compound, wherein the organometallic compound has a $C_2$ symmetric structure, and is represented by Formula 1,
wherein the sum of $\Delta(\text{Ir}-\text{N})$ and $\Delta(\text{Ir}-\text{C})$ is about 0.002 angstroms or less:

$$\text{Ir}(L_1)_2(L_2) \qquad \text{Formula 1}$$

wherein, in Formula 1,
$L_1$ is a ligand represented by Formula 2 as provided herein, wherein one of two $L_1$s is a first $L_1$ ligand and the other $L_1$s is a second $L_1$ ligand and the first $L_1$ ligand and the second $L_1$ ligand are identical to each other,
$L_2$ is a ligand represented by Formula 3 as provided herein, and
$\Delta(\text{Ir}-\text{N})$ and $\Delta(\text{Ir}-\text{C})$ are as defined herein.

20 Claims, 4 Drawing Sheets

(56) References Cited

U.S. PATENT DOCUMENTS

| | | | |
|---|---|---|---|
| 2016/0285007 A1 | 9/2016 | Swager et al. | |
| 2016/0285013 A1* | 9/2016 | Boudreault | C07F 15/0033 |
| 2017/0054095 A1 | 2/2017 | Choi et al. | |
| 2017/0092882 A1 | 3/2017 | Kamatani et al. | |
| 2017/0098778 A1 | 4/2017 | Oh et al. | |
| 2018/0130956 A1 | 5/2018 | Boudreault et al. | |
| 2018/0134954 A1* | 5/2018 | Tsai | C07F 15/0033 |
| 2018/0198079 A1 | 7/2018 | Boudreault et al. | |
| 2018/0287070 A1* | 10/2018 | Ji | H10K 85/346 |
| 2018/0351102 A1* | 12/2018 | Wolohan | H10K 85/6574 |
| 2019/0013484 A1 | 1/2019 | Kamatani et al. | |
| 2019/0157576 A1 | 5/2019 | Kwong et al. | |
| 2019/0305230 A1 | 10/2019 | Xia et al. | |
| 2020/0071346 A1 | 3/2020 | Choi et al. | |
| 2020/0111977 A1 | 4/2020 | Choi et al. | |
| 2020/0212319 A1* | 7/2020 | Choi | C09B 57/10 |
| 2020/0308201 A1* | 10/2020 | Lee | H10K 85/6576 |
| 2020/0308202 A1 | 10/2020 | Cho et al. | |
| 2020/0308205 A1 | 10/2020 | Lee et al. | |
| 2020/0308207 A1 | 10/2020 | Kim et al. | |
| 2020/0313095 A1 | 10/2020 | Aratani et al. | |
| 2021/0167302 A1* | 6/2021 | Layek | H10K 85/322 |
| 2023/0397488 A1 | 12/2023 | Choi et al. | |

FOREIGN PATENT DOCUMENTS

| | | | |
|---|---|---|---|
| CN | 104380494 A | 2/2015 | |
| CN | 104871333 A | 8/2015 | |
| CN | 104871334 A | 8/2015 | |
| CN | 104885248 A | 9/2015 | |
| CN | 104885248 A | 4/2017 | |
| CN | 106554771 A | 4/2017 | |
| CN | 107827933 A | 3/2018 | |
| CN | 108059645 A | 5/2018 | |
| CN | 111004287 A | 4/2020 | |
| CN | 111377974 A | 7/2020 | |
| CN | 111747990 A | 10/2020 | |
| CN | 111747991 A | 10/2020 | |
| CN | 111747992 A | 10/2020 | |
| CN | 111755629 A | 10/2020 | |
| EP | 2465912 A1 | 6/2012 | |
| EP | 3637489 A1 | 4/2020 | |
| EP | 3674308 A1 | 7/2020 | |
| EP | 3715352 A1 | 9/2020 | |
| EP | 3715354 A1 | 9/2020 | |
| EP | 3715355 A1 | 9/2020 | |
| EP | 3715436 A1 | 9/2020 | |
| EP | 3715437 A1 | 9/2020 | |
| JP | 2000003782 A | 6/1998 | |
| JP | 2000000378 A | 1/2000 | |
| JP | 2009114137 A | 5/2009 | |
| JP | 2014127687 A | 7/2014 | |
| JP | 2014127688 A | 7/2014 | |
| JP | 2014138100 A | 7/2014 | |
| JP | 2014139147 A | 7/2014 | |
| JP | 2014139987 A | 7/2014 | |
| JP | 2014141425 A | 8/2014 | |
| JP | 6157125 B2 | 7/2017 | |
| JP | 2020059709 A | 4/2020 | |
| KR | 1020050001794 A | 1/2005 | |
| KR | 20120036560 A | 4/2012 | |
| KR | 101468065 B1 | 12/2014 | |
| KR | 1020170142944 A | 12/2017 | |
| KR | 1020180082339 A | 7/2018 | |
| KR | 1020200083198 A | 7/2020 | |
| KR | 1020200113482 A | 10/2020 | |
| WO | WO-02156645 A1 * | 2/2002 | H05B 33/14 |
| WO | WO-2004016711 A1 * | 2/2004 | C07F 15/004 |
| WO | WO-2005097943 A1 * | 10/2005 | C09K 11/06 |
| WO | 2013176194 A1 | 11/2013 | |
| WO | 2014104387 A1 | 7/2014 | |
| WO | 2014104395 A1 | 7/2014 | |
| WO | 2014112450 A1 | 7/2014 | |
| WO | 2014112657 A1 | 7/2014 | |
| WO | 2014112658 A1 | 7/2014 | |
| WO | 2014115528 A1 | 7/2014 | |
| WO | 2014123238 A1 | 8/2014 | |
| WO | 2014123239 A1 | 8/2014 | |

OTHER PUBLICATIONS

Pending claims in U.S. Appl. No. 16/697,765, filed Apr. 11, 2023. (Year: 2023).*

Extended EP search Report dated Apr. 21, 2021 of EP Patent Application No. 20215336.7.

Kwon-Hyeon Kim et al., "Phosphorescent dye-based supramolecules for high-efficiency organic light-emitting diodes," Nature Communications, Sep. 10, 2014, pp. 1-8.

Matthew J. Jurow et al., "Understanding and predicting the orientation of heteroleptic phosphors in organic light- emitting materials," Nature Materials, Oct. 5, 2015, pp. 1-9.

Thomas Lampe et al., "Dependence of phosphorescent emitter orientation on deposition technique in doped organic films," Chemistry of Materials, Jan. 21, 2016, pp. 1-13.

Office Action issued dated Sep. 26, 2023 of CN Patent Application No. 201911324015.2.

English Translation of Office Action dated Mar. 13, 2023, issued in corresponding CN Patent Application No. 201911324015.2, 10 pp.

English Translation of Office Action dated May 18, 2023 issued in corresponding KR Patent Application No. 10-2019-0136792, 6 pp.

English translation of Office Action issued in corresponding JP Patent Application No. 2019-232371, dated Feb. 1, 2022, 6 pp.

English Translation of Office Action issued May 15, 2023 in corresponding TW Patent Application No. 108147808, 8 pp.

Extended European search report issued by the European Patent Office on Apr. 22, 2020 in the examination of the European Patent Application No. 19217630.3, which corresponds to the U.S. Application above.

Extended European search report issued by the European Patent Office on Jul. 6, 2020 in the examination of the European Patent Application No. 20165786.3, which corresponds to the U.S. Application above.

Joseph C. Sloop, "Advances in the Preparation of Fluorinated Isoquinolines: A Decade of Progress", Journal of Chemistry, 2017, Hindawi, Jan. 23, 2017, Article ID 2860123, 15 pages.

Julianne M. Thomsen, et al., Iridium-based complexes for water oxidation, Dalton Trans., 2015, 44, 12452-12472.

Jun Ohata, et al., Luminogenic iridium azide complexes, Chem. Commun., 2015, 51, 15192-15195.

M. A. Baldo, et al., Highly efficient phosphorescent emission from organic electroluminescent devices, Nature, v395, pp. 151-154 (1998).

M. A. Baldo, et al., Very high-efficiency green organic light-emitting devices based on electrophosphorescence Appl. Phys. Lett. 75, 4 (1999).

Office Action dated Mar. 13, 2023, issued in corresponding CN Patent Application No. 201911324015.2, 10 pp.

Office Action dated May 18, 2023 issued in corresponding KR Patent Application No. 10-2019-0136792, 7 pp.

Office Action issued in corresponding JP Patent Application No. 2019-232371, dated Feb. 1, 2022, 5 pp.

Office Action issued May 15, 2023 and Search Report in corresponding TW Patent Application No. 108147808, 6 pp.

Qin Wang, et al., Effects of charged self-assembled quantum dots on two-dimensional quantum transport, Appl. Phys. Lett. 76, 1704 (2000), 4 pp.

Raymond C. Kwong, et al., High operational stability of electrophosphorescent devices, Appl. Phys. Lett. 81, 162 (2002), 4pp.

Sergey Lamansky, et al., Highly Phosphorescent Bis-Cyclometalated Iridium Complexes: Synthesis, Photophysical Characterization, and Use in Organic Light Emitting Diodes, J. Am. Chem. Soc. 2001, 123, 4304-4312.

Sergey Lamansky, et al., Synthesis and Characterization of Phosphorescent Cyclometalated Iridium Complexes, Inorg. Chem. 2001, 40, 1704-1711.

(56) References Cited

OTHER PUBLICATIONS

Toshitada Yoshihara, et al., Mitochondria-targeted oxygen probes based on cationic iridium complexes with a 5-amino-1,10-phenanthroline ligand, J. Photochem. Photobiol., 2015, 299, 172-182.
Office Action issued Jan. 12, 2024 of CN Patent Application No. 202011526190.2.
Office Action issued Oct. 23, 2023 of TW Patent Application No. 109110652.
Office Action issued Feb. 21, 2024 of CN Patent Application No. 202010227409.2.

* cited by examiner

ORGANOMETALLIC COMPOUND, ORGANIC LIGHT-EMITTING DEVICE INCLUDING THE SAME AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2019-0174284, filed on Dec. 24, 2019, and Korean Patent Application No. 10-2020-0126371, filed on Sep. 28, 2020, in the Korean Intellectual Property Office, and all the benefits accruing therefrom under 35 U.S.C. § 119, the contents of which are incorporated herein in their entireties by reference.

BACKGROUND

1. Field

One or more embodiments of the present disclosure relate to an organometallic compound, an organic light-emitting device including the same and an electronic apparatus including the organic light-emitting device.

2. Description of Related Art

Organic light-emitting devices are self-emission devices, which have improved characteristics in terms of a viewing angle, a response time, brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating visible light.

SUMMARY

One or more embodiments include a novel organometallic compound, an organic light-emitting device including the same and an electronic apparatus including the organic light-emitting device.

Additional aspects will be set forth in part in the description which follows and, in part, will be apparent from the description, or may be learned by practice of the presented embodiments of the disclosure.

An aspect of the present disclosure provides an organometallic compound which has a $C_2$ symmetric structure, and is represented by Formula 1, wherein the sum of $\Delta(Ir-N)$ and $\Delta(Ir-C)$ is 0.002 angstroms or less.

$$Ir(L_1)_2(L_2) \qquad \text{Formula 1}$$

In Formula 1, $L_1$ is a ligand represented by Formula 2, wherein one of two $L_1$s is a first $L_1$ ligand and the other $L_1$s is a second $L_1$ ligand and the first $L_1$ ligand and the second $L_1$ ligand are identical to each other, $L_2$ is a ligand represented by Formula 3,

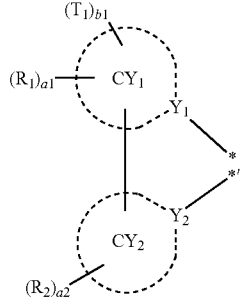

Formula 2

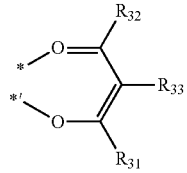

Formula 3 wherein, in Formula 2, $Y_1$ in Formula 2 is N, and $Y_2$ is C, ring $CY_1$ is a polycyclic group comprising three or more 6-membered rings that are condensed with each other, ring $CY_2$ is a $C_5$-$C_{30}$ carbocyclic group or a $C_1$-$C_{30}$ heterocyclic group, $T_1$ is a group having a para Hammett substituent constant (σp) that is greater than 0 and less than 0.5, b1 is an integer from 1 to 10, wherein, when b1 is 2 or more, two or more $T_1$ groups are identical to or different from each other, $R_1$, $R_2$, and $R_{31}$ to $R_{33}$ in Formulae 2 and 3 are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{50}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q), —P(=O)(Q$_8$)(Q$_9$), or —P(Q)(Q$_9$), a1 and a2 in Formula 2 are each independently be an integer from 0 to 10, wherein, when a1 is 2 or more, two or more of $R_1$ groups are identical to or different from each other, and when a2 is 2 or more, two or more of $R_2$ groups are identical to or different from each other,

* and *' in Formulae 2 and 3 each indicate a binding site to Ir in Formula 1, $\Delta$(Ir—N) is an absolute value of a difference between an Ir and $Y_1$ bond distance for the first $L_1$ ligand and an Ir and $Y_1$ bond distance for the second $L_1$ ligand in Formulae 1 and 2, $\Delta$(Ir—C) is an absolute value of a difference between an Ir and $Y_2$ bond distance for the first $L_1$ ligand and an Ir and $Y_2$ bond distance for the second $L_1$ ligand in Formulae 1 and 2, two or more of $R_1$ groups in the number of a1 are optionally linked to each other to form a $C_5$-$C_{30}$ carbocyclic group unsubstituted or substituted with at least one $R_{1a}$, or two or more of $R_1$ groups in the number of a1 are optionally linked to each other to form a $C_1$-$C_{30}$ heterocyclic group unsubstituted or substituted with at least one $R_{1a}$, two or more of $R_2$ groups in the number of a2 are optionally linked to each other to form a $C_5$-$C_{30}$ carbocyclic group unsubstituted or substituted with at least one $R_{1a}$, or two or more of $R_2$ groups in the number of a2 are optionally linked to each other to form a $C_1$-$C_{30}$ heterocyclic group unsubstituted or substituted with at least one $R_{1a}$, two or more of $R_1$ and $R_2$ are optionally linked to each other to form a $C_5$-$C_{30}$ carbocyclic group unsubstituted or substituted with at least one $R_{1a}$, or two or more of $R_1$ and $R_2$ are optionally linked to each other to form a $C_1$-$C_{30}$ heterocyclic group unsubstituted or substituted with at least one $R_{1a}$, two or more of $R_{31}$ to $R_{33}$ are optionally linked to each other to form a $C_5$-$C_{30}$ carbocyclic group unsubstituted or substituted with at least one $R_{1a}$, or two or more of $R_{31}$ to $R_{33}$ are optionally linked to each other to form a $C_1$-$C_{30}$ heterocyclic group unsubstituted or substituted with at least one $R_{1a}$, $R_{1a}$ is the same as defined in connection with $R_1$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof, —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$), or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

Another aspect provides an organic light-emitting device including a first electrode, a second electrode, and an organic layer disposed between the first electrode and the second electrode and including an emission layer, wherein the organic layer includes at least one organometallic compound represented by Formula 1.

The organometallic compound included in the emission layer of the organic layer may act as a dopant.

Another aspect provides an electronic apparatus including the organic light-emitting device.

BRIEF DESCRIPTION OF THE DRAWINGS

The above and other aspects, features, and advantages of the disclosure will be more apparent from the following detailed description taken in conjunction with the accompanying drawings, in which.

DETAILED DESCRIPTION

Figure 1:
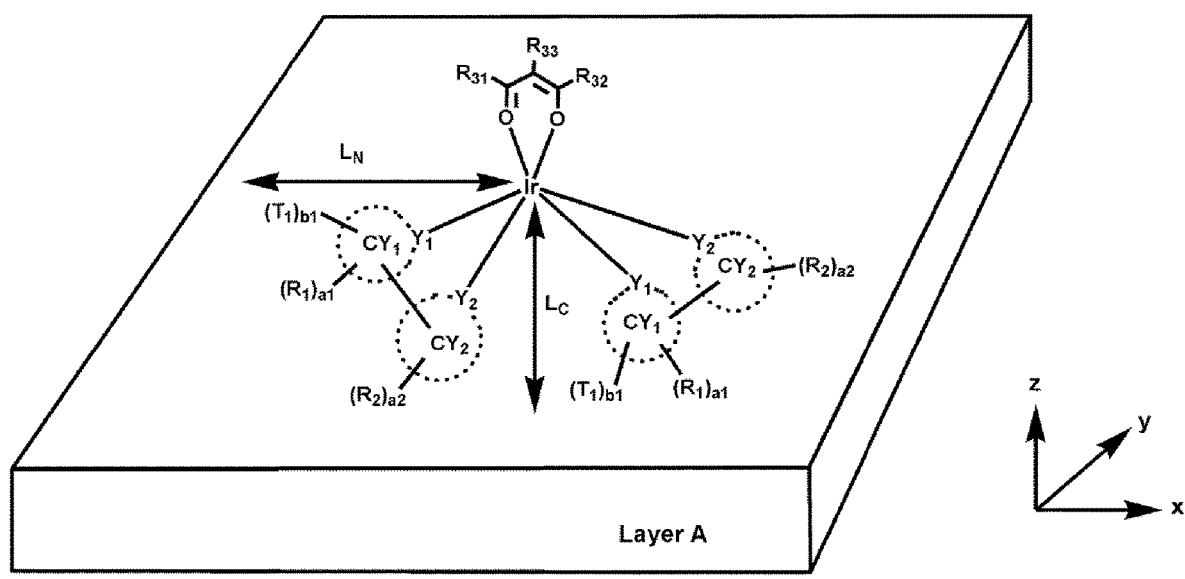
FIG. 1 is a schematic illustration of a simplified depiction of an organometallic compound represented by Formula 1 as deposited on the surface of a layer A.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figure are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, 20%, 10%, 5% of the stated value.

The organometallic compound is represented by Formula 1 below:

Formula 1 wherein, the organometallic compound represented by Formula 1 includes one iridium (Ir), and $L_1$ in Formula 1 is a ligand represented by Formula 2, and $L_2$ is a ligand represented by Formula 3 below:

Formula 2

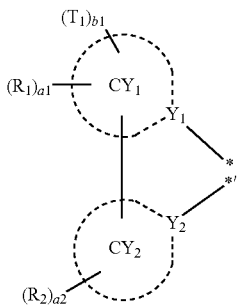

Formula 3

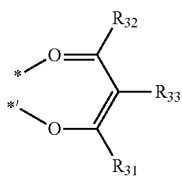

In Formula 2, $Y_1$ is N, and $Y_2$ is C.

One of two $L_1$s is a first $L_1$ ligand and the other $L_1$s is a second $L_1$ ligand and the first $L_1$ ligand and the second $L_1$ ligand are identical to each other. Accordingly, the organometallic compound represented by Formula 1 has a $C_2$ symmetric structure having a $C_2$ symmetry axis.

The sum of Δ(Ir—N) and Δ(Ir—C) of the organometallic compound represented by Formula 1 may be equal to or less than 0.002 angstroms (Å), from about 0 Å to about 0.002 Å, from about 0 Å to about 0.001 Å, about 0 Å to about 0.0009 Å, from about 0 Å to about 0.0008 Å, or from about 0 Å to about 0.00072 Å. Here, Δ(Ir—N) is the difference (absolute value) in bond distances between Ir and $Y_1$ in Formula 2, and is the difference (absolute value) between an Ir and $Y_1$ bond distance for the first $L_1$ ligand $D_1$ (Ir—N) and an Ir and $Y_1$ bond distance for the second $L_1$ ligand $D_2$ (Ir—N) in Formula 1'. Here, Δ(Ir—C) is the difference (absolute value) in bond distances between Ir and $Y_2$ in Formula 2, and is the difference (absolute value) between an Ir and $Y_2$ bond distance for the first $L_1$ ligand $D_1$ (Ir—C) and an Ir and $Y_2$ bond distance for the second $L_1$ ligand $D_2$ (Ir—C) in Formula 1:

Formula 1'

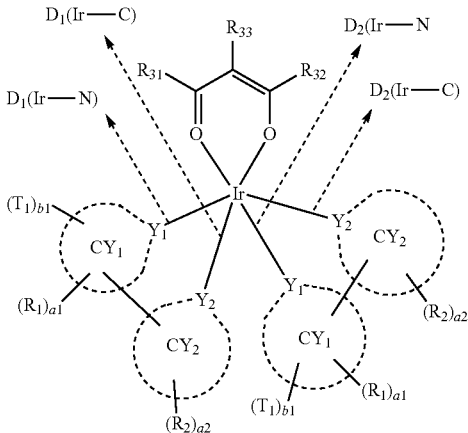

Without wishing to be bound by theory, since the sum of Δ(Ir—N) and Δ(Ir—C) of the organometallic compound represented by Formula 1 satisfies these ranges, the vibronic state of an $S_0$ level of the organometallic compound has a symmetric characteristic, and thus, a $T_1$-$S_0$ transition of the organometallic compound represented by Formula 1 in the excited state may be reduced. As a result, the full width at half maximum (FWHM) and/or the full width at quarter maximum (FWQM) of the photoluminescence (PL) spectrum and/or the electroluminescence (EL) spectrum of the organometallic compound are reduced, and thus, an electronic device, for example, an organic light-emitting device, using the organometallic compound represented by Formula 1 may have excellent color purity and high luminescence efficiency.

In one or more embodiments, $L_N/L_C$ of the organometallic compound represented by Formula 1 may be from about 1.45 to about 2.88, from about 1.45 to about 2.50, from about 1.46 to about 2.30, from about 1.47 to about 2.20, from about 1.48 to about 2.20, or from about 1.491 to about 2.128. Here, $L_N$ is the maximum distance between a non-hydrogen atom included in the group represented by:

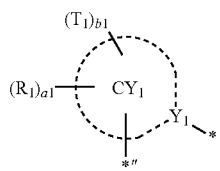

of Formula 2 and Ir of Formula 1, and $L_C$ is the maximum distance between a non-hydrogen atom included in the group represented by:

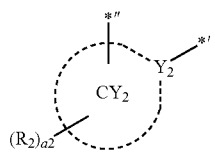

of Formula 2 and Ir of Formula 1 (see FIG. 1).

As used herein, the "maximum distance" refers to the distance between Ir and the furthest non-hydrogen atom of the respective group represented above.

$L_N$, $L_C$, Δ(Ir—N), and Δ(Ir—C), described above, may be measured by performing density functional theory (DFT) calculation on the organometallic compound of Formula 1. For example, the DFT calculation may be performed using Gaussian. In one embodiment, for the DFT calculation, optimizing of the molecular structure of the organometallic compound of Formula 1 may be performed using B3LYP/LanL2DZ function for Ir and B3LYP/6-31G(G,P) function for ligands ($L_1$ and $L_2$).

Figure 2:
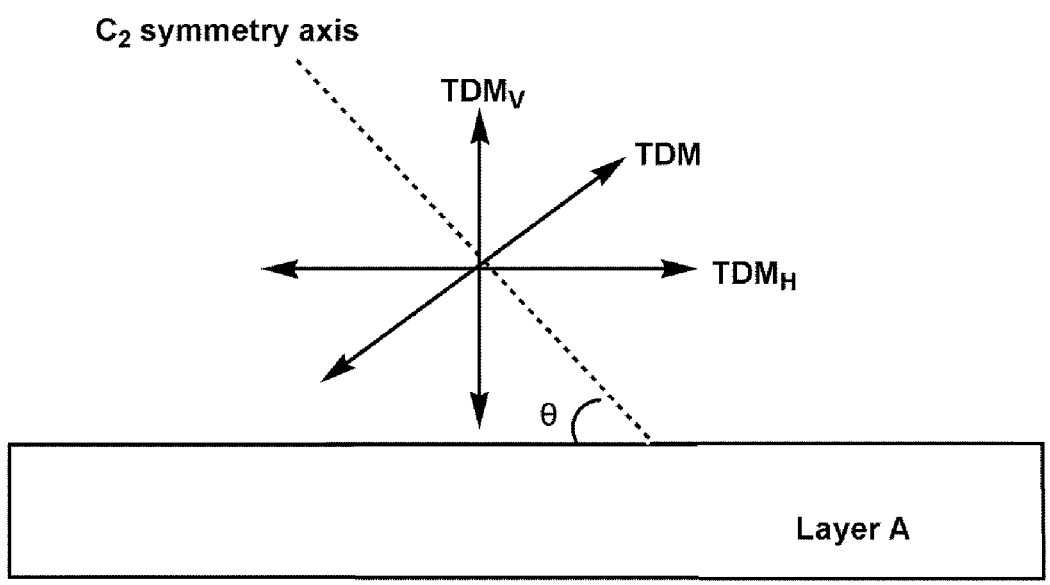
FIG. 2 is a schematic illustration of the relationship among the $C_2$ symmetry axis, the transition dipole moment (TDM), the horizontal orientation ratio of the TDM ($TDM_H$), and the vertical orientation of the TDM ($TDM_V$) of the organometallic compound represented by Formula 1, with respect to the surface of the layer A.

Referring back to FIG. 1, when the organometallic compound represented by Formula 1 is deposited on Layer A, 1) two ligands $L_1$ represented by Formula 2 may be arranged along the surface (the x-y plane) of Layer A, and 2) ligand $L_2$ represented by may be arranged in a direction opposite to the surface of Layer A (that is, the vacuum side in the z-axis direction). In this regard, the $C_2$ symmetry axis of Formula 1 and the linking direction between Ir and ligand $L_2$ may be parallel to each other, and the transition dipole moment (TDM) of the organometallic compound of Formula 1 may be perpendicular to the $C_2$ symmetry axis (see FIG. 2).

When the $L_N/L_C$ of the organometallic compound represented by Formula 1 satisfies the above-described ranges, the angle θ formed between the $C_2$ symmetry axis of Formula 1 and the surface of Layer A may be reduced. Regarding Layer A, the TDM of the organometallic compound represented by Formula 1 may be the sum of i) the horizontal orientation ratio of the TDM, that is, $TDM_H$ and ii) the vertical orientation ratio of the TDM, that is, $TDM_V$ (see FIG. 2). As the angle (θ) formed between the $C_2$ symmetry axis of Formula 1 and the surface of Layer A decreases, the $TDM_H$ increases and thus, the TDM of the organometallic compound may be substantially parallel to the surface of Layer A of the organometallic compound. For example, the angle (θ) formed between the TDM of the organometallic compound and the surface of Layer A may be from about 0° to about 10°.

As such, when the TDM of the organometallic compound represented by Formula 1 is substantially parallel to the surface of Layer A, when an electronic device, for example, an organic light-emitting device, including the organometallic compound is driven, the electric field is emitted in a direction that is substantially parallel to the surface of Layer A and thus, the light loss due to the waveguide mode and/or surface plasmon polariton mode may be reduced. Thus, an electronic device, for example, an organic light-emitting device, using the organometallic compound represented by Formula 1 that satisfies the $L_N/L_C$ ranges may have high out-coupling efficiency. Accordingly, an electronic device (for example, an organic light-emitting device) having high emission efficiency may be embodied.

On the other hand, the maximum external quantum efficiency of an organic light-emitting device may be calculated as in Equation 1:

$$\eta_{maxEQE} = \gamma \phi \eta_{S/T} \eta_{out} \quad \text{Equation 1}$$

In Equation 1, $\eta_{maxEQE}$ is a maximum external quantum efficiency (EQE),

γ is the charge balance,

φ is the quantum efficiency, $\eta_{S/T}$ is a singlet/triplet fraction, and $\eta_{out}$ is an out-coupling efficiency.

The external quantum efficiency of an organic light-emitting device at target luminance may be calculated according to Equation 2:

$$\eta_{EQE} = \eta_{maxEQE}(1-r) \quad \text{Equation 2}$$

In Equation 2, $\eta_{EQE}$ is the external quantum efficiency at target luminance, and r is the roll-off ratio.

That is, from Equation 1 and Equation 2, increasing the maximum external quantum efficiency and decreasing the roll-off ratio improves the emission efficiency of the organic light-emitting device. To increase the maximum external quantum efficiency, the out-coupling efficiency can be increased.

When the organometallic compound has a structure satisfying $L_N/L_C$ in the above-described range, the organometallic compound may provide a high out-coupling efficiency. Thus, an organic light-emitting device including the organometallic compound may have improved maximum external quantum efficiency and may result in implementation of an organic light-emitting device having high emission efficiency.

In Formula 2, ring $CY_1$ is a polycyclic group comprising three or more 6-membered rings that are condensed with each other. For example, the 6-membered ring may be a cyclohexane group, a cyclohexene group, a benzene group, a pyridine group, a pyrimidine group, a pyrazine group, or a pyridazine group.

In one embodiment, ring $CY_1$ in Formula 2 is a polycyclic group in which three or four 6-membered rings are condensed with each other.

In Formula 2, ring $CY_2$ is a $C_5$-$C_{30}$ carbocyclic group or a $C_1$-$C_{30}$ heterocyclic group.

For example, ring $CY_2$ in Formula 2 may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, The first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azagermole group, an azaborole group, an azaselenophene group, or an azaphosphole group.

The second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one embodiment, ring $CY_2$ in Formula 2 may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one embodiment, ring $CY_2$ in Formula 2 may be a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

$T_1$ in Formula 2 may be a group having a para Hammett substituent constant (op) that is greater than 0 and less than 0.5, for example, from about 0.01 to about 0.4 or from about 0.01 to 0.3. Examples of the para Hammett substituent constant (op) that is greater than 0 and less than 0.5 are described in Hansch et al., A Survey of Hammett substituent Constants and Resonance and Field Parameters, *Chem. Rev.* 1991, 91, pp. 165-195.

In one embodiment, $T_1$ in Formula 2 may be:

a fluoro group (—F) or a cyano group; or a fluorinated $C_1$-$C_{20}$ alkyl group, a fluorinated $C_3$-$C_{10}$ cycloalkyl group, a fluorinated $C_1$-$C_{10}$ heterocycloalkyl group, fluorinated phenyl group, fluorinated biphenyl group, a cyano-substituted $C_1$-$C_{20}$ alkyl group, a cyano-substituted $C_3$-$C_{10}$ cycloalkyl group, a cyano-substituted $C_1$-$C_{10}$ heterocycloalkyl group, a cyano-substituted phenyl group, or a cyano-substituted biphenyl group, each unsubstituted or further substituted with deuterium, a fluoro group, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

b1 in Formula 2 indicates the number of $T_1$ groups, and may be an integer from 1 to 10. That is, ring $CY_1$ of Formula 2 is essentially substituted with at least one $T_1$. When b1 is 2 or more, two or more $T_1$ groups may be identical to or different from each other. For example, b1 may be 1, 2, or 3.

As described above, since ring $CY_1$ of Formula 2 is essentially substituted with at least one T, charge transfer in ligand $L_1$ represented by Formula 2 may quickly occur, so that the organometallic compound represented by Formula 1 may have a short decay time.

When the luminance of organic light-emitting device is increased, the density of excitons and polarons in the emission layer is increased, and thus, energy transfer between excitons and excitons and/or energy transfer between excitons and polarons may occur and the quenching phenomenon may occur, resulting in the roll-off phenomenon. In this regard, polarons refer to particles having a charge property. In order to reduce the quench phenomenon, it is necessary to reduce the diffusion length of the exciton in the emission layer by decreasing the density of exciton in the emission layer or the time during which excitons exist. Here, the time during which excitons exist refers to the time during which the organometallic compound stays in the triplet state, that is, the decay time. Since the organometallic compound has a short decay time, an organic light-emitting device using the organometallic compound may have a decreased roll-off ratio, and as a result, an organic light-emitting device having high emission efficiency may be embodied.

The decay time may be evaluated from the time-resolved photoluminescence (TRPL) spectrum of a layer including the organometallic compound represented by Formula 1.

$R_1$, $R_2$ and $R_{31}$ to $R_{33}$ in Formulae 2 and 3 may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$). Q$_1$ to Q$_9$ are the same as described in the present specification.

For example, each of $R_1$ and $R_2$ in Formula 2 may not be hydrogen.

For example, $R_1$, $R_2$ and $R_{31}$ to $R_{33}$ in Formulae 2 and 3 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof,
a $C_1$-$C_{20}$ alkyl group, a deuterated $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a silolanyl group, a phenyl group, a ($C_1$-$C_{20}$ alkyl) a phenyl group, a biphenyl group, a terphenyl group, a naphthyl group, a 1,2,3,4-tetrahydronaphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, deuterated $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) an adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, and —$P(\!\!=\!\!O)(Q_8)(Q_9)$, and $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or a combination thereof.

In one embodiment, $R_1$, $R_2$ and $R_{31}$ to $R_{33}$ in Formulae 2 and 3 may each independently be hydrogen, deuterium, —F, a cyano group, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a phenyl group, a biphenyl group, —$Si(Q_3)(Q_4)(Q_5)$, or —$Ge(Q_3)(Q_4)(Q_5)$.

In one or more embodiments, $R_1$, $R_2$ and $R_{31}$ to $R_{33}$ in Formulae 2 and 3 may each independently be:

hydrogen, deuterium, —F, or a cyano group;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof; or —$Si(Q_3)(Q_4)(Q_5)$, or —$Ge(Q_3)(Q_4)(Q_5)$.

In one or more embodiments, Formula 2 may satisfy at least one of Condition 1-1 and Condition 1-2:

Condition 1-1

$R_2$ is not include a fluoro group (—F) and a cyano group.

Condition 1-2

$R_2$ is:

hydrogen or deuterium;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof; or —$Si(Q_3)(Q_4)(Q_5)$ or —$Ge(Q_3)(Q_4)(Q_5)$.

In one or more embodiments, Formula 2 may satisfy Condition 2-1, Condition 2-2, or Condition 2-3:

Condition 2-1

At least one $R_2$ group in number of a2 includes a fluoro group (—F), a cyano group, or a combination thereof.

Condition 2-2

At least one $R_2$ groups in number of a2 is:

a fluoro group (—F) or a cyano group; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, a cyano group-containing $C_1$-$C_{20}$ alkyl group, a cyano group-containing $C_3$-$C_{10}$ cycloalkyl group, a cyano group-containing $C_1$-$C_{10}$ heterocycloalkyl group, a cyano group-containing phenyl group, or a cyano group-containing biphenyl group, each unsubstituted or substituted with deuterium, a fluoro group, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

Condition 2-3

$R_2$ is:

hydrogen, deuterium, a fluoro group (—F) or a cyano group;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a fluoro group, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof; or —Si($Q_3$)($Q_4$)($Q_5$) or —Ge($Q_3$)($Q_4$)($Q_5$), and at least one $R_2$ group in number of a2 is:

a fluoro group (—F) or a cyano group; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, a cyano group-containing $C_1$-$C_{20}$ alkyl group, a cyano group-containing $C_3$-$C_{10}$ cycloalkyl group, a cyano group-containing $C_1$-$C_{10}$ heterocycloalkyl group, a cyano group-containing phenyl group, or a cyano group-containing biphenyl group, each unsubstituted or substituted with deuterium, a fluoro group, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

In one or more embodiments, ring $CY_2$ in Formula 2 is not a naphthalene group (for example, ring $CY_2$ in Formula 2 may be a benzene group, a dibenzofuran group, a dibenzothiophene group, a carbazole group or a fluorene group) and Formula 2 may satisfy Condition 1-1 or Condition 1-2.

In one or more embodiments, ring $CY_2$ in Formula 2 may be a naphthalene group and Formula 2 may satisfy Condition 1-1 or Condition 1-2.

In one or more embodiments, ring $CY_2$ in Formula 2 may be a naphthalene group and Formula 2 may satisfy Condition 2-1, Condition 2-2, or Condition 2-3.

In one or more embodiments, $R_1$, $R_2$ and $R_{31}$ to $R_{33}$ in Formulae 2 and 3 may each independently be:

hydrogen or deuterium;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof; or —Si($Q_3$)($Q_4$)($Q_5$) or —Ge($Q_3$)($Q_4$)($Q_5$).

For example, $R_1$, $R_2$ and $R_{31}$ to $R_{33}$ in Formulae 2 and 3 may each independently be hydrogen, deuterium, a cyano group, —F, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-1 to 9-39 in which at least one hydrogen is substituted with a cyano group, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 9-201 to 9-233 in which at least one hydrogen is substituted with a cyano group, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-1 to 10-126 in which at least one hydrogen is substituted with a cyano group, a group represented by one of Formulae 10-201 to 10-343, a group represented by one of Formulae 10-201 to 10-343 in which at least one hydrogen is substituted with deuterium, a group represented by one of Formulae 10-201 to 10-343 in which at least one hydrogen is substituted with —F, a group represented by one of Formulae 10-201 to 10-343 in which at least one hydrogen is substituted with a cyano group, —Si($Q_3$)($Q_4$)($Q_5$), or —Ge($Q_3$)($Q_4$)($Q_5$) wherein $Q_3$ to $Q_5$ are the same as described in the present specification.

In one embodiment, $T_1$ of Formula 2 may be —F, —$CF_3$, —$CF_2H$, —$CFH_2$, a cyano group, a group represented by one of Formulae 9-1 to 9-39 in which at least one hydrogen is substituted with —F, a group represented by one of Formulae 9-1 to 9-39 in which at least one hydrogen is substituted with a cyano group, a group represented by one of Formulae 9-201 to 9-233 in which at least one hydrogen is substituted with —F, a group represented by one of Formulae 9-201 to 9-233 in which at least one hydrogen is substituted with a cyano group, a group represented by one of Formulae 10-1 to 10-126 in which at least one hydrogen is substituted with —F, a group represented by one of Formulae 10-1 to 10-126 in which at least one hydrogen is substituted with a cyano group, a group represented by one of Formulae 10-201 to 10-343 in which at least one hydrogen is substituted with —F, or a group represented by one of Formulae 10-201 to 10-343 in which at least one hydrogen is substituted with a cyano group.

In one embodiment, $R_2$ of Formula 2 may be hydrogen, deuterium, —$CH_3$, —$CD_3$, —$CD_2H$, —$CDH_2$, a group represented by one of Formulae 9-1 to 9-39, a group represented by one of Formulae 9-1 to 9-39 in which at least one hydrogen is substituted with deuterium, a group represented by one of Formulae 9-201 to 9-233, a group represented by one of Formulae 9-201 to 9-233 in which at least one hydrogen is substituted with deuterium, a group represented by one of Formulae 10-1 to 10-126, a group represented by one of Formulae 10-1 to 10-126 in which at least one hydrogen is substituted with deuterium, a group represented by one of Formulae 10-201 to 10-343, a group represented by one of Formulae 10-201 to 10-343 in which at least one hydrogen is substituted with deuterium, —Si($Q_3$)($Q_4$)($Q_5$), or —Ge($Q_3$)($Q_4$)($Q_5$) wherein $Q_3$ to $Q_5$ are the same as described in the present specification.

In one embodiment, $R_2$ of Formula 2 may be hydrogen, deuterium, a cyano group, —F, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-1 to 9-39 in which at least one hydrogen is substituted with a cyano group, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 9-201 to 9-233 in which at least one hydrogen is substituted with a cyano group, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-1 to 10-126 in which at least one hydrogen is substituted with a cyano group, a group represented by one of Formulae 10-201 to 10-343, a group represented by one of Formulae 10-201 to 10-343 in which at least one hydrogen is substituted with deuterium, a group represented by one of Formulae 10-201 to 10-343 in which at least one hydrogen is substituted with —F, a group represented by one of Formulae 10-201 to 10-343 in which at least one hydrogen is substituted with a cyano group, —Si($Q_3$)($Q_4$)($Q_5$), or —Ge($Q_3$)($Q_4$)($Q_5$) and at least one $R_2$ group in number of a2 may be a cyano group, —F, —$CF_3$, —$CF_2H$, —$CFH_2$, a group represented by one of Formulae 9-1 to 9-39 in which at least one hydrogen is substituted with —F, a group represented by one of Formulae 9-1 to 9-39 in which at least one hydrogen is substituted with a cyano group, a group represented by one of Formulae 9-201 to 9-233 in which at least one hydrogen is substituted with —F, a group represented by one of Formulae 9-201 to 9-233 in which at least one hydrogen is substituted with a cyano group, a group represented by one of Formulae 10-1 to 10-126 in which at least one hydrogen is substituted with —F, a group represented by one of Formulae 10-1 to 10-126 in which at least one hydrogen is substituted with a cyano group, a group represented by one of Formulae 10-201 to 10-343 in which at least one hydrogen is substituted with —F, or a group represented by one of Formulae 10-201 to 10-343 in which at least one hydrogen is substituted with a cyano group:

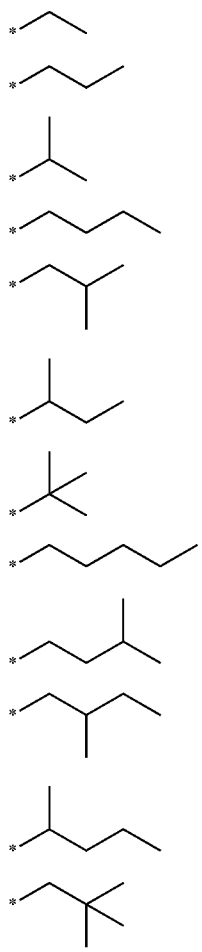

9-1
9-2
9-3
9-4
9-5
9-6
9-7
9-8
9-9
9-10
9-11
9-12

-continued

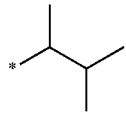 9-13

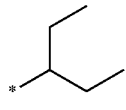 9-14

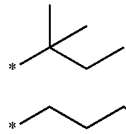 9-15

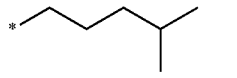 9-16

 9-17

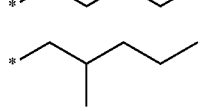 9-18

 9-19

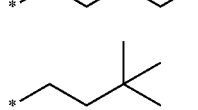 9-20

 9-21

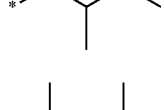 9-22

 9-23

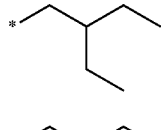 9-24

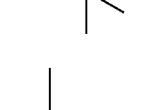 9-25

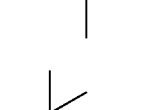 9-26

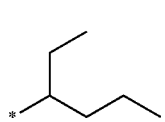 9-27

 9-28

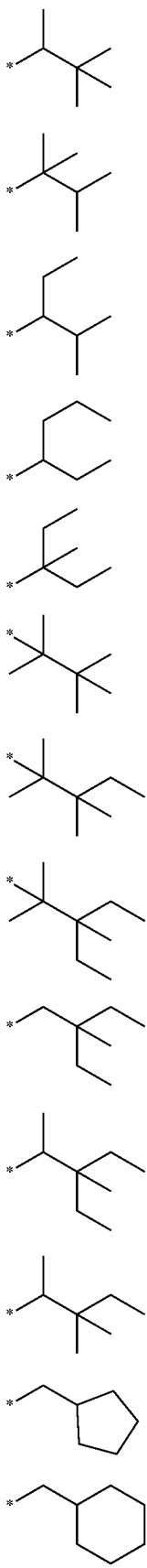
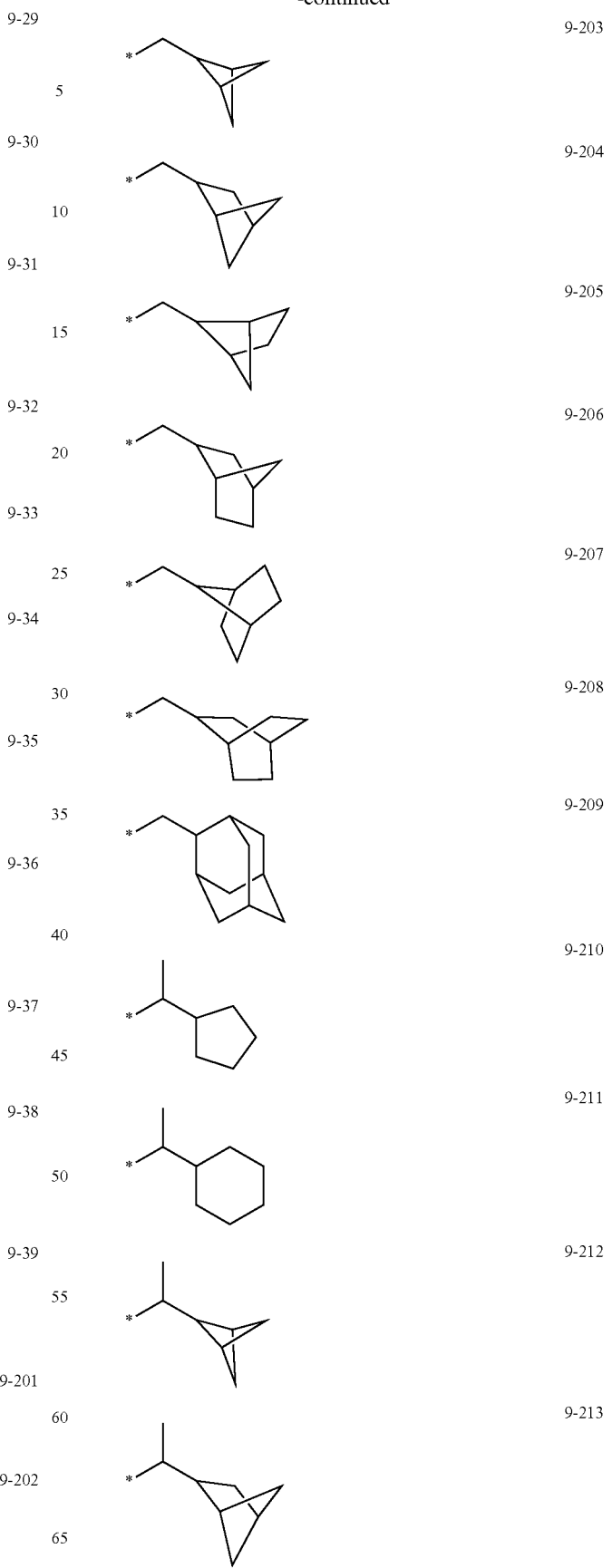

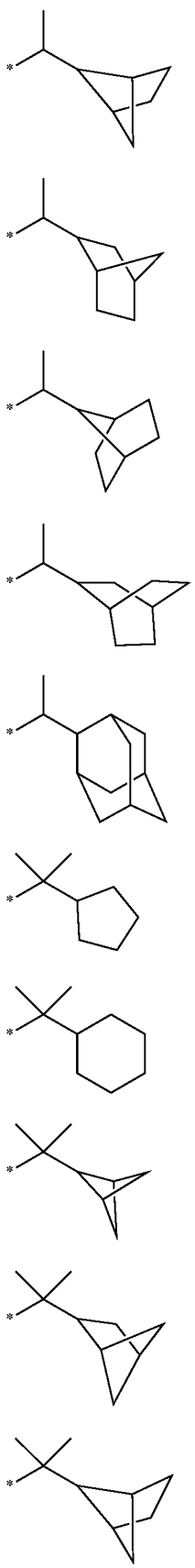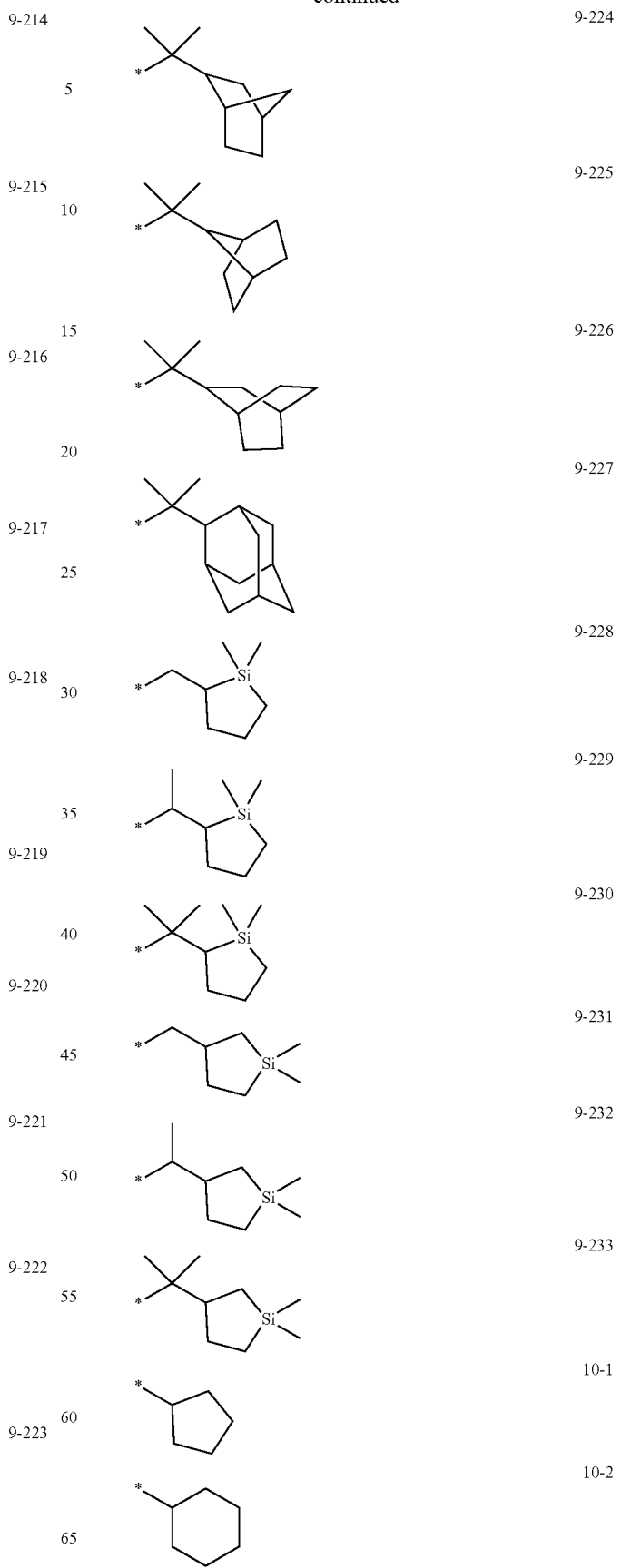

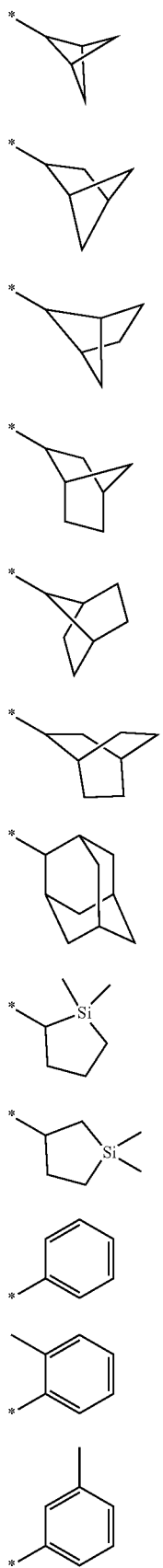
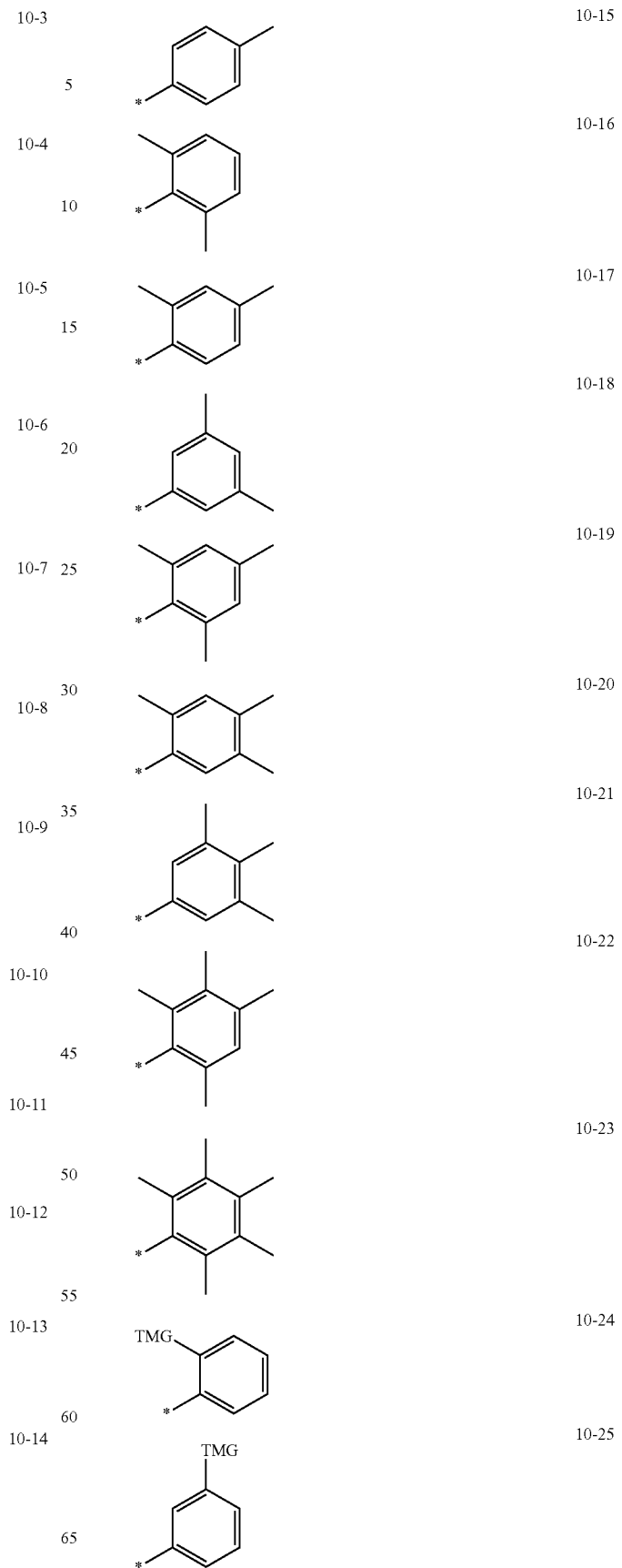

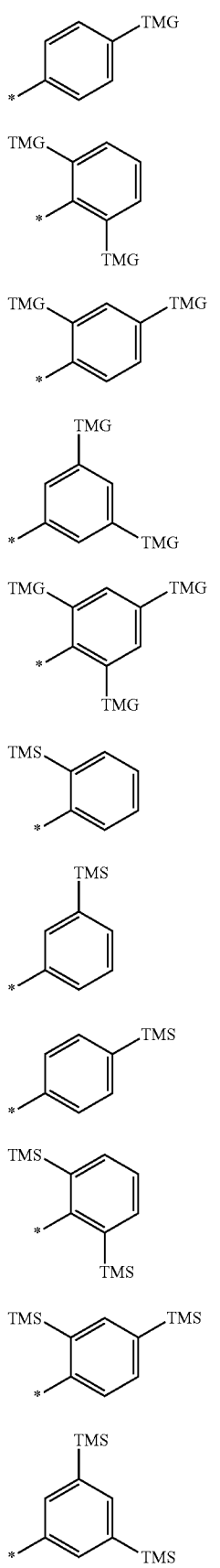
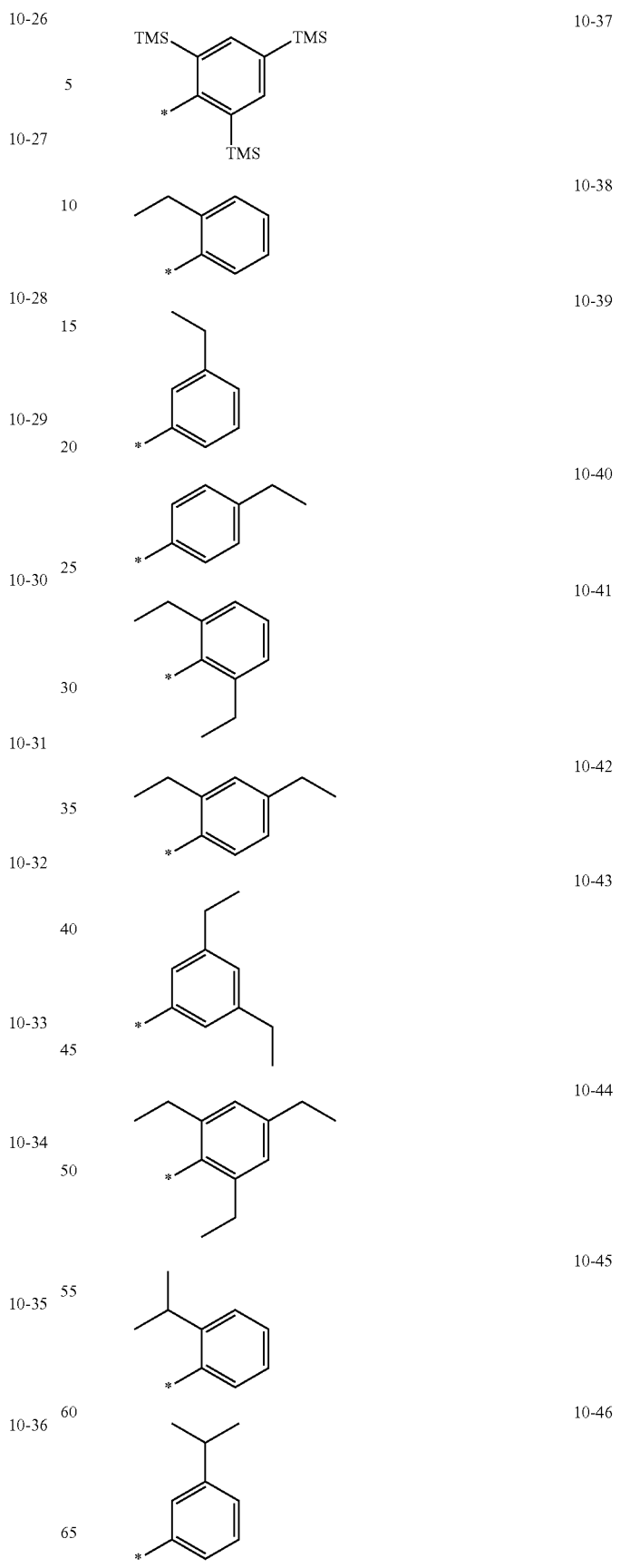

-continued
10-47 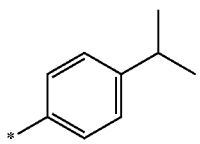
10-48 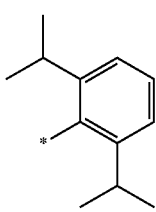
10-49 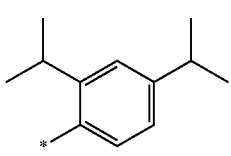
10-50 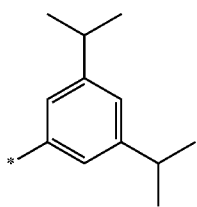
10-51 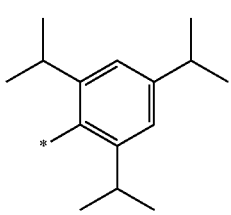
10-52 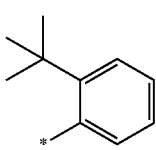
10-53 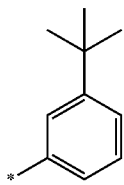
10-54 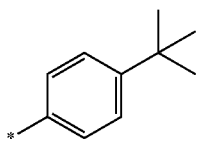
-continued
10-55 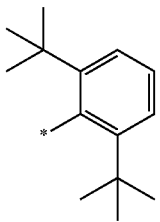
10-56 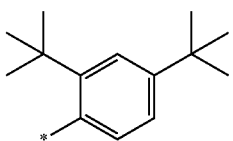
10-57 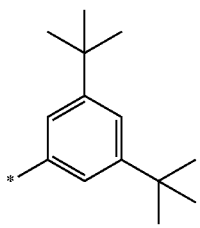
10-58 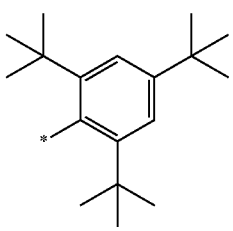
10-59 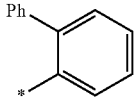
10-60 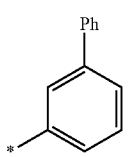
10-61 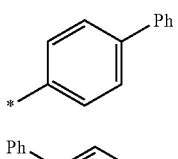
10-62
10-63 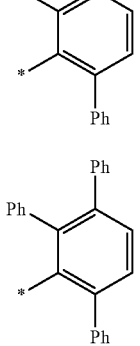

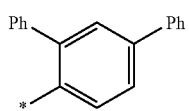
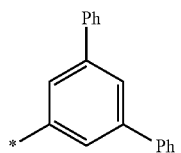
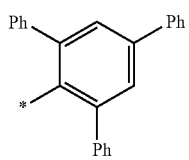
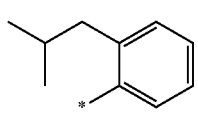
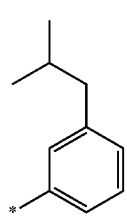
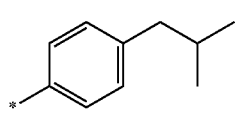
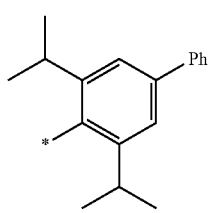
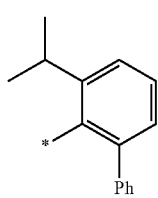
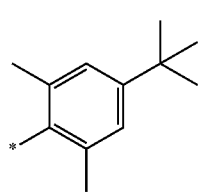
10-64
10-65
10-66
10-67
10-68
10-69
10-70
10-71
10-72
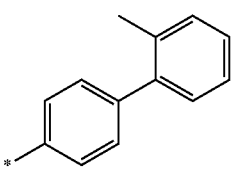
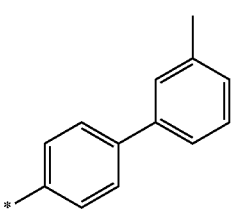
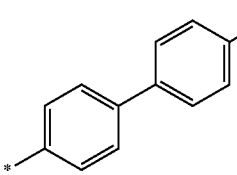
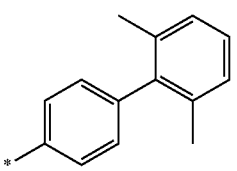
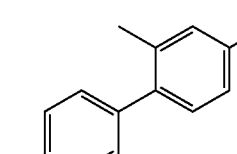
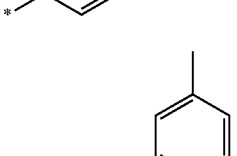
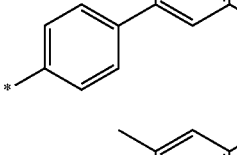
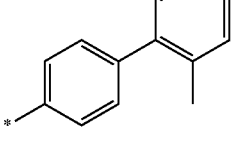
10-73
10-74
10-75
10-76
10-77
10-78
10-79
10-80

-continued
10-81 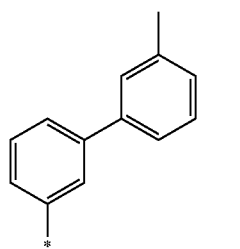
10-82 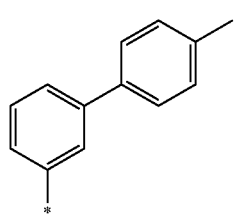
10-83 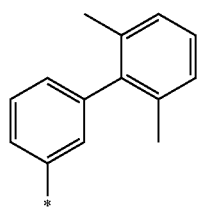
10-84 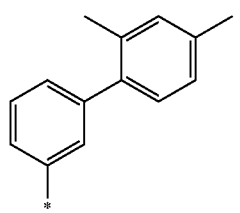
10-85 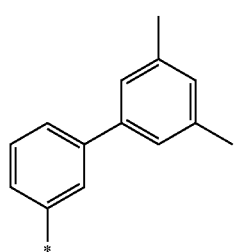
10-86 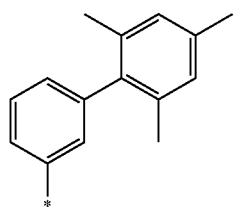
10-87 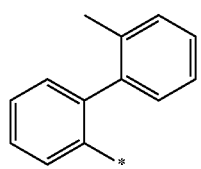
-continued
10-88 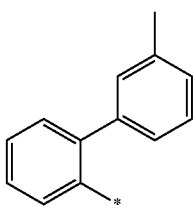
10-89 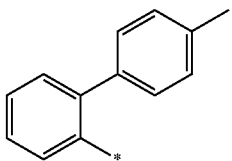
10-90 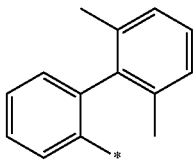
10-91 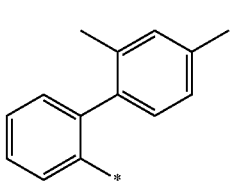
10-92 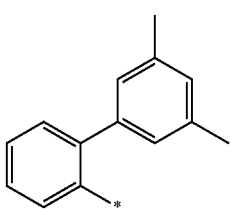
10-93 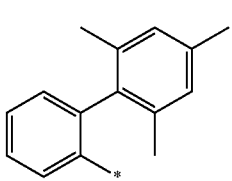
10-94 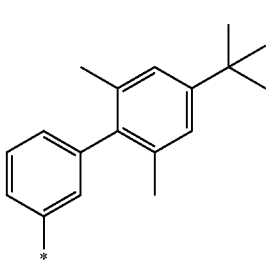
10-95

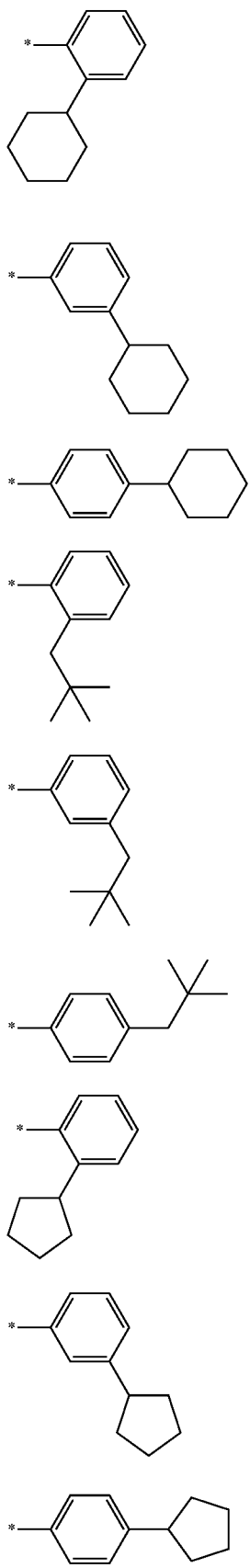

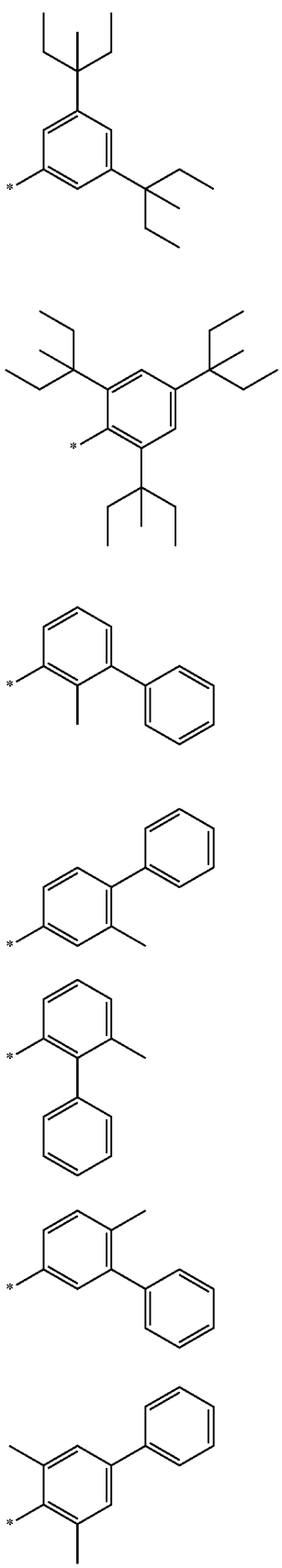
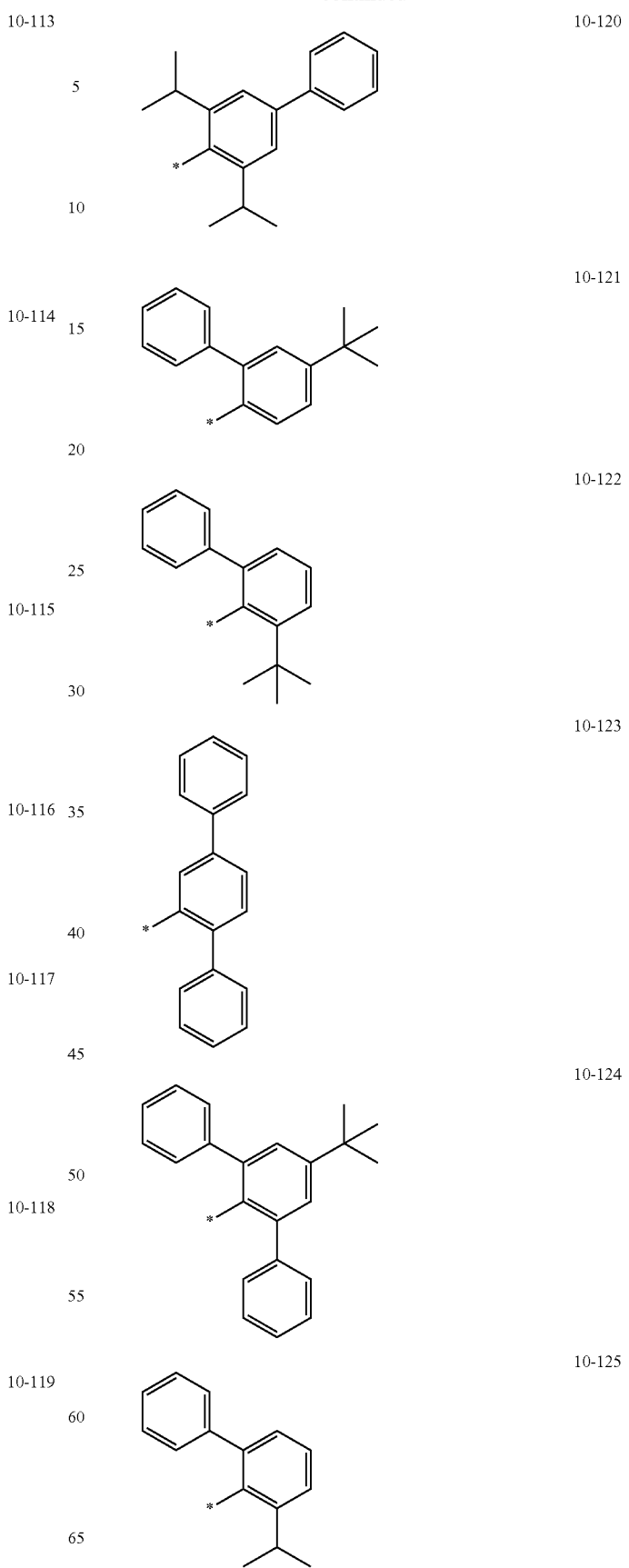

10-126 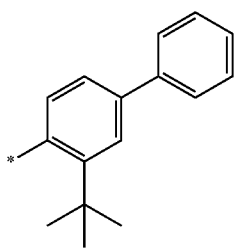
10-201 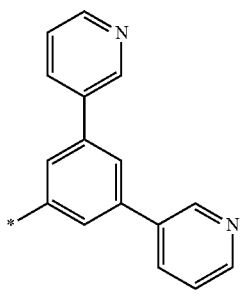
10-202 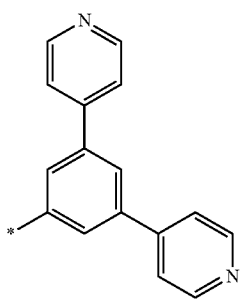
10-203 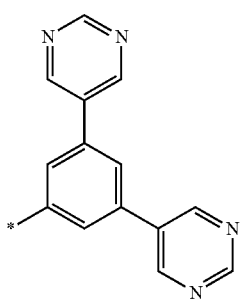
10-204 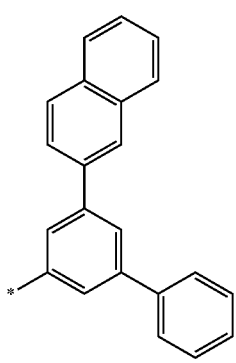
10-205 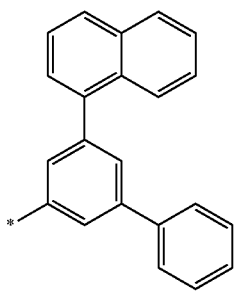
10-206 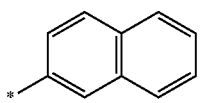
10-207 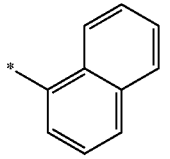
10-208 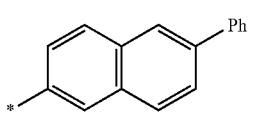
10-209 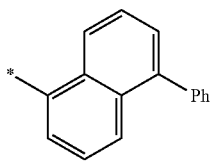
10-210 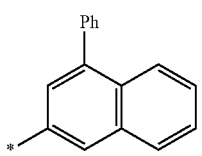
10-211 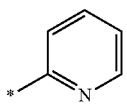
10-212 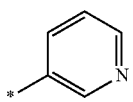
10-213 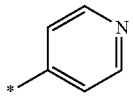
10-214 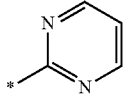
10-215 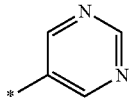

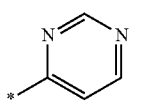
10-204
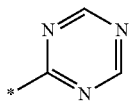
10-205
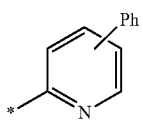
10-206
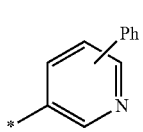
10-207
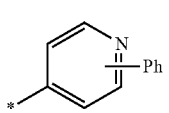
10-208
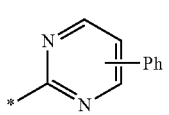
10-209
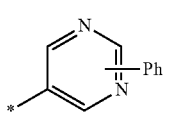
10-210
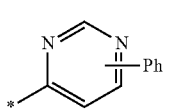
10-211
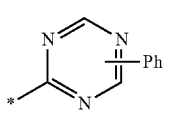
10-212
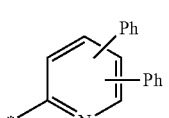
10-213
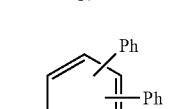
10-214
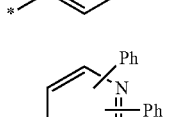
10-215
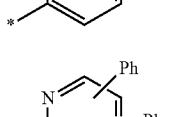
10-216
10-217
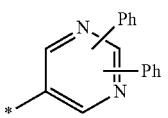
10-218
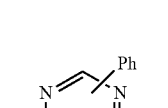
10-219
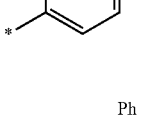
10-220
10-221
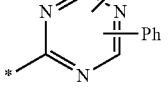
10-222
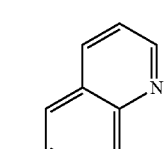
10-223
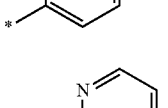
10-224
10-225
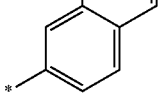
10-226
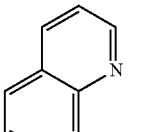
10-227
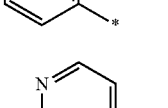
10-228
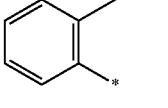
10-229
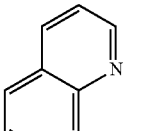
10-230
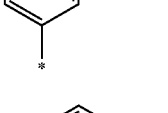
10-231
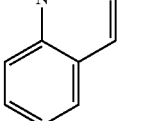
10-232
10-233
10-234
10-235
10-236
10-237

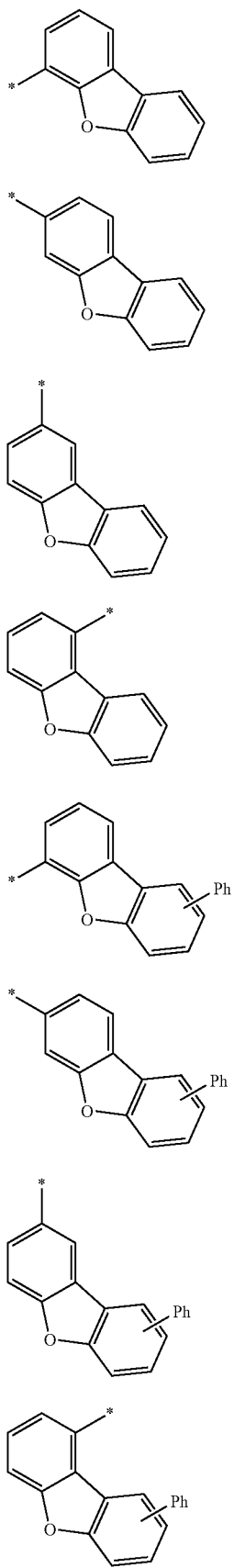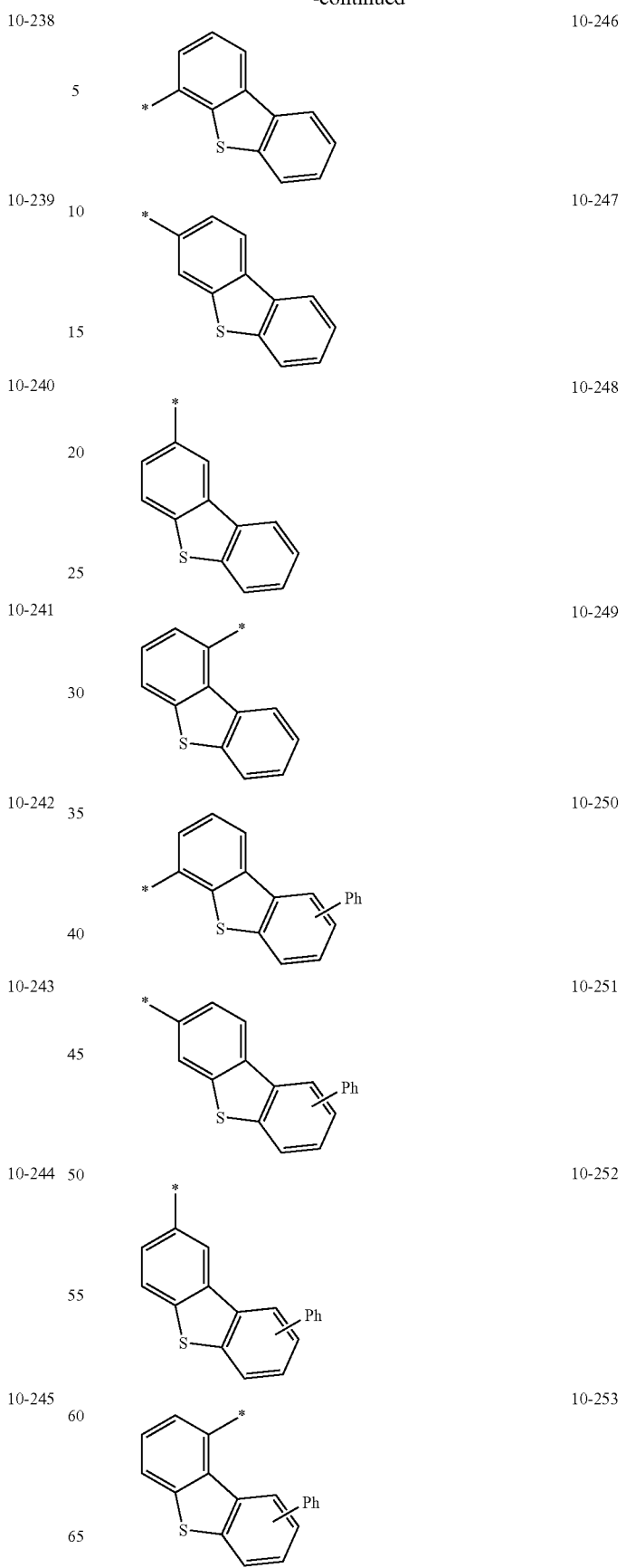

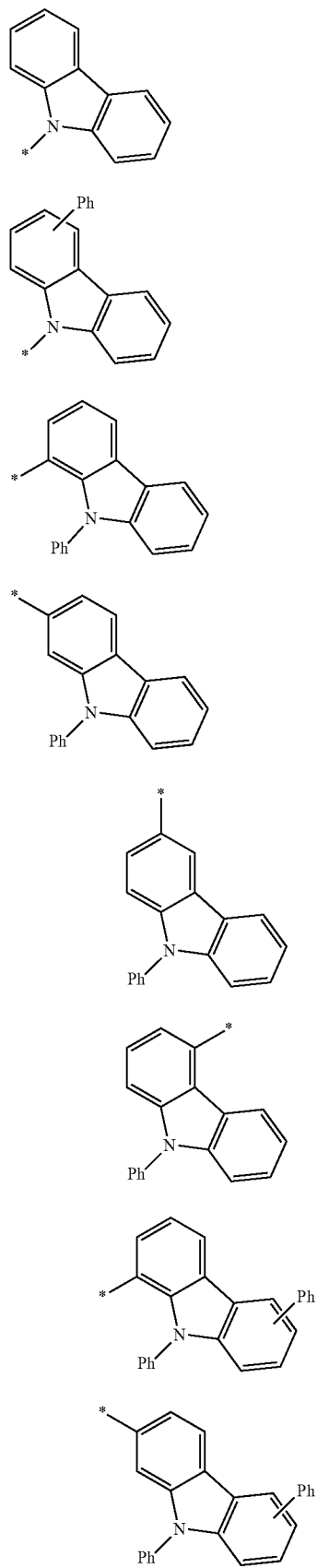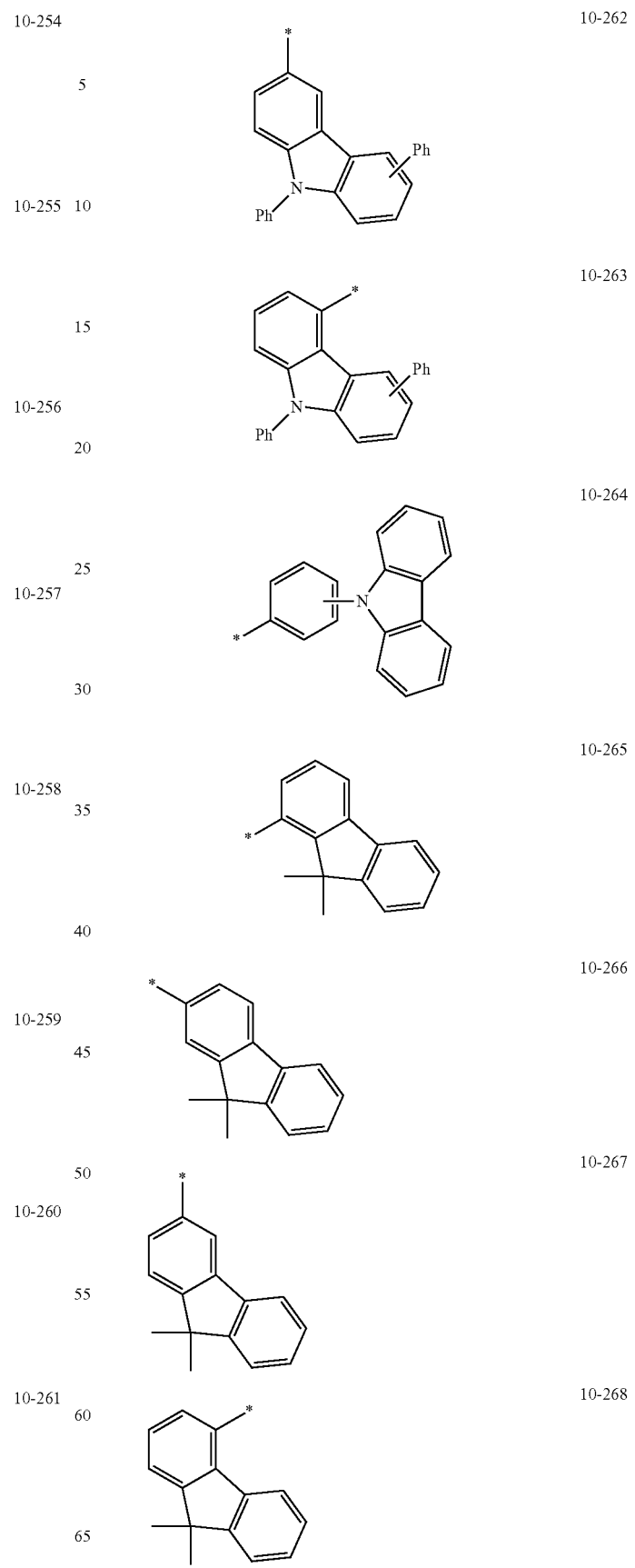

-continued
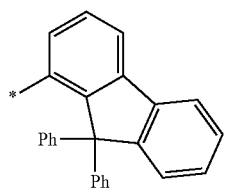
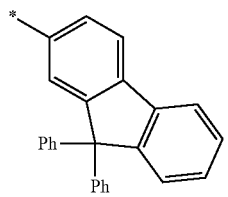
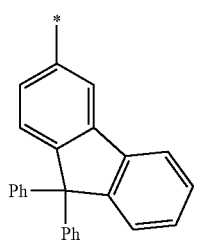
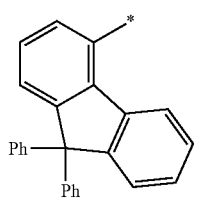
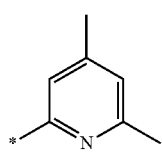
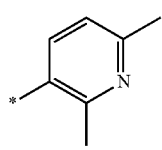
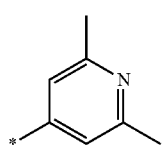
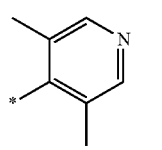
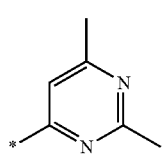
-continued
10-269 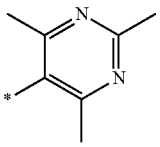
10-270 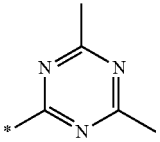
10-271 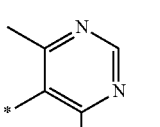
10-272 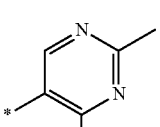
10-273 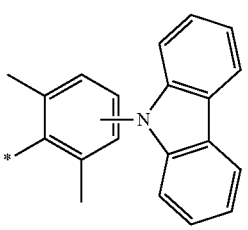
10-274 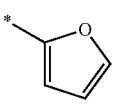
10-275 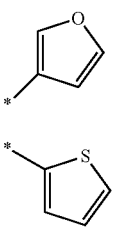
10-276 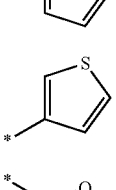
10-277 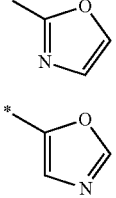
10-278
10-279
10-280
10-281
10-282
10-283
10-284
10-285
10-286
10-287
10-288
10-289 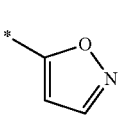

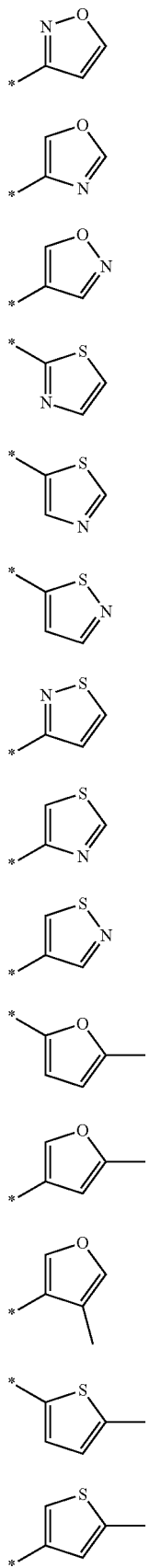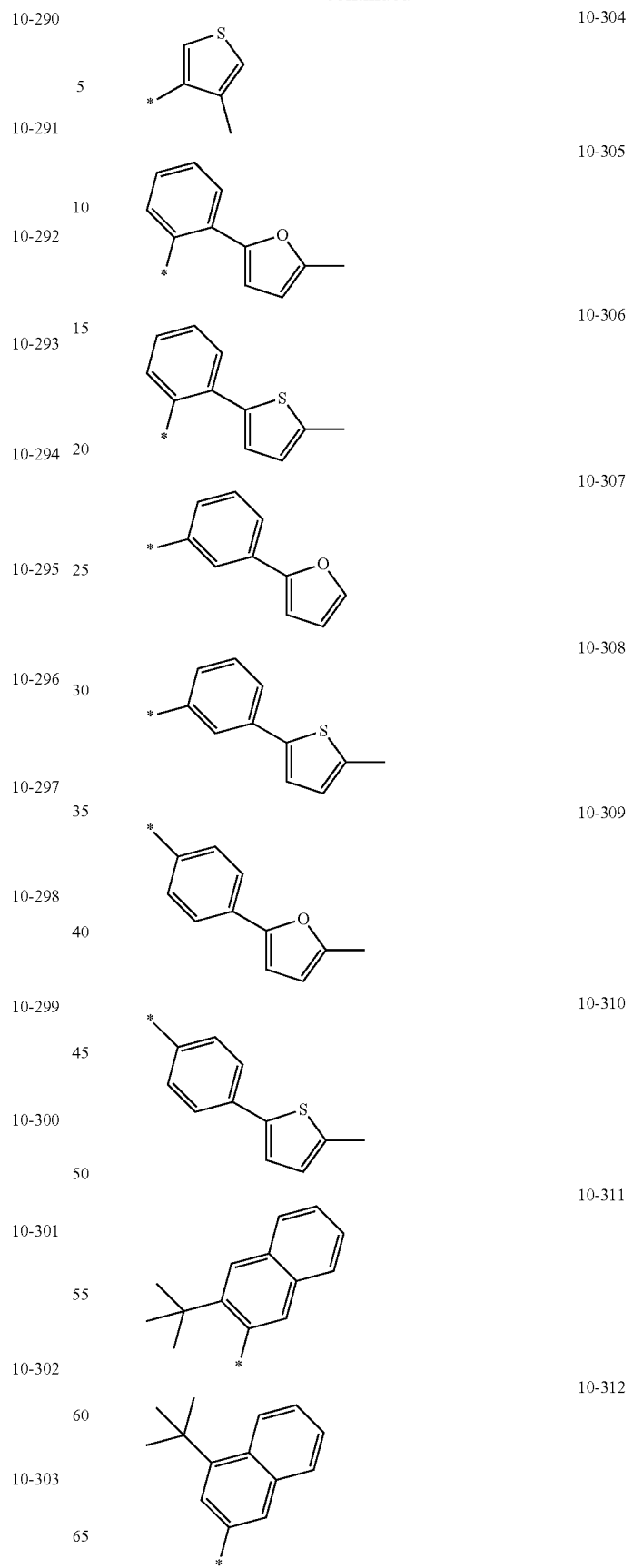

-continued
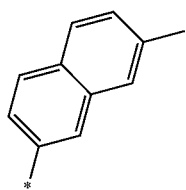
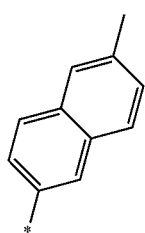
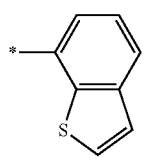
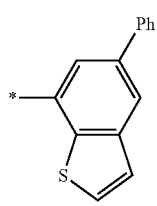
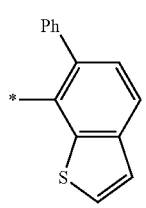
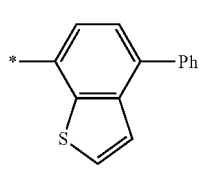
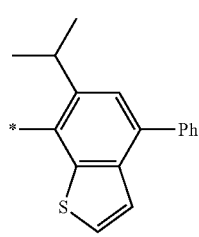
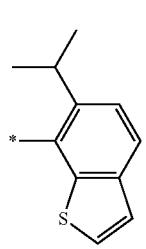
-continued
10-313
10-314
10-315
10-316
10-317
10-318
10-319
10-320
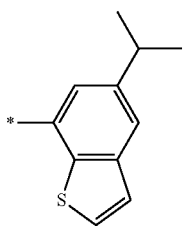
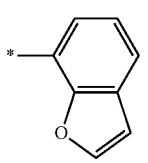
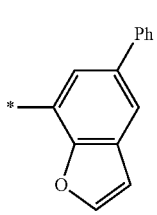
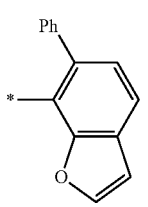
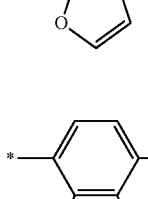
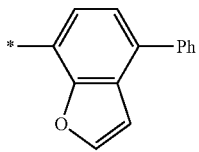
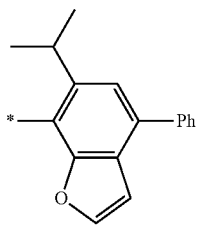
10-321
10-322
10-323
10-324
10-325
10-326
10-327

10-328
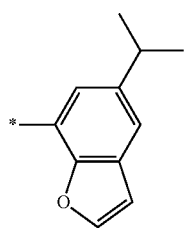
10-328
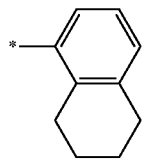
10-329
10-330
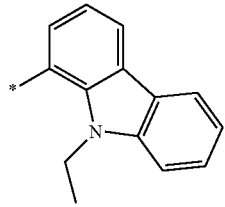
10-331
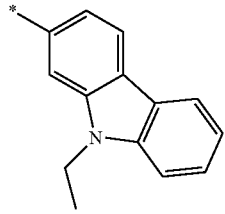
10-332
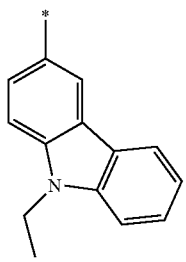
10-334
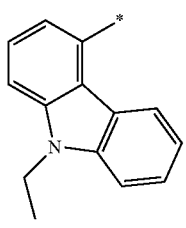
10-335
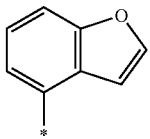
10-336
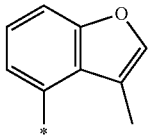
10-337
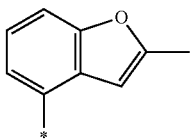
10-338
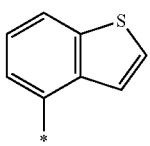
10-339
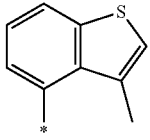
10-340
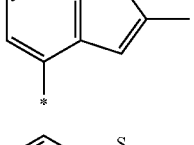
10-341
10-342
10-343
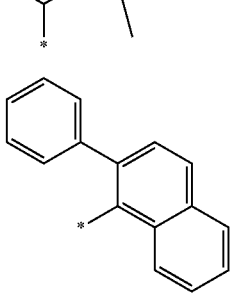
In Formula 9-1 to 9-39, 9-201 to 9-233, 10-1 to 10-126 and 10-201 to 10-343, * indicates a binding site to a neighboring atom, "Ph" is a phenyl group, "TMS" is a trimethylsilyl group, and "TMG" is a trimethylgermyl.
The "group represented by one of Formulae 9-1 to 9-39 in which at least one hydrogen is substituted with deuterium" and the "group represented by one of Formulae 9-201 to 9-233 in which at least one hydrogen is substituted with deuterium" may be, for example, a group represented by one of Formulae 9-501 to 9-514 and 9-601 to 9-635:
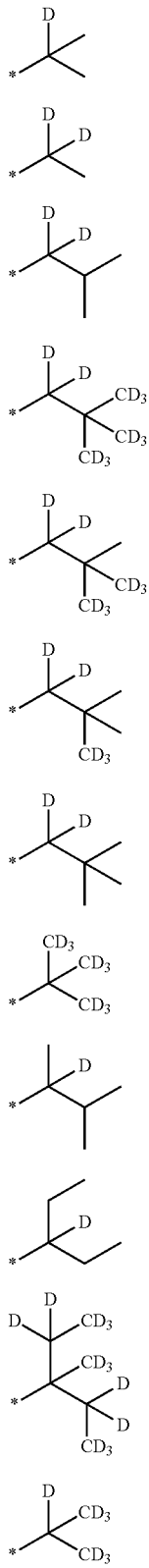
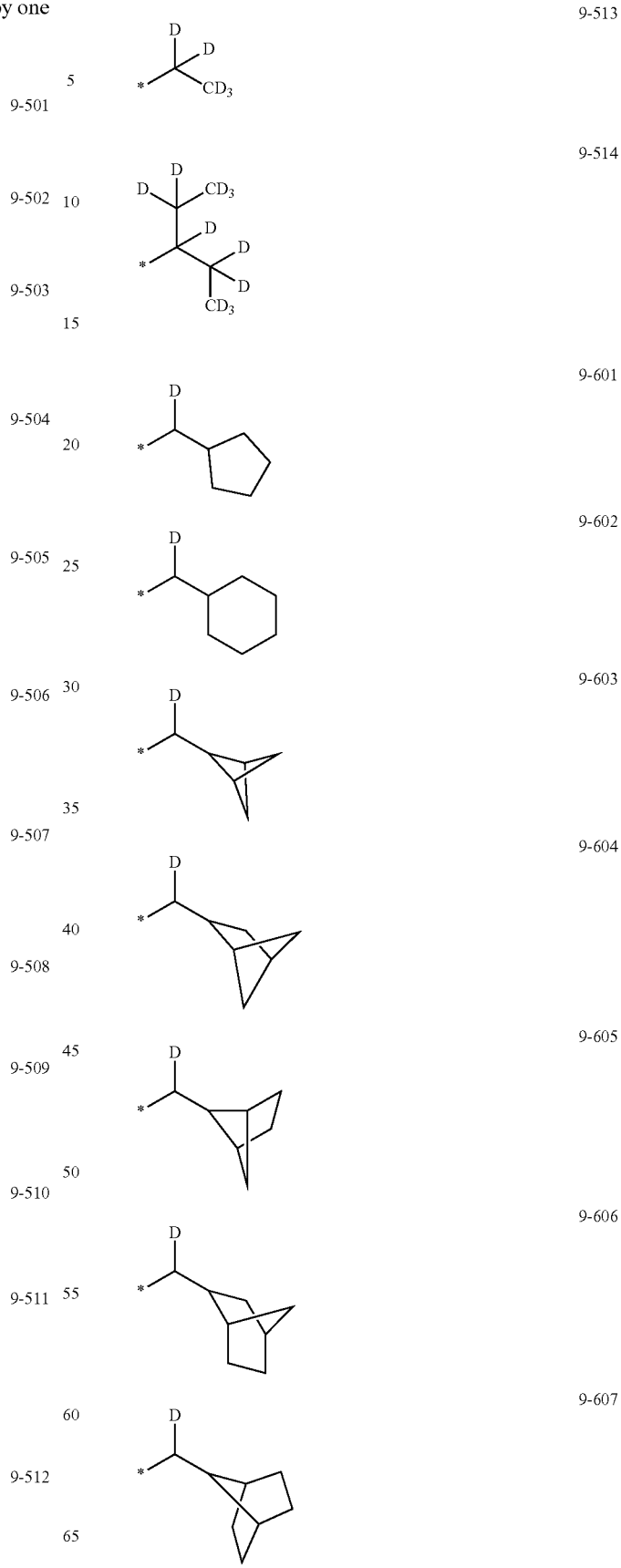

-continued
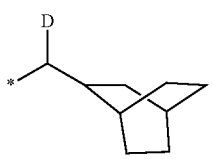 9-608
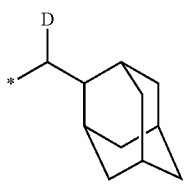 9-609
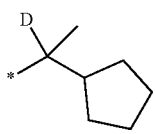 9-910
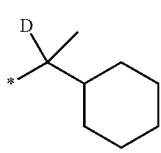 9-611
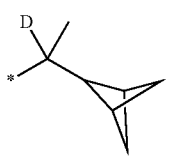 9-612
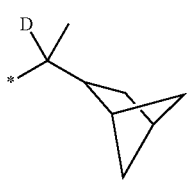 9-613
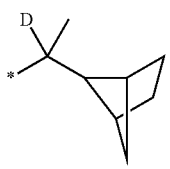 9-614
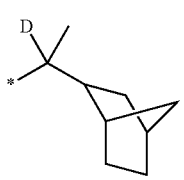 9-615
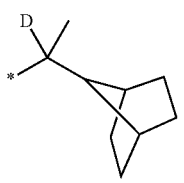 9-616
-continued
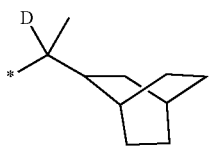 9-617
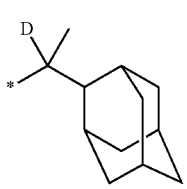 9-618
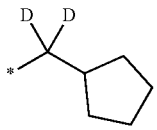 9-619
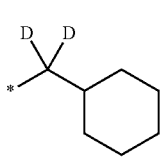 9-620
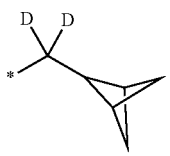 9-621
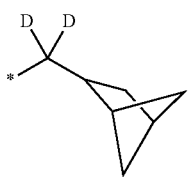 9-622
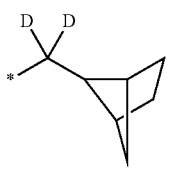 9-623
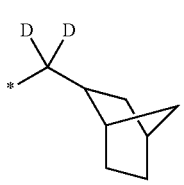 9-624
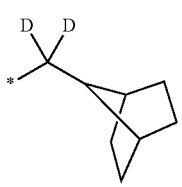 9-625

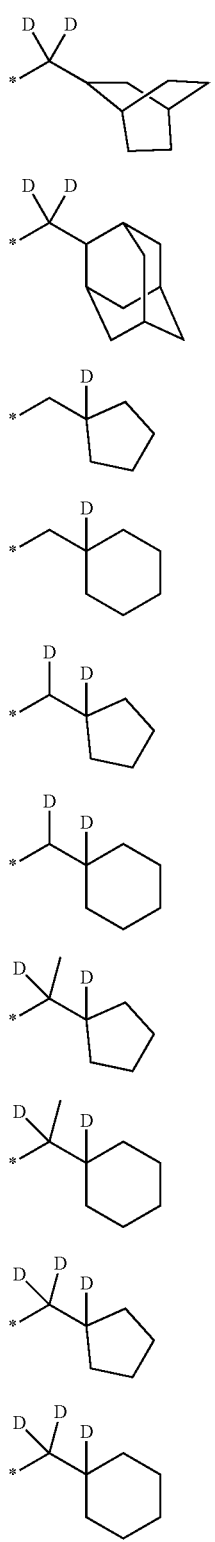

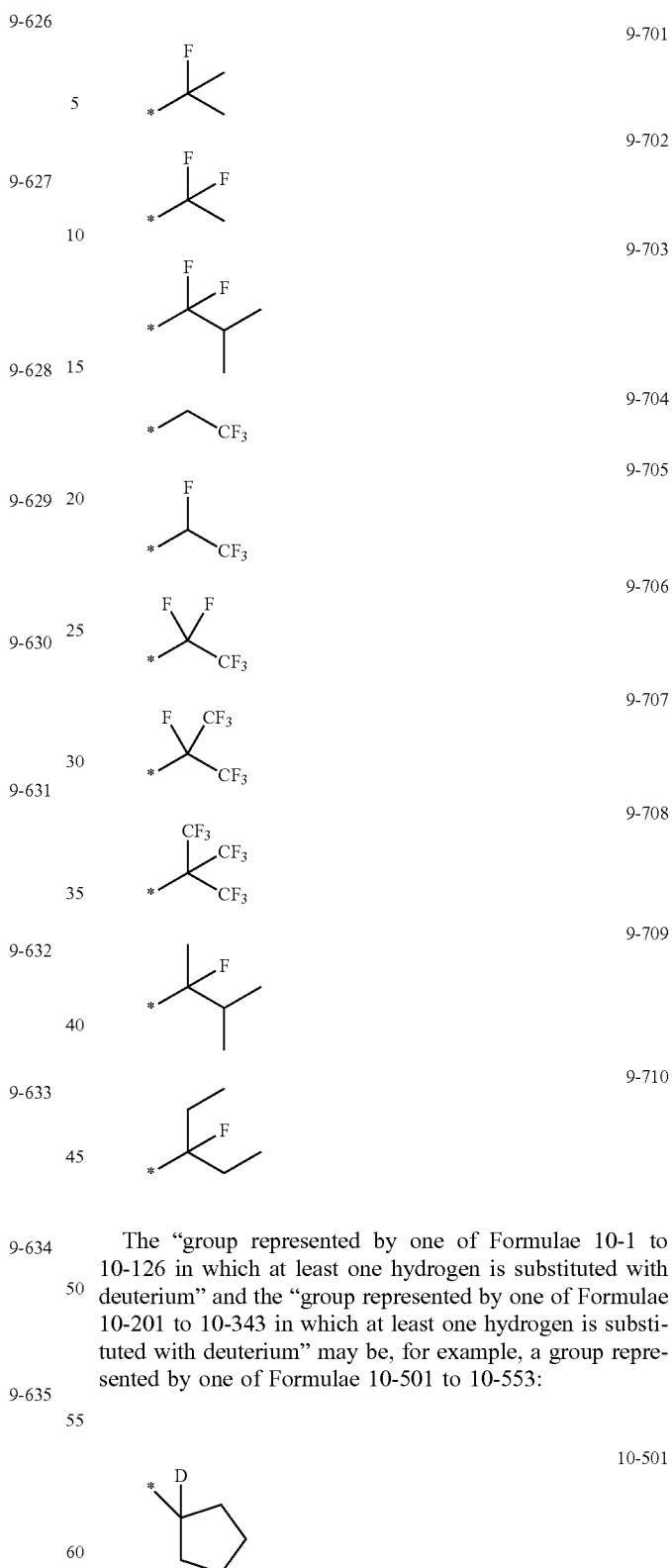

The "group represented by one of Formulae 9-1 to 9-39 in which at least one hydrogen is substituted with —F" and the "group represented by one of Formulae 9-201 to 9-233 in which at least one hydrogen is substituted with —F" may be, for example, a group represented by one of Formulae 9-701 to 9-710:

The "group represented by one of Formulae 10-1 to 10-126 in which at least one hydrogen is substituted with deuterium" and the "group represented by one of Formulae 10-201 to 10-343 in which at least one hydrogen is substituted with deuterium" may be, for example, a group represented by one of Formulae 10-501 to 10-553:

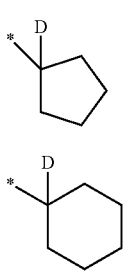

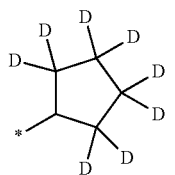
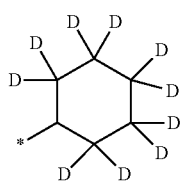
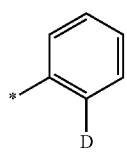
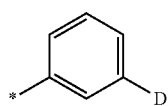
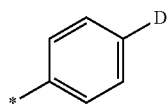
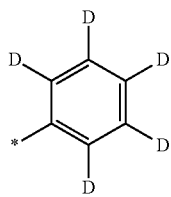
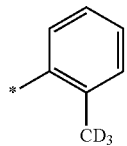
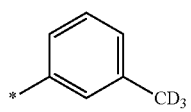
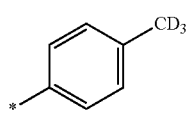
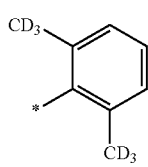
10-503
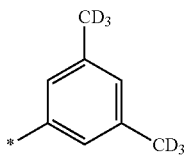
10-504
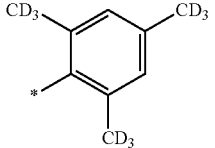
10-505
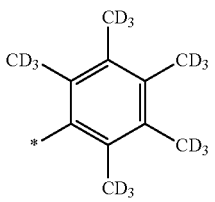
10-506
10-507 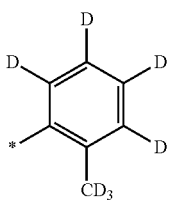
10-508 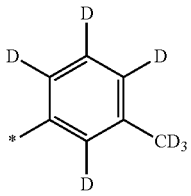
10-509 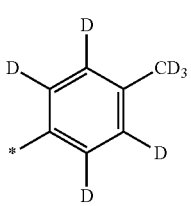
10-510 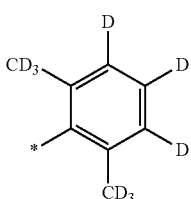
10-511 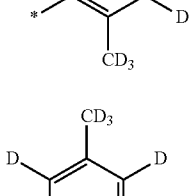
10-512 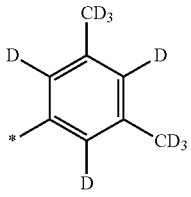
10-513
10-514
10-515
10-516
10-517
10-518
10-519
10-520

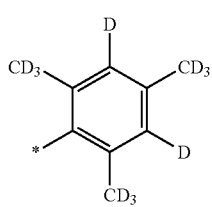
10-521
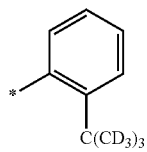
10-522
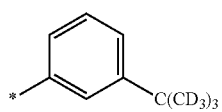
10-523
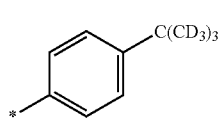
10-524
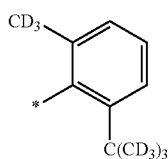
10-525
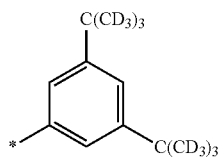
10-526
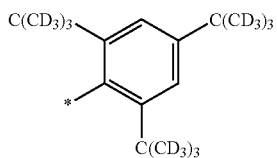
10-527
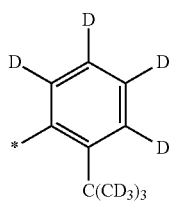
10-528
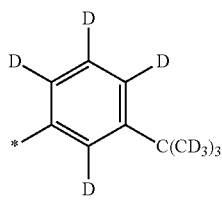
10-529
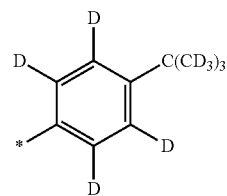
10-530
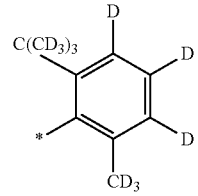
10-531
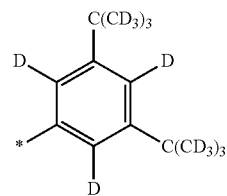
10-532
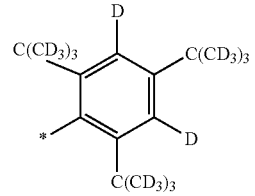
10-533
10-534
10-535
10-536

-continued
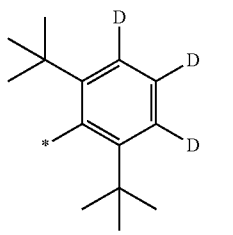
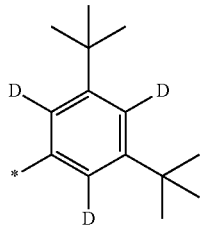
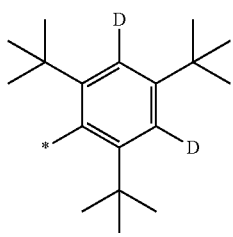
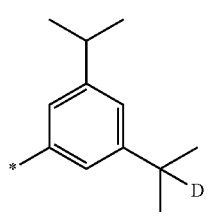
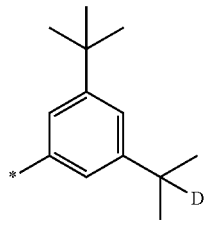
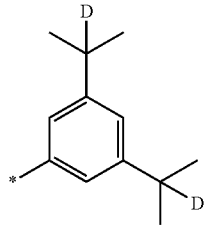
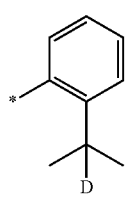
-continued
10-537
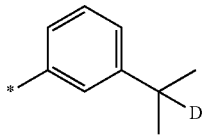
10-545
10-538
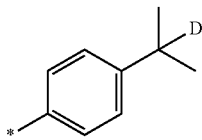
10-546
10-540
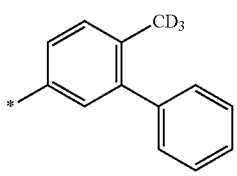
10-547
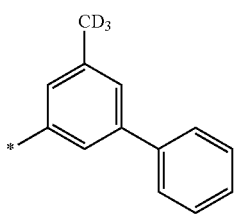
10-548
10-541
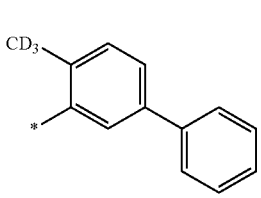
10-549
10-542
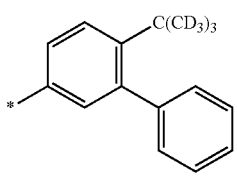
10-550
10-543
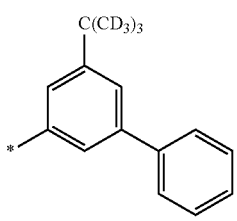
10-551
10-544
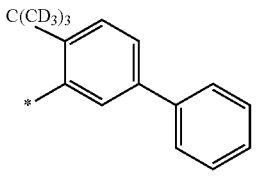
10-552

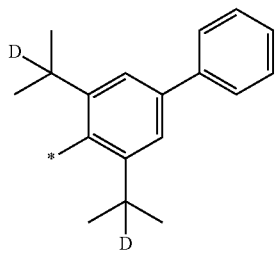

10-553

The "group represented by one of Formulae 10-1 to 10-126 in which at least one hydrogen is substituted with —F" and the "group represented by one of Formulae 10-201 to 10-343 in which at least one hydrogen is substituted with —F" may be, for example, a group represented by one of Formulae 10-601 to 10-615:

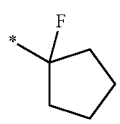

10-601

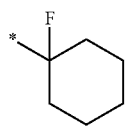

10-602

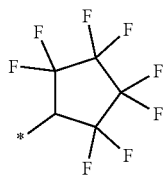

10-603

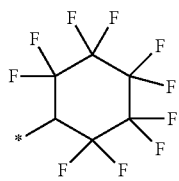

10-604

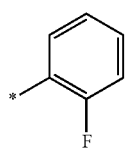

10-605

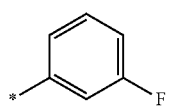

10-606

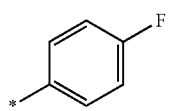

10-607

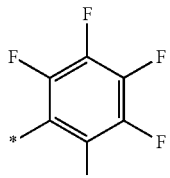

10-608

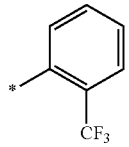

10-609

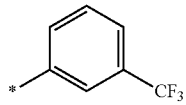

10-610

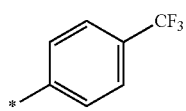

10-611

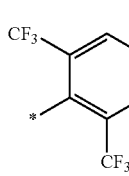

10-612

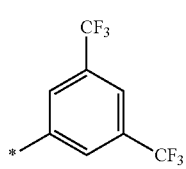

10-613

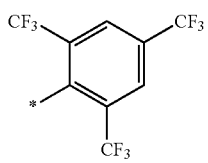

10-614

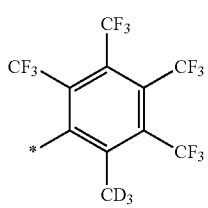

10-615 a1 and a2 in Formula 2 respectively indicate numbers of $R_1$ groups and $R_2$ groups, and may each independently an integer from 0 to 10. wherein when a1 is 2 or more, two or more $R_1$ groups may be identical to or different from each other, and when a2 is 2 or more, two or more $R_2$ groups may be identical to or different from each other. For example, a1 in Formula 2 may be an integer from 0 to 3. In one embodiment, a2 in Formula 2 may be an integer from 0 to 6.

In one embodiment, a2 in Formula 2 may be 1 or 2.

In one or more embodiments, in Formula 2, a2 may be 1 or 2 and $R_2$ may not be hydrogen.

\* and \*″ in Formulae 2 and 3 are each a binding site to Ir in Formula 1.

In one or more embodiments, the organometallic compound represented by Formula 1 may include at least one deuterium.

In one or more embodiments, at least one $R_1$ group in the number of a1 in Formula 1 may include at least one deuterium.

In one or more embodiments, at least one $R_2$ group in the number of a2 of Formula 1 may include deuterium.

In one or more embodiments, at least one $R_2$ group in the number of a2 of Formula 1 may be a deuterated $C_1$-$C_{20}$ alkyl group, a deuterated $C_3$-$C_{10}$ cycloalkyl group, or a deuterated $C_1$-$C_{10}$ heterocycloalkyl group, each unsubstituted or substituted with a $C_1$-$C_{20}$ alkyl group, a $C_3$-$C_{10}$ cycloalkyl group, a $C_1$-$C_{10}$ heterocycloalkyl group, or a combination thereof.

In Formulae 2 and 3, 1) two or more $R_1$ groups in the number of a1 may optionally be linked to each other to form a $C_5$-$C_{30}$ carbocyclic group that is unsubstituted or substituted with at least one $R_{1a}$, or two or more $R_1$ groups in the number of a1 may optionally be linked to each other to form a $C_1$-$C_{30}$ heterocyclic group that is unsubstituted or substituted with at least one $R_{1a}$, 2) two or more of $R_2$ groups in the number of a2 may optionally be linked to each other to form a $C_5$-$C_{30}$ carbocyclic group that is unsubstituted or substituted with at least one $R_{1a}$, or two or more of $R_2$ groups in the number of a2 may optionally be linked to each other to form a $C_1$-$C_{30}$ heterocyclic group that is unsubstituted or substituted with at least one $R_{1a}$, 3) two or more of $R_1$ and $R_2$ may optionally be linked to each other to form a $C_5$-$C_{30}$ carbocyclic group that is unsubstituted or substituted with at least one $R_{1a}$, or two or more of $R_1$ and $R_2$ may optionally be linked to each other to form a $C_1$-$C_{30}$ heterocyclic group that is unsubstituted or substituted with at least one $R_{1a}$, and 4) two or more of $R_{31}$ to $R_{33}$ may optionally be linked to each other to form a $C_5$-$C_{30}$ carbocyclic group that is unsubstituted or substituted with at least one $R_{1a}$, or two or more of $R_{31}$ to $R_{33}$ may optionally be linked to each other to form a $C_1$-$C_{30}$ heterocyclic group that is unsubstituted or substituted with at least one $R_{1a}$. $R_{1a}$ is the same as described in connection with $R_1$.

In one embodiment, the group represented by:

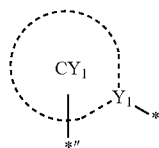

in Formula 2 may be a group represented by one of Formulae 2-1 to 2-21:

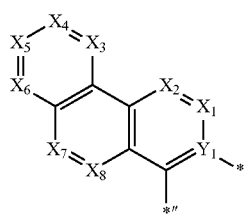

2-1

-continued

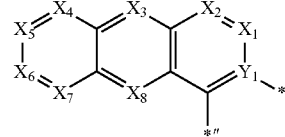

2-2

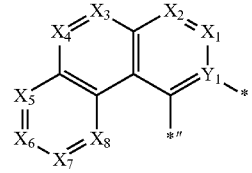

2-3

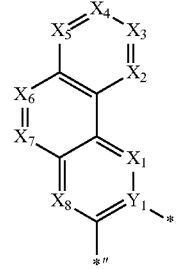

2-4

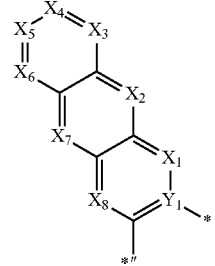

2-5

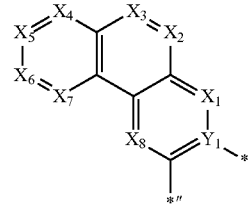

2-6

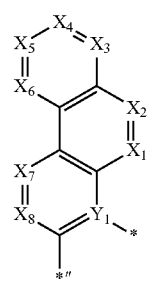

2-7

-continued
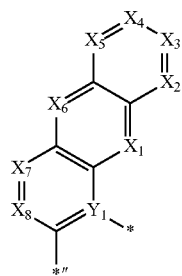
2-8
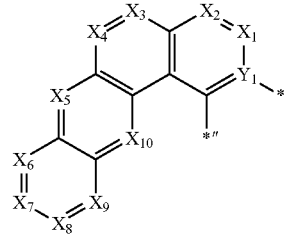
2-14
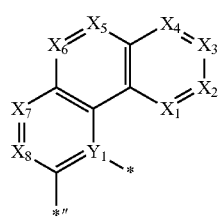
2-9
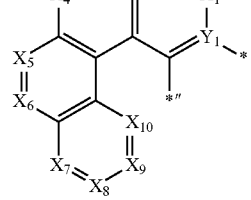
2-15
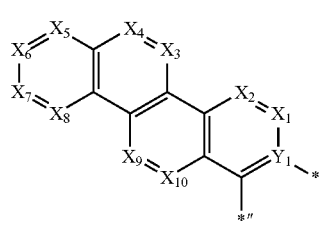
2-10
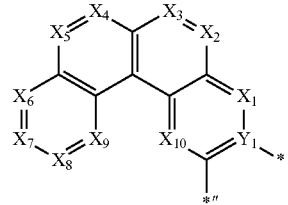
2-16
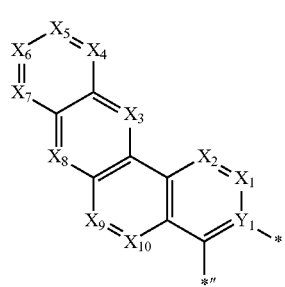
2-11
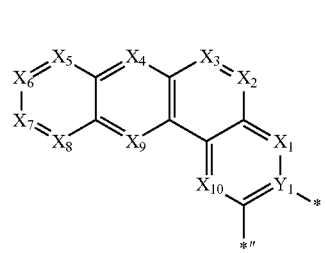
2-17
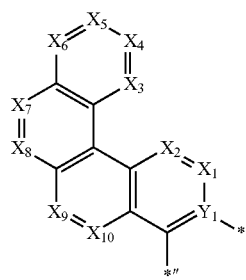
2-12
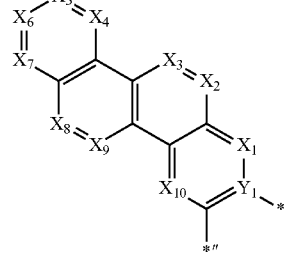
2-18
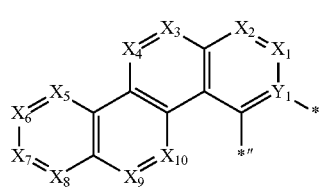
2-13
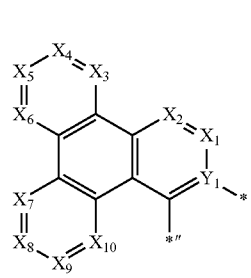
2-19

-continued 2-20

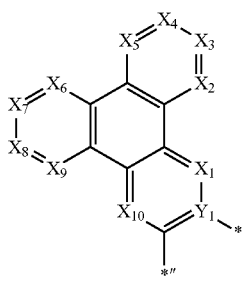

2-21

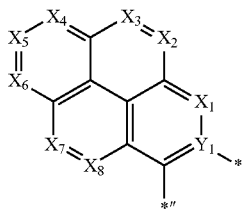

In Formulae 2-1 to 2-21, $Y_1$ may be N, $X_1$ to $X_{10}$ may each independently be C or N, and at least one of $X_1$ to $X_8$ of Formulae 2-1 to 2-9 and 2-21 may be C, and at least one of $X_1$ to $X_{10}$ of Formulae 2-10 to 2-20 may be C, \* is a binding site to Ir in Formula 1, and \*''' indicates a binding site to a neighboring atom.

For example, $X_1$ to $X_{10}$ may each be C.

In one or more embodiments, the group represented by:

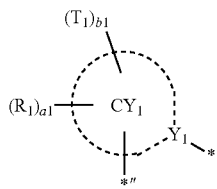

in Formula 2 may be a group represented by one of Formulae 2(1) to 2(75):

2(1)

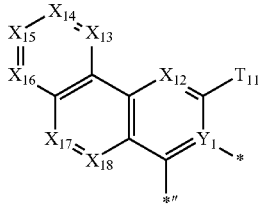

2(2)

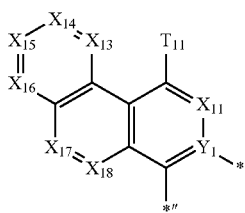

-continued

2(3)

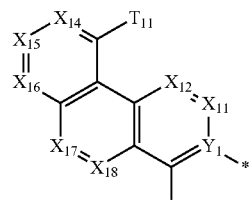

2(4)

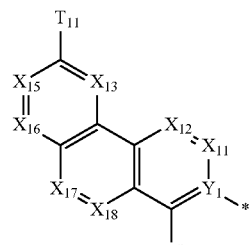

2(5)

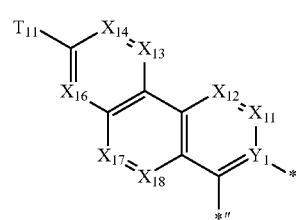

2(6)

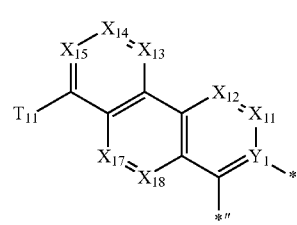

2(7)

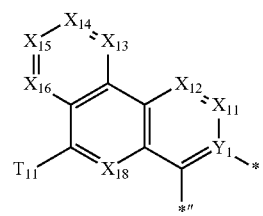

2(8)

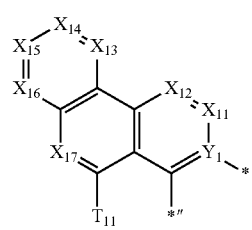

2(9)

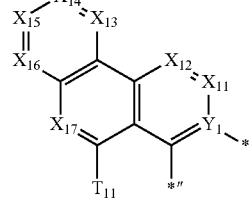

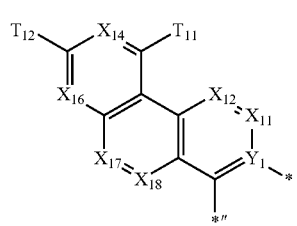
2(10)
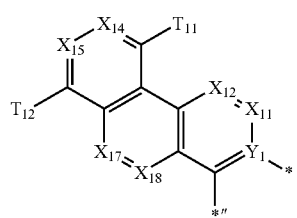
2(11)
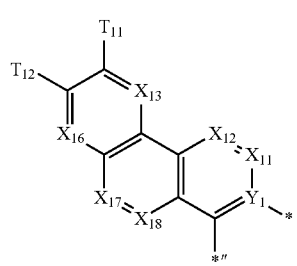
2(12)
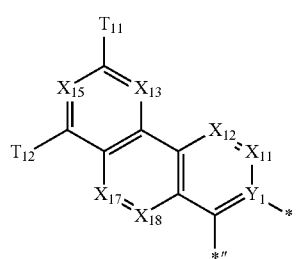
2(13)
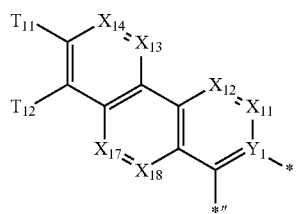
2(14)
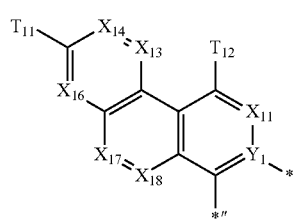
2(15)
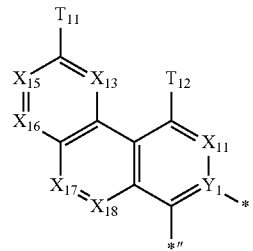
2(16)
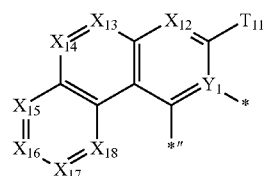
2(17)
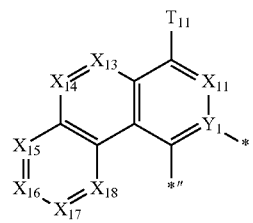
2(18)
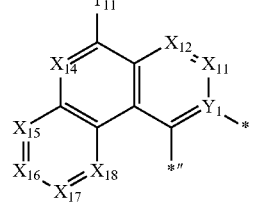
2(19)
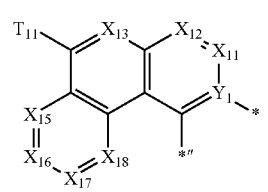
2(20)
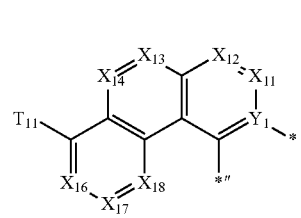
2(21)
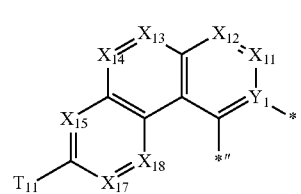
2(22)

-continued
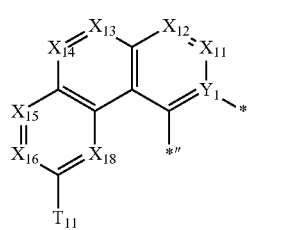
2(23)
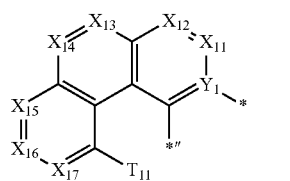
2(24)
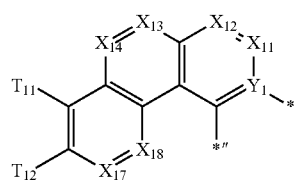
2(25)
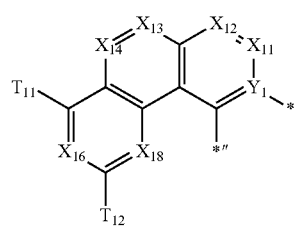
2(26)
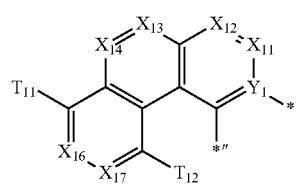
2(27)
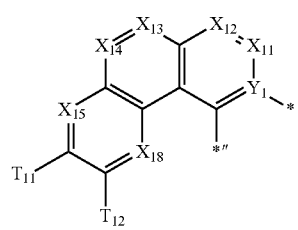
2(28)
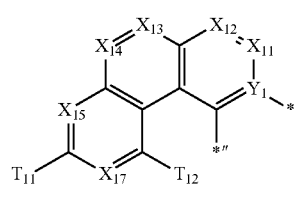
2(29)
-continued
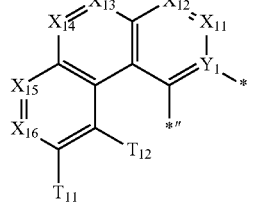
2(30)
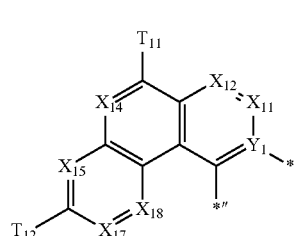
2(31)
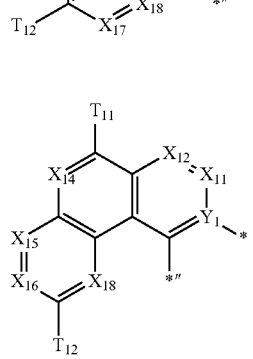
2(32)
2(33)
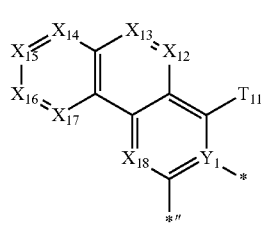
2(34)
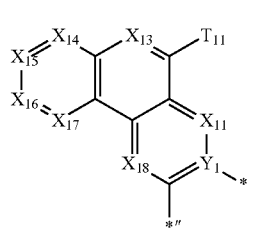
2(35)
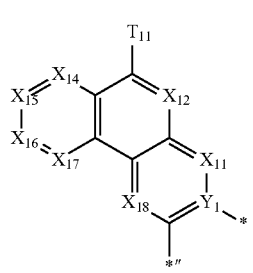

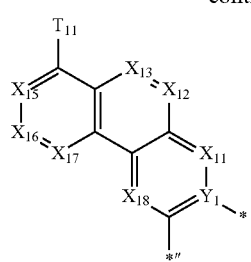
2(36)
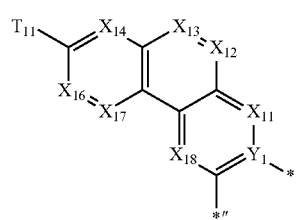
2(37)
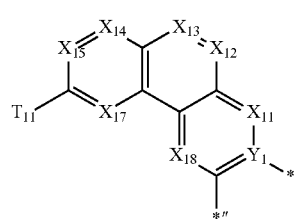
2(38)
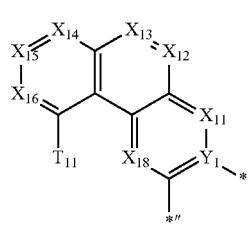
2(39)
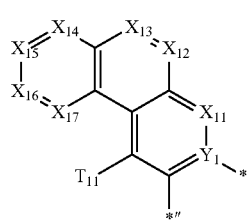
2(40)
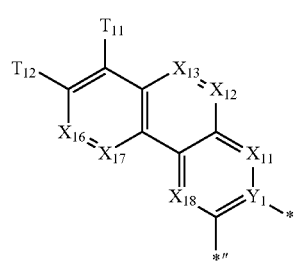
2(41)
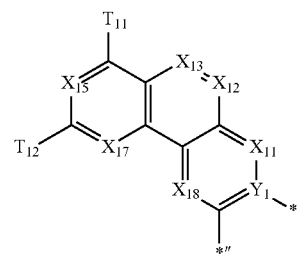
2(42)
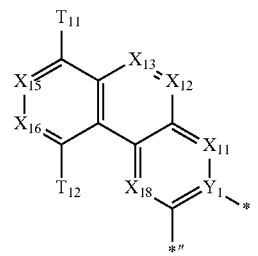
2(43)
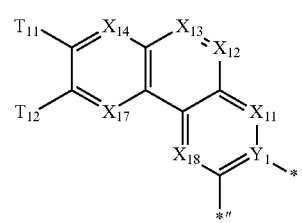
2(44)
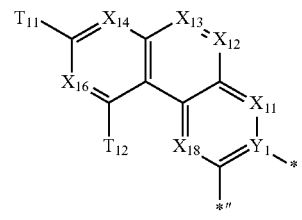
2(45)
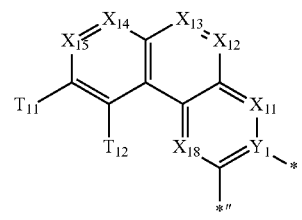
2(46)
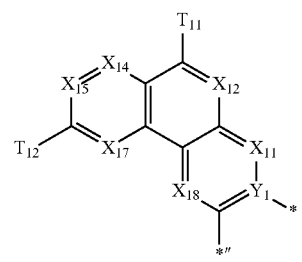
2(47)

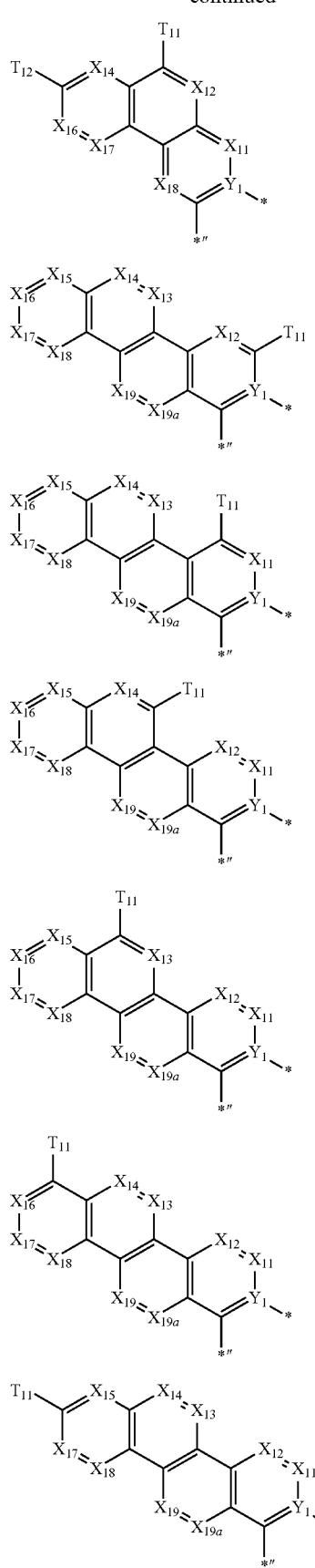
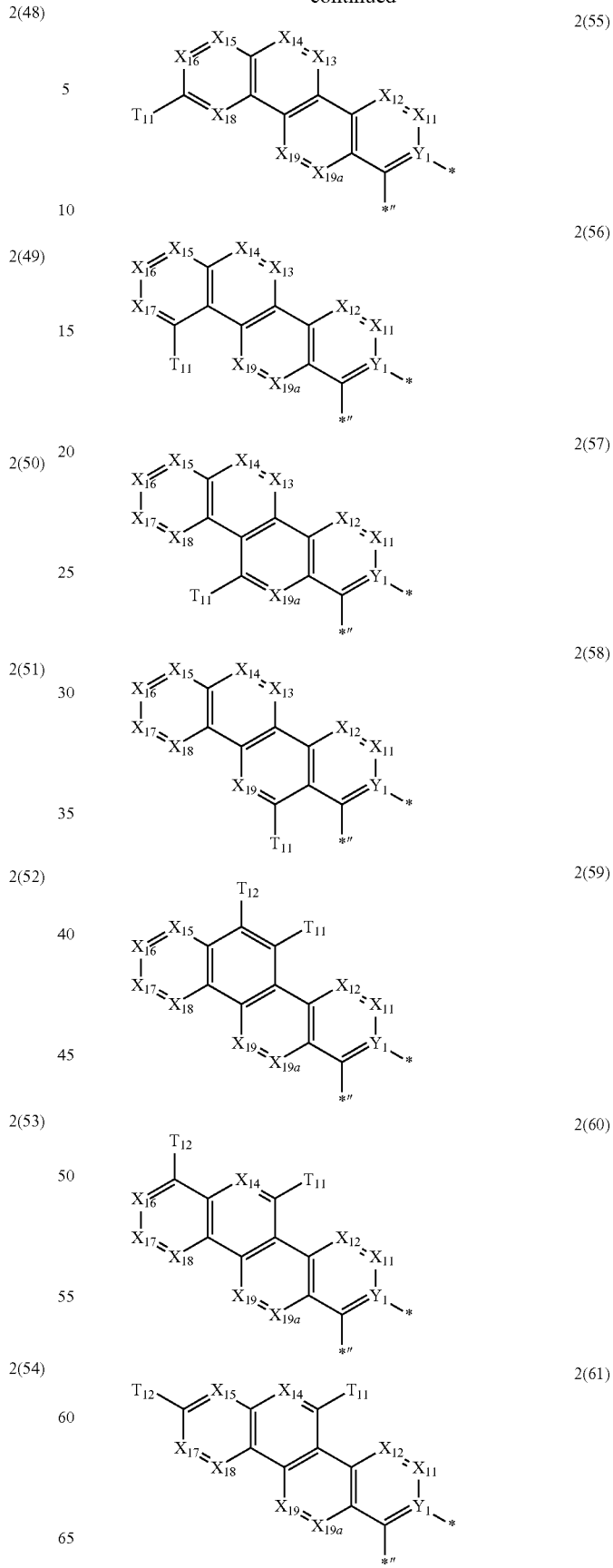

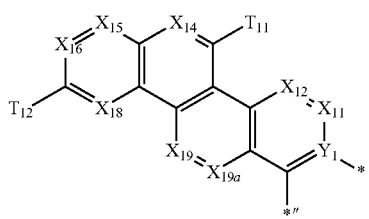 2(62)
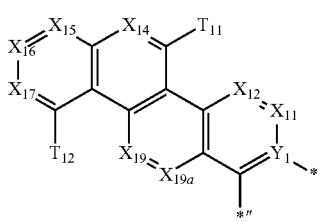 2(63)
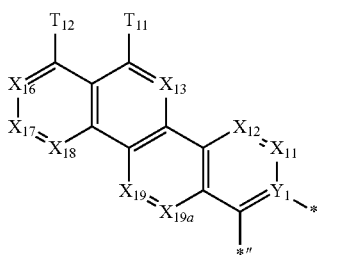 2(64)
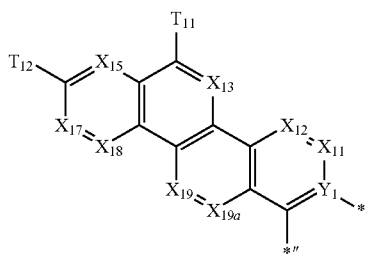 2(65)
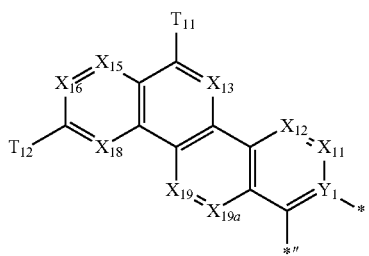 2(66)
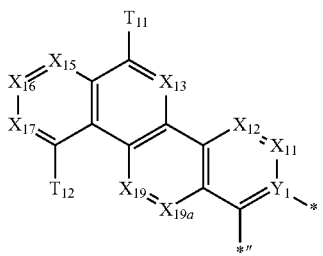 2(67)
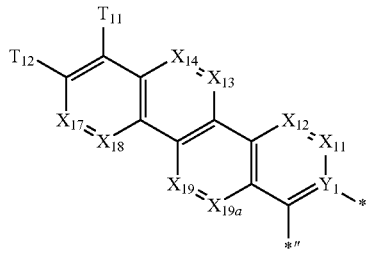 2(68)
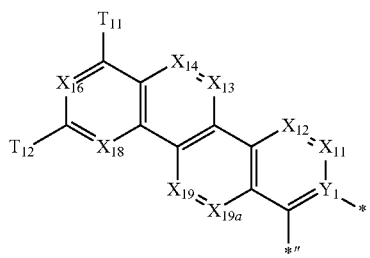 2(69)
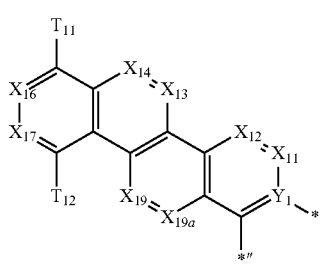 2(70)
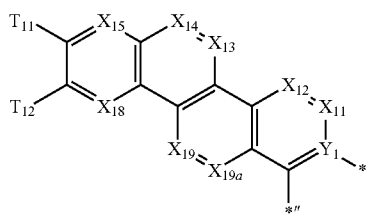 2(71)
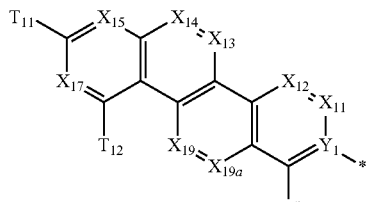 2(72)
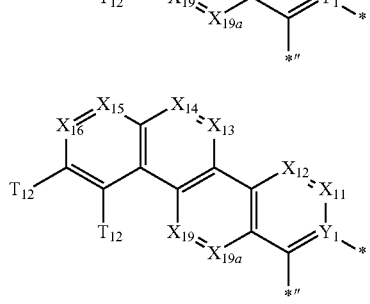 2(73)

-continued

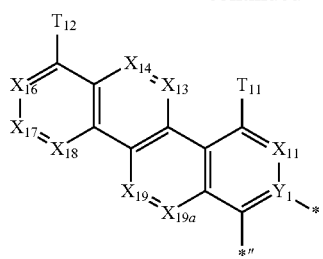

2(74)

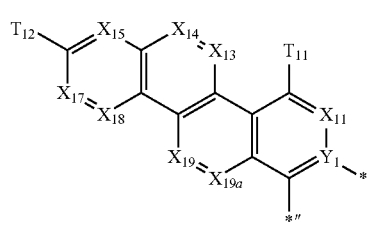

2(75)

In Formulae 2(1) to 2(75),

Y$_1$ may be N,

X$_{11}$ may be C(R$_{11}$) or N, X$_{12}$ may be C(R$_{12}$) or N, X$_{13}$ may be C(R$_{13}$) or N, X$_{14}$ may be C(R$_{14}$) or N, X$_{15}$ may be C(R$_{15}$) or N, X$_{16}$ may be C(R$_{16}$) or N, X$_{17}$ may be C(R$_{17}$) or N, X$_{18}$ may be C(R$_{18}$) or N, X$_{19}$ may be C(R$_{19}$) or N, X$_{19a}$ may be C(R$_{19a}$) or N, wherein R$_1$ to R$_{19}$ and R$_{19a}$ are each independently the same as described in connection with R$_1$ (for example, R$_1$ to R$_{19}$ and R$_{19a}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{60}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_7$-C$_{60}$ arylalkyl group, a substituted or unsubstituted C$_1$-C$_{60}$ heteroaryl group, a substituted or unsubstituted C$_1$-C$_{60}$ heteroaryloxy group, a substituted or unsubstituted C$_1$-C$_{60}$ heteroarylthio group, a substituted or unsubstituted C$_2$-C$_{60}$ heteroarylalkyl group, a substituted or unsubstituted C$_2$-C$_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), wherein Q$_1$ to Q$_9$ are as defined herein), T$_{11}$ and T$_{12}$ are the same as described in connection with T$_1$,

* is a binding site to Ir in Formula 1, and

*" indicates a binding site to a neighboring atom.

In one or more embodiments, a group represented by:

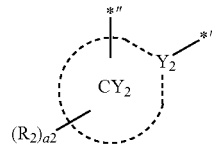

in Formula 2 may be a group represented by one of Formulae CY2-1 to CY2-10:

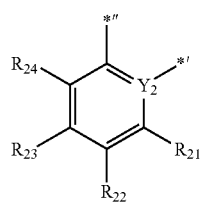

CY2-1

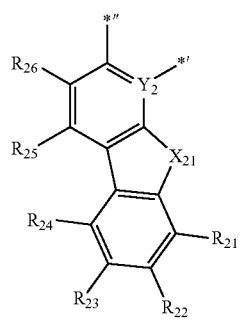

CY2-2

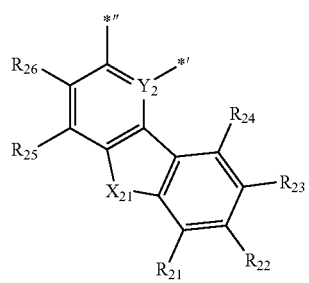

CY2-3

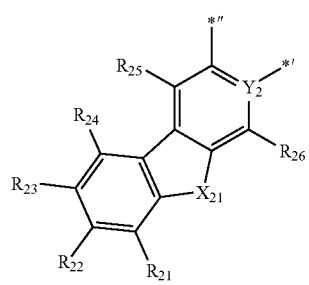

CY2-4

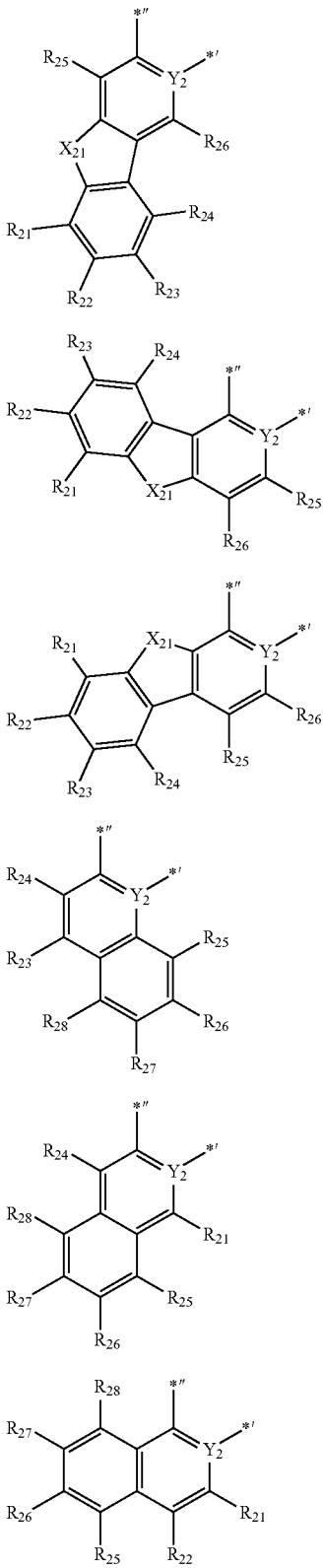

In Formulae CY2-1 to CY2-10,
Y₂ may be C,
X₂₁ may be O, S, N(R₇), C(R₂₇)(R₂₈), or Si(R₂₇)(R₂₈), R₂₁ to R₂₈ are the same as described in connection with R₂ (for example, R₂₁ to R₂₈ are each independently hydrogen, deuterium, —F, —Cl, —Br, —I, —SF₅, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q₁)(Q₂), —Si(Q₃)(Q₄)(Q₅), —Ge(Q₃)(Q₄)(Q₅), —B(Q₆)(Q₇), —P(=O)(Q₈)(Q₉), or —P(Q₈)(Q₉), wherein Q₁ to Q₉ are as defined herein),

*' is a binding site to Ir in Formula 1, and
*'' is a binding site to a neighboring atom in Formula 1.

In one or more embodiments, a group represented by:

$$\text{[structure with CY}_2\text{, }Y_2\text{, }(R_2)_{a2}\text{, *', *'']}$$

in Formula 2 may be a group represented by Formula CY2-1 or CY2-8.

In one or more embodiments, a group represented by:

$$\text{[structure with CY}_2\text{, }Y_2\text{, }(R_2)_{a2}\text{, *', *'']}$$

in Formula 2 may be a group represented by one of Formulae CY2-1(1) to CY2-1(3) and CY2-8(1) to CY2-8(6):

CY2-1(1)

[structure]

CY2-1(2)

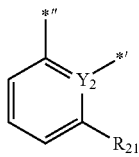

CY2-1(3)

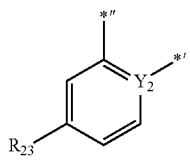

CY2-8(1)

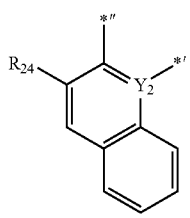

CY2-8(2)

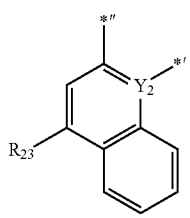

CY2-8(3)

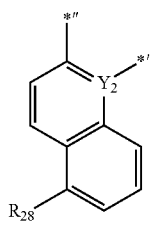

CY2-8(4)

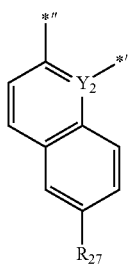

CY2-8(5)

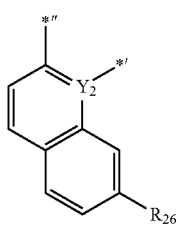

CY2-8(6)

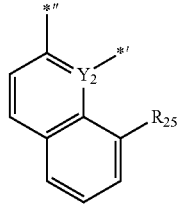

For example, i) $R_{21}$ and $R_{23}$ in Formulae CY2-1 and CY2-1(1) to CY2-1(3) and ii) $R_{23}$ to $R_{28}$ in Formulae CY2-8(1) to CY2-8(6) may each independently be a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

In one embodiment, i) $R_{21}$ and $R_{23}$ in Formulae CY2-1 and CY2-1(1) to CY2-1(3) and ii) $R_{23}$ to $R_{28}$ in Formulae CY2-8(1) to CY2-8(6) may each independently be a $C_1$-$C_{20}$ alkyl group which is unsubstituted or substituted with deuterium, a $C_1$-$C_{20}$ alkyl group, or a combination thereof.

In one embodiment, $R_{22}$ and $R_{24}$ in Formula CY2-1 may each independently be hydrogen or deuterium.

In one embodiment, $R_{21}$ and $R_{23}$ in Formulae CY2-1 and CY2-1(1) may be identical to each other.

In one embodiment, $R_{21}$ and $R_{23}$ in Formulae CY2-1 and CY2-1(1) may be different from each other.

In one embodiment, $R_{21}$ and $R_{23}$ in Formulae CY2-1 and CY2-1(1) may be different from each other, and the number of carbon atoms included in $R_{23}$ may be greater than the number of carbon atoms included in $R_{21}$.

In one embodiment, i) at least one of $R_{21}$ to $R_{24}$ in Formula CY2-1, ii) at least one of $R_{21}$ to $R_{26}$3 in Formulae CY2-2 to CY2-7, iii) at least one of $R_{23}$ to $R_{28}$ in Formula CY2-8, iv) $R_{21}$, one of $R_{24}$ to $R_{28}$, or a combination thereof in Formula CY2-9, v) $R_{21}$, one of $R_{22}$ and $R_{25}$ to $R_{28}$, or a combination thereof in Formula CY2-10, vi) $R_{21}$ and $R_{23}$ in Formulae CY2-1(1) to CY2-1(3), and vii) $R_{23}$ to $R_{28}$ in Formulae CY2-8(1) to CY2-8(6) may each independently be a deuterated $C_1$-$C_{20}$ alkyl group, a deuterated $C_3$-$C_{10}$ cycloalkyl group, a deuterated $C_1$-$C_{10}$ heterocycloalkyl group, or a deuterated a phenyl group, each unsubstituted or substituted with a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

In one embodiment, i) at least one of $R_{21}$ and $R_{23}$ in Formula CY2-1 (for example, $R_{21}$ and $R_{23}$ in Formula CY2-1), ii) $R_{21}$ and $R_{23}$ in Formula CY2-1(1) to CY2-1(3), and iii) $R_{23}$ to $R_{28}$ in Formula CY2-8(1) to CY2-8(6) may each independently be a deuterated $C_1$-$C_{20}$ alkyl group, a deuterated $C_3$-$C_{10}$ cycloalkyl group, a deuterated $C_1$-$C_{10}$ heterocycloalkyl group, or a deuterated phenyl group, each unsubstituted or substituted with a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

In one embodiment, i) $R_{23}$ to $R_{28}$ in Formula CY2-8, ii) $R_{21}$ and $R_{24}$ to $R_{28}$ in Formula CY2-9, and iii) $R_{21}$, $R_{22}$ and $R_{25}$ to $R_{28}$ in Formula CY2-10 may each independently be:
hydrogen or deuterium;
a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof; or —Si($Q_3$)($Q_4$)($Q_5$), or —Ge($Q_3$)($Q_4$)($Q_5$).

In one embodiment, i) $R_{23}$ to $R_{28}$ in Formula CY2-8, ii) $R_{21}$ and $R_{24}$ to $R_{28}$ in Formula CY2-9, and iii) $R_{21}$, $R_{22}$ and $R_{25}$ to $R_{28}$ in Formula CY2-10 may each independently be:
  hydrogen, deuterium, —F, or a cyano group;
  a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof; or
  —Si($Q_3$)($Q_4$)($Q_5$), or —Ge($Q_3$)($Q_4$)($Q_5$), and
i) at least one of $R_{23}$ to $R_{28}$ in Formula CY2-8, ii) one of $R_{21}$ and $R_{24}$ to $R_{28}$, or a combination thereof in Formula CY2-9, and iii) one of $R_{21}$, $R_{22}$ and $R_{25}$ to $R_{28}$, or a combination thereof in Formula CY2-10 may each independently be:
  —F, or a cyano group; or
  a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, a cyano group-containing $C_1$-$C_{20}$ alkyl group, a cyano group-containing $C_3$-$C_{10}$ cycloalkyl group, a cyano group-containing $C_1$-$C_{10}$ heterocycloalkyl group, a cyano group-containing phenyl group, or a cyano group-containing biphenyl group, each unsubstituted or substituted with deuterium, —F, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

In one embodiment, $R_{23}$ to $R_{28}$ in Formulae CY2-8(1) to CY2-8(6) may each independently be:
  —F, or a cyano group; or
  a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, a cyano group-containing $C_1$-$C_{20}$ alkyl group, a cyano group-containing $C_3$-$C_{10}$ cycloalkyl group, a cyano group-containing $C_1$-$C_{10}$ heterocycloalkyl group, a cyano group-containing phenyl group, or a cyano group-containing biphenyl group, each unsubstituted or substituted with deuterium, —F, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

In one or more embodiments, the number of carbon atoms included in $R_{31}$ and $R_{32}$ of Formula 3 may be 4 or more (for example, 5 or more).

In one or more embodiments, the organometallic compound represented by Formula 1 may satisfy Condition 4, Condition 5, or a combination thereof.

Condition 4
$R_{31}$ in Formula 3 is a group represented by Formula 4.
Condition 5
$R_{32}$ in Formula 3 is a group represented by Formula 5.

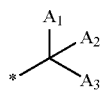

Formula 4

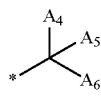

Formula 5

$A_1$ to $A_6$ in Formulae 4 and 5 may each independently be:
  hydrogen or deuterium; or
  a $C_1$-$C_{20}$ alkyl group, a $C_3$-$C_{10}$ cycloalkyl group, a $C_6$-$C_{60}$ aryl group, a $C_1$-$C_{60}$ heteroaryl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and
* indicates a binding site to a neighboring atom.

For example, Formula 4 may satisfy one of Condition 4-1 to Condition 4-6, and/or Formula 5 may satisfy one of Condition 5-1 to Condition 5-6:

Condition 4-1
$A_1$ to $A_3$ are not hydrogen simultaneously.

Condition 4-2
$A_1$ to $A_3$ may each independently be a $C_1$-$C_2$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 4-3
$A_1$ and $A_2$ may each independently be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and
$A_3$ may be a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 4-4
$A_1$ may be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and
$A_2$ and $A_3$ may each independently be a $C_2$-$C_2$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 4-5
$A_1$ may be hydrogen, deuterium, —$CH_3$, —$CH_2D$, —$CHD_2$, or —$CD_3$,
$A_2$ may be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and
$A_3$ may be a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 4-6
$A_1$ may be hydrogen, deuterium, —$CH_3$, —$CH_2D$, —$CHD_2$, or —$CD_3$, and
$A_2$ and $A_3$ may each independently be a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 5-1

$A_4$ to $A_6$ are not hydrogen simultaneously.

Condition 5-2

$A_4$ to $A_6$ may each independently be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 5-3

$A_4$ and $A_5$ may each independently be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and $A_6$ may be a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 5-4

$A_4$ may be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and $A_5$ and $A_6$ may each independently be a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 5-5

$A_4$ may be hydrogen, deuterium, —$CH_3$, —$CH_2D$, —$CHD_2$, or —$CD_3$, $A_5$ may be a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and $A_6$ may be a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

Condition 5-6

$A_4$ may be hydrogen, deuterium, —$CH_3$, —$CH_2D$, —$CHD_2$, or —$CD_3$, and $A_5$ and $A_6$ may each independently be a $C_2$-$C_2$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

In one or more embodiments, at least one of $R_{31}$ to $R_{33}$ of Formula 3 may each independently be a $C_3$-$C_{10}$ cycloalkyl group which is unsubstituted or substituted with deuterium, a $C_1$-$C_{20}$ alkyl group, a $C_3$-$C_{10}$ cycloalkyl group, a phenyl group, a biphenyl group, or a combination thereof.

In one or more embodiments, the organometallic compound represented by Formula 1 may be one of Compounds 1 to 19:

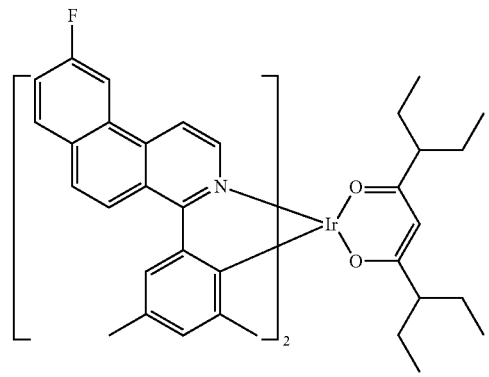

1

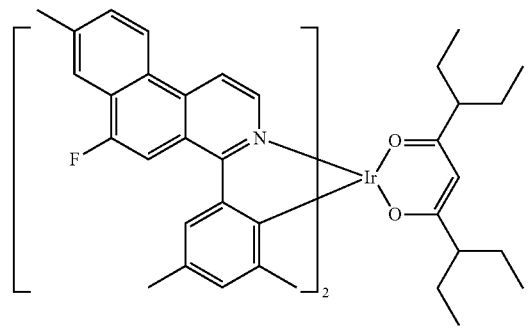

2

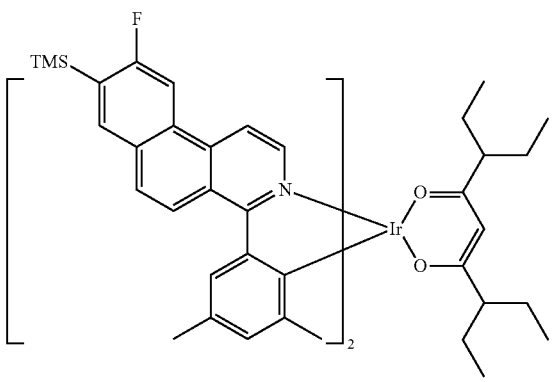

3

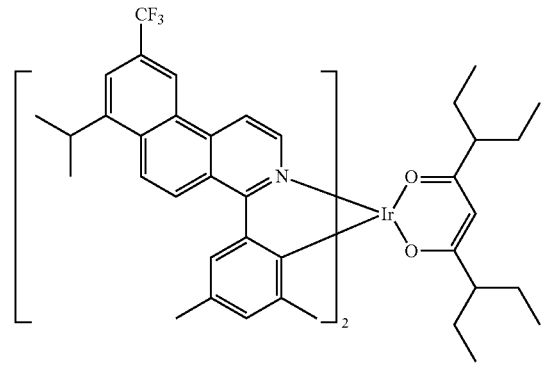

4

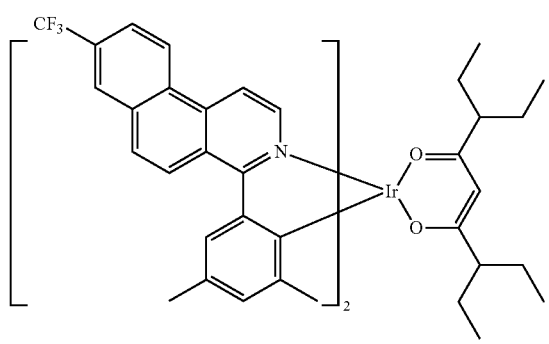
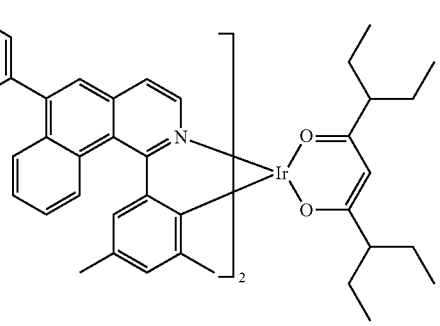
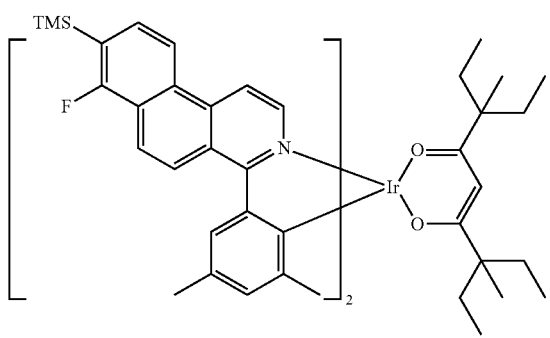
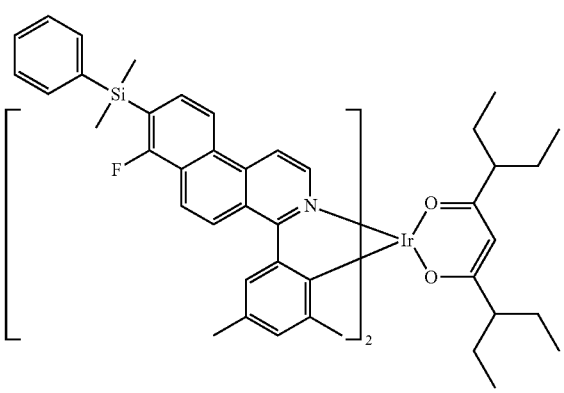
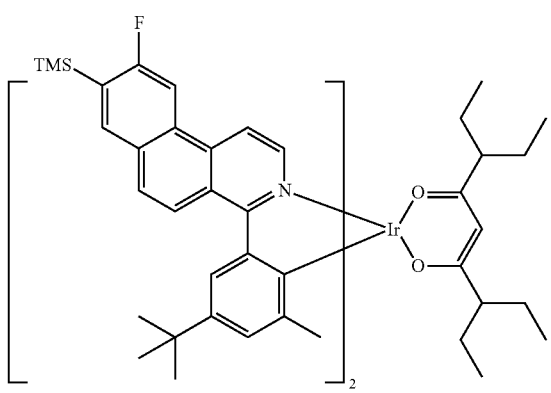
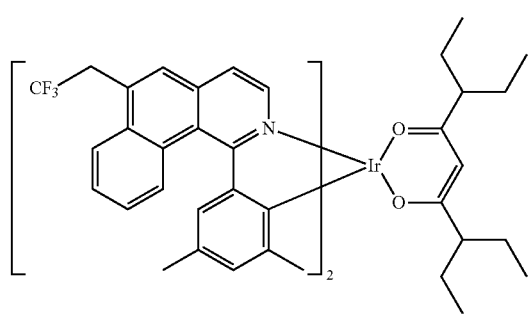
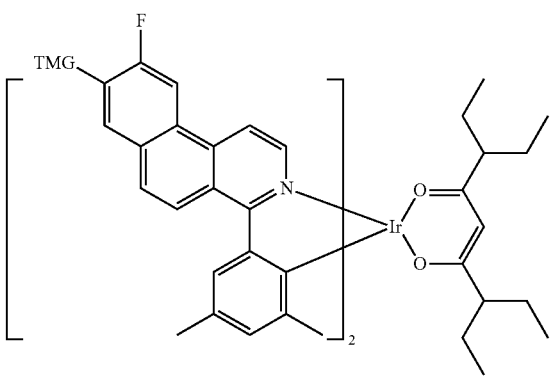

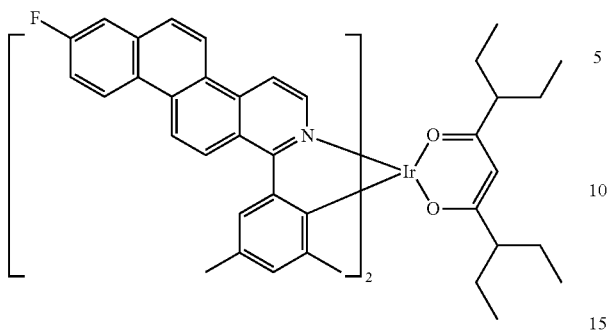

13

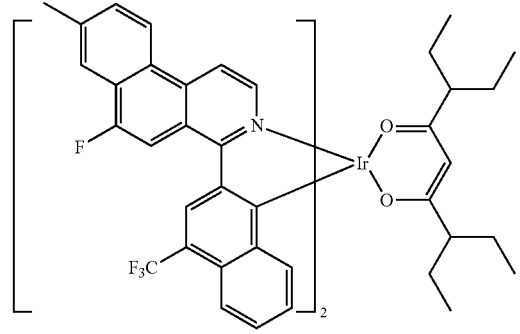

17

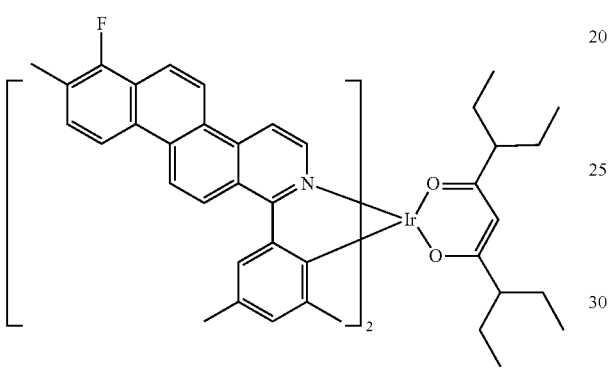

14

18

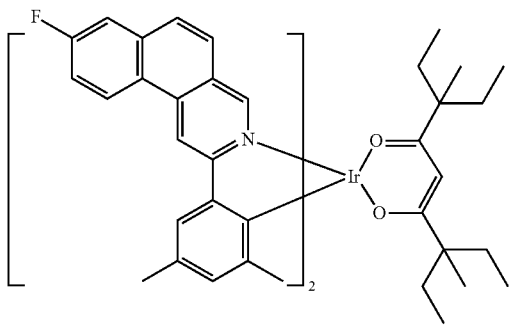

15

19

16

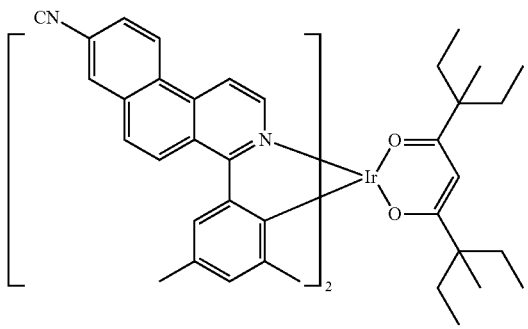

In one embodiment, the FWQM of the emission peak of the photoluminescence spectrum or the electroluminescence spectrum of the organometallic compound represented by Formula 1 may be less than or equal to 100 nanometers (nm). For example, the FWQM of the emission peak of the photoluminescence spectrum or the electroluminescence spectrum of the organometallic compound may be 100 nm or less, from about 60 nm to about 100 nm, from about 70 nm to about 100 nm, from about 80 nm to about 100 nm, or from about 82 nm to about 96 nm.

In one embodiment, the maximum emission wavelength (emission peak wavelength, $\lambda_{max}$) of the emission peak of the photoluminescence spectrum or the electroluminescence spectrum of the organometallic compound represented by Formula 1 may be from about 600 nm to about 660 nm, or from about 615 nm to about 640 nm. In one embodiment, the maximum emission wavelength (emission peak wavelength, $\lambda_{max}$) of the emission peak of the photoluminescence spectrum or the electroluminescence spectrum of the organometallic compound may be from about 615 nm to about 630 nm or from about 620 nm to about 630 nm.

The horizontal orientation ratio of the transition dipole moment of the organometallic compound represented by Formula 1 may be from about 90% to about 100%.

For example, the horizontal orientation ratio of the transition dipole moment of the organometallic compound may be, for example, from about 90% to about 99%, from about 90% to about 98%, from about 90% to about 97%, from about 90% to about 96%, from about 90% to about 95%, or from about 91% to about 95%.

A horizontal orientation ratio measurement method of a transition dipole moment of the organometallic compound may refer to Evaluation Example 3 described below.

As described above, since a horizontal orientation ratio of a transition dipole moment of the organometallic compound is high, when an organic light-emitting device including the organometallic compound is driven, an electric field is emitted in a direction that is substantially parallel to a film including the organometallic compound. Thus, the light loss due to the waveguide mode and/or surface plasmon polariton mode may be reduced. Due to the mechanism, since external extraction efficiency that is, efficiency in which light emitted from the organometallic compound in an electric device (for example, an organic light-emitting device) including a film (for example, an emission layer to be described later) including the organometallic compound is extracted toward the outside) of an electronic device emitting light is high, an electronic device including the organometallic compound, for example, an organic light-emitting device may achieve high luminescence efficiency.

Photoluminescence quantum yield (PLQY) in a film of the organometallic compound represented by Formula 1 may be from about 90% to about 100%. For example, PLQY in a film of the organometallic compound may be from about 91% to 100%, from about 92% to 100%, from about 93% to 100%, from about 94% to 100%, from about 95% to 100%, from about 96% to 100%, from about 97% to 100%, from about 98% to 100%, from about 99% to 100%, or 100%.

In one embodiment, PLQY in a film of the organometallic compound may be from about 95% to about 99%, from about 96% to about 99%, from about 97% to about 99%, or from about 98% to about 99%.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an emission layer, wherein the organic layer includes at least one organometallic compound represented by Formula 1.

As the organic light-emitting device includes an organic layer including the organometallic compound represented by Formula 1 as described above, the organic light-emitting device may have low driving voltage, high external quantum efficiency, a relatively small FWQM, and long lifespan.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit red light or green light.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in the same layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one embodiment, in the organic light-emitting device, the first electrode is an anode, and the second electrode is a cathode, and the organic layer may further include a hole transport region disposed between the first electrode and the emission layer and an electron transport region disposed between the emission layer and the second electrode, and the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

Figure 3:
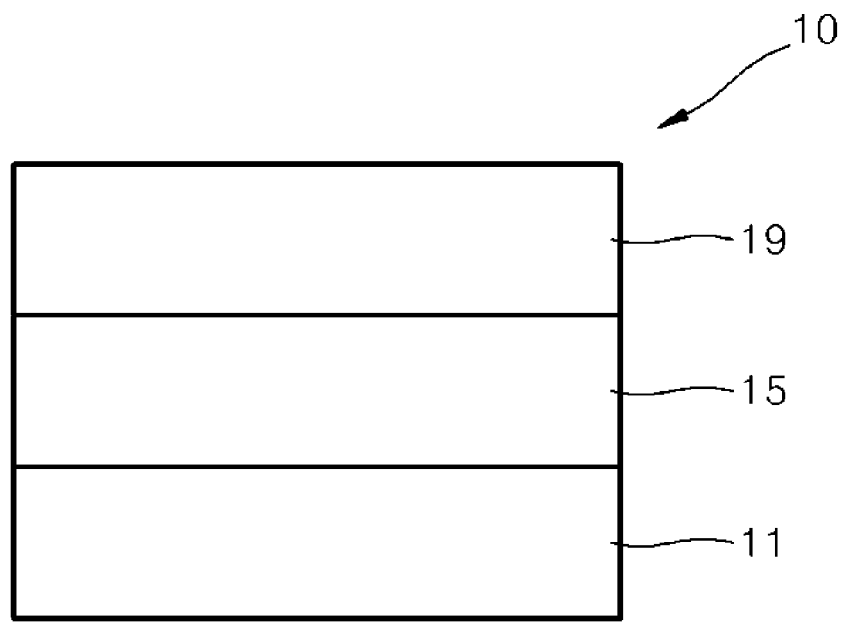
FIG. 3 is a schematic cross-sectional view of an organic light-emitting device according to one or more embodiments.

FIG. 3 is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIG. 3. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide (SnO$_2$), or zinc oxide (ZnO). In one or more embodiments, the material for forming the first electrode 11 may be a metal or a metal alloy, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer (HIL), a hole transport layer, an electron blocking layer, a buffer layer, or a combination thereof.

The hole transport region may include a hole injection layer, a hole transport layer, or a combination thereof. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes an HIL, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum degree of about $10^{-8}$ torr to about $10^{-3}$ torr, and a deposition rate of about 0.01 angstroms per second (Å/sec) to about 100 Å/sec.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

The hole transport region may be m-MTDATA, TDATA, 2-TNATA, NPB, β—NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or a combination thereof:

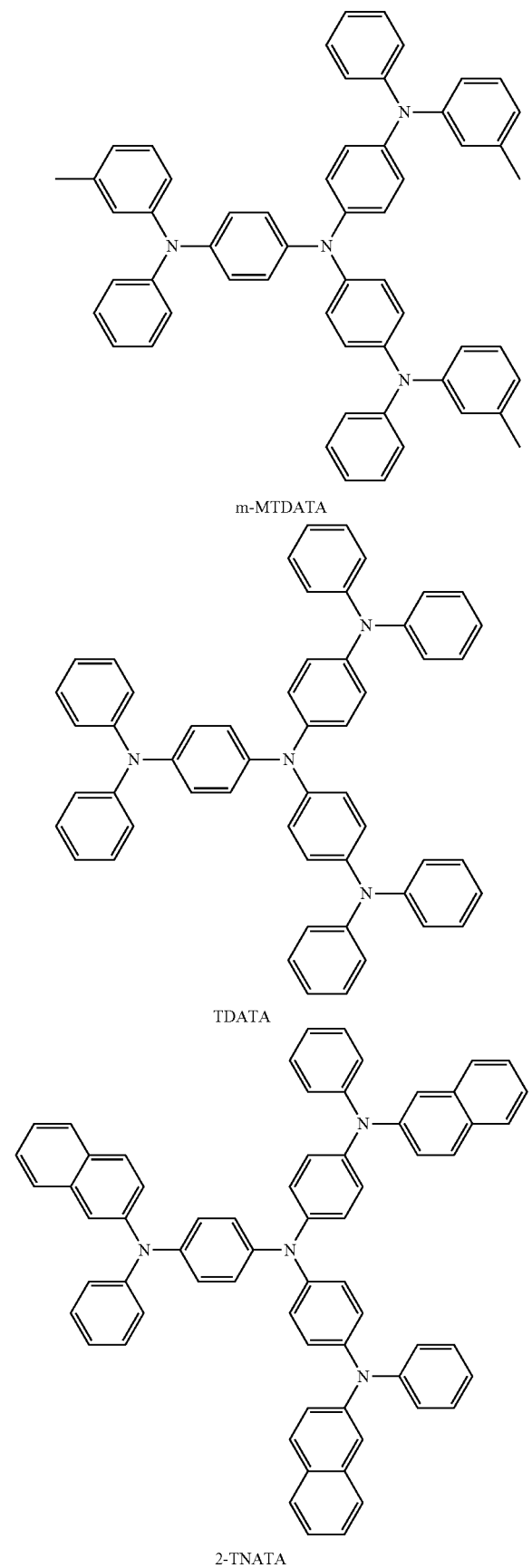

-continued
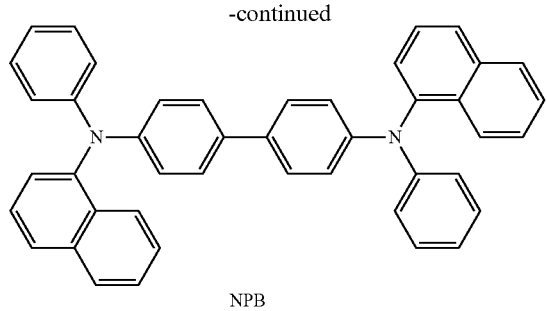
NPB
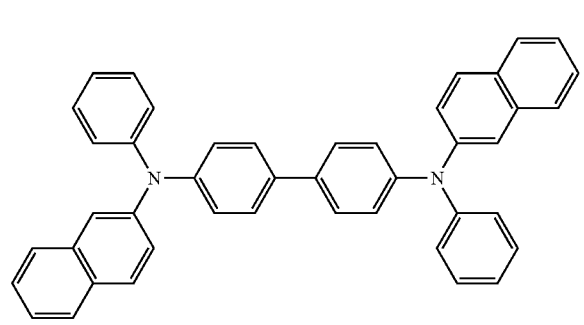
ß-NPB
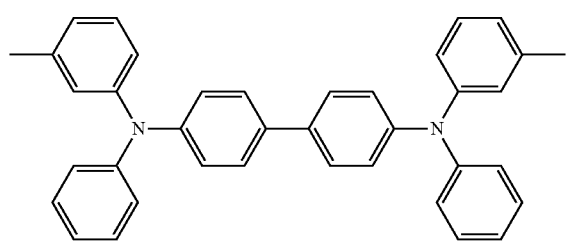
TPD
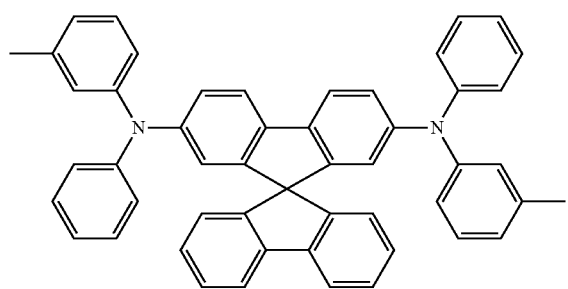
Spiro-TPD
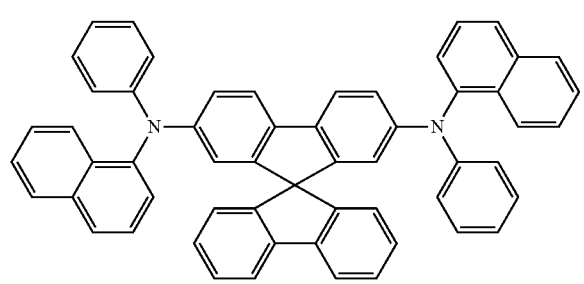
Spiro-NPB
-continued
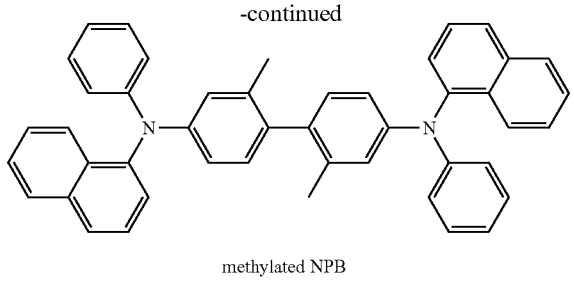
methylated NPB
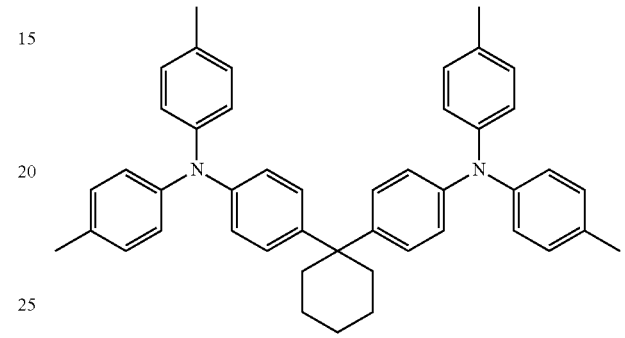
TAPC
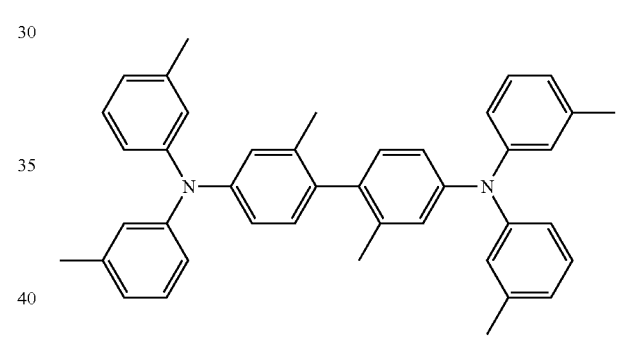
HMTPD
Formula 201
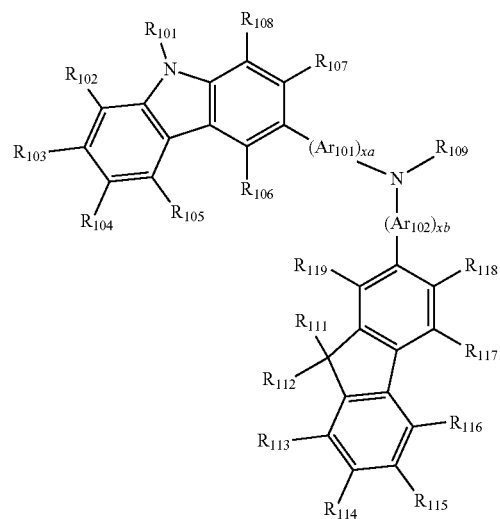

Formula 202

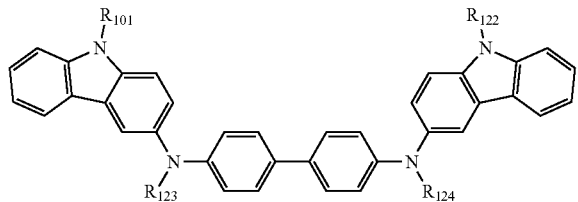

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

According to an embodiment, the compound represented by Formula 201 may be represented by Formula 201A below:

Formula 201A

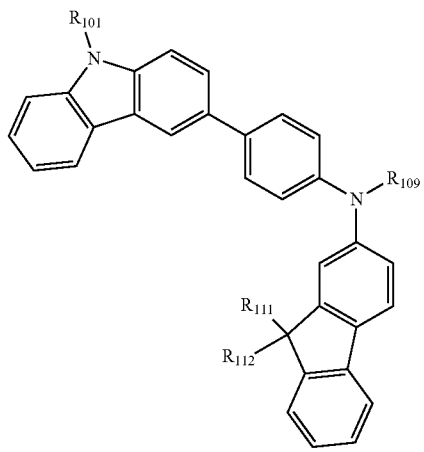

$R_{101}$, $R_{111}$, $R_{112}$, and $R_{109}$ in Formula 201A may be understood by referring to the description provided herein.

For example, the hole transport region may include one of Compounds HT1 to HT21 or a combination thereof:

HT1

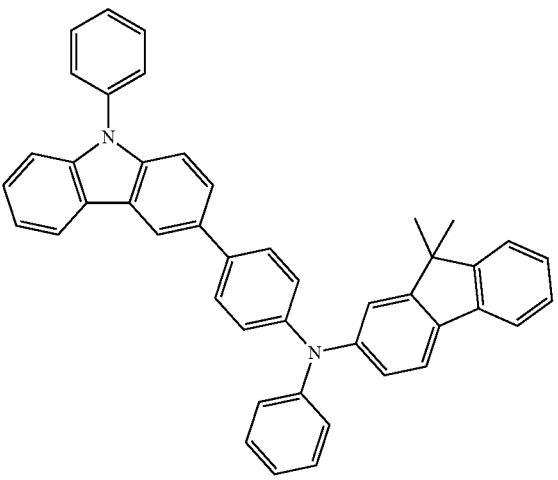

HT2
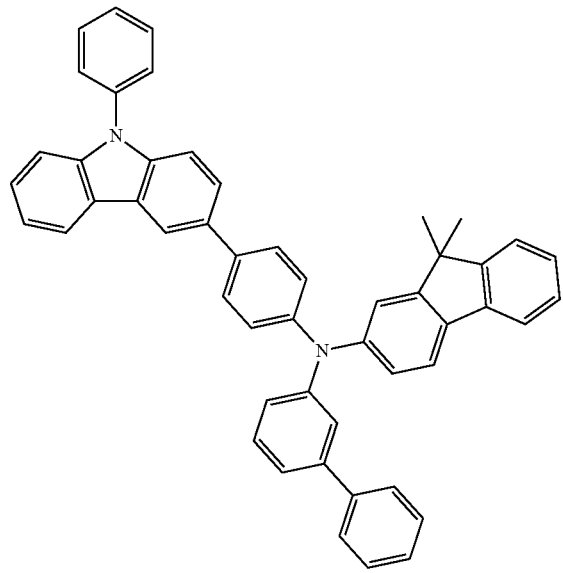
HT4
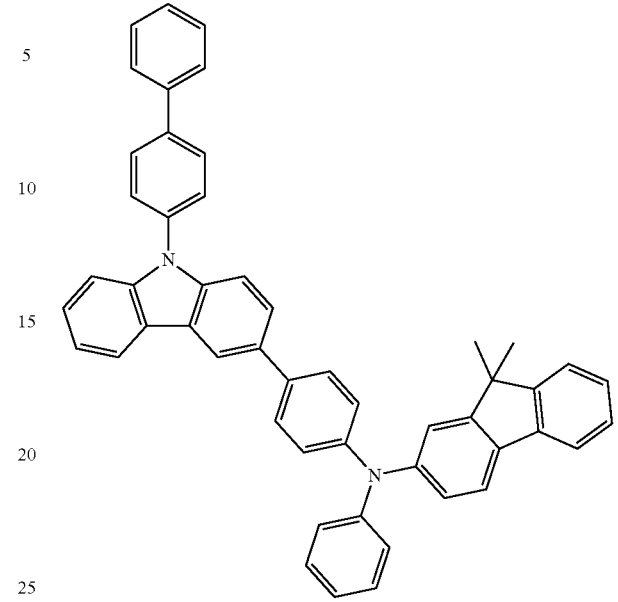
HT3
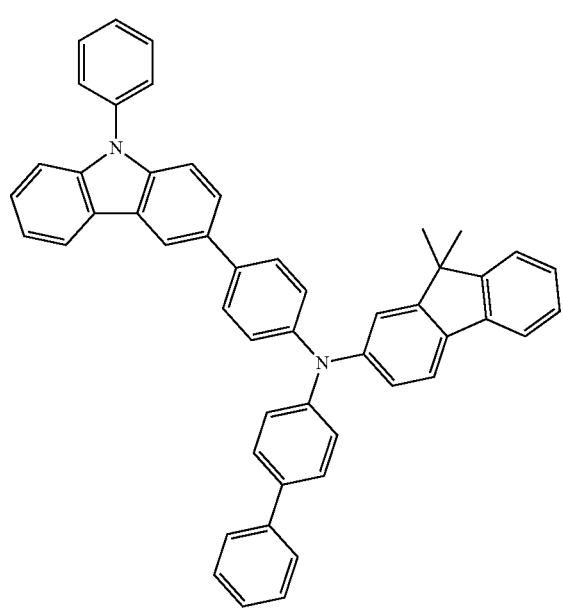
HT5
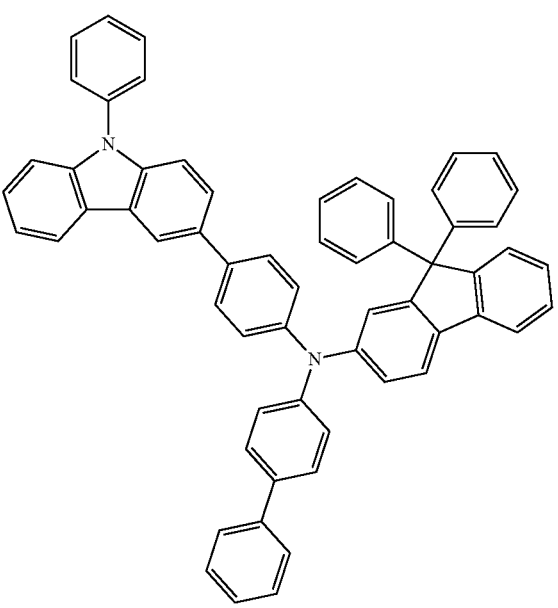

107
-continued
HT6
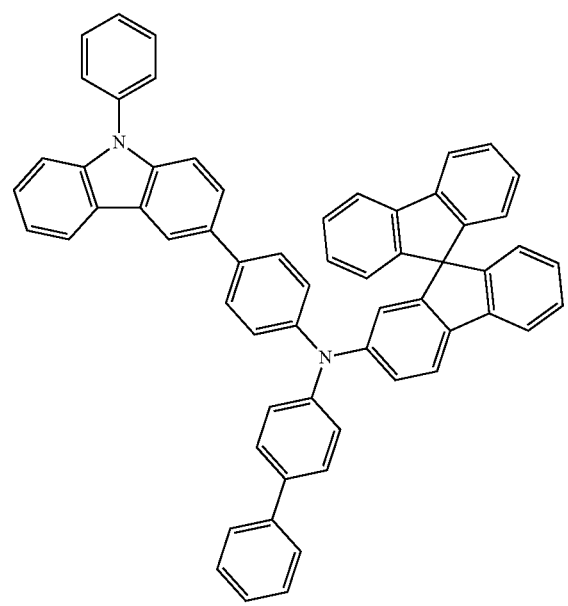
HT7
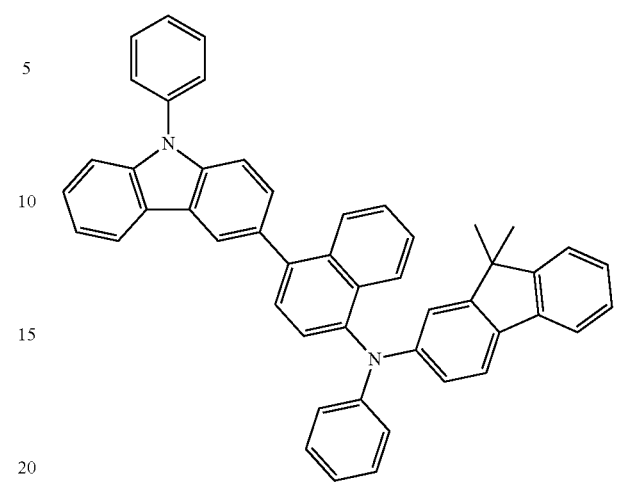
108
-continued
HT8
HT9
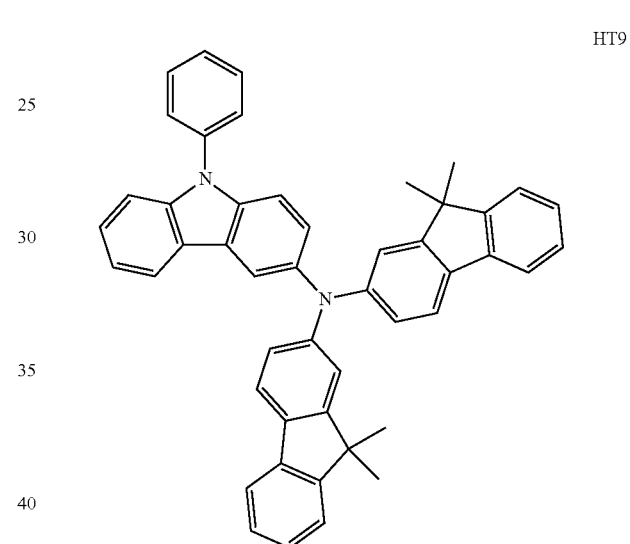
HT10
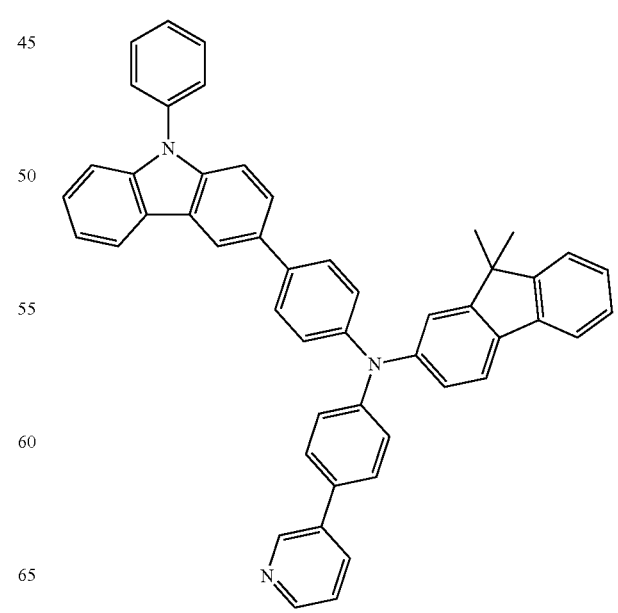

HT11
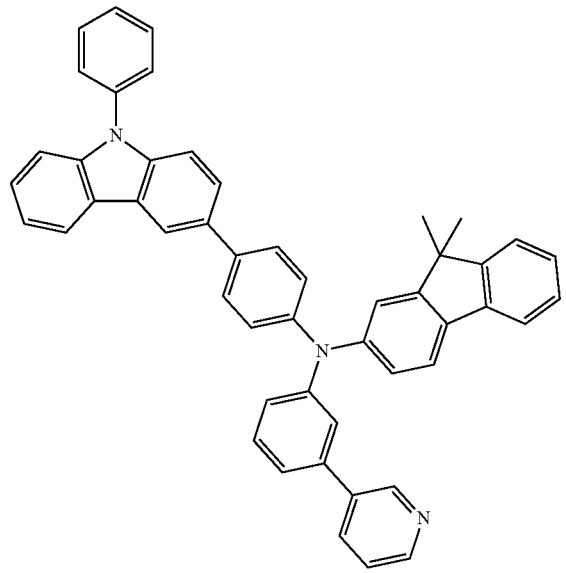
HT14
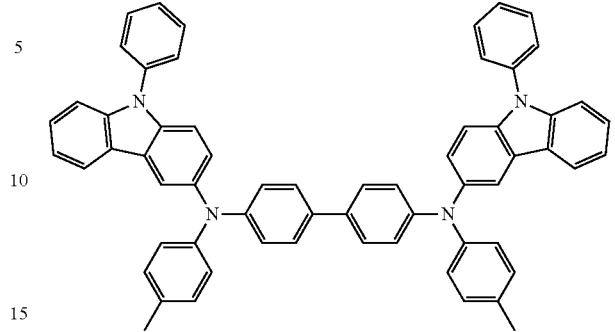
HT15
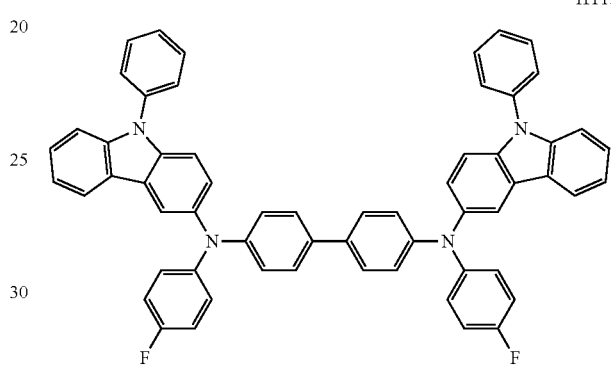
HT12
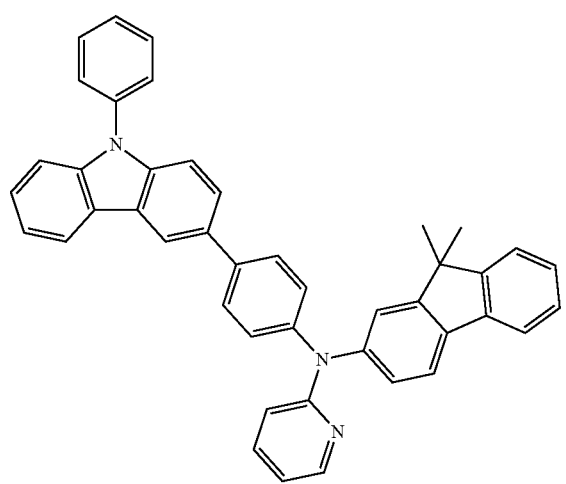
HT16
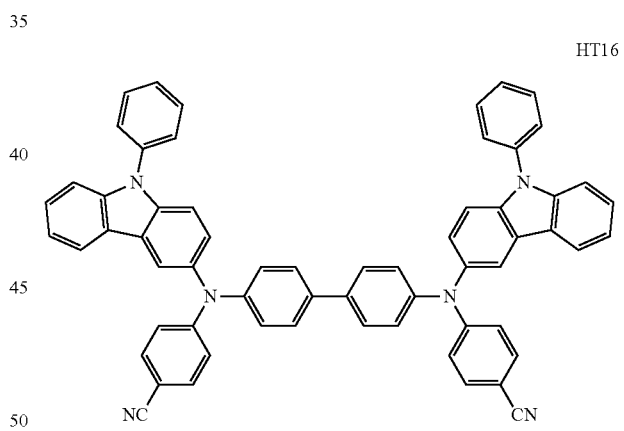
HT13
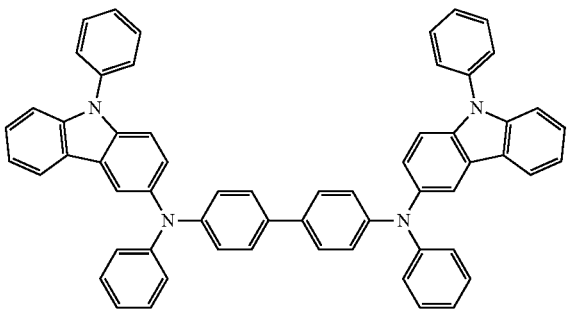
HT17
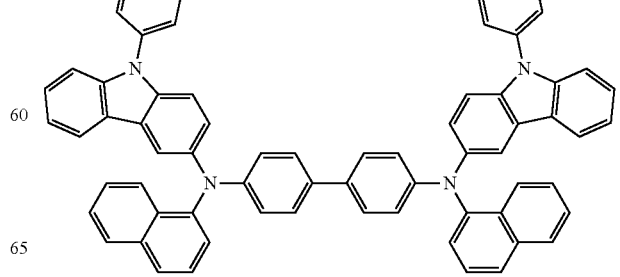

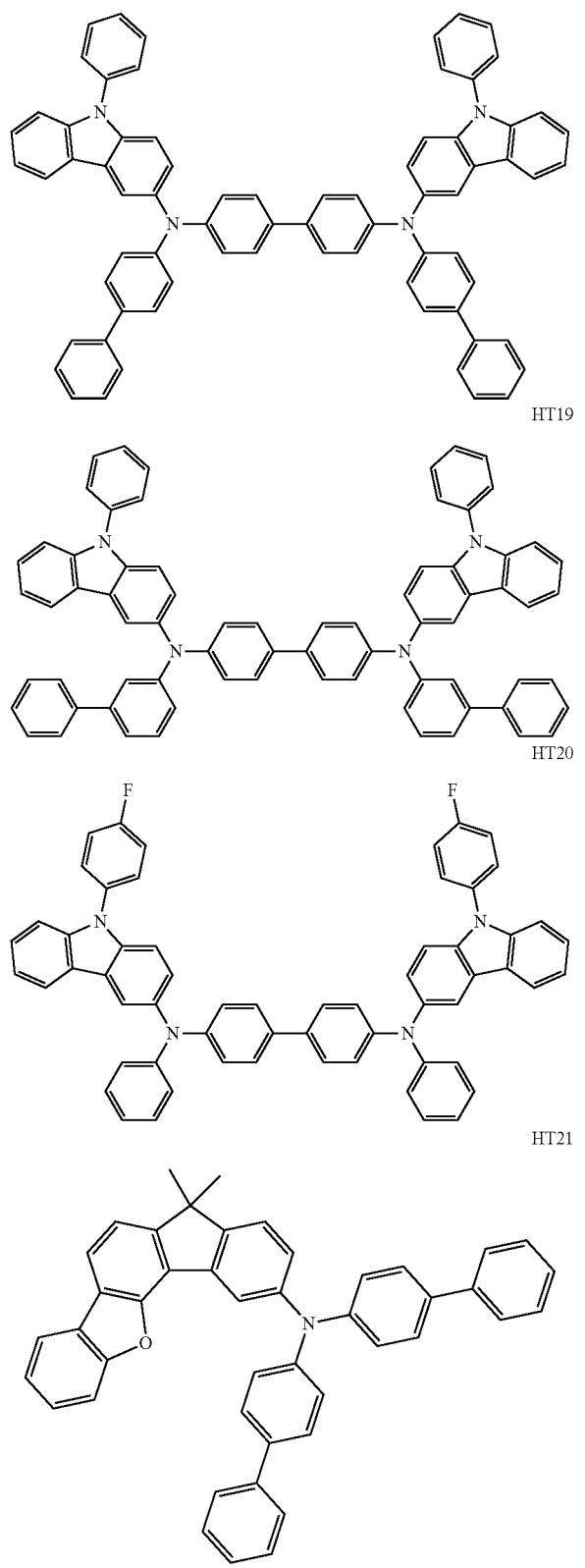

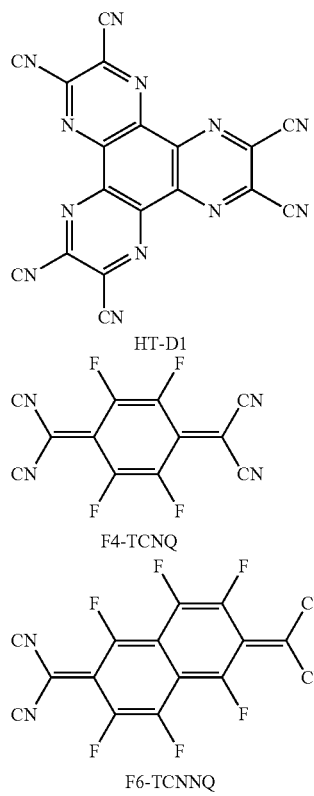

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, the p-dopant may be: a quinone derivative such as tetracyanoquinodimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or a combination thereof.

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described below, or a combination thereof. For example, when the hole transport region includes an electron blocking layer, mCP, the Compound HT21, or a combination described below may be used as the material for forming an electron blocking layer.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, or a combination thereof:

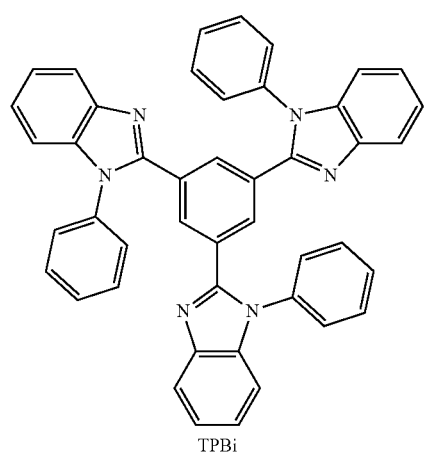

TPBi

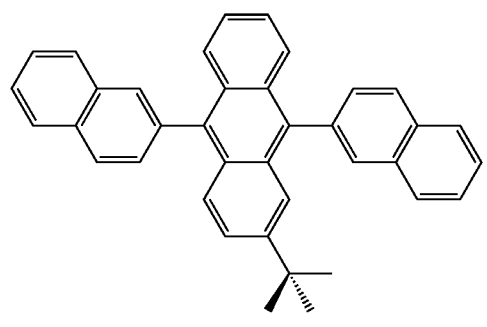

TBADN

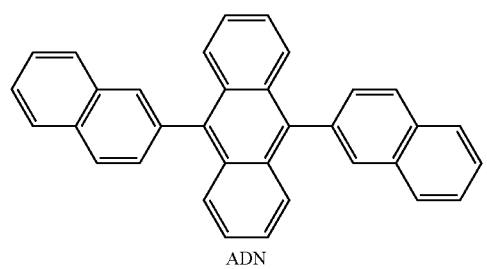

ADN

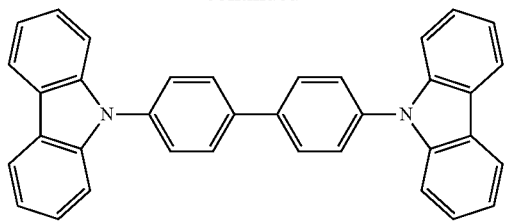

CBP

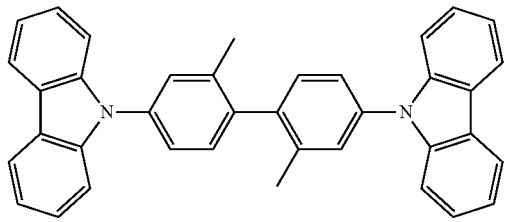

CDBP

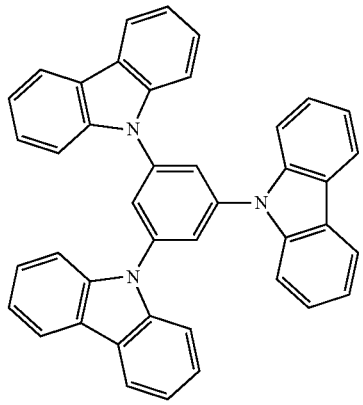

TCP

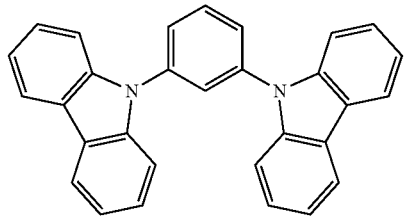

mCP

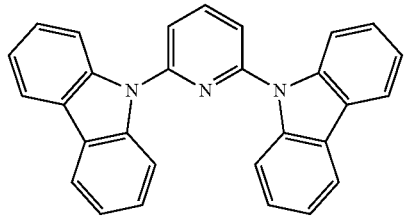

H50

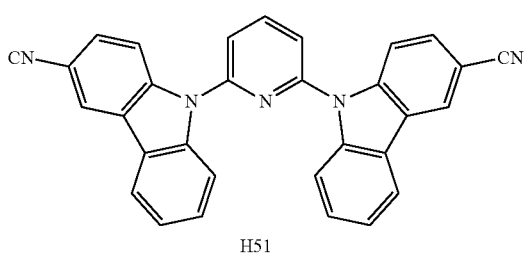

H51

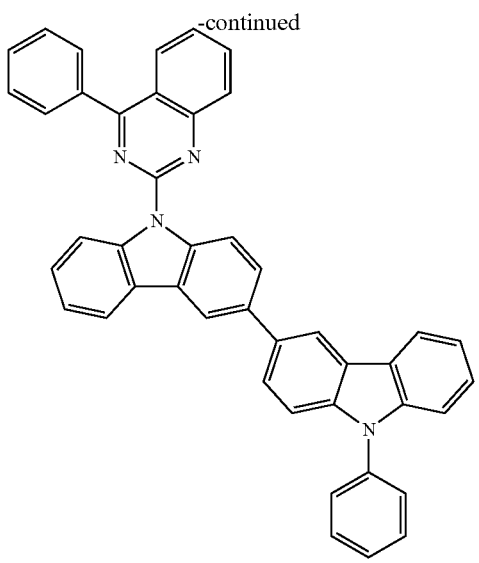

H52

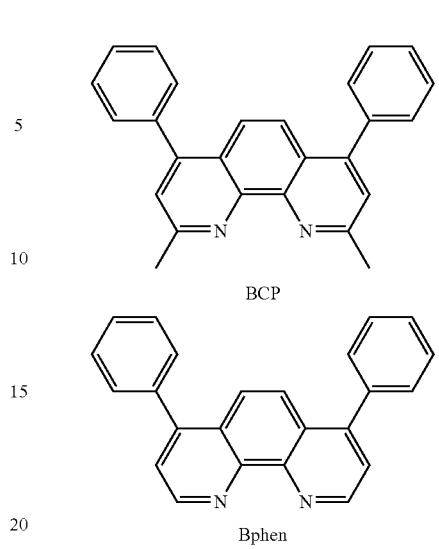

BCP

Bphen

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, BPhen, BAlq, or a combination thereof.

In one or more embodiments, the hole blocking layer may include the host, a material for forming an electron transport layer, a material for forming an electron injection layer, which will be described later, or a combination thereof.

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BCP, Bphen, Alq$_3$, BAlq, TAZ, NTAZ, or a combination thereof.

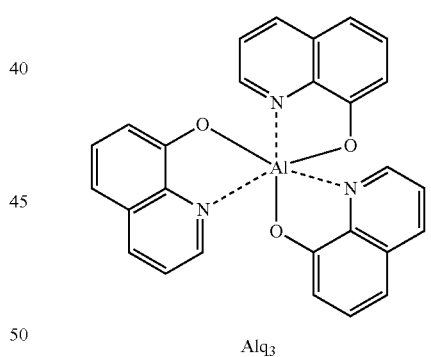

Alq$_3$

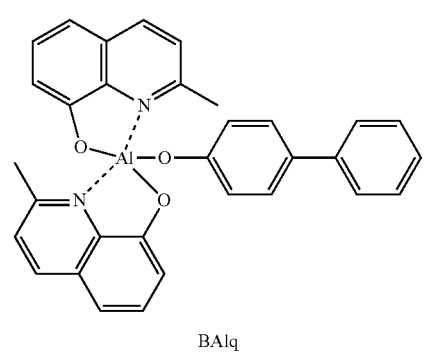

BAlq

-continued
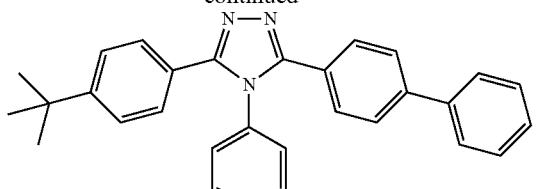
TAZ
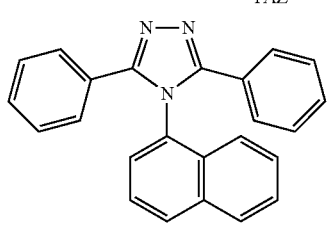
NTAZ
In one or more embodiments, the electron transport layer may include at least one of Compounds ET1 to ET25 or a combination thereof.
ET1
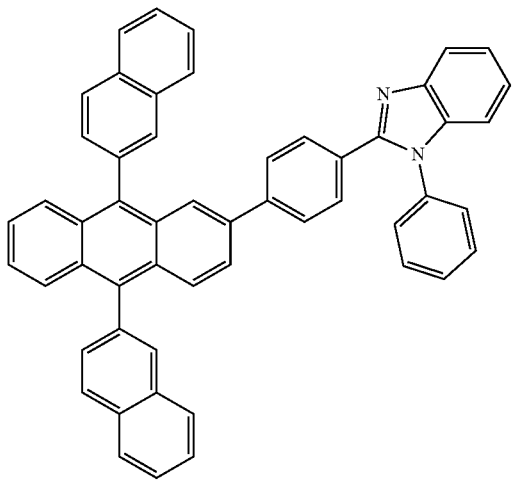
ET2
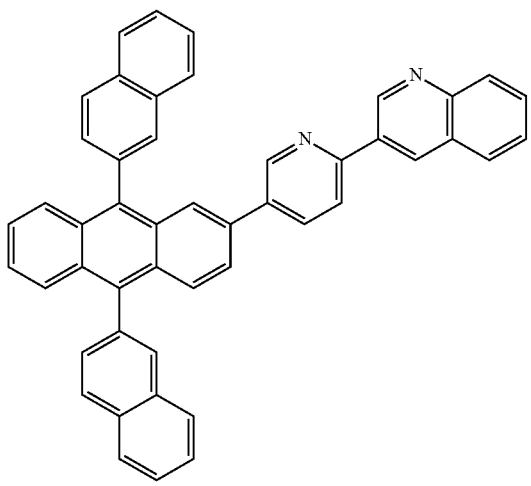
-continued
ET3
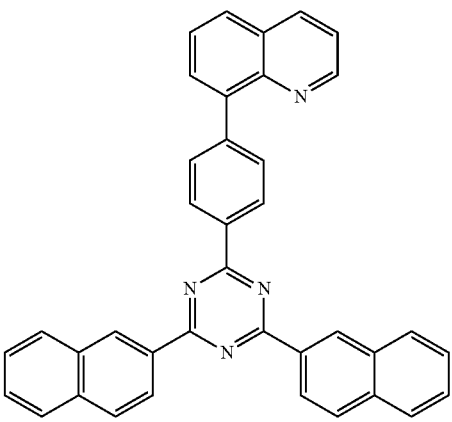
ET4
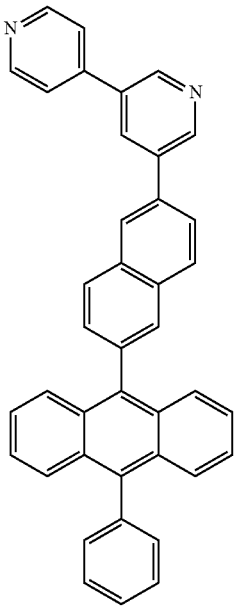
ET5
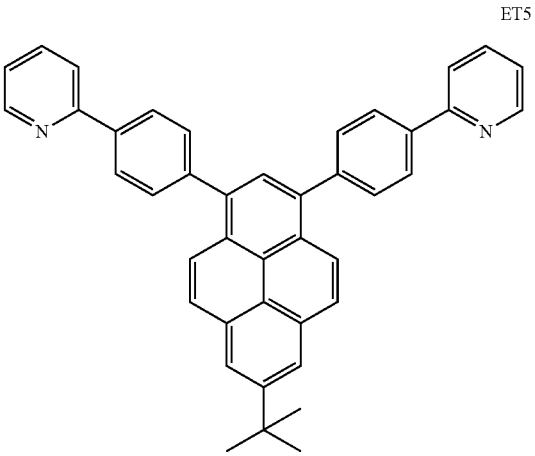

-continued
ET6
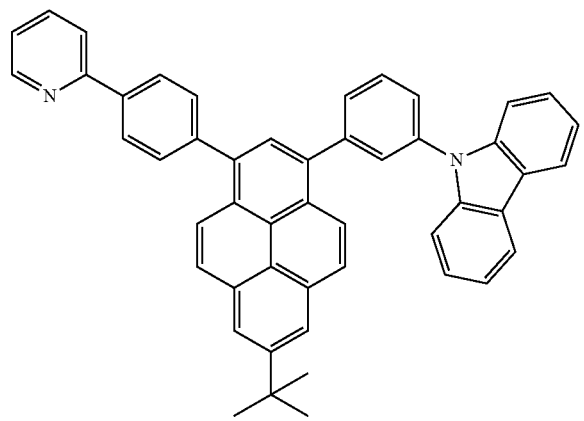
ET7
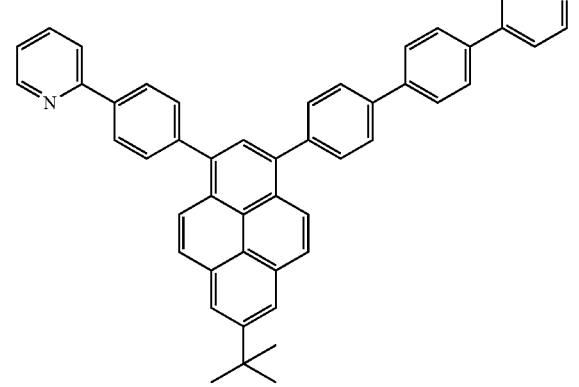
ET8
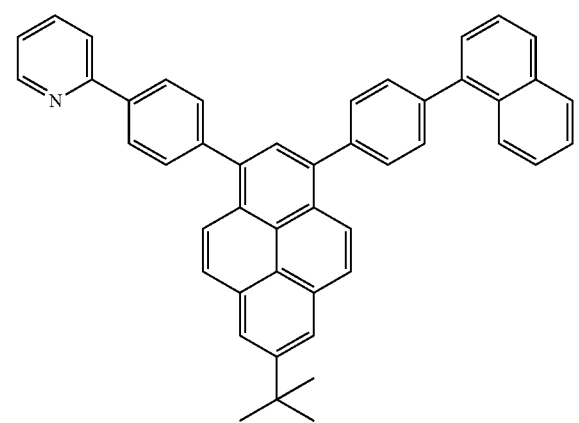
-continued
ET9
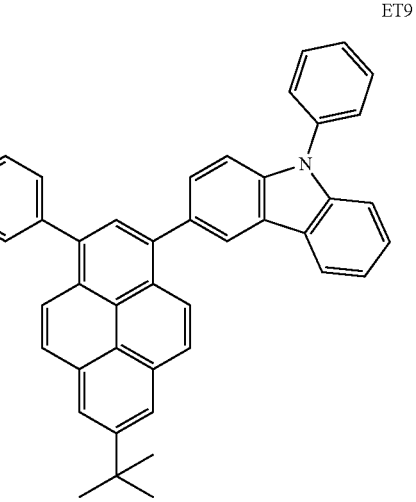
ET10
ET11
ET12
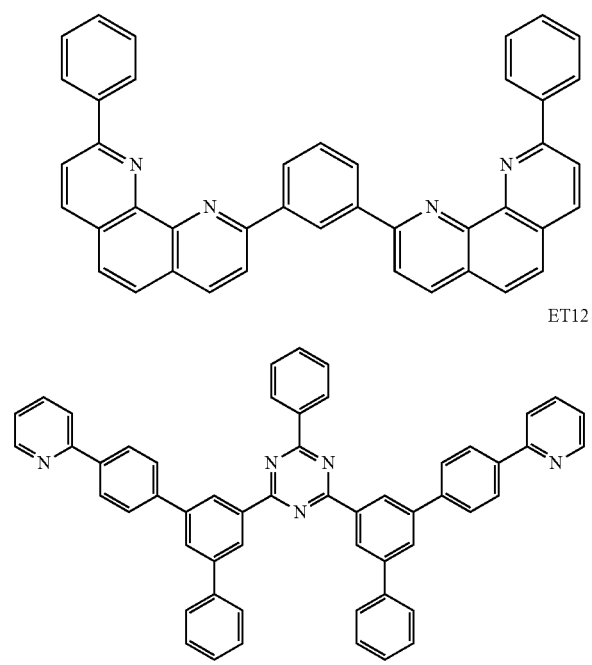

ET13
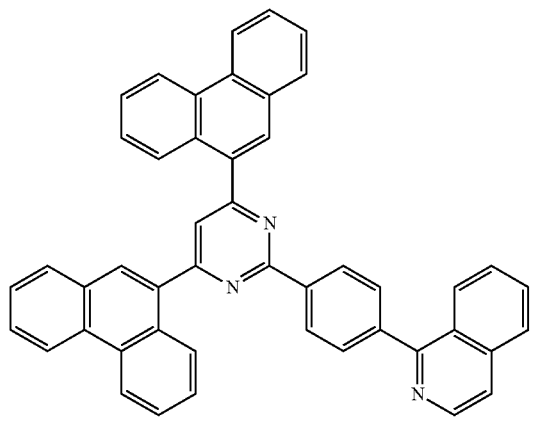
ET16
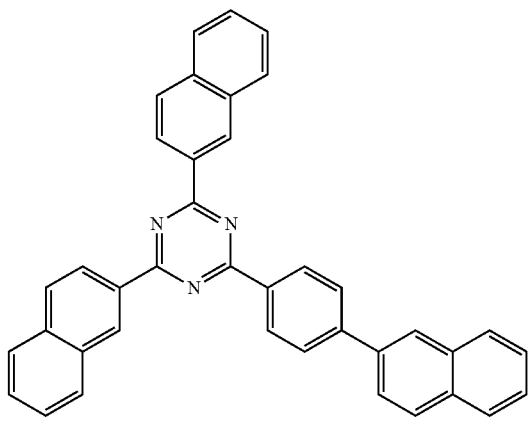
ET14
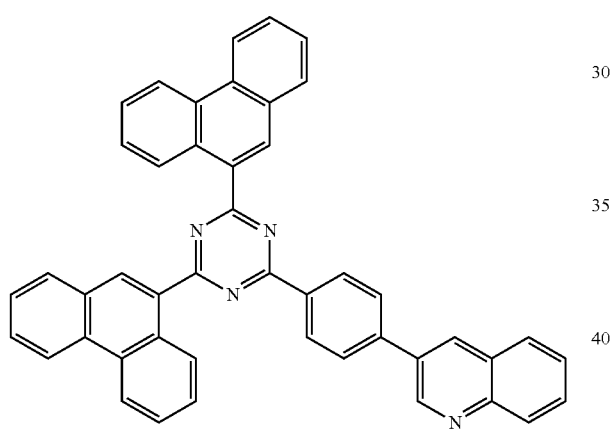
ET17
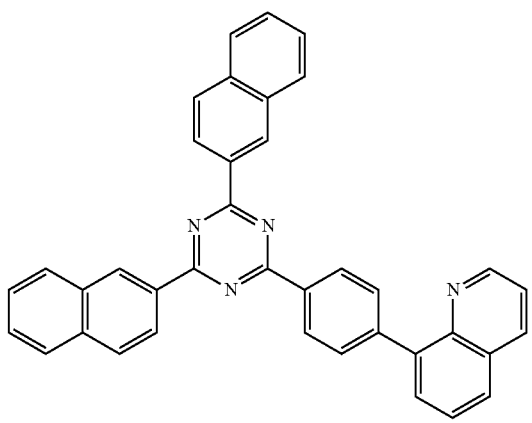
ET15
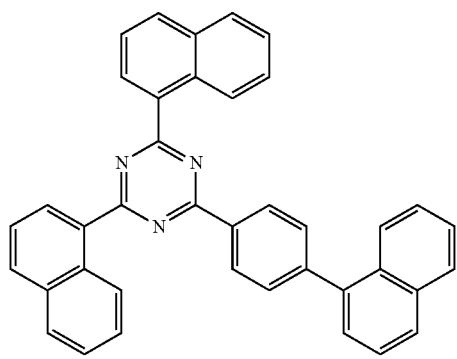
ET18
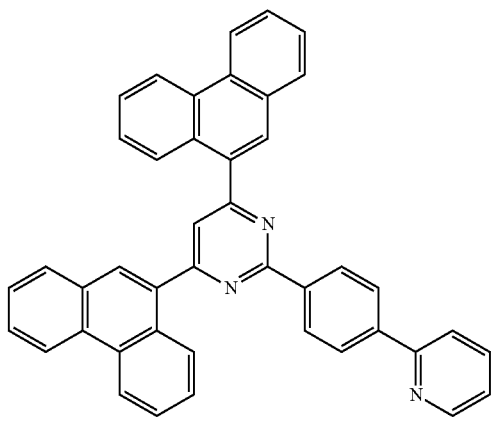

ET19
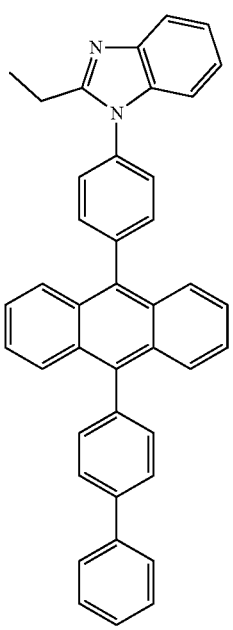
ET20
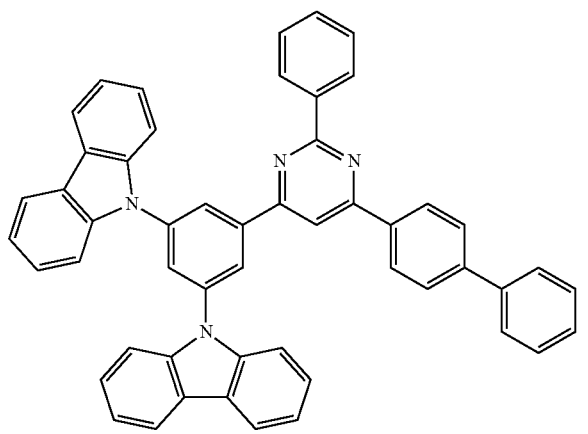
ET21
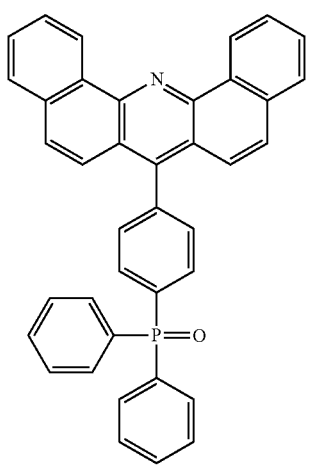
ET22
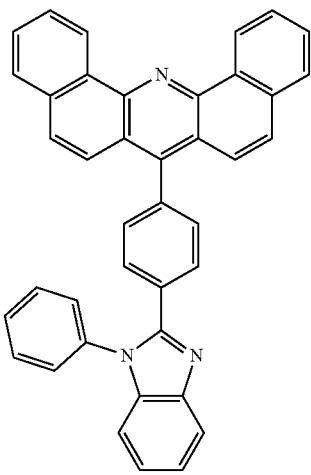
ET23
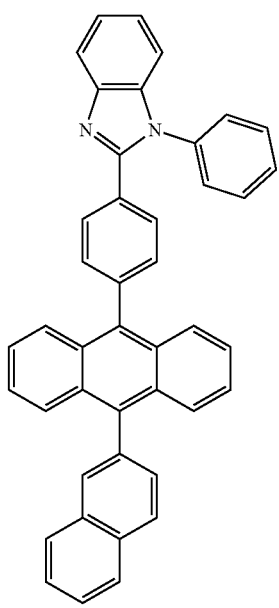
ET24

ET25

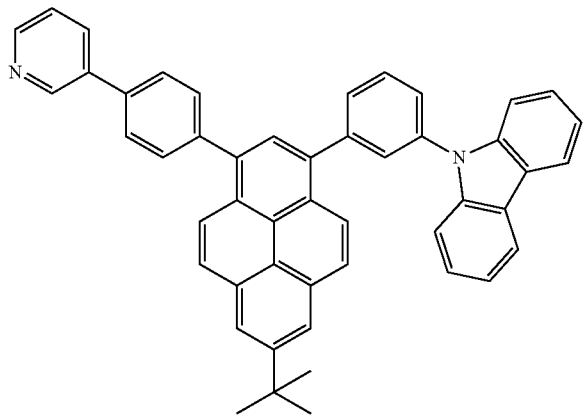

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a $L_1$ complex. The $L_1$ complex may include, for example, Compound ET-D1 or ET-D2:

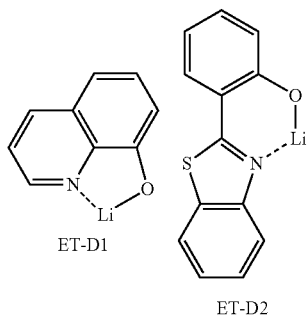

The electron transport region may include an electron injection layer that promotes the flow of electrons from the second electrode 19 thereinto.

The electron injection layer may include LiF, NaCl, CsF, $Li_2$, BaO, or a combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on, or disposed on, the organic layer 15. The second electrode 19 may be a cathode. A material for forming the second electrode 19 may be a metal, a metal alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device has been described with reference to FIG. 3, but exemplary embodiments of the present disclosure are not limited thereto.

According to an aspect of another embodiment, an electronic apparatus including the organic light-emitting device may be provided. The electronic apparatus may be used for various purposes such as a display, lighting, and a mobile phone.

The term "$C_5$-$C_{30}$ carbocyclic group" as used herein refers to a saturated or unsaturated cyclic group having 5 to 30 carbon atoms as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{1a}$)" are an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, a fluorene group each unsubstituted or substituted with at least one $R_a$.

The term "$C_1$-$C_{30}$ heterocyclic group" as used herein refers to a saturated or unsaturated cyclic group having 1 to 30 carbon atoms and at least one heteroatom selected from N, O, Si, P, S, Ge, Se, and B as ring-forming atoms. The $C_1$-$C_{30}$ heterocyclic group may be a monocyclic group or a polycyclic group. The "$C_1$-$C_{30}$ heterocyclic group (unsubstituted or substituted with at least one $R_{1a}$)" may be, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group each unsubstituted or substituted with at least one $R_{1a}$ as defined herein.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched C alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group are a methoxy group, an ethoxy group, a propoxy group, a butoxy group, and a pentoxy group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, a bicyclo[2.2.2]octyl group, and the like.

The term "$C_1$-$C_{10}$ heterocycloalkyl group" as used herein refers to a monovalent saturated monocyclic group having at least one heteroatom selected from N, O, Si, P, S, Ge, Se, and B as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, a tetrahydrothiophenyl group, and the like.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, S, Ge, Se, and B as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having at least one hetero atom selected from N, O, Si, P, S, Ge, Se, and B as a ring-forming atom and a cyclic aromatic system having 1 to 60 carbon atoms, and the term "$C_1$-$C_{60}$ heteroarylene group" as used herein refers to a divalent group having at least one hetero atom selected from N, O, Si, P, S, Ge, Se, and B as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, Si, P, S, Ge, Se, and B, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

A substituent of the substituted $C_5$-$C_{30}$carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or a combination thereof.

$Q_1$ to $Q_9$, $Q_{11}$ to $Q_{19}$, $Q_{21}$ to $Q_{29}$ and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

For example, $Q_1$ to $Q_9$, $Q_1$ to $Q_{19}$, $Q_{21}$ to $Q_{29}$ and $Q_{31}$ to $Q_{39}$ described herein may each independently be:

—CH₃, —CD₃, —CD₂H, —CDH₂, —CH₂CH₃, —CH₂CD₃, —CH₂CD₂H, —CH₂CDH₂, —CHDCH₃, —CHDCD₂H, —CHDCDH₂, —CHDCD₃, —CD₂CD₃, —CD₂CD₂H, or —CD₂CDH₂; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or a combination thereof.

The term "deuterated $C_1$-$C_{60}$ alkyl group (or, a deuterated $C_1$-$C_{20}$ alkyl group, a deuterated $C_2$-$C_{20}$ alkyl group, or the like)" as used herein may refer to a $C_1$-$C_{60}$ alkyl group that is substituted with at least one deuterium (or, a $C_1$-$C_{20}$ alkyl group that is substituted with at least one deuterium, a $C_2$-$C_{20}$ alkyl substituted with at least one deuterium, or the like). For example, the term "deuterated $C_1$ alkyl group (that is, a deuterated methyl group)" includes —CD₃, —CD₂H, and —CDH₂.

The term "deuterated $C_3$-$C_{10}$ cycloalkyl group" as used herein refers to a $C_3$-$C_{10}$ cycloalkyl group that is substituted with at least one deuterium. An example of the "deuterated $C_3$-$C_{10}$ cycloalkyl group" may refer to Formula 10-501.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", and "fluorinated $C_1$-$C_{10}$ heterocycloalkyl group" may refer to a $C_1$-$C_{60}$ alkyl group that is substituted with at least one fluoro group (—F) (or a $C_1$-$C_{20}$ alkyl group or the like), a $C_3$-$C_{10}$ cycloalkyl group, and a $C_1$-$C_{10}$ heterocycloalkyl group, respectively. For example, the "fluorinated $C_1$ alkyl group (that is, the fluorinated methyl group)" may include —CF₃, —CF₂H, and —CFH₂. The "fluorinated $C_1$-$C_{60}$ alkyl group (or a fluorinated $C_1$-$C_{20}$ alkyl group or the like)", "fluorinated $C_3$-$C_{10}$ cycloalkyl group", or "fluorinated $C_1$-$C_{10}$ heterocycloalkyl group" may be i) a fully fluorinated $C_1$-$C_{60}$ alkyl group (or a fully fluorinated $C_1$-$C_{20}$ alkyl group or the like), a fully fluorinated $C_3$-$C_{10}$ cycloalkyl group, or a fully fluorinated $C_1$-$C_{10}$ heterocycloalkyl group, in which all hydrogen included in each group is substituted with a fluoro group or ii) a partially fluorinated $C_1$-$C_{60}$ alkyl group (or a partially fluorinated $C_1$-$C_{20}$ alkyl group or the like), a partially fluorinated $C_3$-$C_{10}$ cycloalkyl group, or a partially fluorinated $C_1$-$C_{10}$ heterocycloalkyl group, in which one or more hydrogen atoms included in each group is substituted with a fluoro group but all of the hydrogen atoms are not substituted with a fluoro group.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic ring groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one carbon selected from ring-forming carbons is substituted with nitrogen.

Hereinafter, a compound and an organic light-emitting device according to one or more exemplary embodiments are described in further detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

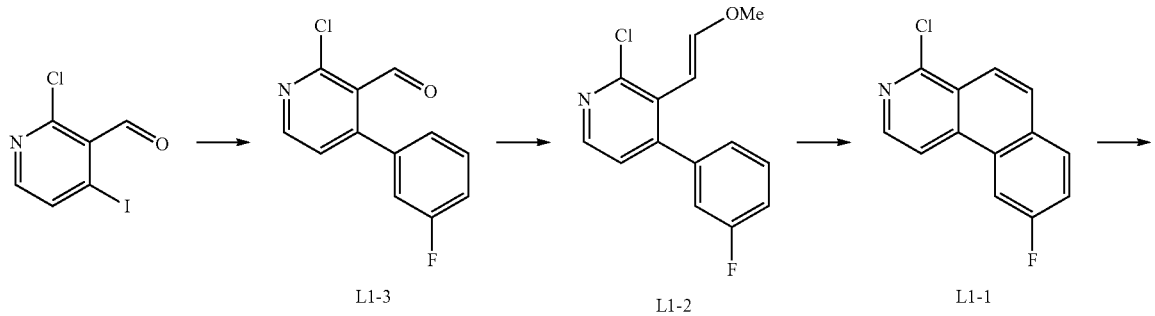

-continued

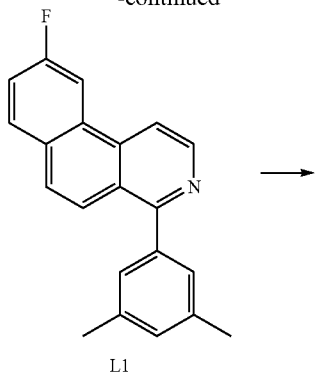

L1

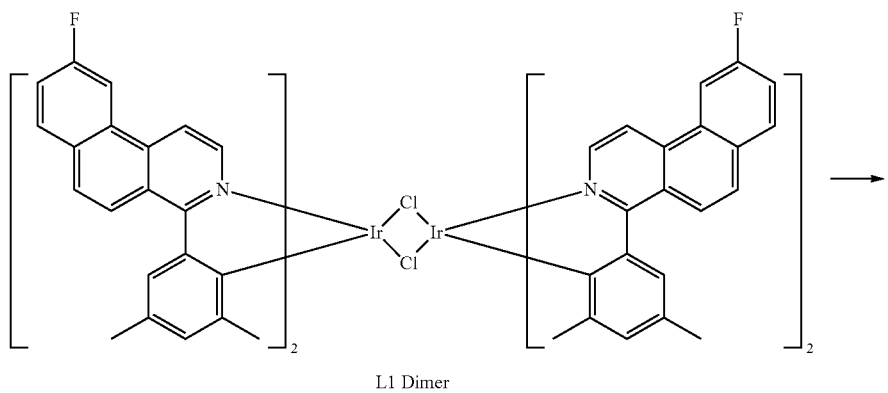

L1 Dimer

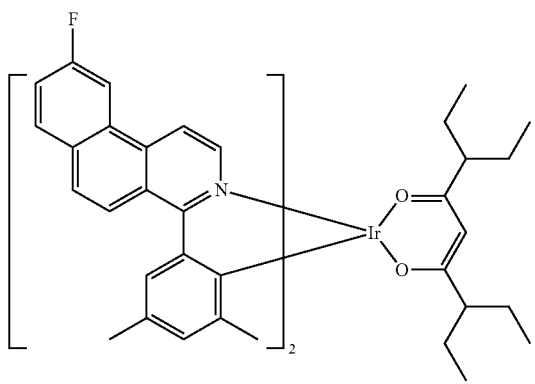

1

Synthesis of Intermediate L1-3

1.9 grams (g) (7.2 millimoles, mmol) of 2-chloro-4-iodonicotinaldehyde was mixed with 60 milliliters (mL) of acetonitrile and 15 mL of water, and 0.4 g (0.5 mmol) of PdCl$_2$(PPh$_3$)$_2$, 1.0 g (7.2 mmol) of 3-fluorophenyboronic acid, and 2.5 g (18.0 mmol) of K$_2$CO$_3$ were added thereto, and the mixture heated at reflux at 85° C. for 16 hours. The resultant obtained therefrom was concentrated under reduced pressure, and dichloromethane and water were added thereto. An organic layer extracted therefrom was dried over magnesium sulfate and then evaporated under reduced pressure, and then purified by liquid chromatography to obtain 1.5 g (yield of 87%) of Intermediate L1-3.

Liquid chromatography-mass spectrometry (LC-MS) m/z=236 (M+H)$^+$

Synthesis of Intermediate L1-2

5.4 g (15.8 mmol) of (methoxymethyl)triphenylphosphonium chloride was mixed with 50 mL of anhydrous ether, and then 16 ml of 1.0M potassium tert-butoxide solution was added dropwise thereto and stirred for about 1 hour at room temperature. Thereafter, 1.5 g (6.3 mmol) of Intermediate L1-3 mixed with 30 ml of anhydrous THF was slowly added dropwise thereto and stirred for 18 hours at room temperature. Water and ethyl acetate were added to the resultant obtained therefrom. An organic layer extracted therefrom was dried over magnesium sulfate and then evaporated under reduced pressure, and then purified by liquid chromatography to obtain 1.6 g (yield of 96%) of Intermediate L1-2.

LC-MS m/z=264 (M+H)$^+$

Synthesis of Intermediate L1-1

1.4 g (5.1 mmol) of Intermediate L1-2 was mixed with 40 mL of dichloromethane, and 3.0 mL of methanesulfonic acid were slowly added dropwise thereto and then stirred for about 18 hours at room temperature. A saturated sodium hydrogen carbonate aqueous solution was added to the resultant obtained therefrom. An organic layer extracted therefrom was dried over magnesium sulfate and then evaporated under reduced pressure, and then purified by liquid chromatography to obtain 1.0 g (yield of 85%) of Intermediate L1-1.

LC-MS m/z=232 (M+H)$^+$

Synthesis of Intermediate L1

1.0 g (4.1 mmol) of Intermediate L1-1 was mixed with 40 mL of THF and 10 mL of water, and 0.9 g (6.2 mmol) of 3,5-dimethylphenylboronic acid, 0.09 g (0.4 mmol) of Pd(OAc)$_2$, 0.35 g (0.82 mmol) of 2-dicyclohexylphosphino-2',6'-bimethoxybiphenyl (SPhos), and 1.4 g (10.3 mmol) of K$_2$CO$_3$ were added thereto, and the mixture was heat at reflux for 24 hours. Ethyl acetate and water were added to the resultant obtained therefrom. An organic layer extracted therefrom was dried over magnesium sulfate and then evaporated under reduced pressure, and then purified by liquid chromatography to obtain 1.1 g (yield of 85%) of Intermediate L1.

LC-MS m/z=302 (M+H)$^+$

Synthesis of Intermediate L1 Dimer 1.05 g (3.4 mmol) of Intermediate L1 and 0.6 g (1.6 mmol) of iridium chloride were mixed with 40 mL of ethoxyethanol and 15 mL of distilled water, and the mixture was heated at reflux for 24 hours. The resultant obtained therefrom was cooled to room temperature. A solid material formed therefrom was filtered and washed thoroughly with water, methanol, and hexane in the stated order to obtain a solid which was then dried in a vacuum oven to obtain 1.1 g of Intermediate L1 Dimer.

Synthesis of Compound 1

1.0 g (0.63 mmol) of Intermediate L1 Dimer, 4.5 mmol of 3,7-diethylnonane-4,6-dione, and 0.48 g (4.5 mmol) of Na$_2$CO$_3$ were mixed with 40 mL of ethoxyethanol, and the mixture was stirred at 90° C. for 24 hours. The temperature of the resultant obtained therefrom was cooled to room temperature. A solid material formed therefrom was filtered and purified by liquid chromatography to obtain 0.6 g (yield of 47%) of Compound 1.

LC-MS m/z=1007 (M+H)$^+$

Synthesis Example 2 (Compound 2)

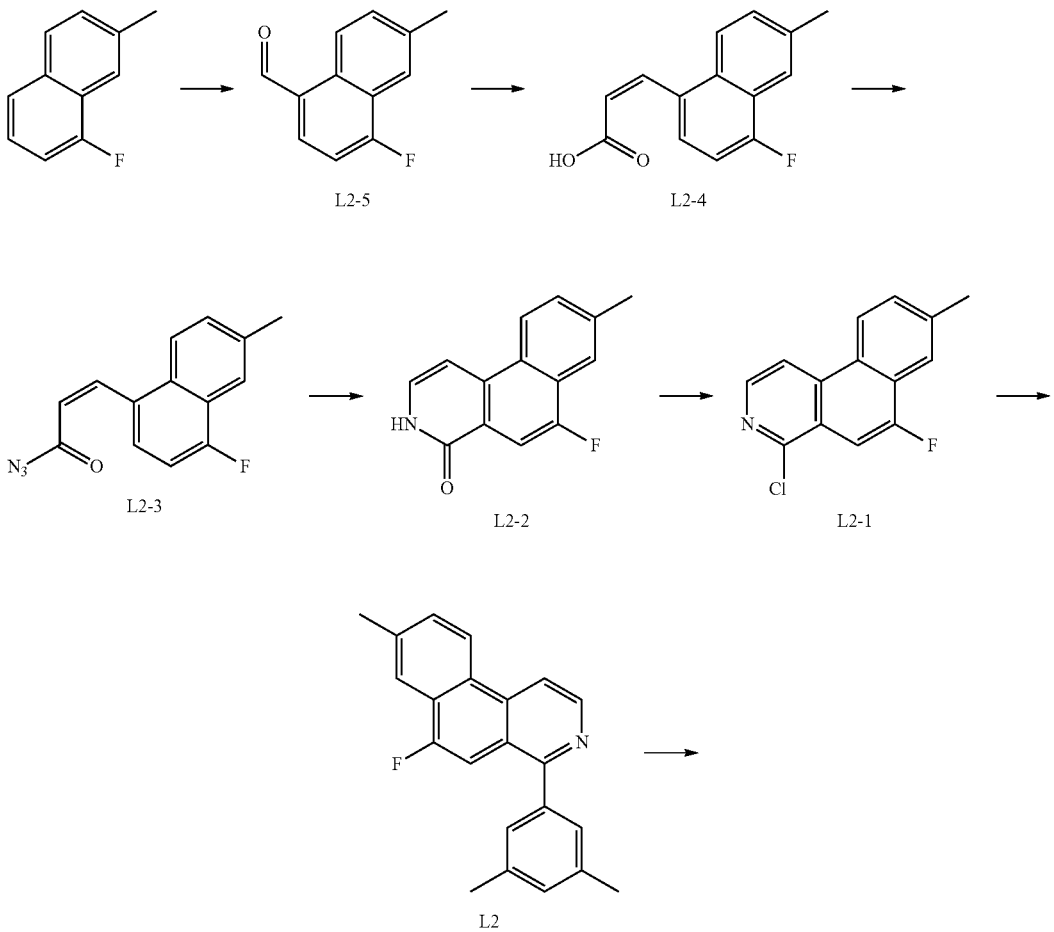

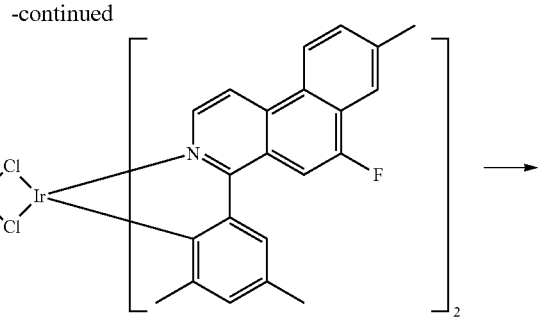

L2 Dimer

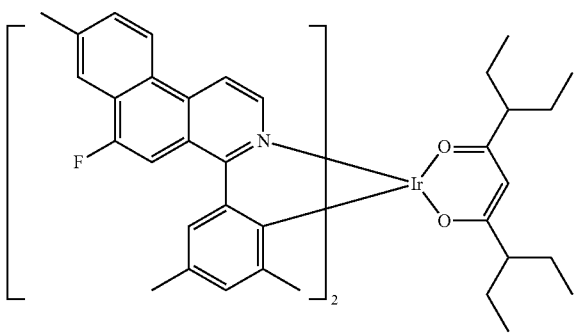

Synthesis of Intermediate L2-5

15 g (130 mmol) of dichloromethylmethylether and 200 ml of dichloromethane were mixed, and then 15 mL (130 mmol) of $SnCl_4$ were slowly added thereto at 0° C. and stirred for about 2 hours. 16.5 g (103 mmol) of 1-fluoro-7-methylnaphthalene with which 100 mL of $CH_2Cl_2$ was mixed was slowly added dropwise thereto and then stirred at room temperature for about 16 hours. When the reaction was completed, an organic layer extracted by adding the reaction mixture to 150 mL of cold water was dried over magnesium sulfate and then evaporated under reduced pressure, and purified by liquid chromatography to obtain 12.2 g (yield of 63%) of Intermediate L2-5.

LC-MS m/z=189 $(M+H)^+$

Synthesis of Intermediate L2-4

10 g (53.1 mmol) of Intermediate L2-5, 6.7 g (64.2 mmol) of malonic acid, and 6.3 mL (64.2 mmol) of piperidine were mixed with 80 ml of pyridine and then stirred at 90° C. for about 18 hours. When the reaction is completed, pyridine was evaporated under reduced pressure and water was dropwise to the reaction mixture. After acidification thereof to a pH of about 4 by using a 4 normal (N) HCl aqueous solution, the resulting solid was filtered and washed several times using hexane. A compound obtained therefrom was dried without a purification process to obtain 11 g (yield of 75%) of Intermediate L2-4.

LC-MS m/z=231 $(M+H)^+$

Synthesis of Intermediate L2-3

11 g (47.8 mmol) of Intermediate L2-4 was mixed with 250 mL of dehydrated acetone, and then 5.5 mL (57.4 mmol) of ethyl chloroformate was added thereto at room temperature. Then, 17 mL (119.5 mmol) of triethylamine was slowly added dropwise thereto. The reaction mixture was stirred at room temperature for 2 hours, and then 6.2 g (95.6 mmol) of sodium azide with which 100 mL of water was mixed at 0° C. was slowly added dropwise thereto and stirred for about 1 hour. When the reaction was completed, the reaction mixture was added to cold water and stirred. A solid formed therefrom was filtered without a purification process to obtain 11 g (yield of 90%) of Intermediate L2-3.

Synthesis of Intermediate L2-2

56 mL of tributylamine was mixed with 170 mL of diphenyl ether, and then 5 g (19.6 mmol) of Intermediate L2-3 with which 170 mL of diphenyl ether was mixed was slowly added dropwise thereto, and the mixture was stirred while heating for about 6 hours. When the reaction is complete, the reaction mixture was cooled at room temperature, and 300 mL of hexane was added thereto and stirred at room temperature for about 1 hour. A solid formed therefrom was filtered without a purification process to obtain 2.4 g (yield of 55%) of Intermediate L2-2.

LC-MS m/z=228 $(M+H)^+$

Synthesis of Intermediate L2-1

2.4 g (10.6 mmol) of Intermediate L2-2 was dissolved in 80 mL of $POCl_3$ and then stirred while heating for about 18 hours. When the reaction was completed, the reaction mixture was cooled, and then slowly added dropwise to 200 mL of cold water and neutralized with a saturated sodium hydrogen carbonate aqueous solution. An organic layer was extracted by adding dichloromethane thereto, the organic layer was separated, was dried over magnesium sulfate and then evaporated under reduced pressure, and purified by liquid chromatography to obtain 2.0 g (yield of 80%) of Intermediate L2-1.

LC-MS m/z=246 (M+H)$^+$

Synthesis of Intermediate L2

1.8 g (yield of 73%) of Intermediate L2 was obtained in the same manner as used to synthesize Intermediate L1 of Synthesis Example 1, except that Intermediate L2-1 was used instead of Intermediate L1-1.

LC-MS m/z=316 (M+H)$^+$

Synthesis of Intermediate L2 Dimer

Intermediate L2 Dimer was obtained in the same manner as used to synthesize Intermediate L1 Dimer of Synthesis Example 1, except that Intermediate L2 was used instead of Intermediate L1.

Synthesis of Compound 2

0.6 g (yield of 40%) of Compound 2 was obtained in the same manner as used to synthesize Compound 1 of Synthesis Example 1, except that Intermediate L2 Dimer was used instead of Intermediate L1 Dimer.

LC-MS m/z=1035 (M+H)$^+$

Synthesis Example 3 (Compound 3)

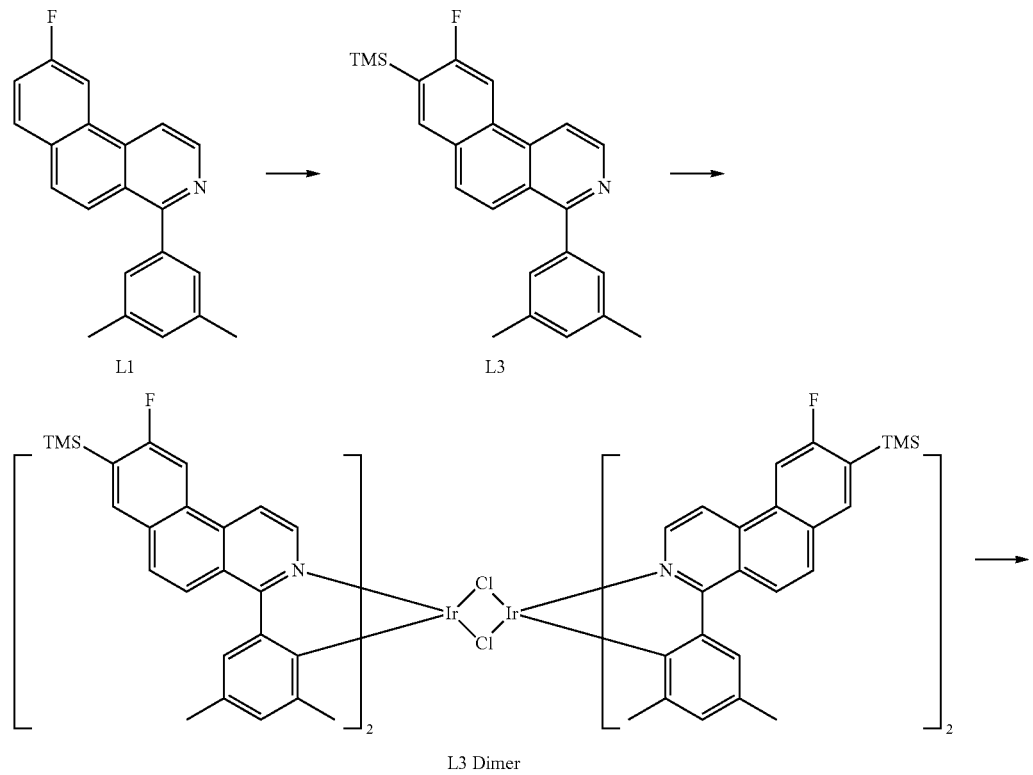

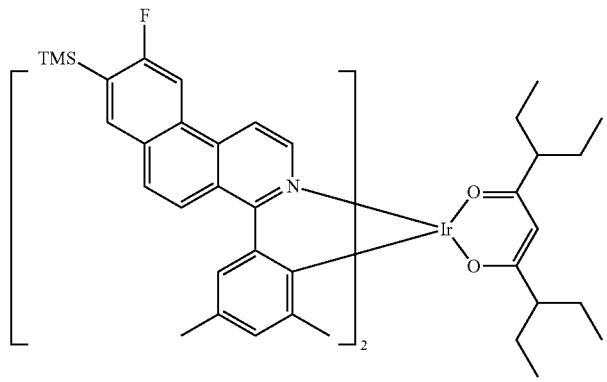

Synthesis of Intermediate L3

2.0 g (6.6 mmol) of Intermediate L1 was mixed with 80 mL of anhydrous tetrahydrofuran (THF), and then 4.6 mL (7.3 mmol) of 1.6 molar (M) butyl lithium (BuLi) solution in hexane was slowly added thereto at −78° C. After about 2 hours, 1.3 mL (9.9 mmol) of chlorotrimethylsilane was slowly added dropwise thereto and then stirred at room temperature for 18 hours. After the reaction was completed, an organic layer obtained by extraction with 60 mL of ethyl acetate and water was dried over magnesium sulfate and evaporated under reduced pressure. Purification by liquid chromatography was performed thereon to obtain 1.1 g (yield of 45%) of Intermediate L3.
LC-MS m/z=374 (M+H)$^+$

Synthesis of Intermediate L3 Dimer

Intermediate L3 Dimer was obtained in the same manner as used to synthesize Intermediate L1 Dimer of Synthesis Example 1, except that Intermediate L3 was used instead of Intermediate L1.

Synthesis of Compound 3

0.7 g (yield of 45%) of Compound 3 was obtained in the same manner as used to synthesize Compound 1 of Synthesis Example 1, except that Intermediate L3 Dimer was used instead of Intermediate L1 Dimer.
LC-MS m/z=1151 (M+H)$^+$

Synthesis Example 4 (Compound 4)

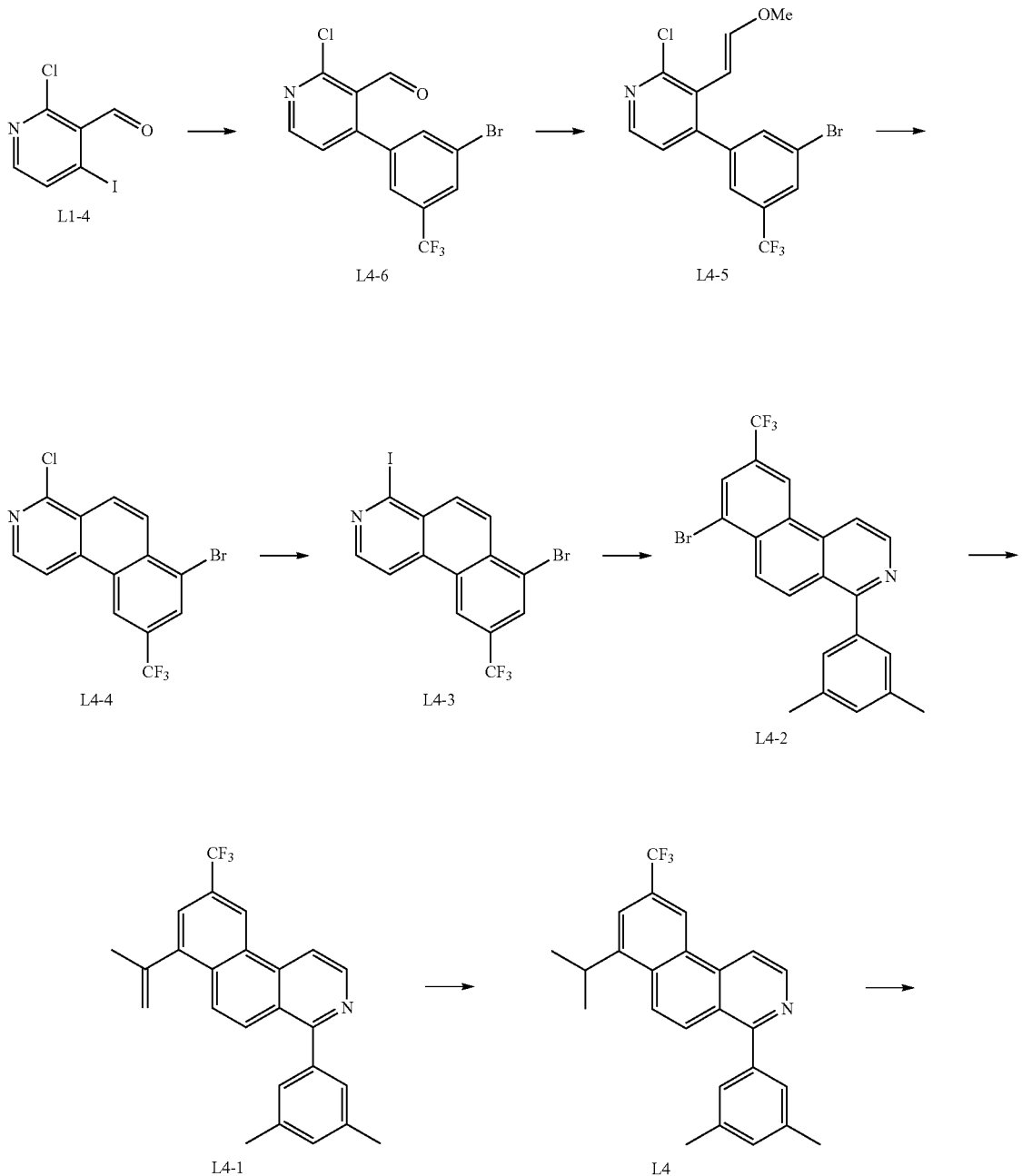

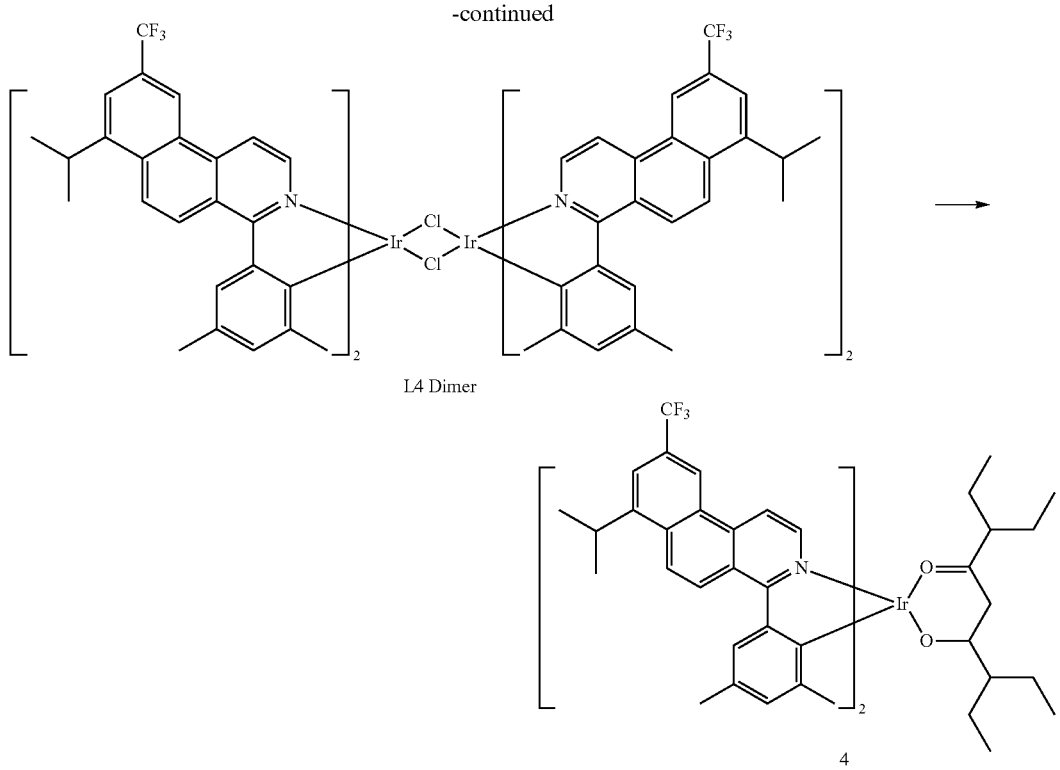

L4 Dimer

Synthesis of Intermediate L4-6

6.2 g (yield of 71%) of Intermediate L4-6 was obtained in the same manner as used to synthesize Intermediate L1-3 of Synthesis Example 1, except that (3-bromo-5-(trifluoromethyl)phenyl)boronic acid was used instead of 3-fluorophenylboronic acid.
LC-MS m/z=364 (M+H)$^+$

Synthesis of Intermediate L4-5

6.5 g (yield of 98%) of Intermediate L4-5 was obtained in the same manner as used to synthesize Intermediate L1-2 of Synthesis Example 1, except that Intermediate L4-6 was used instead of Intermediate L1-3.
LC-MS m/z=392 (M+H)$^+$

Synthesis of Intermediate L4-4

2.1 g (yield of 35%) of Intermediate L4-4 was obtained in the same manner as used to synthesize Intermediate L1-1 of Synthesis Example 1, except that Intermediate L4-5 was used instead of Intermediate L1-2.
LC-MS m/z=360 (M+H)$^+$

Synthesis of Intermediate L4-3

2.1 g (5.9 mmol) of Intermediate L4-4 was mixed with 120 mL of acetonitrile, and then 1.1 mL (8.9 mmol) of chlorotrimethylsilane and 1.3 g (8.9 mmol) of NaI were added thereto, and the mixture was heated at reflux at 90° C. for 36 hours. After the reaction was completed, an organic layer obtained by extraction with 60 mL of ethyl acetate and a saturated sodium thiosulfate aqueous solution was dried over magnesium sulfate and evaporated under reduced pressure. Purification by liquid chromatography was performed thereon to obtain 2.3 g (yield of 87%) of Intermediate L4-3.
LC-MS m/z=452 (M+H)$^+$

Synthesis of Intermediate L4-2

1.8 g (yield of 80%) of Intermediate L4-2 was obtained in the same manner as used to synthesize Intermediate L4 of Synthesis Example 1, except that Intermediate L4-3 was used instead of Intermediate L1-1.
LC-MS m/z=430 (M+H)$^+$

Synthesis of Intermediate L4-1

1.8 g (4.2 mmol) of Intermediate L4-2 was mixed with 60 mL of tetrahydrofuran (THF) and 15 mL of water, and 0.9 g (5.0 mmol) of 4,4,5,5-tetramethyl-2-(prop-1-en-2-yl)-1,3,2-dioxaborolane, 0.1 g (0.4 mmol) of Pd(OAc)$_2$, 0.3 g (0.8 mmol) of SPhos, and 1.5 g (10.5 mmol) of K$_2$CO$_3$ were added thereto, and the mixture was then heated at reflux at 80° C. for 18 hours. After the reaction is completed, an organic layer obtained by extracting the reaction mixture with 50 mL of ethyl acetate was dried over magnesium sulfate and evaporated under reduced pressure, and then purified by liquid chromatography to obtain 1.2 g (yield of 75%) of Intermediate L4-1.
LC-MS m/z=392 (M+H)$^+$

Synthesis of Intermediate L4

1.2 g (3.1 mmol) of Intermediate L4-1 was mixed with 60 mL of ethanol, and 0.1 g (10 wt %) of Pd/C was added thereto, and then hydrogen was injected thereto, which was then stirred at room temperature for 18 hours. After the reaction is completed, the reaction mixture was passed through a Celite pad and then concentrated under reduced pressure, and then purified by liquid chromatography to obtain 1.1 g (yield of 90%) of Intermediate L4.

LC-MS m/z=394 (M+H)$^+$

Synthesis of Intermediate L4 Dimer

Intermediate L4 Dimer was synthesized in the same manner as used to synthesize Intermediate L1 Dimer of Synthesis Example 1, except that Intermediate L4 was used instead of Intermediate L1.

Synthesis of Compound 4

0.6 g (yield of 38%) of Compound 4 was obtained in the same manner as used to synthesize Compound 1 of Synthesis Example 1, except that Intermediate L4 Dimer was used instead of Intermediate L1 Dimer.

LC-MS m/z=1191 (M+H)$^+$

Synthesis Example 5 (Compound 5)

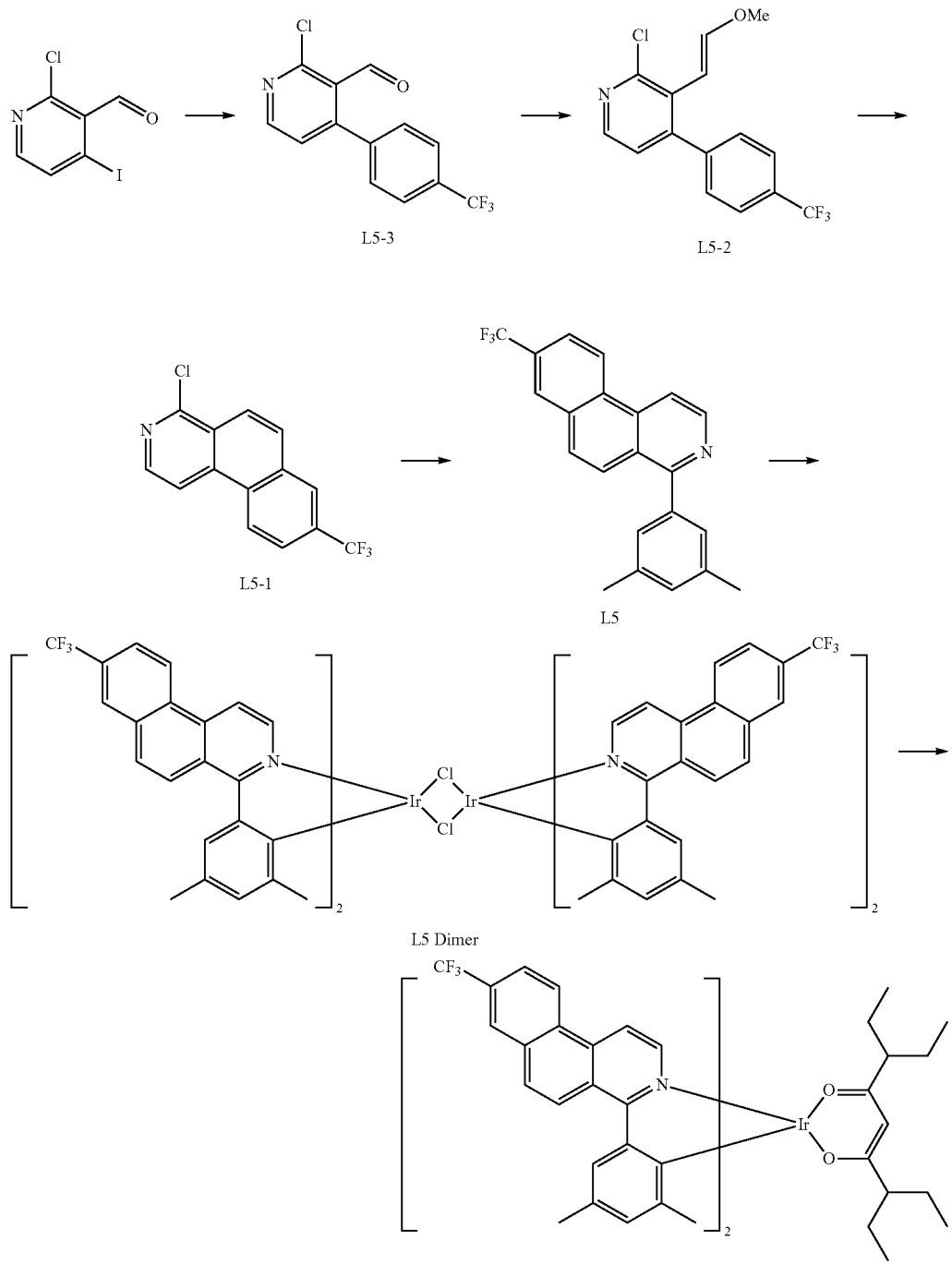

147

Synthesis of Intermediate L5-3

2.2 g (yield of 75%) of Intermediate L5-3 was obtained in the same manner as used to synthesize Intermediate L1-3 of Synthesis Example 1, except that 4-(trifluoromethyl)phenylboronic acid was used instead of 3-fluorophenylboronic acid.

LC-MS m/z=286 (M+H)$^+$

Synthesis of Intermediate L5-2

2.4 g (yield of 99%) of Intermediate L5-2 was obtained in the same manner as used to synthesize Intermediate L1-2 of Synthesis Example 1, except that Intermediate L5-3 was used instead of Intermediate L1-3.

LC-MS m/z=314 (M+H)$^+$

Synthesis of Intermediate L5-1

1.0 g (yield of 50%) of Intermediate L5-1 was obtained in the same manner as used to synthesize Intermediate L1-1 of Synthesis Example 1, except that Intermediate L5-2 was used instead of Intermediate L1-2, and trifluoromethanesulfonic acid was used instead of methanesulfonic acid.

LC-MS m/z=282 (M+H)$^+$

148

Synthesis of Intermediate L5

0.8 g (yield of 70%) of Intermediate L5 was obtained in the same manner as used to synthesize Intermediate L1 of Synthesis Example 1, except that Intermediate L5-1 was used instead of Intermediate L1-1.

LC-MS m/z=352 (M+H)$^+$

Synthesis of Intermediate L5 Dimer

Intermediate L5 Dimer was synthesized in the same manner as used to synthesize Intermediate L1 Dimer of Synthesis Example 1, except that Intermediate L5 was used instead of Intermediate L1.

Synthesis of Compound 5

0.3 g (yield of 40%) of Compound 5 was obtained in the same manner as used to synthesize Compound 1 of Synthesis Example 1, except that Intermediate L5 Dimer was used instead of Intermediate L1 Dimer.

LC-MS m/z=1107 (M+H)$^+$

Synthesis Example 6 (Compound 6)

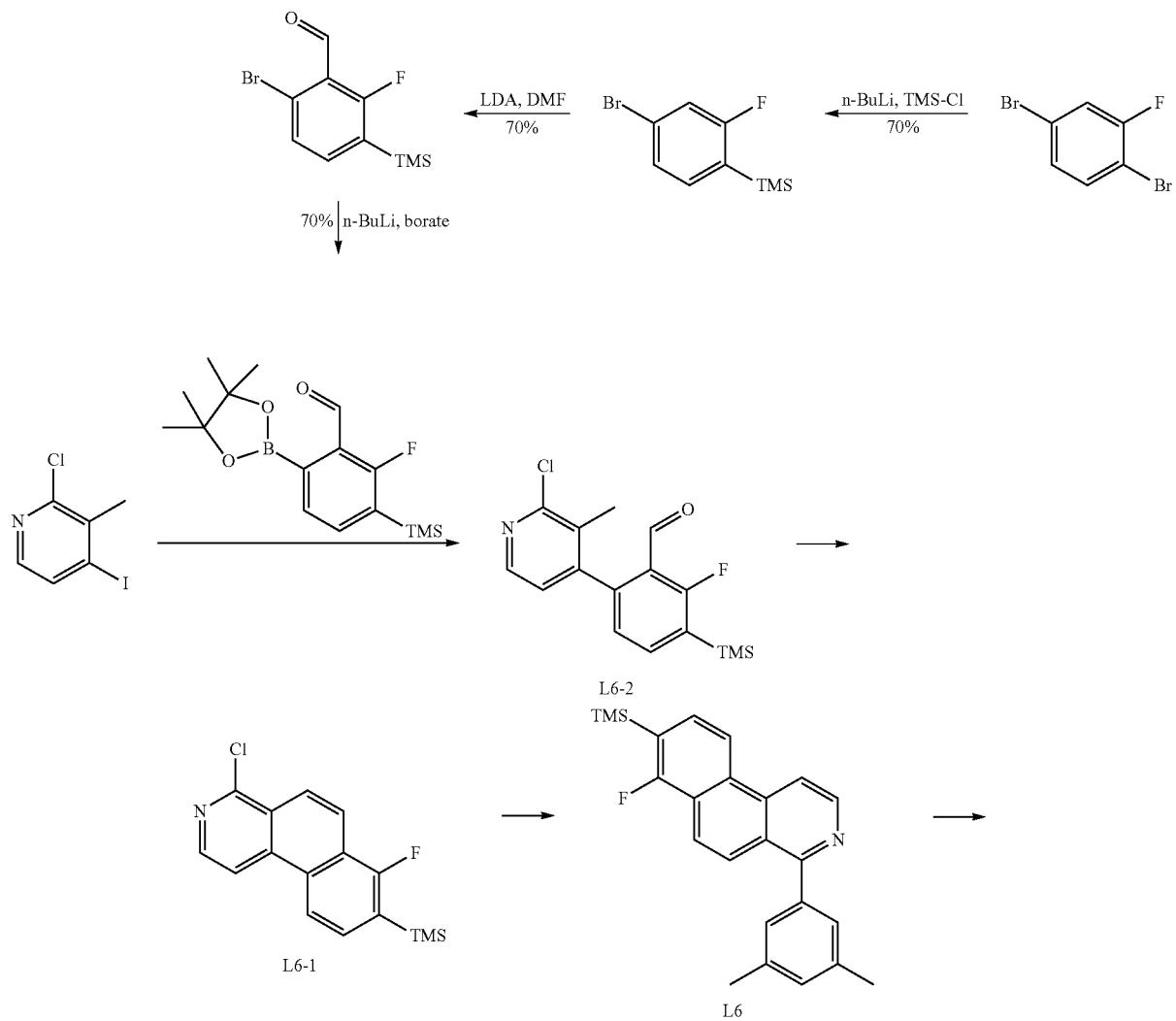

-continued

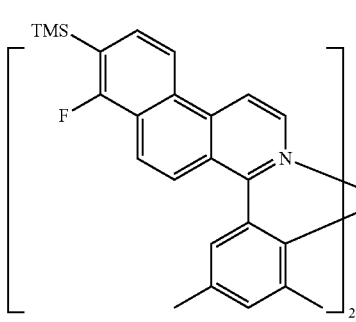
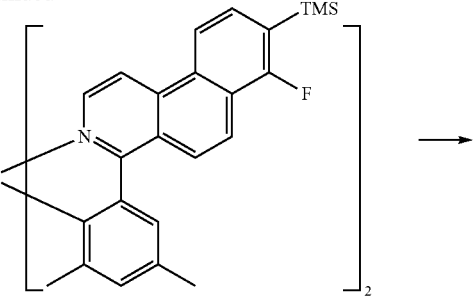

L6 Dimer

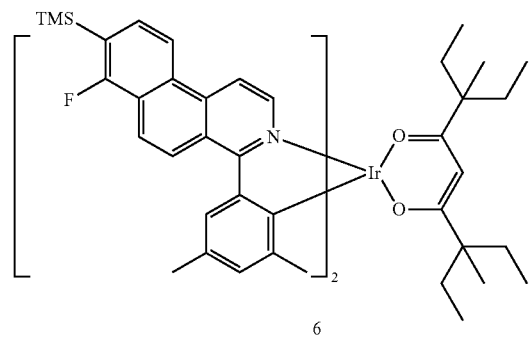

6

Synthesis of Intermediate L6-2

6.0 g (23.7 mmol) of 2-chloro-4-iodo-3-methylpyridine was mixed with 80 mL of acetonitrile and 20 mL of water, and 1.2 g (1.6 mmol) of $PdCl_2(PPh_3)_2$, 8.4 g (26.1 mmol) of 2-fluoro-6-(4,4,5,5-tetramethyl-1,3,2-dioxaborolan-2-yl)-3-(trimethylsilyl)benzaldehyde, and 8.2 g (59.2 mmol) of $K_2CO_3$ were added thereto, and the mixture was then heated at reflux at 85° C. for 18 hours. The resultant obtained therefrom was concentrated under reduced pressure, and ethyl acetate and water were added thereto. An organic layer extracted therefrom was dried over magnesium sulfate and then evaporated under reduced pressure, and then purified by liquid chromatography to obtain 6.1 g (yield of 80%) of Intermediate L6-2. 2-fluoro-6-(4,4,5,5-tetramethyl-1,3,2-dioxaborolan-2-yl)-3-(trimethylsilyl)benzaldehyde was synthesized according to the reaction scheme described above.

LC-MS m/z=322 (M+H)$^+$

Synthesis of Intermediate L6-1

1.7 g (yield of 30%) of Intermediate L6-1 was synthesized in the same manner as used to synthesize Intermediate 1-1 of Synthesis Example 1, except that Intermediate L6-2 was used instead of Intermediate L1-2.

LC-MS m/z=304 (M+H)$^+$

Synthesis of Intermediate L6

1.5 g (yield of 73%) of Intermediate L1 was synthesized in the same manner as used to synthesize Intermediate L1 of Synthesis Example 1, except that Intermediate L6-1 was used instead of Intermediate L1-1.

LC-MS m/z=374 (M+H)$^+$

Synthesis of Intermediate L6 Dimer

Intermediate L6 Dimer was synthesized in the same manner as used to synthesize Intermediate L1 Dimer of Synthesis Example 1, except that Intermediate L6 was used instead of Intermediate L1.

Synthesis of Compound 6

0.8 g (yield of 30%) of Compound 6 was obtained in the same manner as used to synthesize Compound 1 of Synthesis Example 1, except that Intermediate L6 Dimer was used instead of Intermediate L1 Dimer.

LC-MS m/z=1180 (M+H)$^+$

Synthesis Example 7 (Compound 7)

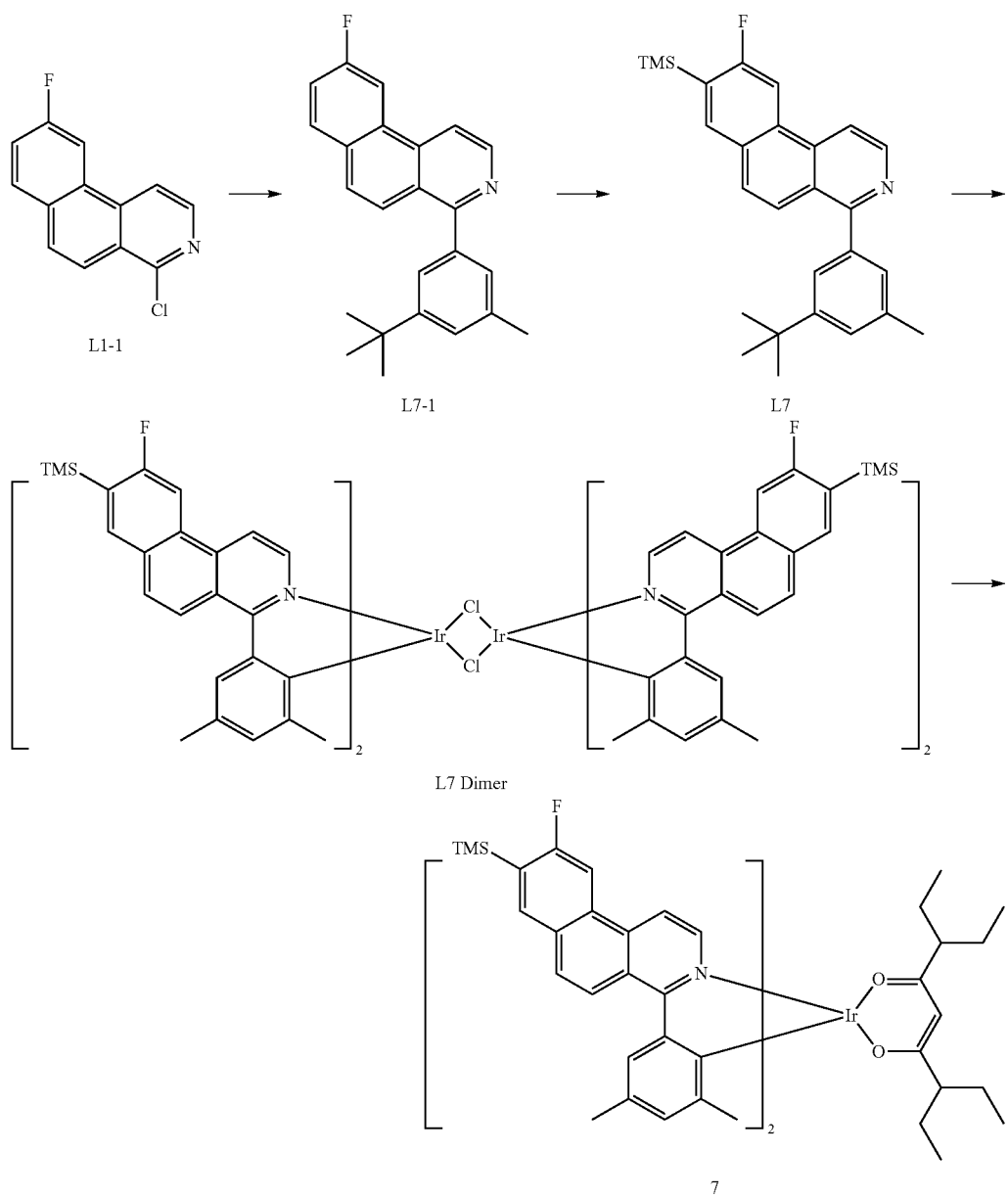

Synthesis of Intermediate L7-1

Intermediate L7-1 was synthesized in the same manner as used to synthesize Intermediate L1 of Synthesis Example 1, except that 2-(3-(tert-butyl)-5-methylphenyl)-4,4,5,5-tetramethyl-1,3,2-dioxaborolane was used instead of 3,5-dimethylphenylboronic acid.

LC-MS m/z=344 (M+H)$^+$

Synthesis of Intermediate L7

0.9 g (yield of 50%) of Intermediate L7 was synthesized in the same manner as used to synthesize Intermediate L3 of Synthesis Example 3, except that Intermediate L7-1 was used instead of Intermediate L1.

LC-MS m/z=416 (M+H)$^+$

Synthesis of Intermediate L7 Dimer

Intermediate L7 Dimer was obtained in the same manner as used to synthesize Intermediate L1 Dimer of Synthesis Example 1, except that Intermediate L7 was used instead of Intermediate L1.

Synthesis of Compound 7

0.3 g (yield of 35%) of Compound 7 was obtained in the same manner as used to synthesize Compound 1 of Synthesis Example 1, except that Intermediate L7 Dimer was used instead of Intermediate L1 Dimer.

LC-MS m/z=1235 (M+H)$^+$

Synthesis Example 8 (Compound 8)

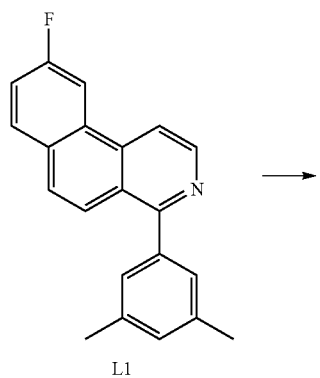
L1

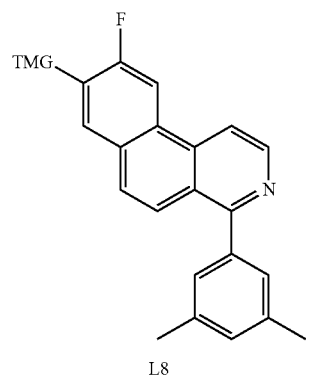
L8

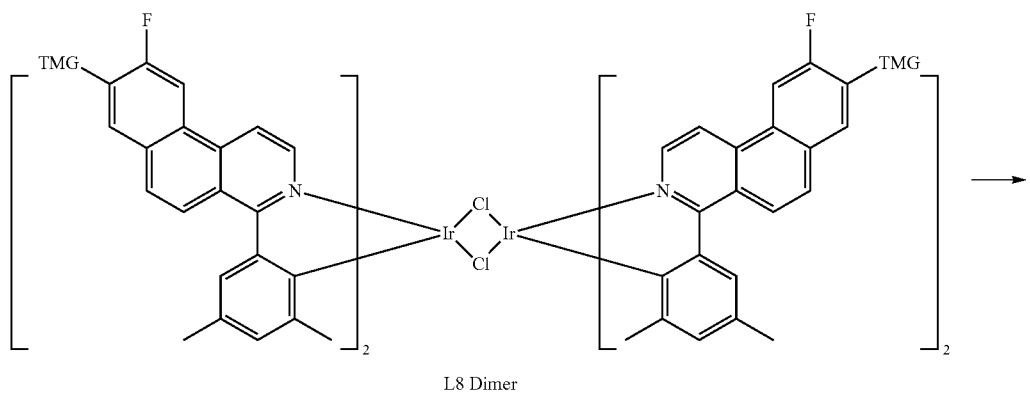
L8 Dimer

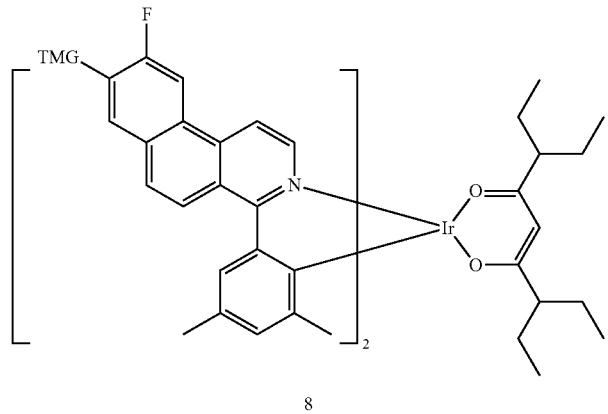
8

Synthesis of Intermediate L8

1.1 g (yield of 40%) of Intermediate L8 was synthesized in the same manner as used to synthesize Intermediate L3 of Synthesis Example 3, except that chlorotrimethylgermane was used instead of chlorotrimethylsilane.

LC-MS m/z=420 (M+H)$^+$

Synthesis of Intermediate L8 Dimer

Intermediate L8 Dimer was obtained in the same manner as used to synthesize Intermediate L1 Dimer of Synthesis Example 1, except that Intermediate L8 was used instead of Intermediate L1.

Synthesis of Compound 8

0.5 g (yield of 46%) of Compound 8 was obtained in the same manner as used to synthesize Compound 1 of Synthesis Example 1, except that Intermediate L8 Dimer was used instead of Intermediate L1 Dimer.

LC-MS m/z=1243 (M+H)$^+$

Synthesis Example 9 (Compound 9)
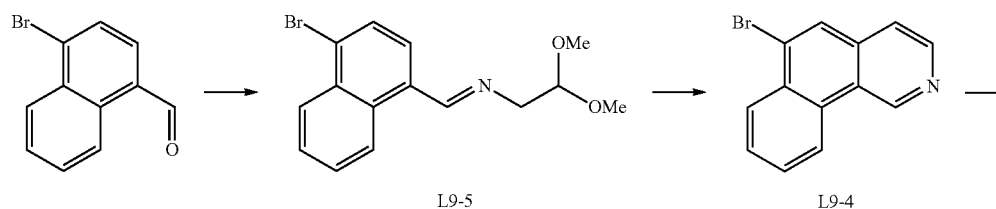
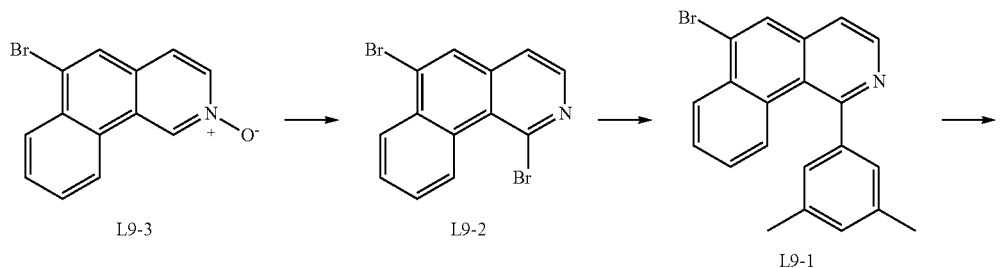
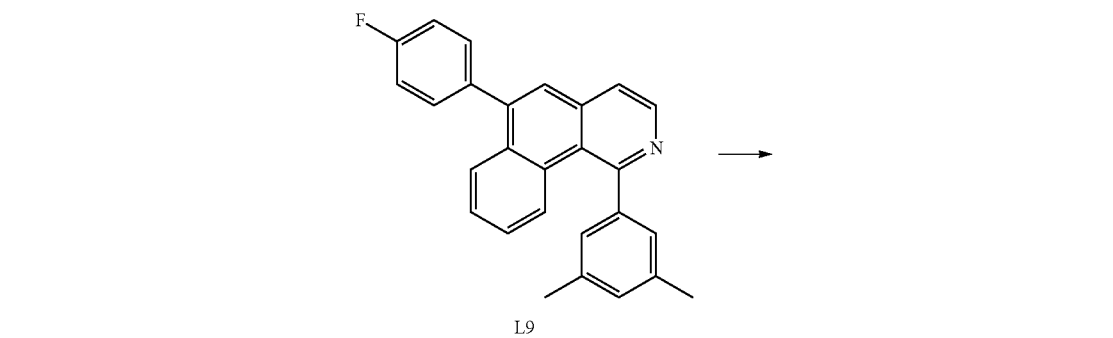
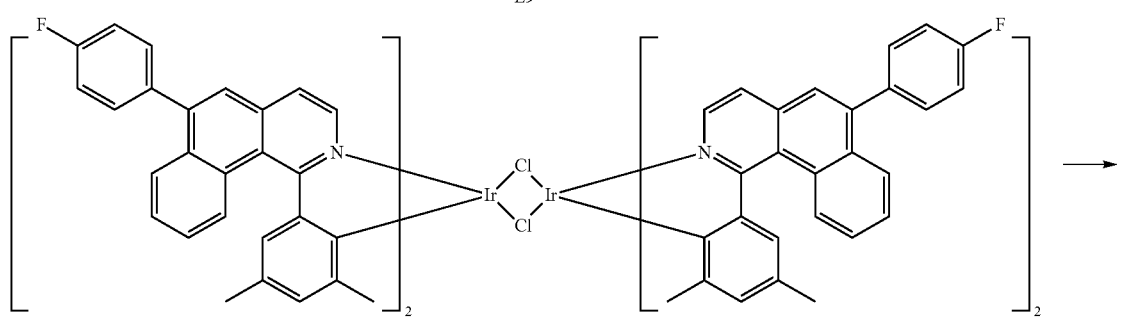
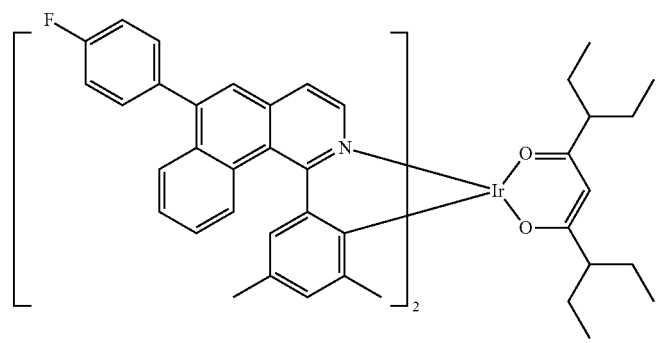

Synthesis of Intermediate L9-5

15 g (64 mmol) of 4-bromo-1-naphthaldehyde was mixed with 100 mL of chloroform, and 10 mL (96 mmol) of aminoacetaldehyde dimethyl acetal was slowly added thereto at room temperature and then stirred. After 1 hour, the mixture was heated at 100° C. and the solvent was removed therefrom to obtain the reaction mixture which was then cooled to room temperature, and then 20 g (yield of 99%) of Intermediate L9-5 was obtained without further purification.

LC-MS m/z=322 (M+H)$^+$

Synthesis of Intermediate L9-4

20 g (62 mmol) of Intermediate L9-5 was mixed with 100 mL of chloroform, and 6 mL (62 mmol) of chloroformate and 9 mL (74 mmol) of trimethylphosphite were sequentially and slowly added dropwise thereto at 0° C. The reaction mixture obtained therefrom was stirred at room temperature for about 48 hours, and 250 mL (250 mmol) of 1.0 M TiCl$_4$ was slowly added dropwise thereto at 0° C. and then the mixture was heated at reflux for about 48 hours. After the reaction was completed, the reaction mixture was cooled to room temperature, and then a water layer obtained by adding the reaction mixture to ice water was washed with dichloromethane and then added to 140 g (495 mmol) of a tartrate aqueous solution, neutralized with a saturated NaHCO$_3$ aqueous solution, and extracted with dichloromethane. An organic layer obtained therefrom was purified by liquid chromatography to obtain 5.4 g (yield of 34%) of Intermediate L9-4.

LC-MS m/z=258 (M+H)$^+$

Synthesis of Intermediate L9-3

5 g (19 mmol) of Intermediate L9-4 was mixed with 60 mL of dichloromethane, and then 6.7 g (38 mmol) of mCPBA was added dropwise thereto at 0° C. The reaction mixture was stirred at room temperature for about 18 hours and then extracted with a 6 N KOH aqueous solution. An organic layer obtained therefrom was dried over magnesium sulfate, and then 5.1 g (yield of 99%) of Intermediate L9-3 was obtained without further purification.

Synthesis of Intermediate L9-2

5 g (18 mmol) of Intermediate L9-3 was mixed with 60 mL of dichloromethane, and then 6.5 g (22 mmol) of POBr$_3$ was slowly added dropwise thereto at 0° C. Then, 0.8 mL (9 mmol) of DMF was slowly added thereto and then stirred at room temperature for about 18 hours. After the reaction is completed, the reaction mixture was neutralized with a saturated NaHCO$_3$ aqueous solution. An organic layer obtained therefrom was dried over magnesium sulfate and then purified by liquid chromatography to obtain 2.2 g (yield of 30%) of Intermediate L9-2.

LC-MS m/z=336 (M+H)$^+$

Synthesis of Intermediate L9-1

1.6 g (yield of 75%) of Intermediate L9-1 was synthesized in the same manner as used to synthesize Intermediate L1 of Synthesis Example 1, except that Intermediate L9-2 was used instead of Intermediate L1-1.

LC-MS m/z=362 (M+H)$^+$

Synthesis of Intermediate L9

1.5 g (4.1 mmol) of Intermediate L9-1 was mixed with 40 mL of tetrahydrofuran, and then 0.3 g (0.3 mmol) of Pd(PPh$_3$)$_4$, 0.7 g (4.9 mmol) of (4-fluorophenyl)boronic acid, 1.4 g (10.2 mmol) of K$_2$CO$_3$, and 10 mL of water were added thereto, and the mixture was heated at reflux at 80° C. for about 18 hours. After the reaction was completed, an organic layer obtained by extraction with ethyl acetate was dried over magnesium sulfate and then purified by liquid chromatography to obtain 1.2 g (yield of 82%) of Intermediate L9.

LC-MS m/z=378 (M+H)$^+$

Synthesis of Intermediate L9 Dimer

Intermediate L9 Dimer was obtained in the same manner as used to synthesize Intermediate L1 Dimer of Synthesis Example 1, except that Intermediate L9 was used instead of Intermediate L1.

Synthesis of Compound 9

0.7 g (yield of 47%) of Compound 9 was obtained in the same manner as used to synthesize Compound 1 of Synthesis Example 1, except that Intermediate L9 Dimer was used instead of Intermediate L1 Dimer.

LC-MS m/z=1159 (M+H)$^+$

Synthesis Example 10 (Compound 10)

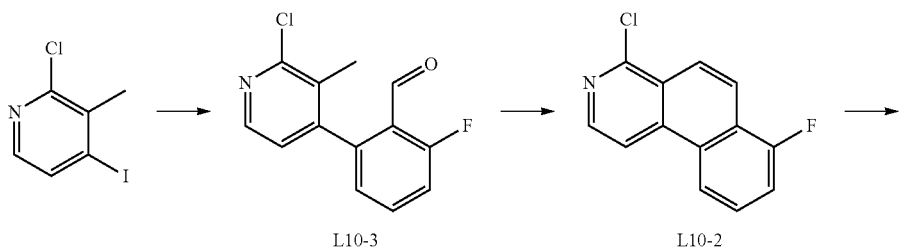

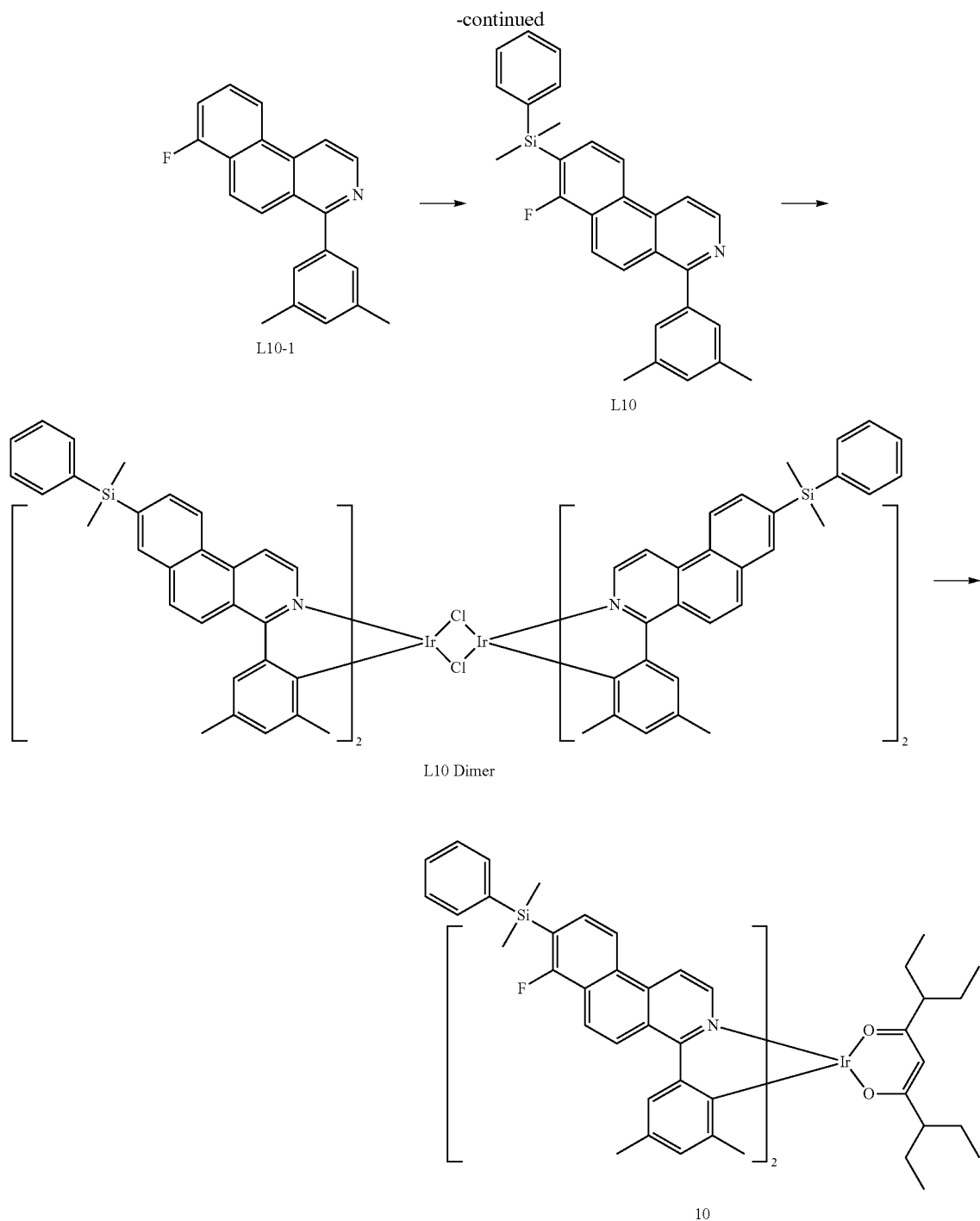

L10-1

L10

L10 Dimer

10

Synthesis of Intermediate L10-3

6.0 g (23.7 mmol) of 2-chloro-4-iodo-3-methylpyridine was mixed with 80 mL of acetonitrile and 20 mL of water, and 1.2 g (1.6 mmol) of $PdCl_2(PPh_3)_2$, 4.4 g (26.1 mmol) of 3-fluoro-2-formylphenyl)boronic acid, and 8.2 g (59.2 mmol) of $K_2CO_3$ were added thereto, and then the mixture was heated at reflux at 80° C. for 18 hours. The resultant obtained therefrom was concentrated under reduced pressure, and ethyl acetate and water were added thereto. An organic layer extracted therefrom was dried over magnesium sulfate and then evaporated under reduced pressure, and then purified by liquid chromatography to obtain 5.0 g (yield of 85%) of Intermediate L10-3.

LC-MS m/z=250 (M+H)$^+$

Synthesis of Intermediate L10-2

4.0 g (16.0 mmol) of Intermediate L10-3 was dissolved in 150 mL of anhydrous N,N-dimethylformamide, and 19 mL (19.2 mmol) of 1.0 M potassium tert-butoxide solution in THF was slowly added dropwise thereto at room temperature and then heated at 80° C. for 6 hours. After the reaction was completed, an organic layer obtained by extraction with ethyl acetate and water was dried over magnesium sulfate. After the reaction mixture was filtered and concentrated under reduced pressure, purification by liquid chromatography was performed thereon to obtain 1.3 g (yield of 35%) of Intermediate L10-2.

LC-MS m/z=232 (M+H)⁺

Synthesis of Intermediate L10-1

1.2 g (yield of 70%) of Intermediate L10-1 was synthesized in the same manner as used to synthesize Intermediate L1 of Synthesis Example 1, except that Intermediate L10-2 was used instead of Intermediate L1-1.

LC-MS m/z=302 (M+H)⁺

Synthesis of Intermediate L10

0.8 g (yield of 46%) of Intermediate L10 was synthesized in the same manner as used to synthesize Intermediate L3 of Synthesis Example 3, except that chlorodimethylphenylsilane was used instead of chlorotrimethylsilane.

LC-MS m/z=436 (M+H)⁺

Synthesis of Intermediate L10 Dimer

Intermediate L10 Dimer was obtained in the same manner as used to synthesize Intermediate L1 Dimer of Synthesis Example 1, except that Intermediate L10 was used instead of Intermediate L1.

Synthesis of Compound 10

0.35 g (yield of 42%) of Compound 10 was obtained in the same manner as used to synthesize Compound 1 of Synthesis Example 1, except that Intermediate L10 Dimer was used instead of Intermediate L1 Dimer.

LC-MS m/z=1276 (M+H)⁺

Synthesis Example 11 (Compound 11)

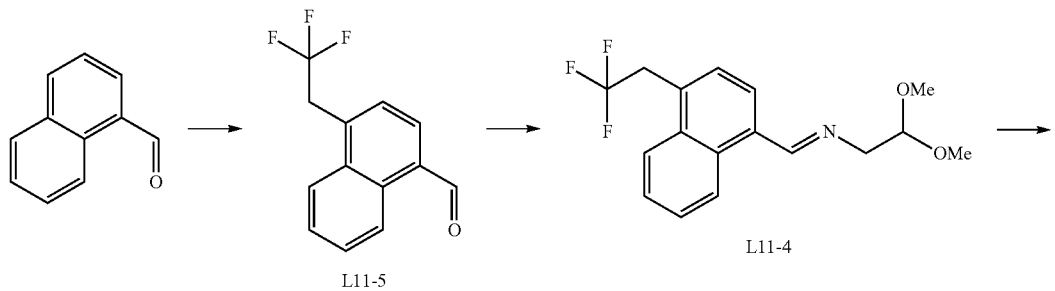

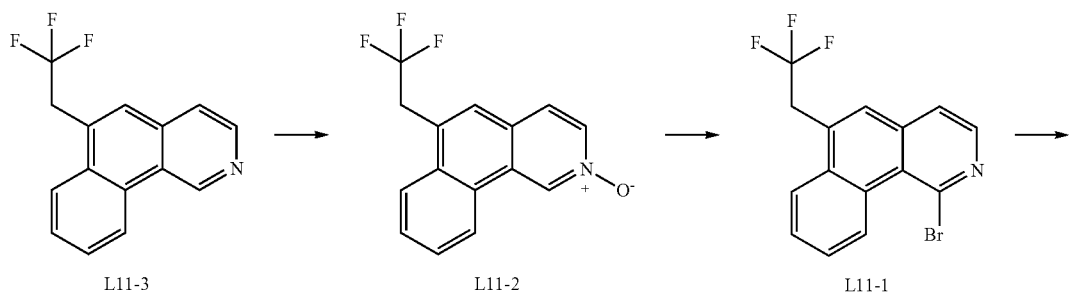

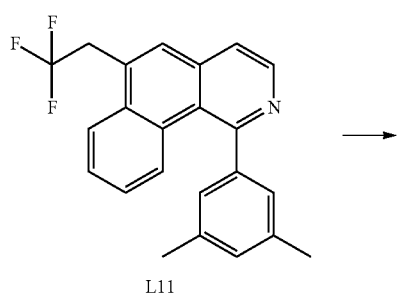

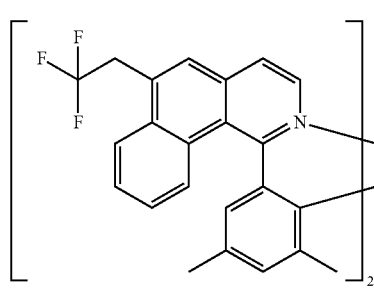
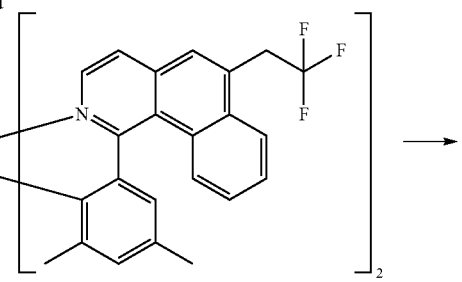

L11 Dimer

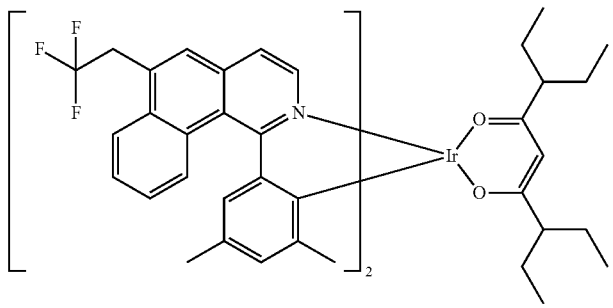

11

Synthesis of Intermediate L11-5

5.0 g (32.0 mmol) of 1-naphthaldehyde was dissolved in 60 mL of anisole, and then 2.6 g (2.24 mmol) of Pd(PPh$_3$)$_4$, 1.7 g (3.2 mmol) of bis[(2-diphenylphosphino)phenyl]ether (DPEPhos), 11 g (80 mmol) of K$_3$PO$_4$, 10.6 ml (64 mmol) of 1,1,1-trifluoro-2-iodoethane, and 20 mL of water were added thereto, and then the resulting mixture was heated at 130° C. for 24 hours. When the reaction was completed, the reaction mixture was neutralized with 1 N HCl, and then ethyl acetate was added thereto to extract an organic layer which was then dried over magnesium sulfate. The reaction mixture obtained therefrom was evaporated under reduced pressure and then purified by liquid chromatography to obtain 3.9 g (yield of 52%) of Intermediate L11-5.

LC-MS m/z=239 (M+H)$^+$

Synthesis of Intermediate L11-4

3.8 g (yield of 73%) of Intermediate L11-4 was synthesized in the same manner as used to synthesize Intermediate L9-5 of Synthesis Example 9, except that Intermediate L11-5 was used instead of 4-bromo-1-naphthaldehyde.

LC-MS m/z=326 (M+H)$^+$

Synthesis of Intermediate L11-3

0.9 g (yield of 28%) of Intermediate L11-3 was synthesized in the same manner as used to synthesize Intermediate L9-4 of Synthesis Example 9, except that Intermediate L11-4 was used instead of Intermediate L9-5.

LC-MS m/z=262 (M+H)$^+$

Synthesis of Intermediate L11-2

0.9 g (yield of 99%) of Intermediate L11-2 was synthesized in the same manner as used to synthesize Intermediate L9-3 of Synthesis Example 9, except that Intermediate L11-3 was used instead of Intermediate L9-4.

Synthesis of Intermediate L11-1

0.7 g (yield of 63%) of Intermediate L11-1 was synthesized in the same manner as used to synthesize Intermediate L9-3 of Synthesis Example 9, except that Intermediate L11-2 was used instead of Intermediate L9-3.

LC-MS m/z=341 (M+H)$^+$

Synthesis of Intermediate L11

0.6 g (yield of 85%) of Intermediate L11 was synthesized in the same manner as used to synthesize Intermediate L1 of Synthesis Example 1, except that Intermediate L11-1 was used instead of Intermediate L1-1.

LC-MS m/z=366 (M+H)$^+$

Synthesis of Intermediate L11 Dimer

Intermediate L11 Dimer was obtained in the same manner as used to synthesize Intermediate L1 Dimer of Synthesis Example 1, except that Intermediate L11 was used instead of Intermediate L1.

Synthesis of Compound 11

0.25 g (yield of 40%) of Compound 11 was obtained in the same manner as used to synthesize Compound 1 of Synthesis Example 1, except that Intermediate L11 Dimer was used instead of Intermediate L1 Dimer.

LC-MS m/z=1135 (M+H)$^+$

Synthesis Example 12 (Compound 12)

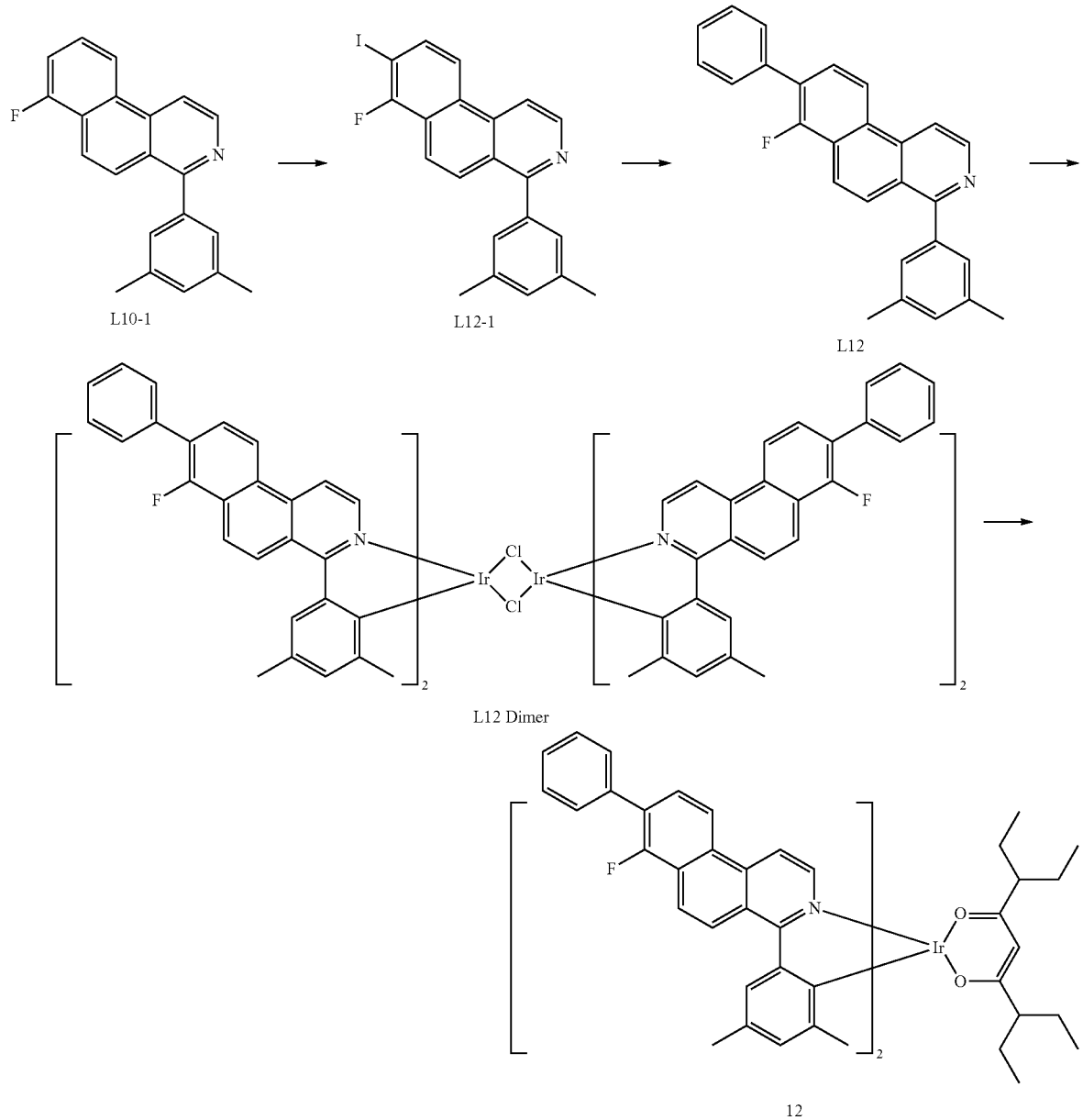

Synthesis of Intermediate L12-1

1.4 g (yield of 50%) of Intermediate L12-1 was synthesized in the same manner as used to synthesize Intermediate L10 of Synthesis Example 10, except that iodine was used instead of chlorodimethylphenylsilane.

LC-MS m/z=428 (M+H)$^+$

Synthesis of Intermediate L12

1.2 g (2.8 mmol) of Intermediate L12-1 was mixed with 40 mL of tetrahydrofuran (THF) and 10 mL of water, and 0.4 g (3.4 mmol) of phenylboronic acid, 0.2 g (0.2 mmol) of Pd(PPh$_3$)$_4$, and 1.0 g (7.0 mmol) of K$_2$CO$_3$ were added thereto, and then the resulting mixture was heated at reflux 85° C. for 18 hours. After the reaction was completed, an organic layer obtained by extracting the reaction mixture with 30 mL of ethyl acetate was dried over magnesium sulfate and evaporated under reduced pressure, and then purified by liquid chromatography to obtain 0.8 g (yield of 78%) of Intermediate L12.

LC-MS m/z=378 (M+H)$^+$

Synthesis of Intermediate L12 Dimer

Intermediate L12 Dimer was obtained in the same manner as used to synthesize Intermediate L1 Dimer of Synthesis Example 1, except that Intermediate L12 was used instead of Intermediate L1.

Synthesis of Compound 12
0.3 g (yield of 40%) of Compound 12 was obtained in the same manner as used to synthesize Compound 1 of Synthesis Example 1, except that Intermediate L12 Dimer was used instead of Intermediate L1 Dimer.
LC-MS m/z=1159 (M+H)$^+$
Synthesis Example 13 (Compound 13)
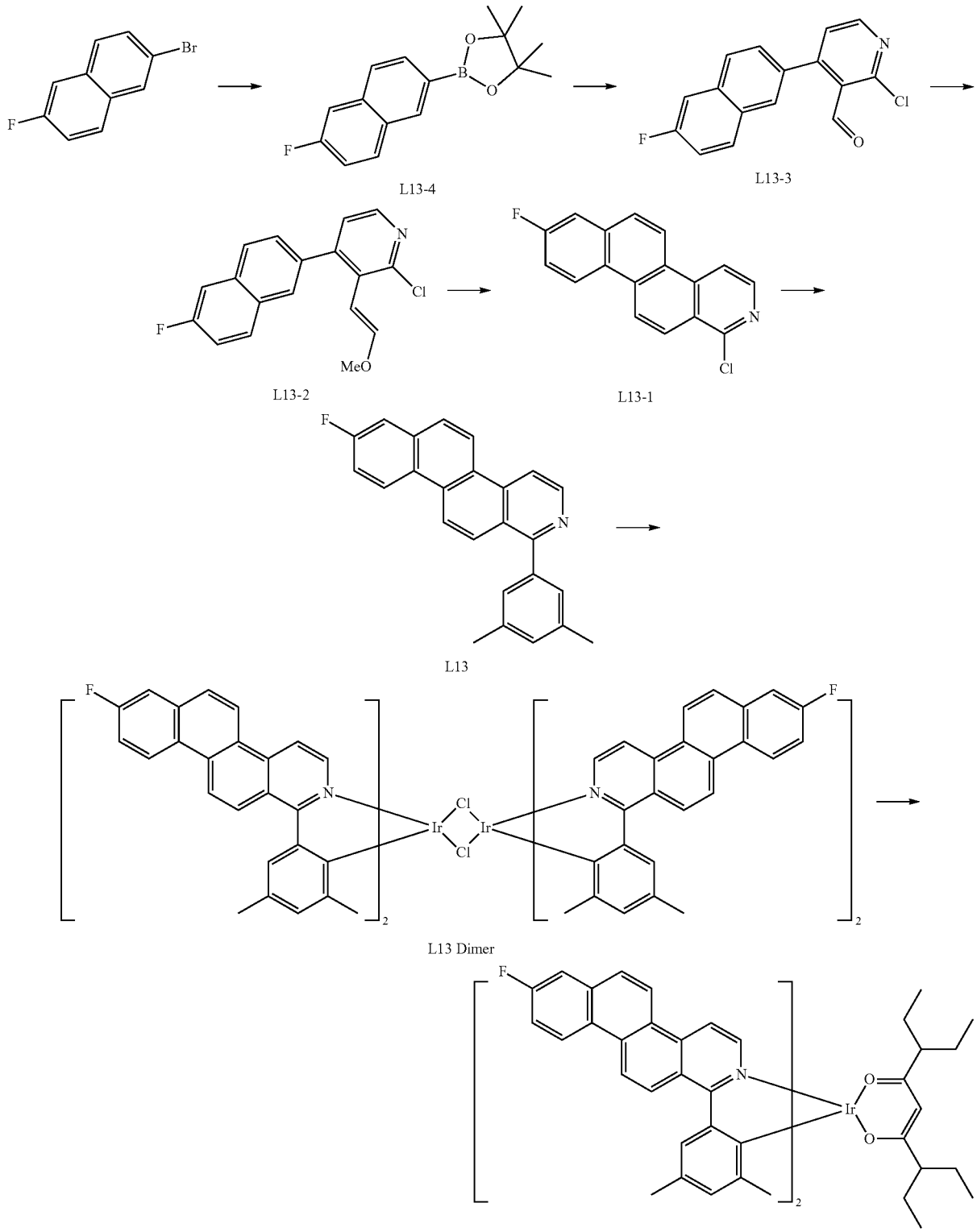

Synthesis of Intermediate L13-4

5.0 g (22.2 mmol) of 2-bromo-6-fluoronaphthalene was dissolved in 60 mL of anhydrous tetrahydrofuran (THF), and then 15 mL (24.4 mmol) of 1.6 M BuLi solution in hexane was slowly added thereto at −78° C. After about 2 hours, 5.4 mL (26.6 mmol) of 2-isopropoxy-4,4,5,5-tetramethyl-1,3,2-dioxaborolane was slowly added dropwise thereto and stirred at room temperature for 18 hours. After the reaction is completed, an organic layer obtained by extraction with 30 mL of ethyl acetate and water was dried over magnesium sulfate and evaporated under reduced pressure. Purification by liquid chromatography was performed thereon to obtain 5.1 g (yield of 85%) of Intermediate L13-4.

LC-MS m/z=273 (M+H)$^+$

Synthesis of Intermediate L13-3

5.1 g (18.7 mmol) of Intermediate L13-4 was mixed with 120 mL of acetonitrile and 30 mL of water, and 0.9 g (1.3 mmol) of PdC$_2$(PPh$_3$)$_2$, 5.0 g (18.7 mmol) of 2-chloro-4-iodonicotinaldehyde, and 6.5 g (46.8 mmol) of K$_2$CO$_3$ were added thereto, and then the resulting mixture was heated at reflux while heating at 80° C. for 24 hours. The resultant obtained therefrom was concentrated under reduced pressure, and dichloromethane and water were added thereto. An organic layer extracted therefrom was dried over magnesium sulfate and then evaporated under reduced pressure, and then purified by liquid chromatography to obtain 4.4 g (yield of 82%) of Intermediate L13-3.

LC-MS m/z=286 (M+H)$^+$

Synthesis of Intermediate L13-2

12.0 g (35.0 mmol) of (methoxymethyl)triphenylphosphonium chloride was mixed with 150 mL of anhydrous ether, and 35 mL of 1.0 M potassium tert-butoxide solution was added dropwise thereto and then stirred at room temperature for about 2 hours. Thereafter, 4.0 g (14.0 mmol) of Intermediate L13-3 mixed with 60 mL of anhydrous THF was slowly added dropwise thereto and stirred for 18 hours at room temperature. Water and ethyl acetate were added to the resultant obtained therefrom. An organic layer extracted therefrom was dried over magnesium sulfate and then evaporated under reduced pressure, and then purified by liquid chromatography to obtain 4.2 g (yield of 95%) of Intermediate L13-2.

LC-MS m/z=314 (M+H)$^+$

Synthesis of Intermediate L13-1

4.0 g (12.7 mmol) of Intermediate L13-2 was mixed with 250 mL of chloroform, and 5.6 mL (63.5 mmol) of triflic acid was slowly added dropwise thereto and then stirred at 60° C. for about 4 hours. A saturated sodium hydrogen carbonate aqueous solution was added to the resultant obtained therefrom. An organic layer extracted therefrom was dried over magnesium sulfate and then evaporated under reduced pressure, and then purified by liquid chromatography to obtain 1.0 g (yield of 28%) of Intermediate L13-1.

LC-MS m/z=282 (M+H)$^+$

Synthesis of Intermediate L13

1.0 g (yield of 82%) of Intermediate L13 was synthesized in the same manner as used to synthesize Intermediate L1 of Synthesis Example 1, except that Intermediate L13-1 was used instead of Intermediate L1-1.

LC-MS m/z=352 (M+H)$^+$

Synthesis of Intermediate L13 Dimer

Intermediate L13 Dimer was obtained in the same manner as used to synthesize Intermediate L1 Dimer of Synthesis Example 1, except that Intermediate L13 was used instead of Intermediate L1.

Synthesis of Compound 13

0.5 g (yield of 46%) of Compound 13 was obtained in the same manner as used to synthesize Compound 1 of Synthesis Example 1, except that Intermediate L13 Dimer was used instead of Intermediate L1 Dimer.

LC-MS m/z=1107 (M+H)$^+$

Synthesis Example 14 (Compound 14)

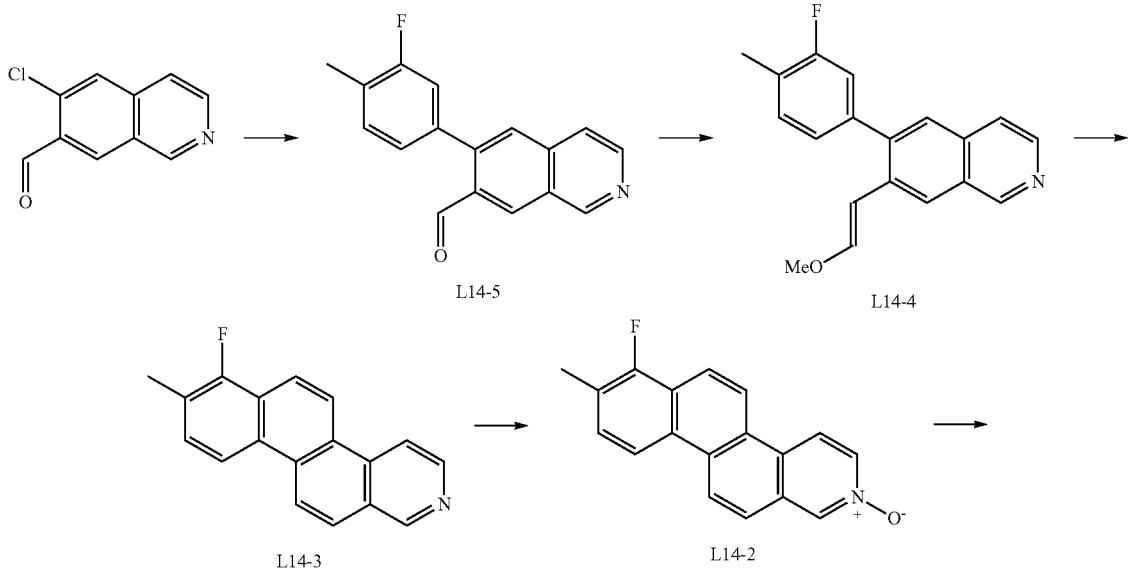

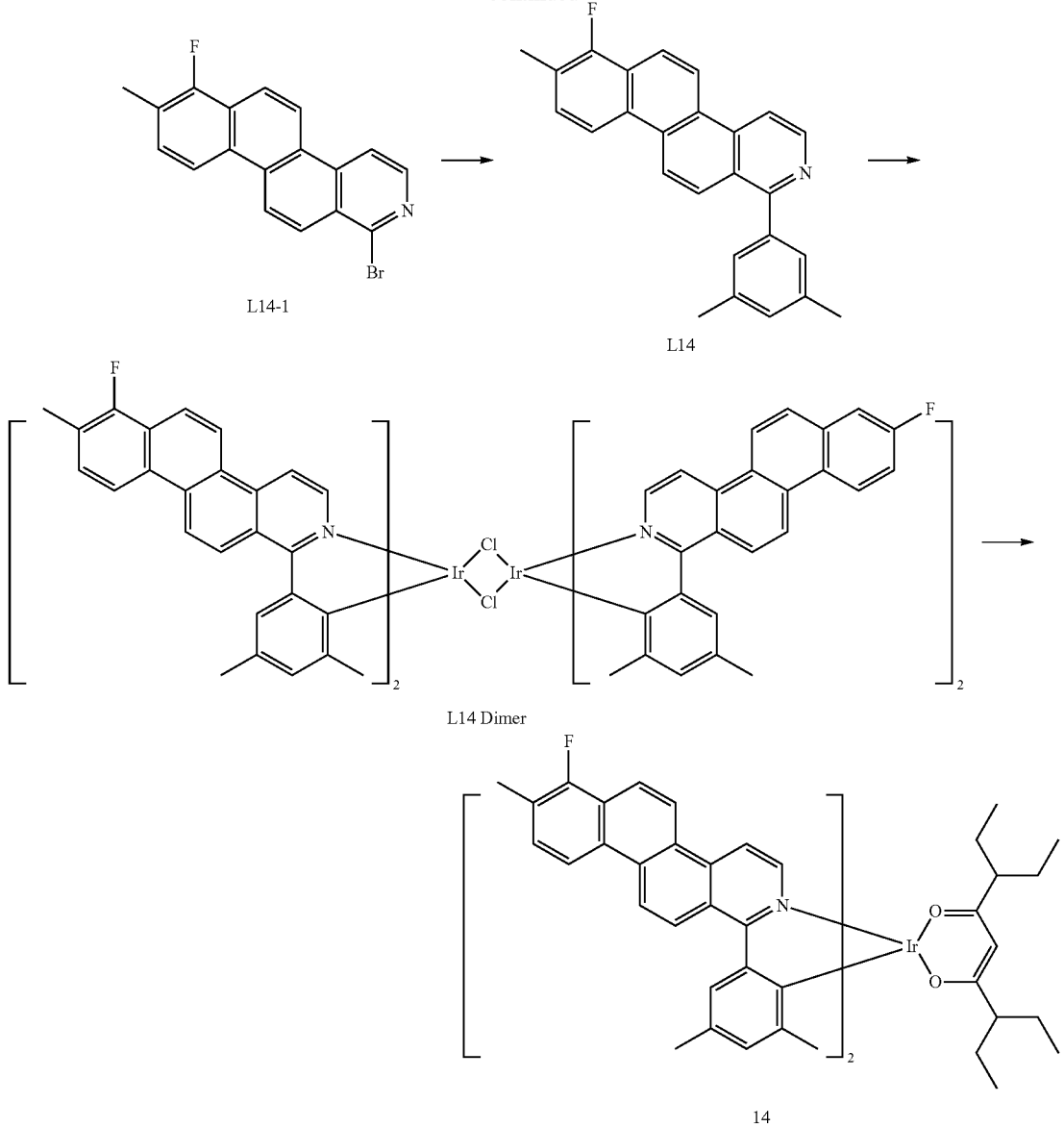

Synthesis of Intermediate L14-5

4.0 g (20.9 mmol) of 6-chloroisoquinoline-7-carbaldehyde was mixed with 80 mL of tetrahydrofuran and 20 mL of water, and 1.6 g (1.4 mmol) of Pd(PPh$_3$)$_4$, 3.9 g (25.1 mmol) of (3-fluoro-4-methylphenyl)boronic acid, and 7.2 g (52.3 mmol) of K$_2$CO$_3$ were added thereto and then heated at reflux while heating for 18 hours. The resultant obtained therefrom was concentrated under reduced pressure and dissolved in dichloromethane, and water was added thereto. An organic layer extracted therefrom was dried over magnesium sulfate and then evaporated under reduced pressure, and then purified by liquid chromatography to obtain 4.4 g (yield of 80%) of Intermediate L14-5.

LC-MS m/z=266 (M+H)$^+$

Synthesis of Intermediate L14-4

4.4 g (yield of 95%) of Intermediate L14-4 was obtained in the same manner as used to synthesize Intermediate L1-2 of Synthesis Example 1, except that Intermediate L14-5 was used instead of Intermediate L1-3.

LC-MS m/z=294 (M+H)$^+$

Synthesis of Intermediate L14-3

1.9 g (yield of 52%) of Intermediate L14-3 was obtained in the same manner as used to synthesize Intermediate L13-1 of Synthesis Example 13, except that Intermediate L14-4 was used instead of Intermediate L13-2.

LC-MS m/z=262 (M+H)$^+$

Synthesis of Intermediate L14-2

0.9 g (yield of 99%) of Intermediate L14-2 was synthesized in the same manner as used to synthesize Intermediate L9-3 of Synthesis Example 9, except that Intermediate L14-3 was used instead of Intermediate L9-4.

Synthesis of Intermediate L14-1

1.3 g (yield of 55%) of Intermediate L14-1 was synthesized in the same manner as used to synthesize Intermediate L9-2 of Synthesis Example 9, except that Intermediate L14-2 was used instead of Intermediate L9-3.

LC-MS m/z=341 (M+H)$^+$

Synthesis of Intermediate L14

1.1 g (yield of 80%) of Intermediate L14 was synthesized in the same manner as used to synthesize Intermediate L1 of Synthesis Example 1, except that Intermediate L14-1 was used instead of Intermediate L1-1.

LC-MS m/z=366 (M+H)$^+$

Synthesis of Intermediate L14 Dimer

Intermediate L14 Dimer was obtained in the same manner as used to synthesize Intermediate L1 Dimer of Synthesis Example 1, except that Intermediate L14 was used instead of Intermediate L1.

Synthesis of Compound 14

0.6 g (yield of 40%) of Compound 14 was obtained in the same manner as used to synthesize Compound 1 of Synthesis Example 1, except that Intermediate L14 Dimer was used instead of Intermediate L1 Dimer.

LC-MS m/z=1135 (M+H)$^+$

Synthesis Example 15 (Compound 15)

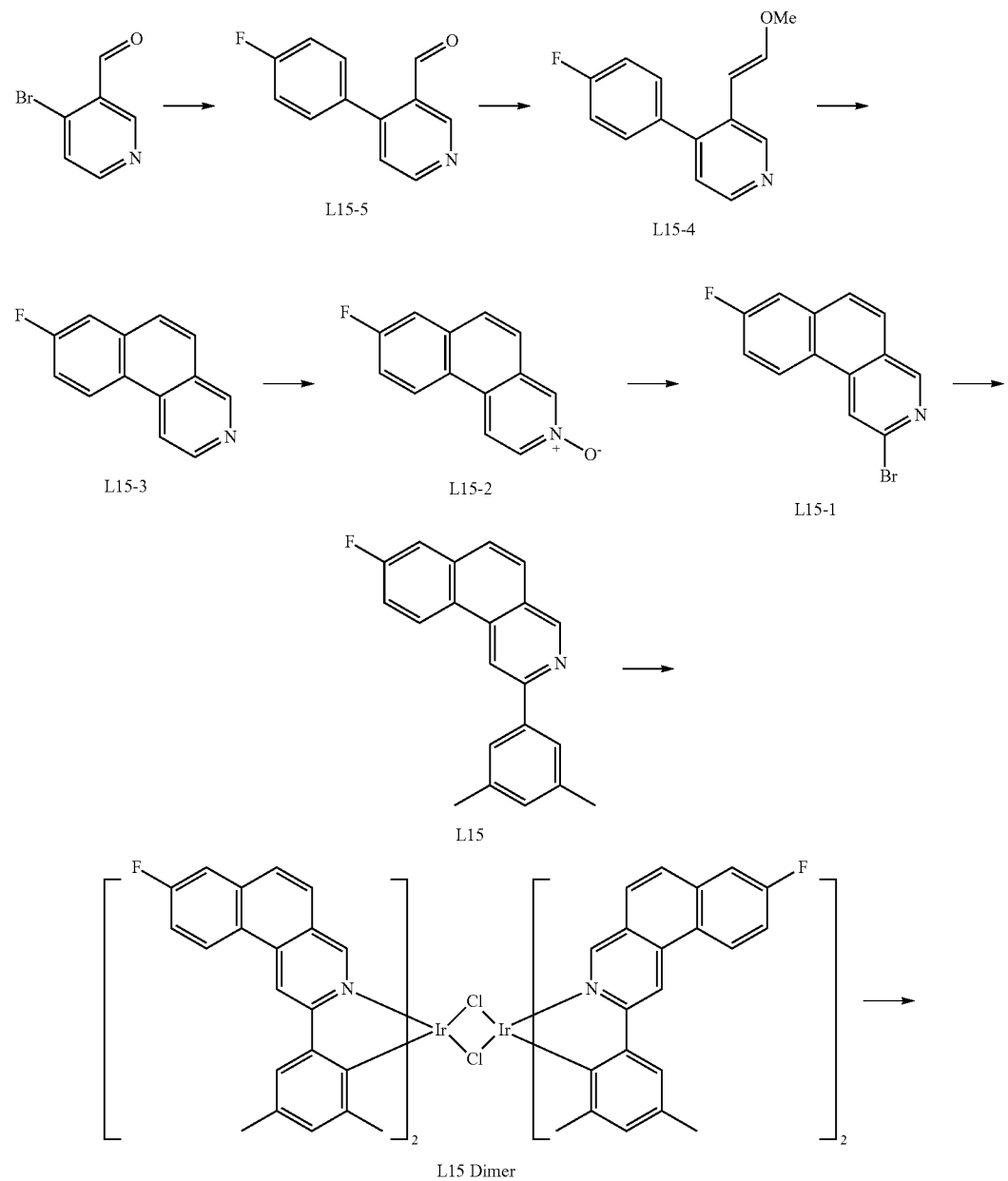

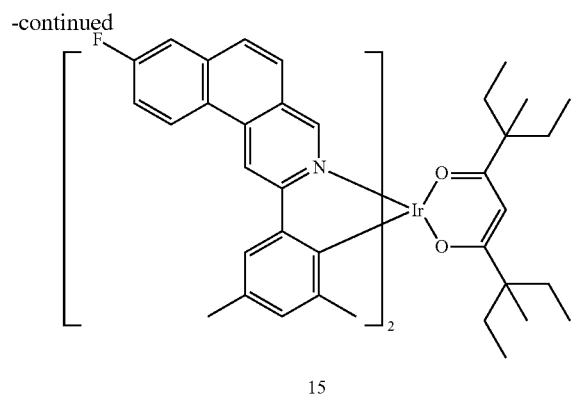

15

Synthesis of Intermediate L15-5

2.8 g (yield of 85%) of Intermediate L15-5 was synthesized in the same manner as used to synthesize Intermediate L14-5 of Synthesis Example 14, except that 4-bromonicotinaldehyde was used instead of 6-chloroisoquinoline-7-carbaldehyde.

LC-MS m/z=202 (M+H)$^+$

Synthesis of Intermediate L15-4

3.0 g (yield of 95%) of Intermediate L15-4 was obtained in the same manner as used to synthesize Intermediate L1-2 of Synthesis Example 1, except that Intermediate L15-5 was used instead of Intermediate L1-3.

LC-MS m/z=230 (M+H)$^+$

Synthesis of Intermediate L15-3

0.9 g (yield of 35%) of Intermediate L15-3 was obtained in the same manner as used to synthesize Intermediate L13-1 of Synthesis Example 13, except that Intermediate L15-4 was used instead of Intermediate L13-2.

LC-MS m/z=198 (M+H)$^+$

Synthesis of Intermediate L15-2

0.9 g (yield of 99%) of Intermediate L15-2 was synthesized in the same manner as used to synthesize Intermediate L9-3 of Synthesis Example 9, except that Intermediate L15-3 was used instead of Intermediate L9-4.

Synthesis of Intermediate L15-1

0.8 g (yield of 70%) of Intermediate L15-1 was synthesized in the same manner as used to synthesize Intermediate L9-2 of Synthesis Example 9, except that Intermediate L15-2 was used instead of Intermediate L9-3.

LC-MS m/z=276 (M+H)$^+$

Synthesis of Intermediate L15

0.7 g (yield of 85%) of Intermediate L15 was synthesized in the same manner as used to synthesize Intermediate L1 of Synthesis Example 1, except that Intermediate L15-1 was used instead of Intermediate L1-1.

LC-MS m/z=302 (M+H)$^+$

Synthesis of Intermediate L15 Dimer

Intermediate L15 Dimer was obtained in the same manner as used to synthesize Intermediate L1 Dimer of Synthesis Example 1, except that Intermediate L15 was used instead of Intermediate L1.

Synthesis of Compound 15

0.2 g (yield of 40%) of Compound 15 was obtained in the same manner as used to synthesize Compound 1 of Synthesis Example 1, except that Intermediate L15 Dimer was used instead of Intermediate L1 Dimer.

LC-MS m/z=1035 (M+H)$^+$

Synthesis Example 16 (Compound 16)

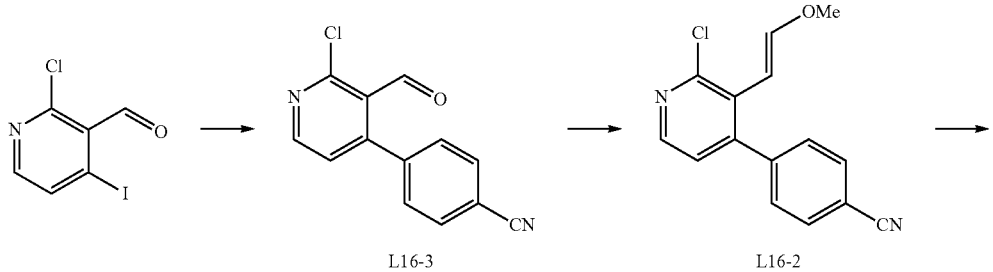

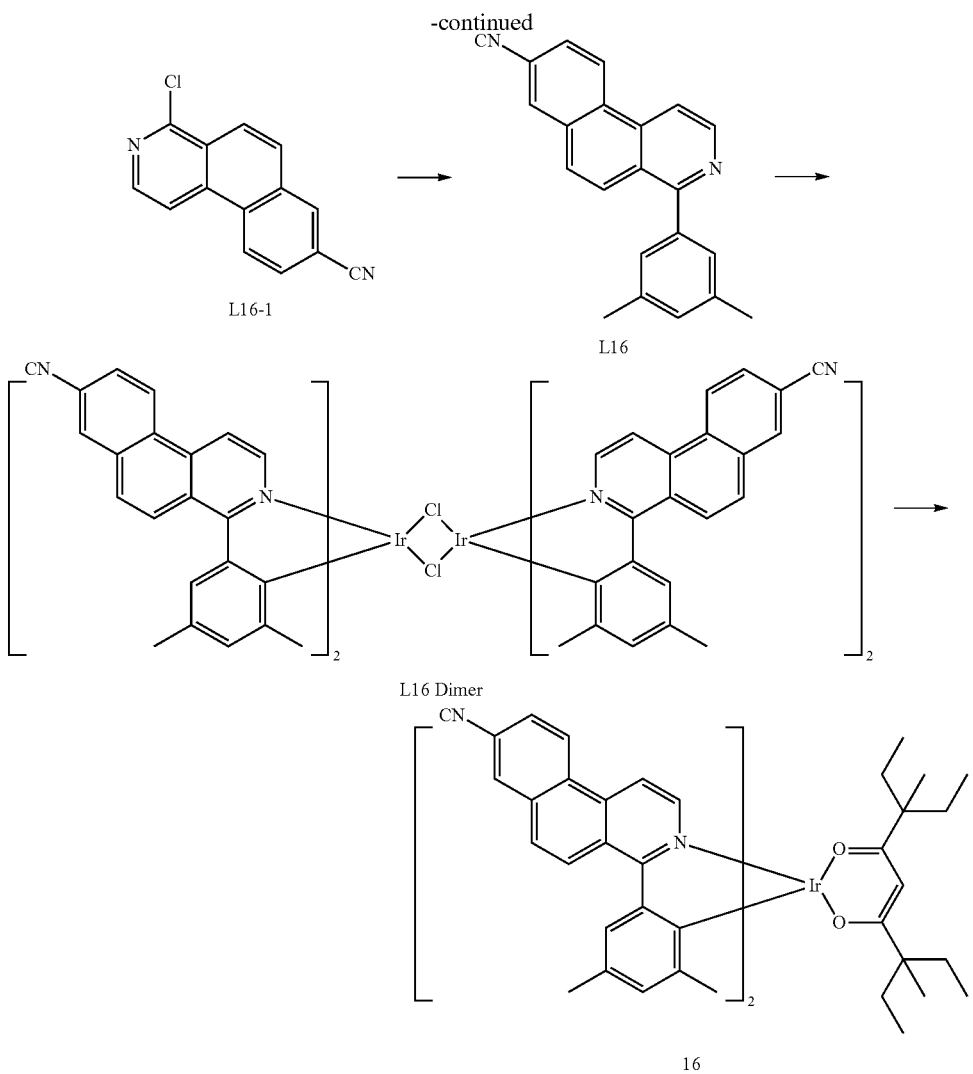

Synthesis of Intermediate L16-3

2.6 g (yield of 71%) of Intermediate L16-3 was synthesized in the same manner as used to synthesize Intermediate L5-3 of Synthesis Example 5, except that (4-cyanophenyl) boronic acid was used instead of (4-(trifluoromethyl)phenyl) boronic acid.
LC-MS m/z=243 (M+H)$^+$ Synthesis of Intermediate L16-2

2.7 g (yield of 95%) of Intermediate L16-2 was obtained in the same manner as used to synthesize Intermediate L5-2 of Synthesis Example 5, except that Intermediate L16-3 was used instead of Intermediate L5-3.
LC-MS m/z=271 (M+H)$^+$ Synthesis of Intermediate L16-1

0.6 g (yield of 25%) of Intermediate L16-1 was obtained in the same manner as used to synthesize Intermediate L15-1 of Synthesis Example 5, except that Intermediate L16-2 was used instead of Intermediate L5-2.
LC-MS m/z=239 (M+H)$^+$ Synthesis of Intermediate L16

0.6 g (yield of 85%) of Intermediate L16 was synthesized in the same manner as used to synthesize Intermediate L1 of Synthesis Example 1, except that Intermediate L16-1 was used instead of Intermediate L1-1.
LC-MS m/z=309 (M+H)$^+$ Synthesis of Intermediate L16 Dimer Intermediate L16 Dimer was obtained in the same manner as used to synthesize Intermediate L1 Dimer of Synthesis Example 1, except that Intermediate L16 was used instead of Intermediate L1.

Synthesis of Compound 16

0.2 g (yield of 40%) of Compound 16 was obtained in the same manner as used to synthesize Compound 1 of Synthesis Example 1, except that Intermediate L16 Dimer was used instead of Intermediate L1 Dimer.
LC-MS m/z=1049 (M+H)$^+$ Synthesis Example 17 (Compound 17)

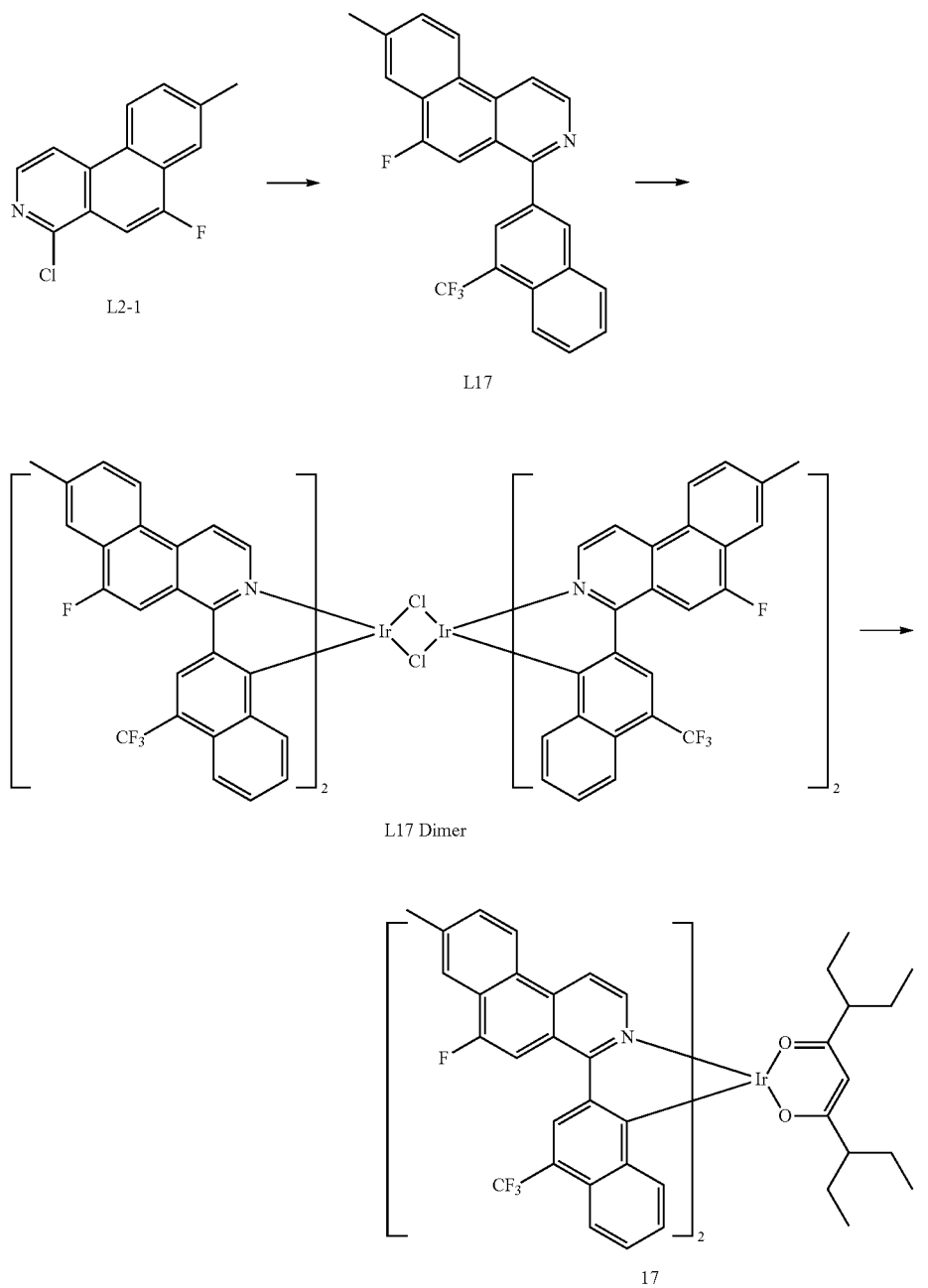

Synthesis of Intermediate L17

0.9 g (yield of 72%) of Intermediate L17 was synthesized in the same manner as used to synthesize Intermediate L2 of Synthesis Example 2, except that 4-(trifluoromethyl)naphthalen-2-yl)boronic acid was used instead of 3,5-dimethylphenylboronic acid.
LC-MS m/z=352 (M+H)$^+$ Synthesis of Intermediate L17 Dimer Intermediate L17 Dimer was obtained in the same manner as used to synthesize Intermediate L2 Dimer of Synthesis Example 2, except that Intermediate L17 was used instead of Intermediate L2.

Synthesis of Compound 17

0.2 g (yield of 15%) of Compound 17 was obtained in the same manner as used to synthesize Compound 2 of Synthesis Example 2, except that Intermediate L17 Dimer was used instead of Intermediate L2 Dimer.
LC-MS m/z=1105 (M+H)$^+$

Synthesis Example 18 (Compound 18)

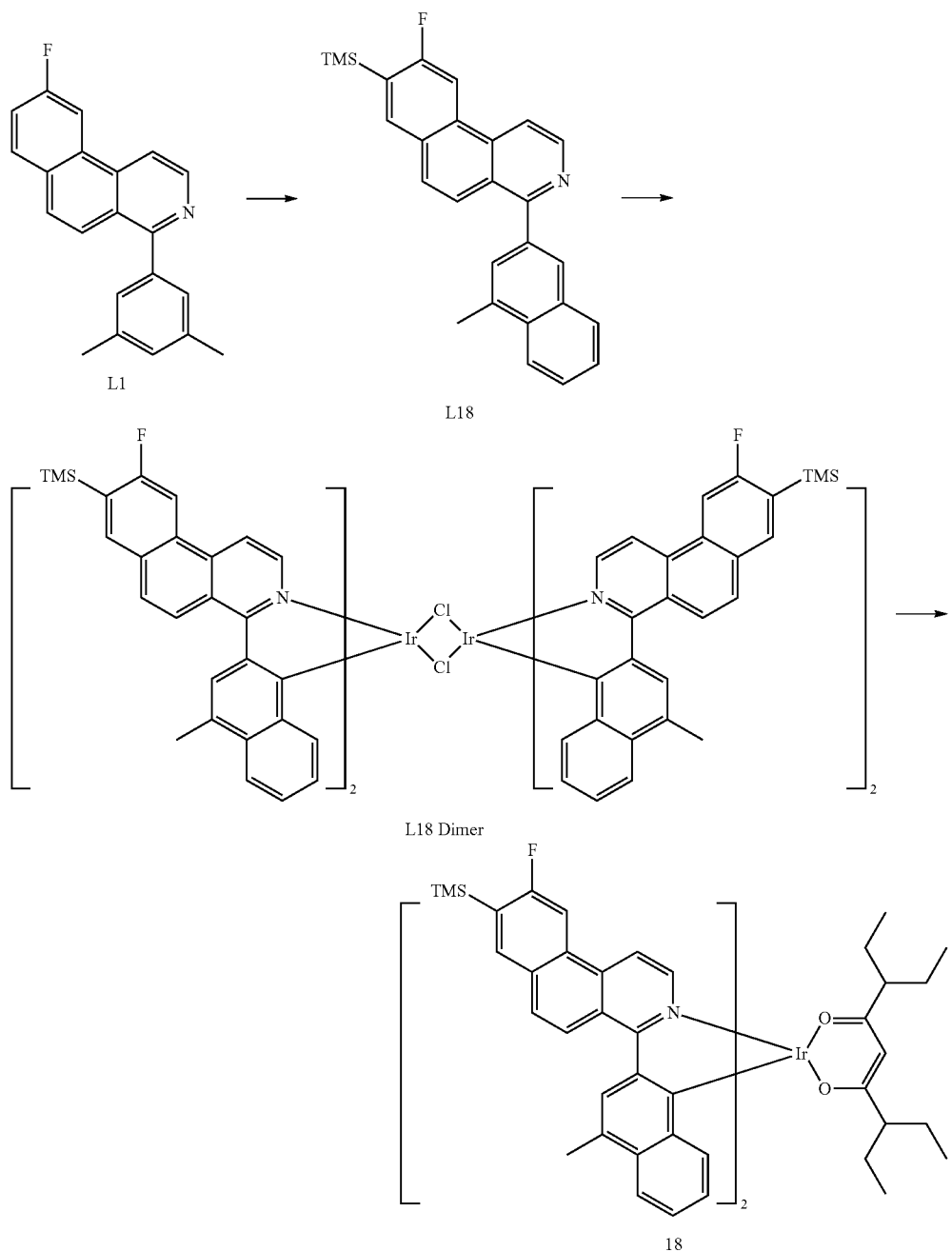

Synthesis of Intermediate L18

0.7 g (yield of 80%) of Intermediate L18 was synthesized in the same manner as used to synthesize Intermediate L3 of Synthesis Example 3, except that (4-methylnaphthalen-2-yl)boronic acid was used instead of 3,5-Dimethylphenylboronic acid.

LC-MS m/z=410 (M+H)$^+$

Synthesis of Intermediate L18 Dimer

Intermediate L18 Dimer was obtained in the same manner as used to synthesize Intermediate L3 Dimer of Synthesis Example 3, except that Intermediate L18 was used instead of Intermediate L3.

Synthesis of Compound 18

0.1 g (yield of 15%) of Compound 18 was obtained in the same manner as used to synthesize Compound 3 of Synthesis Example 3, except that Intermediate L18 Dimer was used instead of Intermediate L3 Dimer.

LC-MS m/z=1221 (M+H)$^+$

Synthesis Example 19 (Compound 19)

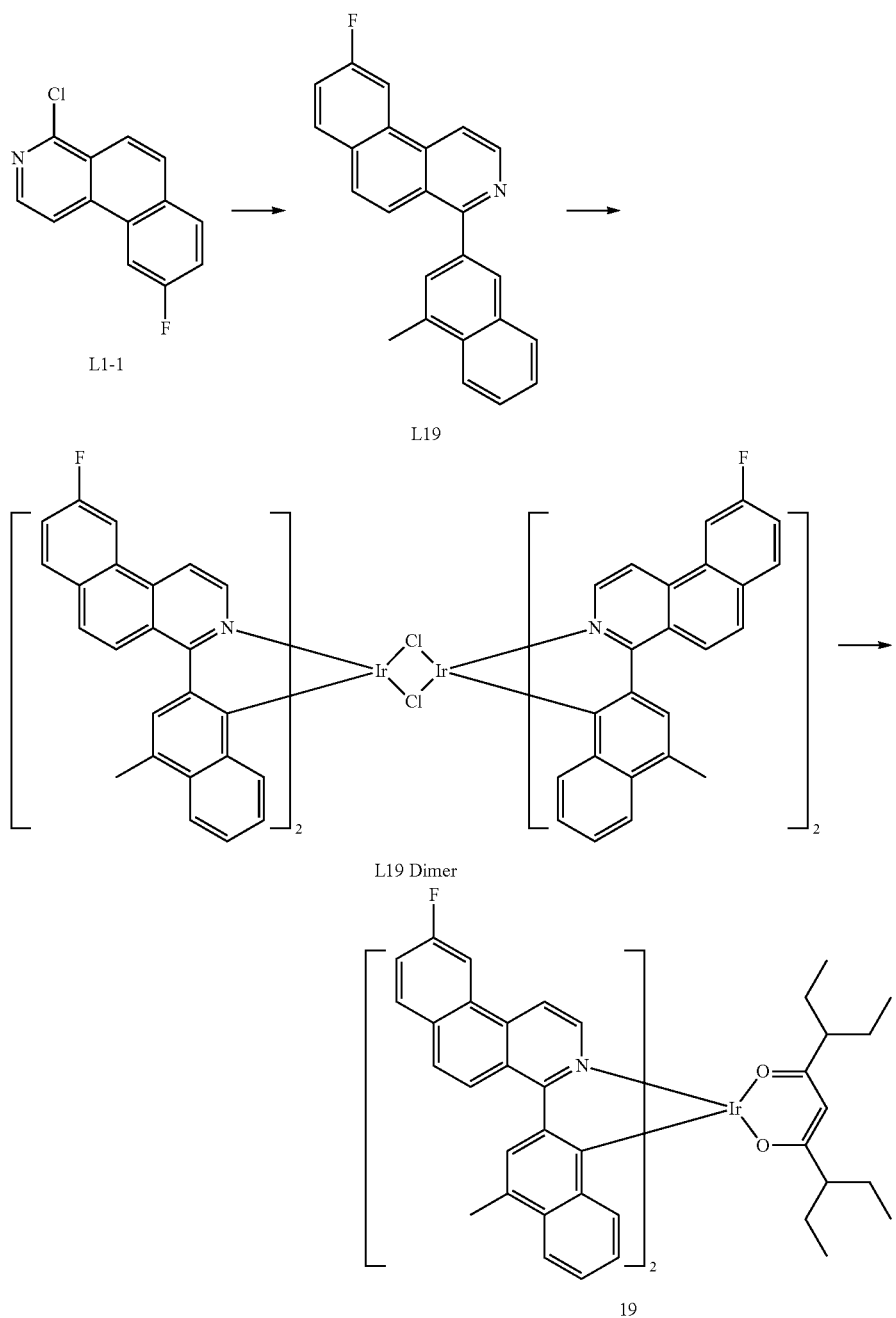

Synthesis of Intermediate L19

1.2 g (yield of 80%) of Intermediate L19 was synthesized in the same manner as used to synthesize Intermediate L1 of Synthesis Example 1, except that (4-methylnaphthalen-2-yl)boronic acid was used instead of 3,5-Dimethylphenylboronic acid.

LC-MS m/z=338 (M+H)$^+$

Synthesis of Intermediate L19 Dimer

Intermediate L19 Dimer was obtained in the same manner as used to synthesize Intermediate L1 Dimer of Synthesis Example 1, except that Intermediate L19 was used instead of Intermediate L1.

Synthesis of Compound 19

0.15 g (yield of 16%) of Compound 19 was obtained in the same manner as used to synthesize Compound 1 of Synthesis Example 1, except that Intermediate L19 Dimer was used instead of Intermediate L1 Dimer.

LC-MS m/z=1077 (M+H)$^+$

Evaluation Example 1

The B3LYP/LanL2DZ function was used with respect to Ir included in Compound 1, and the B3LYP/6-31G(D,P) function was used with respect to an organic ligand included in Compound 1 to optimize a molecular structure of Compound 1, thereby performing density functional theory (DFT) calculation using Gaussian. Thus, the two bond distances between Ir and N ($D_1$(Ir—N) and $D_2$(Ir—N)) and the two bond distances between Ir and C ($D_1$(Ir—C) and $D_2$(Ir—C)) in Compound 1 were evaluated, and Δ(Ir—N) and Δ(Ir—C) of Compound 1 was calculated therefrom (as absolute values). This was also performed on Compounds 2 to 19 and A to C, and results thereof are summarized in Table 1.

TABLE 1

| Compound No. | $D_1$(Ir—N) (Å) | $D_2$(Ir—N) (Å) | Δ (Ir—N) (Å) | $D_1$(Ir—C) (Å) | $D_2$(Ir—C) (Å) | Δ (Ir—C) (Å) | Δ (Ir—N) + Δ (Ir—C) (Å) |
|---|---|---|---|---|---|---|---|
| 1 | 2.0559 | 2.05594 | 0.00004 | 2.02406 | 2.02405 | 0.00001 | 0.00005 |
| 2 | 2.05635 | 2.05638 | 0.00003 | 2.02268 | 2.02261 | 0.00007 | 0.00010 |
| 3 | 2.05467 | 2.05475 | 0.00008 | 2.02342 | 2.02341 | 0.00001 | 0.00009 |
| 4 | 2.05525 | 2.05524 | 0.00001 | 2.02433 | 2.02433 | 0.00000 | 0.00001 |
| 5 | 2.05485 | 2.05482 | 0.00003 | 2.02418 | 2.0242 | 0.00002 | 0.00005 |
| 6 | 2.05539 | 2.05539 | 0.00000 | 2.02316 | 2.02316 | 0.00000 | 0.00000 |
| 7 | 2.05494 | 2.05493 | 0.00001 | 2.02275 | 2.02275 | 0.00000 | 0.00001 |
| 8 | 2.05476 | 2.05475 | 0.00001 | 2.02329 | 2.02329 | 0.00000 | 0.00001 |
| 9 | 2.06452 | 2.06455 | 0.00003 | 2.02961 | 2.0296 | 0.00001 | 0.00004 |
| 10 | 2.05521 | 2.05521 | 0.00000 | 2.02361 | 2.02362 | 0.00001 | 0.00001 |
| 11 | 2.06399 | 2.06399 | 0.00000 | 2.02993 | 2.02994 | 0.00001 | 0.00001 |
| 12 | 2.05654 | 2.05647 | 0.00007 | 2.02372 | 2.02393 | 0.00021 | 0.00028 |
| 13 | 2.05535 | 2.05513 | 0.00022 | 2.02235 | 2.02252 | 0.00017 | 0.00039 |
| 14 | 2.05609 | 2.05606 | 0.00003 | 2.02343 | 2.02343 | 0.00000 | 0.00003 |
| 15 | 2.05478 | 2.05507 | 0.00029 | 2.0311 | 2.0309 | 0.00020 | 0.00049 |
| 16 | 2.05442 | 2.05497 | 0.00055 | 2.02426 | 2.02443 | 0.00017 | 0.00072 |
| 17 | 2.05700 | 2.05703 | 0.00003 | 2.00898 | 2.00897 | 0.00001 | 0.00004 |
| 18 | 2.05604 | 2.05608 | 0.00004 | 2.00892 | 2.00891 | 0.00001 | 0.00005 |
| 19 | 2.05613 | 2.05612 | 0.00001 | 2.01143 | 2.01142 | 0.00001 | 0.00002 |
| A | 2.06067 | 2.06148 | 0.00081 | 1.9929 | 1.99434 | 0.00144 | 0.00225 |
| B | 2.05921 | 2.06009 | 0.00088 | 1.99658 | 1.99795 | 0.00137 | 0.00225 |
| C | 2.05945 | 2.05624 | 0.00321 | 2.0233 | 2.02195 | 0.00135 | 0.00456 |

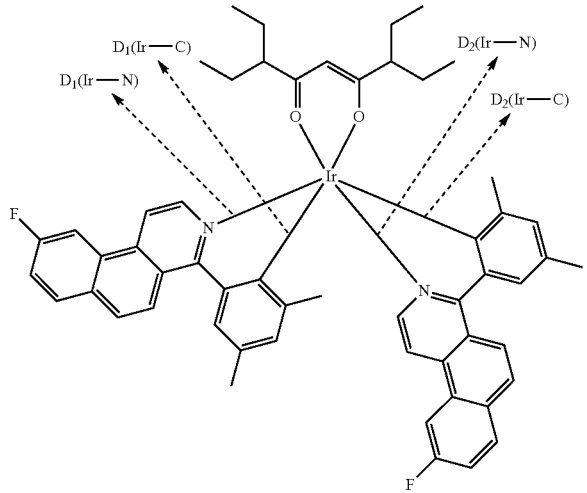

1

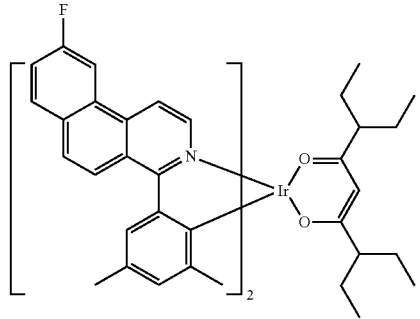

1

TABLE 1-continued
| Compound No. | $D_1$(Ir—N) (Å) | $D_2$(Ir—N) (Å) | Δ (Ir—N) (Å) | $D_1$(Ir—C) (Å) | $D_2$(Ir—C) (Å) | Δ (Ir—C) (Å) | Δ (Ir—N) + Δ (Ir—C) (Å) |
|---|---|---|---|---|---|---|---|
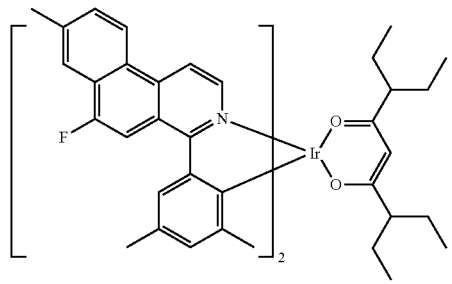
2
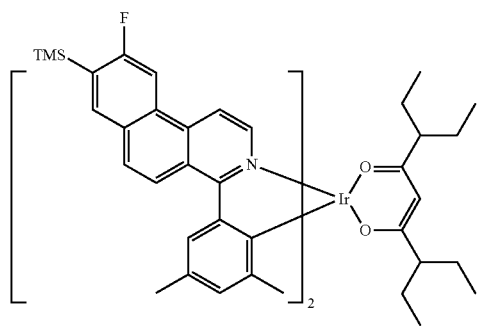
3
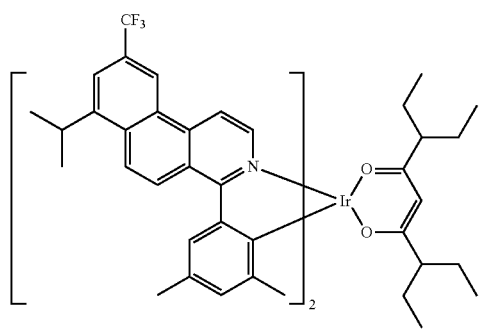
4
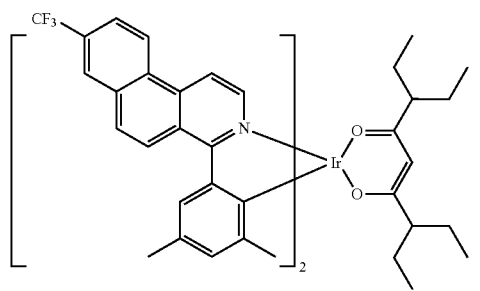
5

TABLE 1-continued
| Compound No. | $D_1$(Ir—N) (Å) | $D_2$(Ir—N) (Å) | Δ (Ir—N) (Å) | $D_1$(Ir—C) (Å) | $D_2$(Ir—C) (Å) | Δ (Ir—C) (Å) | Δ (Ir—N) + Δ (Ir—C) (Å) |
|---|---|---|---|---|---|---|---|
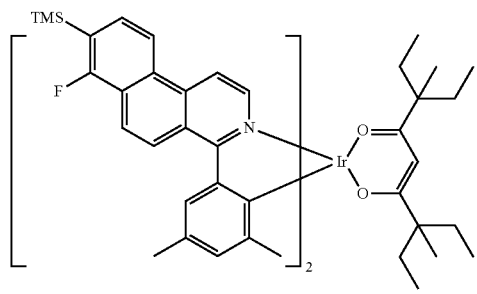
6
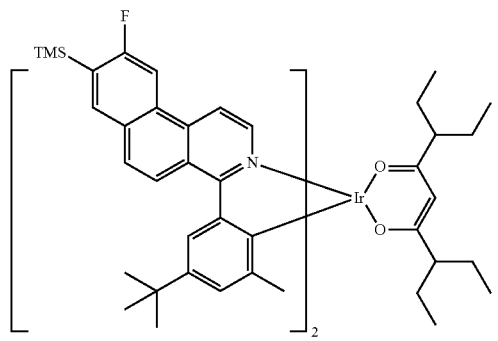
7
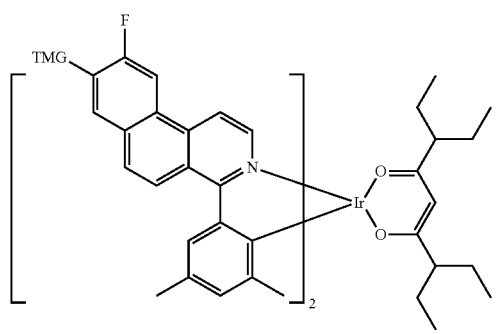
8
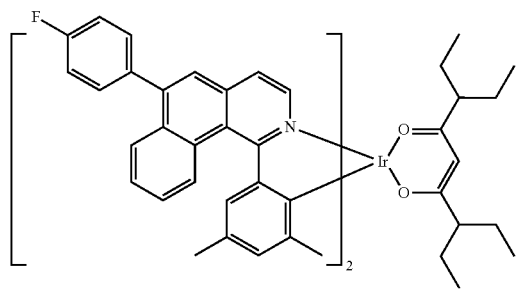
9

TABLE 1-continued
| Compound No. | D₁(Ir—N) (Å) | D₂(Ir—N) (Å) | Δ (Ir—N) (Å) | D₁(Ir—C) (Å) | D₂(Ir—C) (Å) | Δ (Ir—C) (Å) | Δ (Ir—N) + Δ (Ir—C) (Å) |
|---|---|---|---|---|---|---|---|
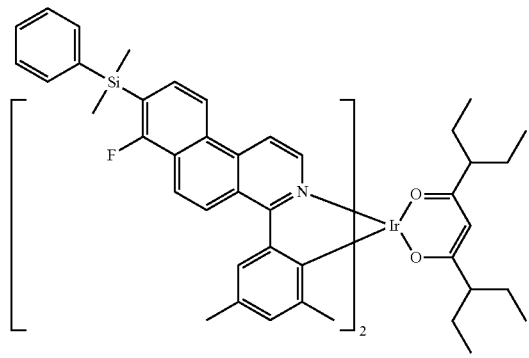
10
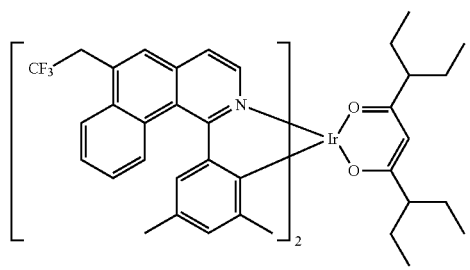
11
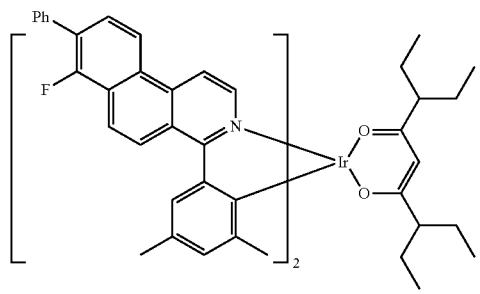
12
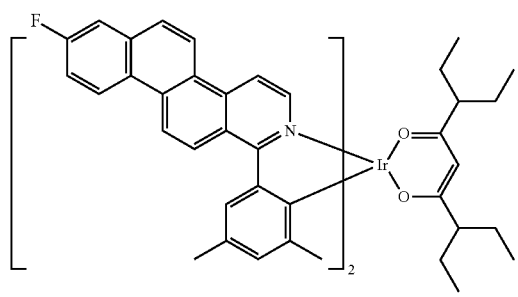
13

TABLE 1-continued
| Compound No. | $D_1(Ir—N)$ (Å) | $D_2(Ir—N)$ (Å) | $\Delta$ (Ir—N) (Å) | $D_1(Ir—C)$ (Å) | $D_2(Ir—C)$ (Å) | $\Delta$ (Ir—C) (Å) | $\Delta$ (Ir—N) + $\Delta$ (Ir—C) (Å) |
|---|---|---|---|---|---|---|---|
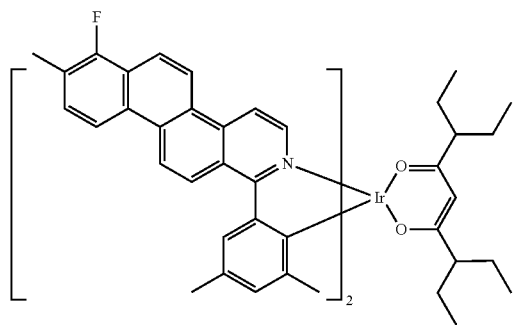
14
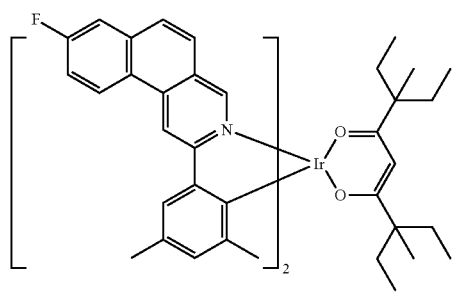
15
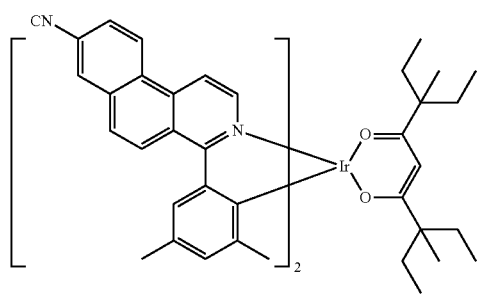
16
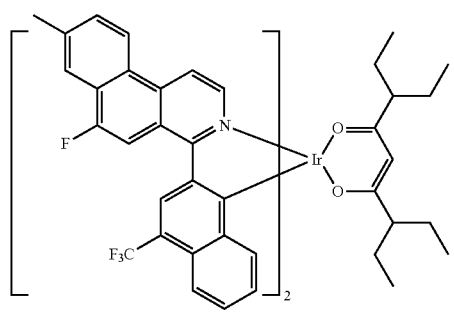
17

TABLE 1-continued
| Compound No. | D₁(Ir—N) (Å) | D₂(Ir—N) (Å) | Δ (Ir—N) (Å) | D₁(Ir—C) (Å) | D₂(Ir—C) (Å) | Δ (Ir—C) (Å) | Δ (Ir—N) + Δ (Ir—C) (Å) |
|---|---|---|---|---|---|---|---|
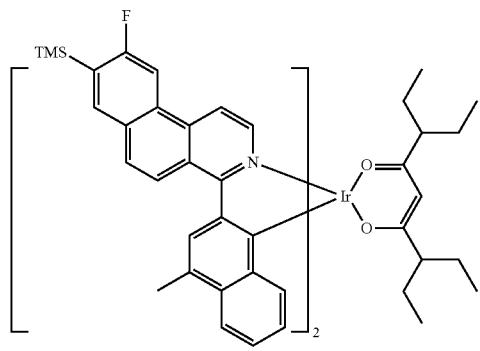
18
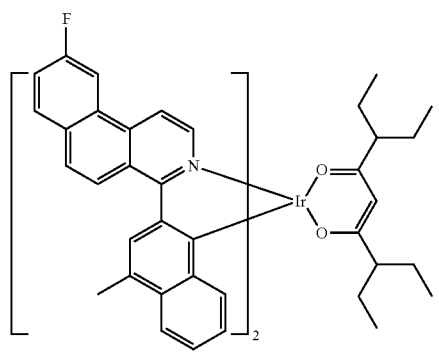
19
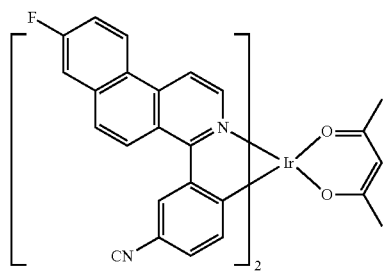
A
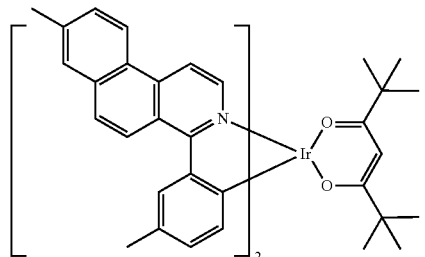
B

TABLE 1-continued

| Compound No. | $D_1$(Ir—N) (Å) | $D_2$(Ir—N) (Å) | Δ (Ir—N) (Å) | $D_1$(Ir—C) (Å) | $D_2$(Ir—C) (Å) | Δ (Ir—C) (Å) | Δ (Ir—N) + Δ (Ir—C) (Å) |
|---|---|---|---|---|---|---|---|

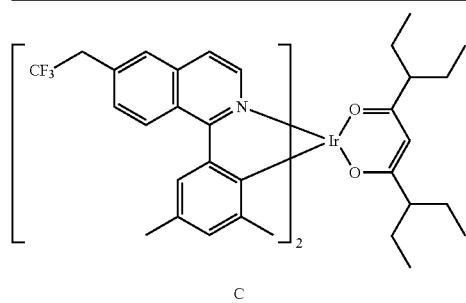

C

Referring to Table 1, it is confirmed that the sum of Δ(Ir—N) and Δ(Ir—C) of each of Compounds 1 to 19 is 0.002 Å or less, but the sum of Δ(Ir—N) and Δ(Ir—C) of each of Compounds A to C is greater than 0.002 Å.

Evaluation Example 2

Figure 4:
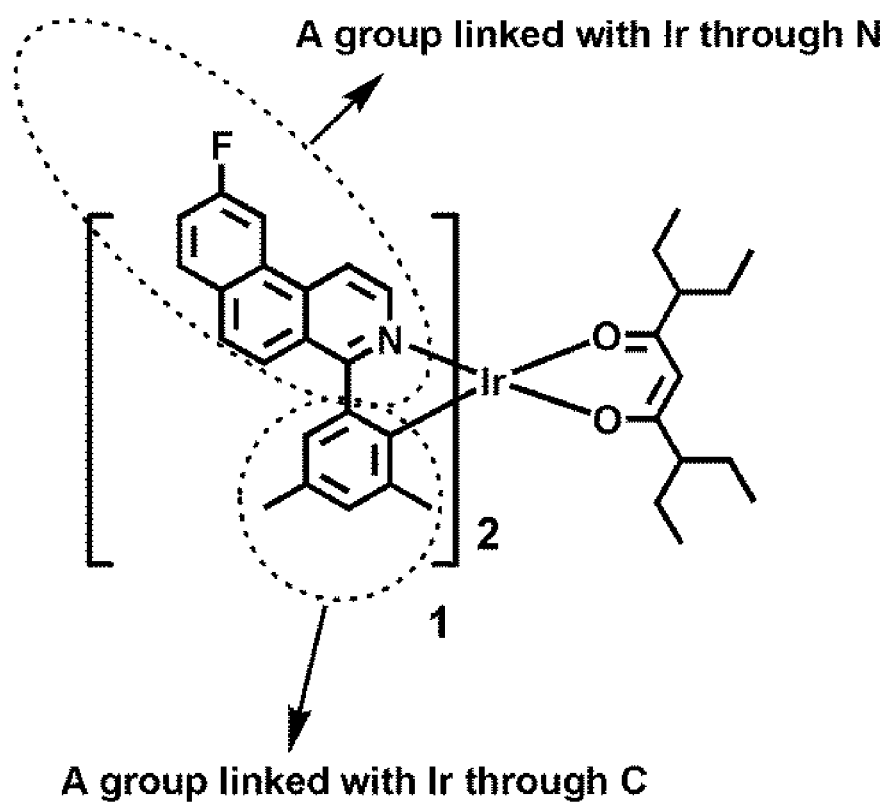
FIG. 4 is a schematic illustration showing a group linked with Ir through N and a group linked with Ir through C for Compound 1.

The B3LYP/LanL2DZ function was used with respect to Ir included in Compound 1, and the B3LYP/6-31G(D,P) function was used with respect to an organic ligand included in Compound 1 to optimize a molecular structure of Compound 1, thereby performing density functional theory (DFT) calculation using Gaussian. Thus, $L_N$ and $L_C$ of Compound 1 were evaluated, and $L_N/L_C$ was calculated therefrom. $L_N$ of Compound 1 is a maximum distance between Ir and another atom that is not hydrogen included in a group linked with Ir through N, and $L_C$ of Compound 1 is a maximum distance between Ir and another atom that is not hydrogen included in a group linked with Ir through C. FIG. 4 exemplifies a group linked with Ir through N and a group linked with Ir through C for Compound 1. This analysis was also performed on Compounds 2 to 19 and A to C, and results thereof are summarized in Table 2.

TABLE 2

| Compound No. | $L_N$ (Å) | $L_C$ (Å) | $L_N/L_C$ |
|---|---|---|---|
| 1 | 9.451 | 6.336 | 1.491 |
| 2 | 10.675 | 6.334 | 1.685 |
| 3 | 12.016 | 6.332 | 1.898 |
| 4 | 10.930 | 6.337 | 1.725 |
| 5 | 11.217 | 6.336 | 1.770 |
| 6 | 11.876 | 6.333 | 1.875 |
| 7 | 12.016 | 7.200 | 1.669 |
| 8 | 12.106 | 6.332 | 1.912 |
| 9 | 12.608 | 6.344 | 1.987 |
| 10 | 13.452 | 6.389 | 2.105 |
| 11 | 10.519 | 6.347 | 1.657 |
| 12 | 13.476 | 6.333 | 2.128 |
| 13 | 12.658 | 6.329 | 2.000 |
| 14 | 12.589 | 6.390 | 1.970 |
| 15 | 10.446 | 6.397 | 1.633 |
| 16 | 11.728 | 6.336 | 1.851 |
| 17 | 10.673 | 7.099 | 1.503 |
| 18 | 12.015 | 6.254 | 1.921 |
| 19 | 9.452 | 6.299 | 1.501 |
| A | 10.437 | 7.411 | 1.408 |
| B | 10.650 | 6.356 | 1.676 |
| C | 9.164 | 6.389 | 1.434 |

Referring to Table 2, it is confirmed that $L_N/L_C$ of each of Compounds 1 to 19 is 1.45 or more, but $L_N/L_C$ of each of Compounds A and C is less than 1.45.

Evaluation Example 3

Compound H52 and Compound 1 were co-deposited at a weight ratio of 98:2 at a vacuum degree of $10^{-7}$ torr on the quartz substrate to prepare a film having a thickness of 50 nm, and then a glass plate for sealing was attached onto the film to seal the film.

With respect to the film, Luxol-OLED/analyzer LOA-100 manufactured by CoCoLink was used to measure a photoluminescence (PL) intensity according to each angle from −150° to +150°, and then a fitting program of an analyzer was used to calculate a horizontal orientation ratio (optical orientation ratio) with respect to Compound 1. This was repeatedly performed on Compounds 2 to 19 and A to C, and results thereof are summarized in Table 4.

TABLE 3

| Compound No. | Horizontal orientation ratio (%) |
|---|---|
| 1 | 91% |
| 2 | 93% |
| 3 | 94% |
| 4 | 93% |
| 5 | 93% |
| 6 | 94% |
| 7 | 92% |
| 8 | 94 % |
| 9 | 95% |
| 10 | 95% |
| 11 | 93% |
| 12 | 95% |
| 13 | 94% |
| 14 | 95% |
| 15 | 92% |
| 16 | 94% |
| 17 | 91% |
| 18 | 94% |
| 19 | 91% |
| A | 82% |
| B | 90% |
| C | 88% |

Referring to Table 3, horizontal orientation ratios of Compounds 1 to 19 are superior to those of Compounds A to C.

Results of Evaluation Examples 1 and 2 are summarized (O: satisfied/X: unsatisfied) to Table 4:

TABLE 4

| Compound No. | Δ (Ir-N) + Δ (Ir-C) < 0.002 Å | $L_N/L_C$ > 1.45 | Inclusion of a group having a para Hammett substituent constant ($\sigma_p$) that is greater than 0 and less than 0.5 |
|---|---|---|---|
| 1 | O | O | O |
| 2 | O | O | O |
| 3 | O | O | O |
| 4 | O | O | O |
| 5 | O | O | O |
| 6 | O | O | O |
| 7 | O | O | O |
| 8 | O | O | O |
| 9 | O | O | O |
| 10 | O | O | O |
| 11 | O | O | O |
| 12 | O | O | O |
| 13 | O | O | O |
| 14 | O | O | O |
| 15 | O | O | O |
| 16 | O | O | O |
| 17 | O | O | O |
| 18 | O | O | O |
| 19 | O | O | O |
| A | X | X | O |
| B | X | O | X |
| C | X | X | O |

Example 1

As an anode, an ITO-patterned glass substrate was cut to a size of 50 millimeters (mm)×50 mm×0.5 mm, sonicated with isopropyl alcohol and pure water each for 5 minutes, and then cleaned by exposure to ultraviolet rays and ozone for 30 minutes. The resultant glass substrate was loaded onto a vacuum deposition apparatus.

HT3 and F6-TCNNQ were vacuum co-deposited at a weight ratio of 98:2 on the anode to form a hole injection layer having a thickness of 100 Å, and HT3 was vacuum-deposited on the hole injection layer to form a hole transport layer having a thickness of 1,350 Å. HT21 was vacuum-deposited on the hole transport layer to form an electron blocking layer having a thickness of 300 Å.

Subsequently, H52 (host) and Compound 1 (dopant) were co-deposited at a weight ratio of 98:2 on the electron blocking layer to form an emission layer having a thickness of 400 Å.

Thereafter, ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device having a structure of ITO (1,500 Å)/HT3+F6-TCNNQ (2 wt %) (100 Å)/HT3 (1,350 Å)/HT21 (300 Å) H52+Compound 1(2 wt %) (400 Å) /ET3+ET-D1 (50%) (350 Å)/ET-D1 (10 Å)/Al(1000 Å).

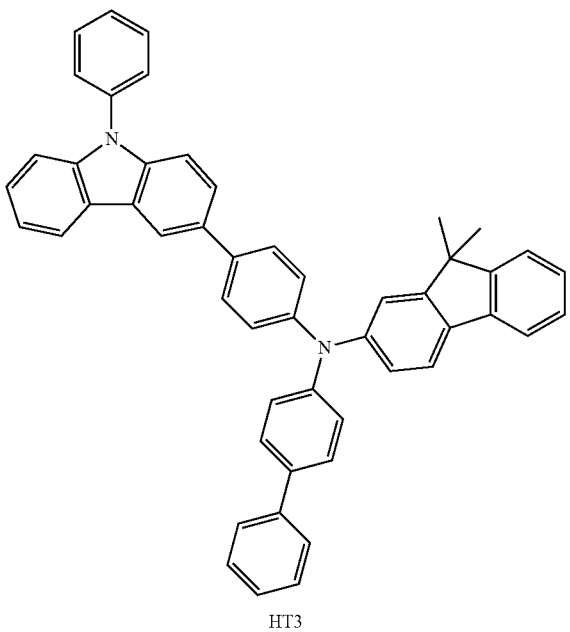

HT3

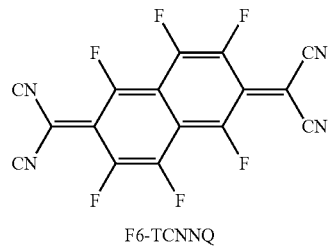

F6-TCNNQ

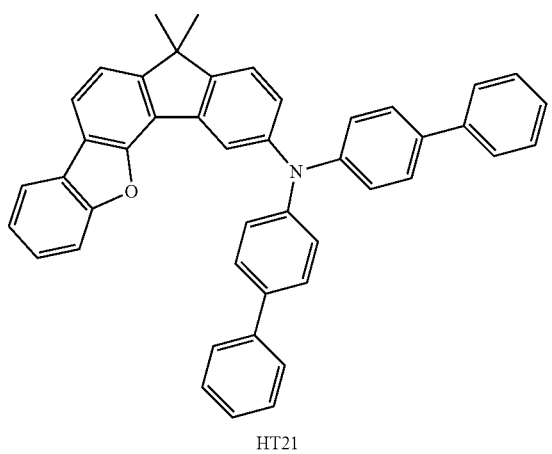

HT21

-continued

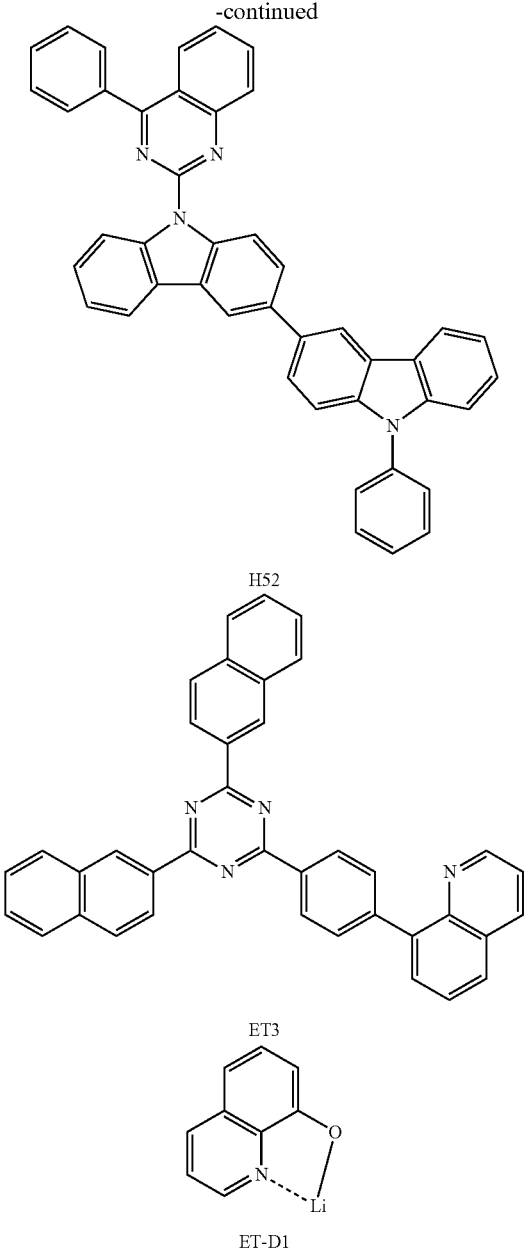

Examples 2 to 19 and Comparative Examples A to C

Organic light-emitting devices were manufactured in the same manner as in Example 1, except that Compounds shown in Table 5 were each used instead of Compound 1 as a dopant in forming an emission layer.

Evaluation Example 4

The driving voltage (V), maximum external quantum efficiency (Max EQE) (%), FWQM (nm) of an EL spectrum, and lifespan ($LT_{97}$) (hr) of each of organic light-emitting devices manufactured according to Examples 1 to 19 and Comparative Examples A to C were evaluated, and results thereof are shown in Table 5. As evaluation apparatuses, a current-voltage meter (Keithley 2400) and a luminance meter (Minolta Cs-1000A) were used, and the lifespan ($LT_{97}$) (at 3500 candela per square meter, $Cd/m^2$) was evaluated by measuring the amount of time that elapsed until luminance was reduced to 97% of the initial luminance of 100%. In Table 5, the driving voltage, maximum external quantum efficiency, and lifespan are respectively expressed as relative values (%).

Roll-off ratio={1−(efficiency (at $3500Cd/m^2$)/maximum luminescence efficiency)}×100%    Equation 20

TABLE 5

| Dopant in emission layer Compound No. | Driving voltage (%) | Max EQE (%) | FWQM (nm) | Lifespan ($LT_{97}$) (%) |
|---|---|---|---|---|
| Example 1 | 1 | 87 | 94 | 92 | 73 |
| Example 2 | 2 | 92 | 96 | 94 | 91 |
| Example 3 | 3 | 92 | 97 | 93 | 71 |
| Example 4 | 4 | 88 | 96 | 94 | 70 |
| Example 5 | 5 | 92 | 97 | 93 | 85 |
| Example 6 | 6 | 92 | 99 | 94 | 89 |
| Example 7 | 7 | 87 | 94 | 92 | 78 |
| Example 8 | 8 | 89 | 96 | 92 | 80 |
| Example 9 | 9 | 92 | 95 | 96 | 65 |
| Example 10 | 10 | 90 | 100 | 94 | 73 |
| Example 11 | 11 | 86 | 98 | 91 | 89 |
| Example 12 | 12 | 92 | 95 | 96 | 62 |
| Example 13 | 13 | 88 | 95 | 93 | 77 |
| Example 14 | 14 | 88 | 94 | 93 | 81 |
| Example 15 | 15 | 84 | 95 | 82 | 100 |
| Example 16 | 16 | 92 | 91 | 91 | 87 |
| Example 17 | 17 | 94 | 91 | 87 | 98 |
| Example 18 | 18 | 88 | 94 | 88 | 90 |
| Example 19 | 19 | 92 | 91 | 87 | 93 |
| Comparative Example A | A | 100 | 79 | 121 | 31 |
| Comparative Example B | B | 96 | 86 | 115 | 62 |
| Comparative Example C | C | 96 | 83 | 105 | 50 |

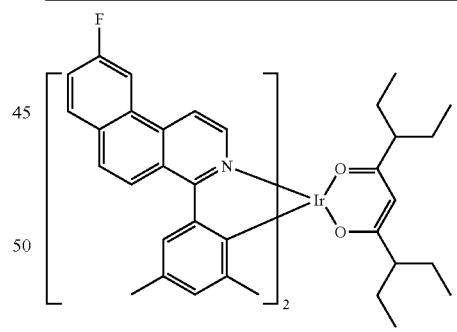

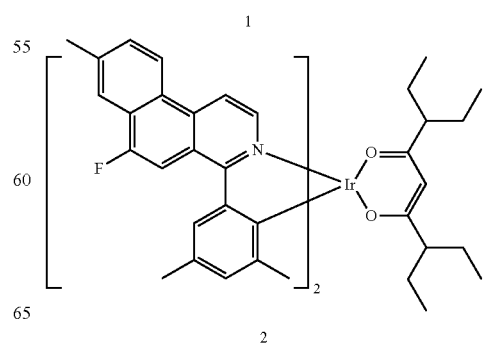

TABLE 5-continued
| Dopant in emission layer Compound No. | Driving voltage (%) | Max EQE (%) | FWQM (nm) | Lifespan (LT97) (%) |
|---|---|---|---|---|
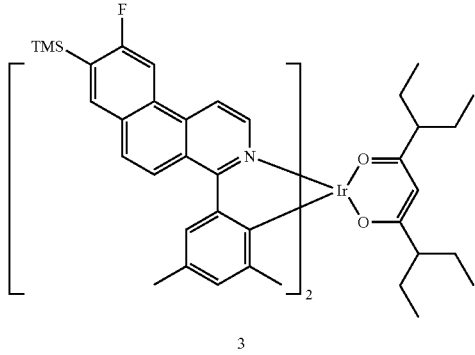
3
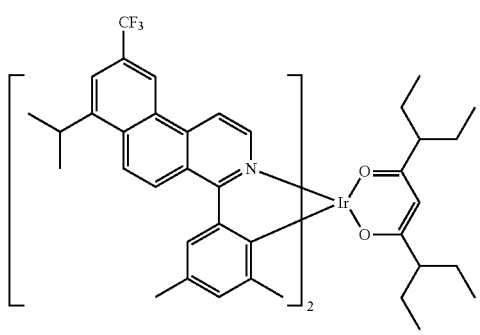
4
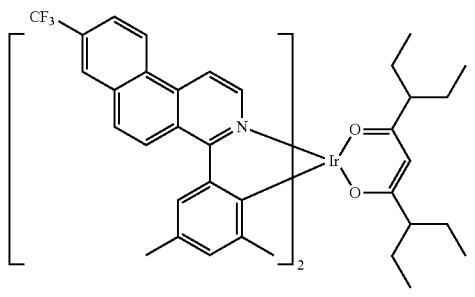
5
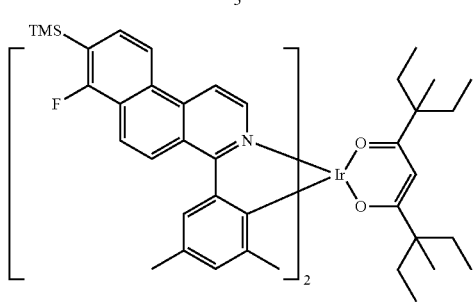
6
TABLE 5-continued
| Dopant in emission layer Compound No. | Driving voltage (%) | Max EQE (%) | FWQM (nm) | Lifespan (LT97) (%) |
|---|---|---|---|---|
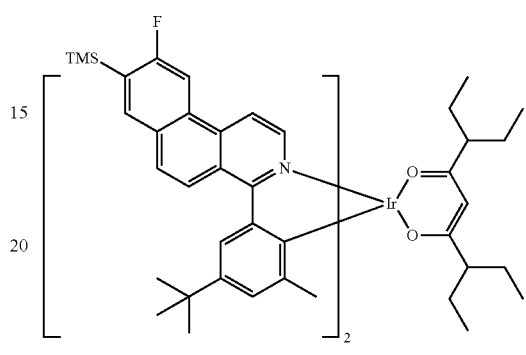
7
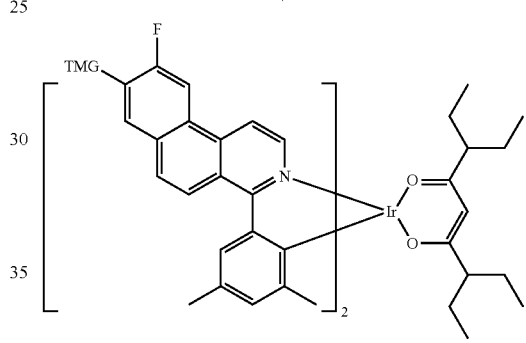
8
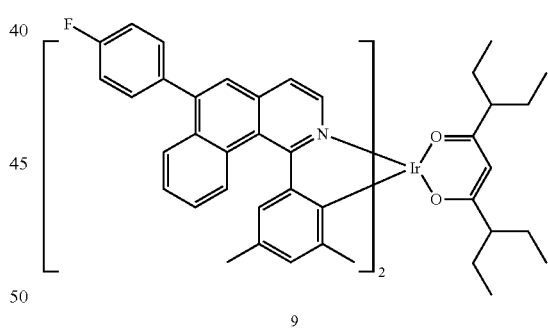
9
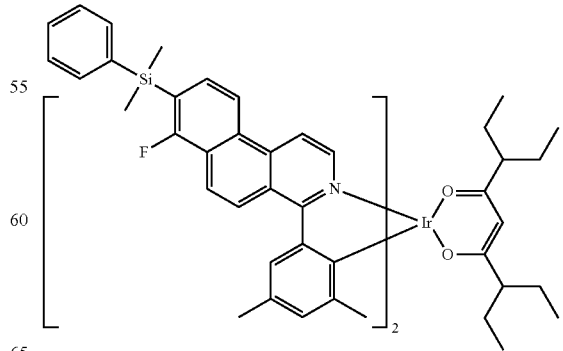
10

TABLE 5-continued
| Dopant in emission layer Compound No. | Driving voltage (%) | Max EQE (%) | FWQM (nm) | Lifespan (LT$_{97}$) (%) |
|---|---|---|---|---|
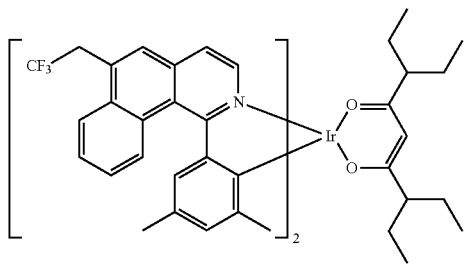
11
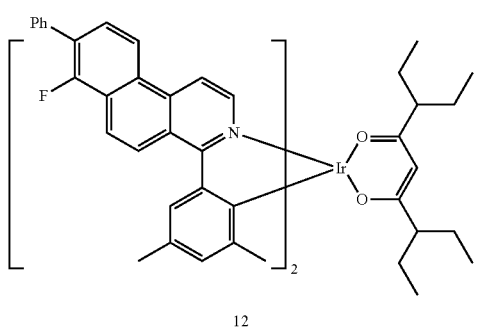
12
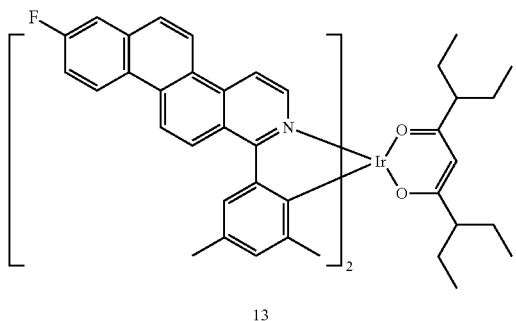
13
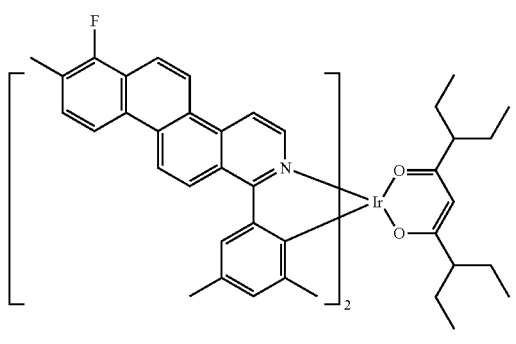
14
TABLE 5-continued
| Dopant in emission layer Compound No. | Driving voltage (%) | Max EQE (%) | FWQM (nm) | Lifespan (LT$_{97}$) (%) |
|---|---|---|---|---|
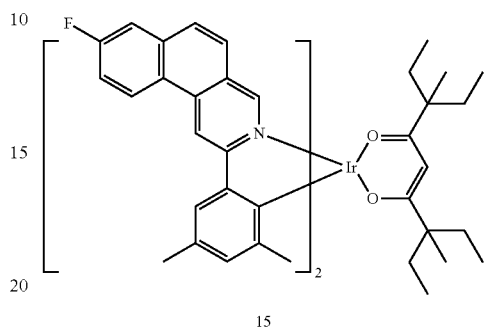
15
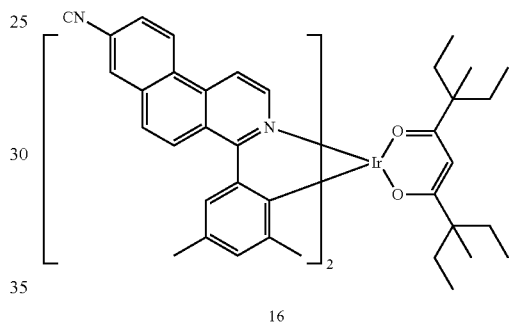
16
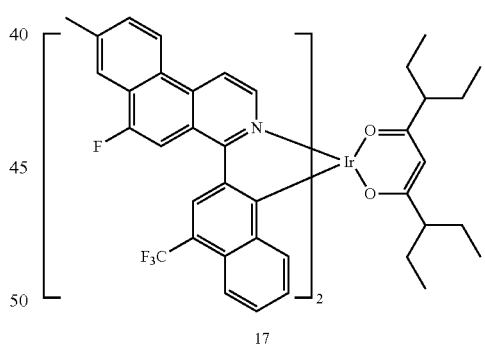
17
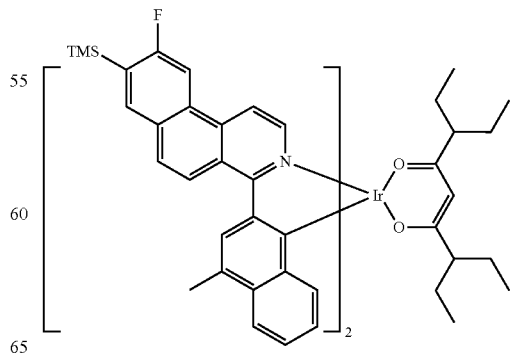
18

TABLE 5-continued

| Dopant in emission layer Compound No. | Driving voltage (%) | Max EQE (%) | FWQM (nm) | Lifespan (LT$_{97}$) (%) |
|---|---|---|---|---|

19

A

B

C

Referring to Table 5, it is confirmed that since the FWQM of light emitted from the organic light-emitting devices manufactured according to Examples 1 to 19 is relatively small, compared to the FWQM of light emitted from the organic light-emitting devices manufactured according to Comparative Examples A to C, the organic light-emitting devices of Examples 1 to 19 may have high color purity, compared to the organic light-emitting devices of Comparative Examples A to C. In addition, the organic light-emitting devices manufactured according to Examples 1 to 19 have improved driving voltage, improved external quantum efficiency, and improved lifespan characteristics, compared to the organic light-emitting devices manufactured according to Comparative Examples A to C.

The organometallic compound has excellent out-coupling efficiency, short decay time, and improved horizontal orientation ratio. Thus, an organic light-emitting device including the organometallic compound and an electronic apparatus including the organic light-emitting device may have high luminescence efficiency.

It should be understood that embodiments described herein should be considered in a descriptive sense only and not for purposes of limitation. Descriptions of features or aspects within each exemplary embodiment should be considered as available for other similar features or aspects in other exemplary embodiments. While one or more exemplary embodiments have been described with reference to the figures, it will be understood by those of ordinary skill in the art that various changes in form and details may be made therein without departing from the spirit and scope of the present disclosure as defined by the following claims.

What is claimed is:
1. An organometallic compound, wherein the organometallic compound has a $C_2$ symmetric structure, and is represented by Formula 1, wherein a sum of Δ(Ir—N) and Δ(Ir—C) is 0.002 angstroms or less:

$$\text{Ir}(L_1)_2(L_2) \qquad \text{Formula 1}$$

wherein, in Formula 1,
$L_1$ is a ligand represented by Formula 2, wherein one of two $L_1$s is a first $L_1$ ligand and the other $L_1$s is a second $L_1$ ligand, and the first $L_1$ ligand and the second $L_1$ ligand are identical to each other, and
$L_2$ is a ligand represented by Formula 3,

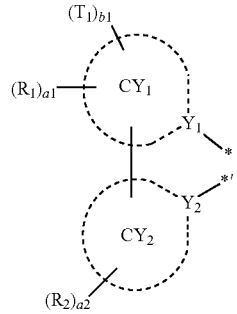

Formula 2

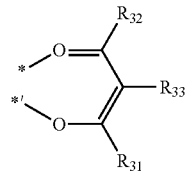

Formula 3 wherein, in Formula 2,
$Y_1$ is N, and $Y_2$ is C,
ring $CY_1$ is a polycyclic group comprising three or more 6-membered rings that are condensed with each other,
ring $CY_2$ is a $C_5$-$C_{30}$ carbocyclic group or a $C_1$-$C_{30}$ heterocyclic group,
$T_1$ is a group having a para Hammett substituent constant ($\sigma_p$) that is greater than 0 and less than 0.5, b1 is an integer from 1 to 10, wherein, when b1 is 2 or more, two or more $T_1$ groups are identical to or different from each other, $R_1$, $R_2$ and $R_{31}$ to $R_{33}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), a1 and a2 in Formula 2 are each independently an integer from 0 to 10, wherein, when a1 is 2 or more, two or more $R_1$ groups are identical to or different from each other, and when a2 is 2 or more, two or more $R_2$ groups are identical to or different from each other,

* and *' in Formulae 2 and 3 each indicate a binding site to Ir in Formula 1,

Δ(Ir—N) is an absolute value of a difference between an Ir and $Y_1$ bond distance for the first $L_1$ ligand and an Ir and $Y_1$ bond distance for the second $L_1$ ligand in Formulae 1 and 2, Δ(Ir—C) is an absolute value of a difference between an Ir and $Y_2$ bond distance for the first $L_1$ ligand and an Ir and $Y_2$ bond distance for the second $L_1$ ligand in Formulae 1 and 2, two or more of $R_1$ groups in the number of a1 are optionally linked to each other to form a $C_5$-$C_{30}$ carbocyclic group unsubstituted or substituted with at least one $R_{1a}$, or two or more of $R_1$ groups in the number of a1 are optionally linked to each other to form a $C_1$-$C_{30}$ heterocyclic group unsubstituted or substituted with at least one $R_{1a}$, two or more of $R_2$ groups in the number of a2 are optionally linked to each other to form a $C_5$-$C_{30}$ carbocyclic group unsubstituted or substituted with at least one $R_{1a}$, or two or more of $R_2$ groups in the number of a2 are optionally linked to each other to form a $C_1$-$C_{30}$ heterocyclic group unsubstituted or substituted with at least one $R_{1a}$, two or more of $R_1$ and $R_2$ are optionally linked to each other to form a $C_5$-$C_{30}$ carbocyclic group unsubstituted or substituted with at least one $R_{1a}$, or two or more of $R_1$ and $R_2$ are optionally linked to each other to form a $C_1$-$C_{30}$ heterocyclic group unsubstituted or substituted with at least one $R_{1a}$, two or more of $R_{31}$ to $R_{33}$ are optionally linked to each other to form a $C_5$-$C_{30}$ carbocyclic group unsubstituted or substituted with at least one $R_{1a}$, or two or more of $R_{31}$ to $R_{33}$ are optionally linked to each other to form a $C_1$-$C_{30}$ heterocyclic group unsubstituted or substituted with at least one $R_{1a}$, $R_{1a}$ is the same as defined in connection with $R_1$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group is each independently:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof, a sulfonic acid group or a salt thereof, a phosphoric acid group or a salt thereof, a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof, a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group, and provided that the organometallic compound satisfies Condition 4, Condition 5, or a combination thereof:

Condition 4
$R_{31}$ in Formula 3 is a group represented by Formula 4,
Condition 5
$R_{32}$ in Formula 3 is a group represented by Formula 5,

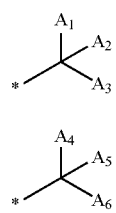

Formula 4

Formula 5 wherein $A_1$ to $A_6$ in Formulae 4 and 5 are each independently:
hydrogen or deuterium; or
a $C_1$-$C_{20}$ alkyl group, a $C_3$-$C_{10}$ cycloalkyl group, a $C_6$-$C_{60}$ aryl group, a $C_1$-$C_{60}$ heteroaryl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and

* indicates a binding site to a neighboring atom, and wherein Formula 4 satisfies one of Condition 4-2 to Condition 4-6, and Formula 5 satisfies one of Condition 5-2 to Condition 5-6:

Condition 4-2
$A_1$ to $A_3$ are each independently a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 4-3
$A_1$ and $A_2$ are each independently a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and
$A_3$ is a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 4-4
$A_1$ is a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_{30}$ cycloalkyl group, a phenyl group, a biphenyl group, or a combination thereof, and
$A_2$ and $A_3$ are each independently a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 4-5
$A_1$ is hydrogen, deuterium, —$CH_3$, —$CH_2D$, —$CHD_2$, or —$CD_3$,
$A_2$ is a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and
$A_3$ is a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 4-6
$A_1$ is hydrogen, deuterium, —$CH_3$, —$CH_2D$, —$CHD_2$, or —$CD_3$, and
$A_2$ and $A_3$ are each independently a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 5-2
$A_4$ to $A_6$ are each independently a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 5-3

$A_4$ and $A_5$ are each independently a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and $A_6$ is a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 5-4

$A_4$ is a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and $A_5$ and $A_6$ are each independently a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, Condition 5-5

$A_4$ is hydrogen, deuterium, —$CH_3$, —$CH_2D$, —$CHD_2$, or —$CD_3$, $A_5$ is a $C_1$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and $A_6$ is a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof, and Condition 5-6

$A_4$ is hydrogen, deuterium, —$CH_3$, —$CH_2D$, —$CHD_2$, or —$CD_3$, and $A_5$ and $A_6$ are each independently a $C_2$-$C_{20}$ alkyl group, a $C_3$-$C_{10}$ cycloalkyl group, a phenyl group, or a biphenyl group, each unsubstituted or substituted with deuterium, a $C_1$-$C_{20}$ alkyl group, a $C_3$-$C_{10}$ cycloalkyl group, a phenyl group, a biphenyl group, or a combination thereof.

2. The organometallic compound of claim 1, wherein the sum of $\Delta$(Ir—N) and $\Delta$(Ir—C) is from about 0 angstroms to about 0.001 angstroms.

3. The organometallic compound of claim 1, wherein $L_N$ is a maximum distance between a non-hydrogen atom included in a group represented by:

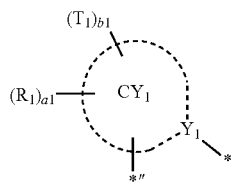

of Formula 2 and Ir of Formula 1, $L_C$ is a maximum distance between a non-hydrogen atom included in a group represented by:

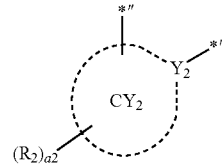

of Formula 2 and Ir of Formula 1,

*'" indicates a binding site to a neighboring atom, and $L_N/L_C$ is from about 1.45 to about 2.88.

4. The organometallic compound of claim 3, wherein $L_N/L_C$ is from about 1.47 to about 2.2.

5. The organometallic compound of claim 1, wherein ring $CY_1$ in Formula 2 is a polycyclic group comprising three or four 6-membered rings that are condensed with each other, wherein the 6-membered ring is a cyclohexane group, a cyclohexene group, a benzene group, a pyridine group, a pyrimidine group, a pyrazine group, or a pyridazine group.

6. The organometallic compound of claim 1, wherein ring $CY_2$ in Formula 2 is a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

7. The organometallic compound of claim 1, wherein $T_1$ in Formula 2 is:

a fluoro group (—F) or a cyano group; or a fluorinated $C_1$-$C_{20}$ alkyl group, a fluorinated $C_3$-$C_{10}$ cycloalkyl group, a fluorinated $C_1$-$C_{10}$ heterocycloalkyl group, fluorinated phenyl group, fluorinated biphenyl group, a cyano-substituted $C_1$-$C_{20}$ alkyl group, a cyano-substituted $C_3$-$C_{10}$ cycloalkyl group, a cyano-substituted $C_1$-$C_{10}$ heterocycloalkyl group, a cyano-substituted phenyl group, or a cyano-substituted biphenyl group, each unsubstituted or further substituted with deuterium, a fluoro group, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

8. The organometallic compound of claim 1, wherein $R_1$, $R_2$ and $R_{31}$ to $R_{33}$ are each independently:

hydrogen, deuterium, —F, or a cyano group;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof, or —$Si(Q_3)(Q_4)(Q_5)$ or —$Ge(Q_3)(Q_4)(Q_5)$, wherein $Q_3$ to $Q_5$ are as defined in claim 1.

9. The organometallic compound of claim 1, wherein a group represented by:

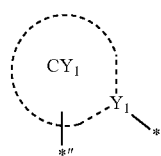

of Formula 2 is a group represented by one of Formulae 2-1 to 2-21:
2-1
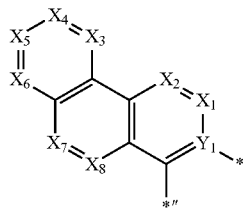
2-2
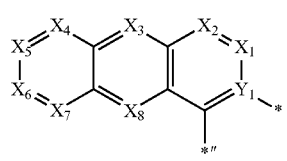
2-3
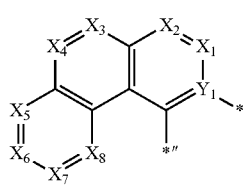
2-4
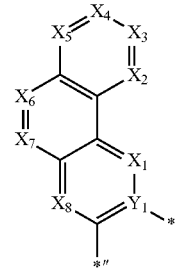
2-5
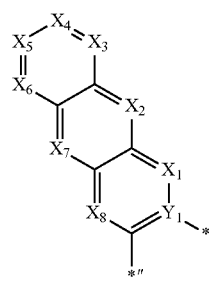
2-6
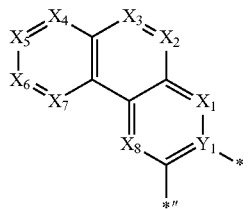
-continued
2-7
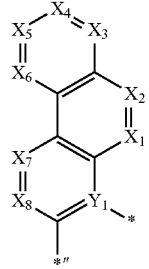
2-8
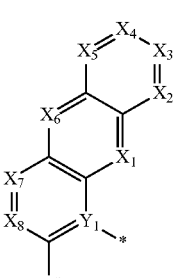
2-9
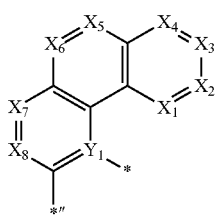
2-10
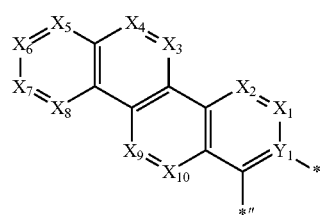
2-11
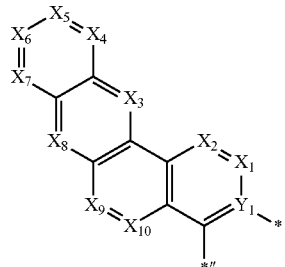
2-12
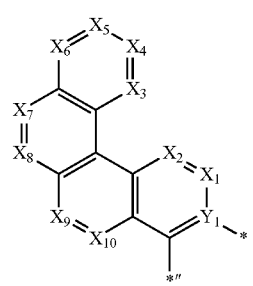

2-13
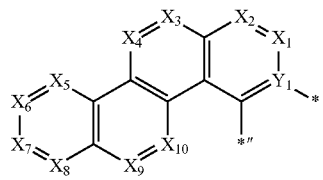

2-14
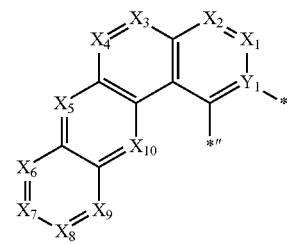

2-15
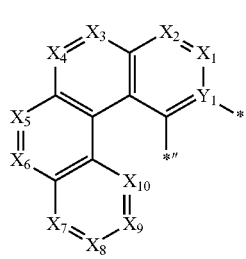

2-16
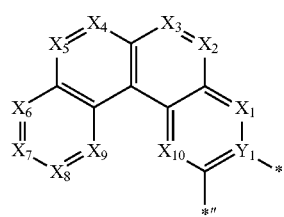

2-17
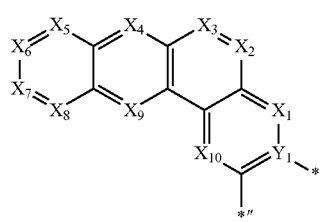

2-18
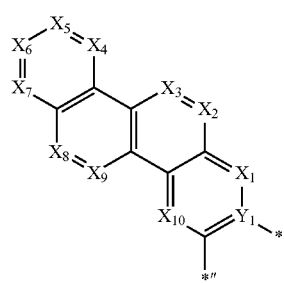

2-19
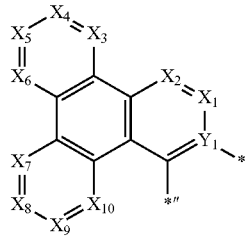

2-20
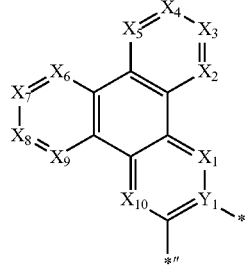

2-21
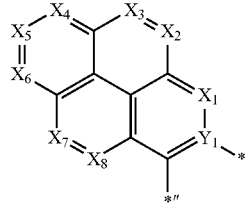

wherein, in Formulae 2-1 to 2-21, $Y_1$ is N, $X_1$ to $X_{10}$ are each independently C or N, and at least one of $X_1$ to $X_8$ of Formulae 2-1 to 2-9 and 2-21 is C, and at least one of $X_1$ to $X_{10}$ of Formulae 2-10 to 2-20 is C,

* is a binding site to Ir in Formula 1, and

*″ indicates a binding site to a neighboring atom.

10. The organometallic compound of claim 1, wherein a group represented by:

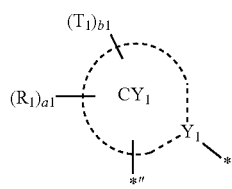

of Formula 2 is a group represented by one of Formulae 2(1) to 2(75):

2(1)
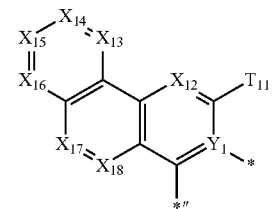

-continued

2(2)

2(3)

2(4)

2(5)

2(6)

2(7)

2(8)

-continued

2(9)

2(10)

2(11)

2(12)

2(13)

2(14)

2(15)

-continued
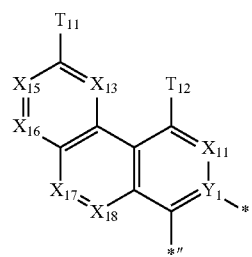
2(16)
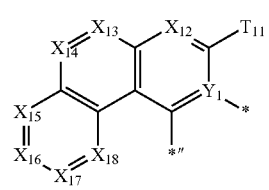
2(17)
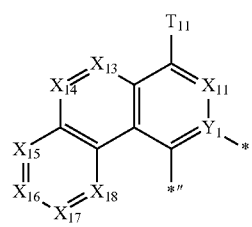
2(18)
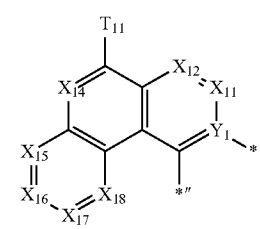
2(19)
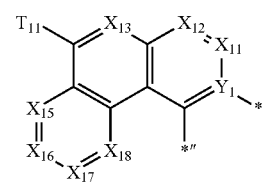
2(20)
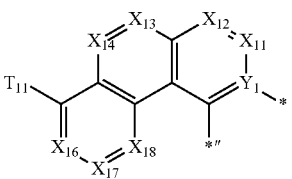
2(21)
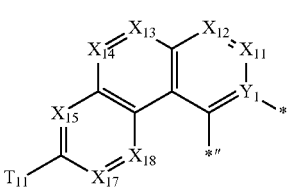
2(22)
-continued
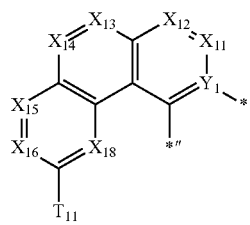
2(23)
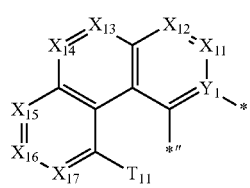
2(24)
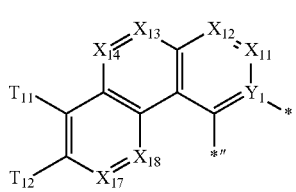
2(25)
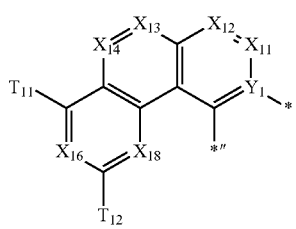
2(26)
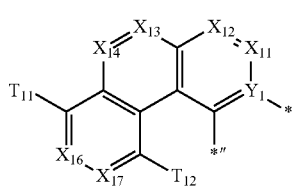
2(27)
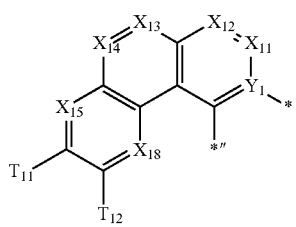
2(28)
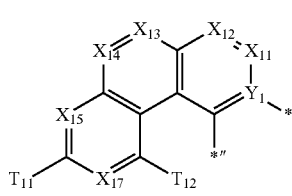
2(29)

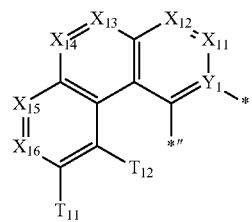
2(30)
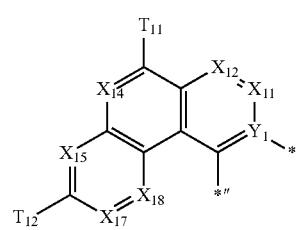
2(31)
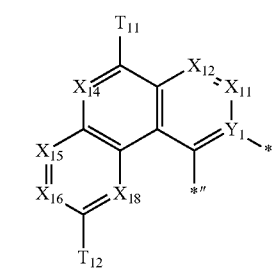
2(32)
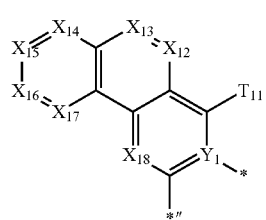
2(33)
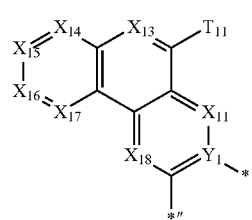
2(34)
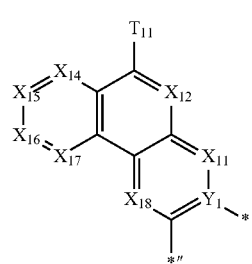
2(35)
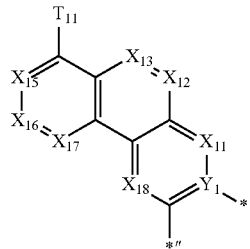
2(36)
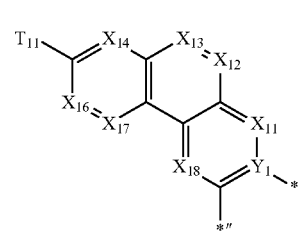
2(37)
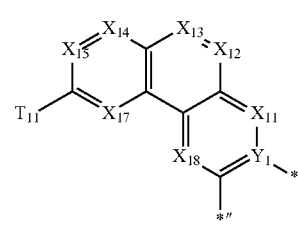
2(38)
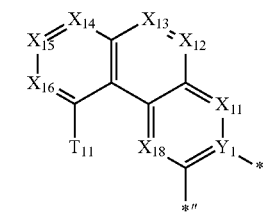
2(39)
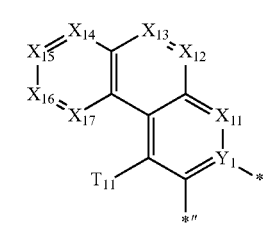
2(40)
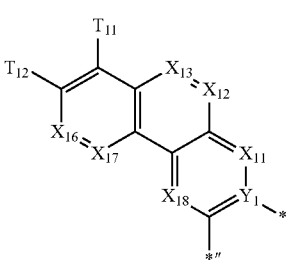
2(41)

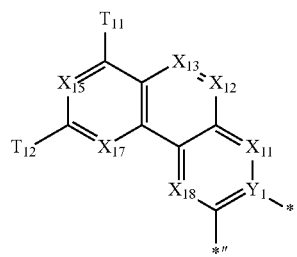
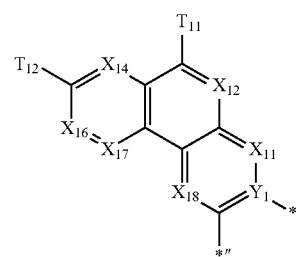

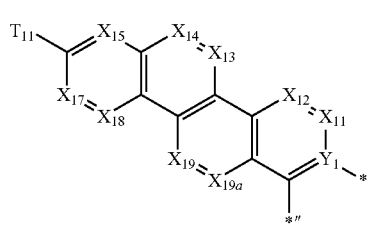
2(54)
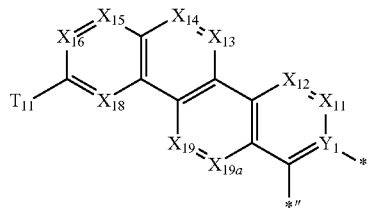
2(55)
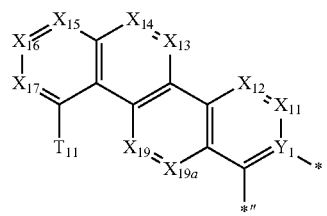
2(56)
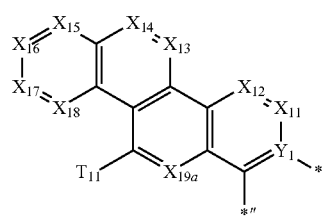
2(57)
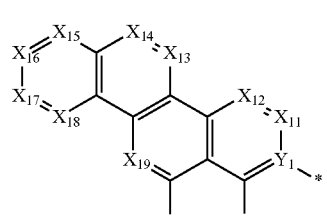
2(58)
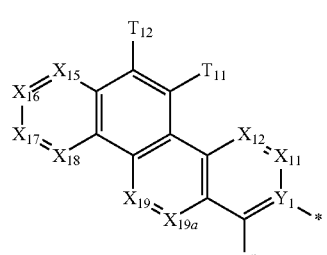
2(59)
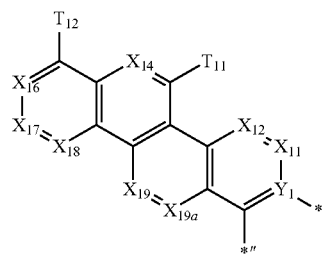
2(60)
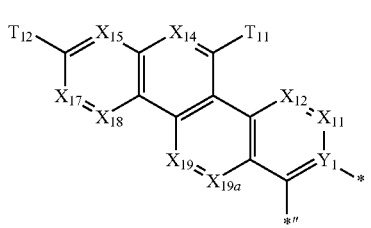
2(61)
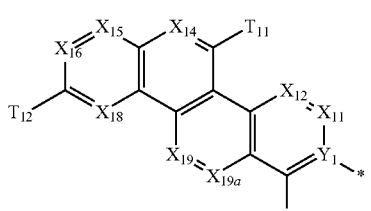
2(62)
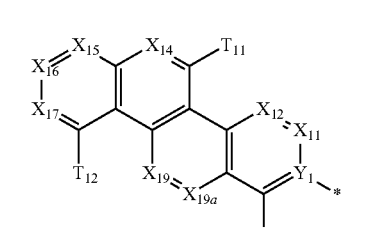
2(63)
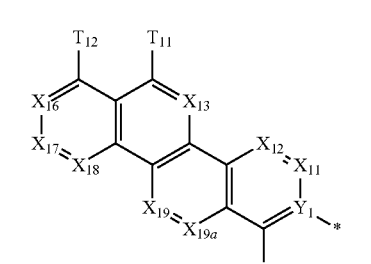
2(64)
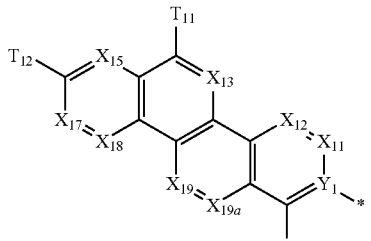
2(65)
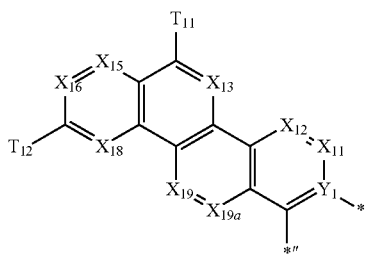
2(66)

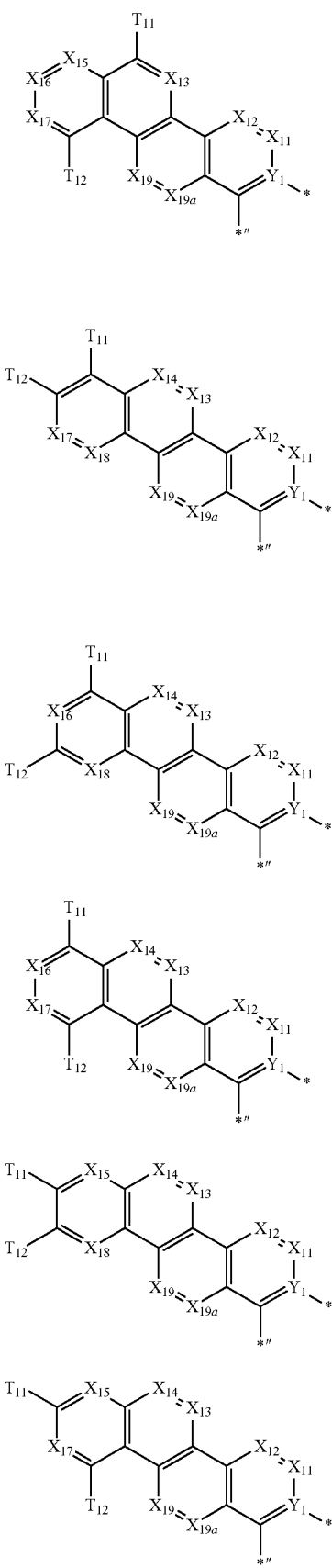

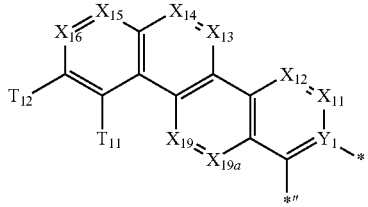

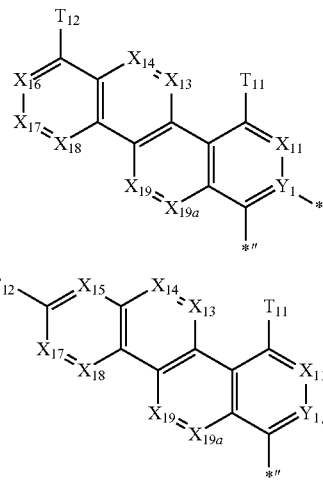

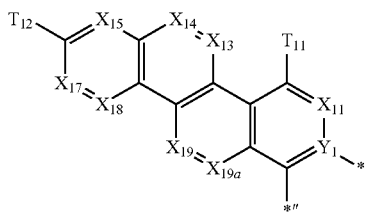

wherein, in Formulae 2(1) to 2(75),
Y$_1$ is N,
X$_{11}$ is C(R$_{11}$) or N, X$_{12}$ is C(R$_{12}$) or N, X$_{11}$ is C(R$_{13}$) or N, X$_{14}$ is C(R$_{14}$) or N, X$_{15}$ is C(R$_{15}$) or N, X$_{16}$ is C(R$_{16}$) or N, X$_{17}$ is C(R$_{17}$) or N, X$_{18}$ is C(R$_{18}$) or N, X$_{19}$ is C(R$_{19}$) or N, X$_{19a}$ is C(R$_{19a}$) or N,
R$_{11}$ to R$_{19}$ and R$_{19a}$ are the same as described in connection with R$_1$ of claim 1,
T$_{1i}$ and T$_{12}$ are the same as described in connection with T$_1$ of claim 1,
* is a binding site to Ir in Formula 1, and
*" indicates a binding site to a neighboring atom.

11. The organometallic compound of claim 1, wherein a group represented by:

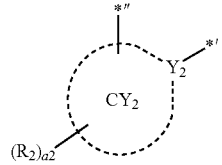

in Formula 1 is a group represented by one of Formulae CY2-1 to CY2-10:

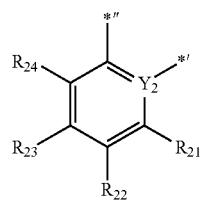

CY2-1

231
-continued

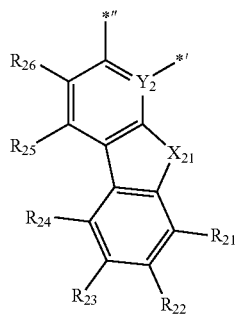
CY2-2

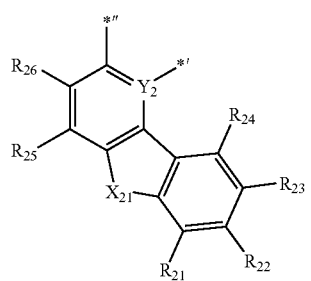
CY2-3

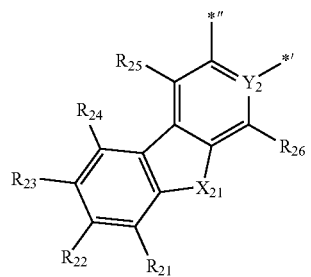
CY2-4

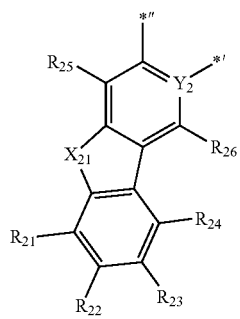
CY2-5

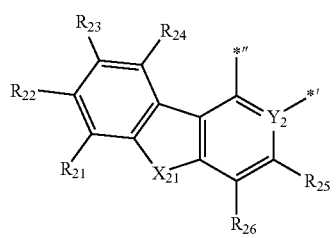
CY2-6

232
-continued

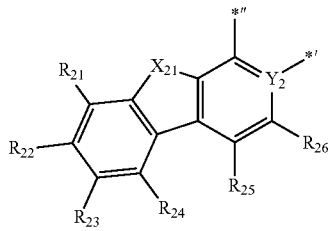
CY2-7

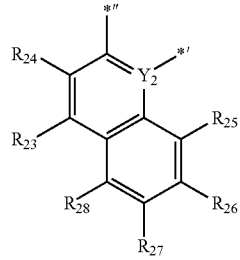
CY2-8

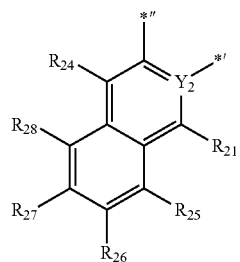
CY2-9

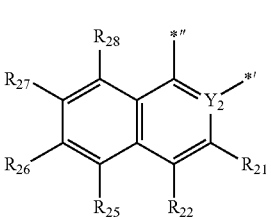
CY2-10 wherein, in Formulae CY2-1 to CY2-10,
$Y_2$ is C,
$X_{21}$ is O, S, $N(R_7)$, $C(R_{27})(R_{28})$, or $Si(R_{27})(R_{28})$,
$R_{21}$ to $R_{28}$ are the same as described in connection with $R_2$ of claim 1,
*' is a binding site to Ir in Formula 1, and
*" is a binding site to a neighboring atom in Formula 1.

12. The organometallic compound of claim 11, wherein a group represented by:

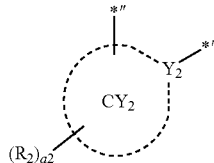

in Formula 1 is a group represented by Formula CY2-1 or CY2-8.

13. The organometallic compound of claim 11, wherein $R_{21}$ and $R_{23}$ in Formula CY2-1 are each independently a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a combination thereof.

14. The organometallic compound of claim 1, wherein the organometallic compound satisfies Condition 4 and Condition 5.

15. The organometallic compound of claim 14, wherein Formula 4 satisfies one of Condition 4-2 to Condition 4-6, Formula 5 satisfies one of Condition 5-2 to Condition 5-6.

16. The organometallic compound of claim 1, wherein at least one of $R_{31}$ to $R_{33}$ of Formula 3 is each independently be a $C_3$-$C_{10}$ cycloalkyl group that is unsubstituted or substituted with deuterium, a $C_1$-$C_{20}$ alkyl group, a $C_3$-$C_{10}$ cycloalkyl group, a phenyl group, a biphenyl group, or a combination thereof.

17. An organic light-emitting device comprising:
    a first electrode;
    a second electrode; and
    an organic layer disposed between the first electrode and the second electrode and comprising an emission layer, wherein the organic layer comprises at least one of the organometallic compound of claim 1.

18. The organic light-emitting device of claim 17, wherein
    the first electrode is an anode,
    the second electrode is a cathode,
    the organic layer further comprises a hole transport region disposed between the first electrode and the emission layer and an electron transport region disposed between the emission layer and the second electrode,
    the hole transport region comprises a hole injection layer, a hole transport layer, an electron blocking layer, a buffer layer, or a combination thereof, and
    the electron transport region comprises a hole blocking layer, an electron transport layer, an electron injection layer, or a combination thereof.

19. The organic light-emitting device of claim 17, wherein the emission layer comprises the at least one organometallic compound.

20. An electronic apparatus comprising the organic light-emitting device of claim 17.

* * * * *